US006573846B1

(12) United States Patent
Trivedi et al.

(10) Patent No.: US 6,573,846 B1
(45) Date of Patent: Jun. 3, 2003

(54) METHOD AND APPARATUS FOR VARIABLE LENGTH DECODING AND ENCODING OF VIDEO STREAMS

(75) Inventors: Sushma Shrikant Trivedi, Sunnyvale, CA (US); Alexei V. Ouzilevski, Cupertino, CA (US); Mushtaq A. Sarwar, Santa Clara, CA (US); Yutaka Takahashi, Cupertino, CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 10/038,797

(22) Filed: Dec. 31, 2001

(51) Int. Cl.[7] ................................................. H03M 7/40
(52) U.S. Cl. ....................................................... 341/67
(58) Field of Search .............................. 341/67, 59, 63, 341/100, 101

(56) References Cited

U.S. PATENT DOCUMENTS

| | | |
|---|---|---|
| 3,016,527 A | 1/1962 | Gilbert et al. |
| 3,675,212 A | 7/1972 | Raviv et al. |
| 5,173,695 A | 12/1992 | Sun et al. |
| 5,510,852 A | 4/1996 | Shyu |
| 5,740,283 A | 4/1998 | Meeker |
| 5,754,186 A | 5/1998 | Tam et al. |
| 5,768,445 A | 6/1998 | Troeller et al. |
| 5,798,767 A | 8/1998 | Poole et al. |
| 5,844,854 A | 12/1998 | Lee |
| 5,875,355 A | 2/1999 | Sidwell et al. |
| 5,878,267 A | 3/1999 | Hampapuram et al. |
| 5,943,058 A | 8/1999 | Nagy |
| 5,946,113 A | 8/1999 | Pritchett |
| 5,963,744 A | 10/1999 | Slavenburg et al. |
| 5,974,380 A | 10/1999 | Smyth et al. |
| 5,990,812 A | 11/1999 | Bakhmutsky |
| 6,021,420 A | 2/2000 | Takamuki |
| 6,122,690 A | 9/2000 | Nannetti et al. |
| 6,122,722 A | 9/2000 | Slavenburg |
| 6,145,077 A | 11/2000 | Sidwell et al. |
| 6,201,530 B1 | 3/2001 | Thadani et al. |
| 6,215,424 B1 * | 4/2001 | Cooper ........................ 341/67 |
| 6,219,457 B1 | 4/2001 | Potu |
| 6,232,990 B1 | 5/2001 | Poirion |
| 6,246,347 B1 | 6/2001 | Bakhmutsky |
| 6,339,386 B1 * | 1/2002 | Cho ............................. 341/67 |

OTHER PUBLICATIONS

Linley Gwennap, "MediaGX Targets Low–Cost PCs", *Microprocessor Report*, vol. 11, No. 3, Mar. 10, 1997, pp. 1–8.
*Proposed SMPTE Standard for Television, SMPTE 314M*, pp. 146 (no date given).
*AltiVec Technology, Programming Interface Manual*, Motorola, Rev. 0, Jun. 1999, pp. 4–84.
*AltiVec Technology, Programming Environments Manual*, Motorola, Rev. 0, Nov. 1998, pp. 1–1–1–12, p. 6–113.

* cited by examiner

*Primary Examiner*—Brian Young
(74) *Attorney, Agent, or Firm*—Blakely, Sokoloff, Taylor & Zafman LLP

(57) ABSTRACT

Methods and apparatuses for decoding a compressed video stream. In one aspect of the invention, a method to decode a variable length encoded bit stream includes: concurrently processing first data obtained from variable length decoding a first code word in a register while variable length decoding a second code word in the register. In one example, processing the first data includes: looking up an inverse zigzag index; computing an Inverse Direct Cosine Transformation (IDCT) coefficient; storing the IDCT coefficient in a buffer in a transposed inverse zigzag order; and branching conditionally based on a condition encountered in variable length decoding the first code word.

124 Claims, 101 Drawing Sheets

/ 3600

| Functional Unit | Latency | Dispatch Rate |
|---|---|---|
| IALU - not multipy or divide | 2 | 1 |
| IALU - multiply | 19 | 19 |
| IALU - divide | 35 | 35 |
| ISHU | 2 | 1 |
| LSU - non-DMA address update | 2 | 1 |
| LSU - non-DMA load data update | 3 | 1 |
| LSU - non-DMA store | 1 | 1 |
| LSU - DMA instructions | 1 | 1 |
| VPU | 2 | 1 |
| VSIU | 2 | 1 |
| VCIU | 6 | 1 |
| VLUT - reads, vvld | 4 | 1 |
| VLUT - writes | 1 | 1 |
| Branch instruction | 1 | 1 |

| Program Counter | PSt |
|---|---|
| 0                                      29 | 30    31 |

/ 3901

| Pst | Name | Description |
|---|---|---|
| 00 | Idle | CQ counters are equal and no current command executing. Program counter is invalid. |
| 01 | Run | Command was executing. Program counter points to next instruction that would have been executed. |
| 10 | IWait | Command was executing, but instruction fetching has stopped due to a previous exception. Program counter points to the next instruction that would have been executed. |
| 11 | CWait | Command was not executing due to an exception in fetching the command. Program counter is invalid. |

Figure 29

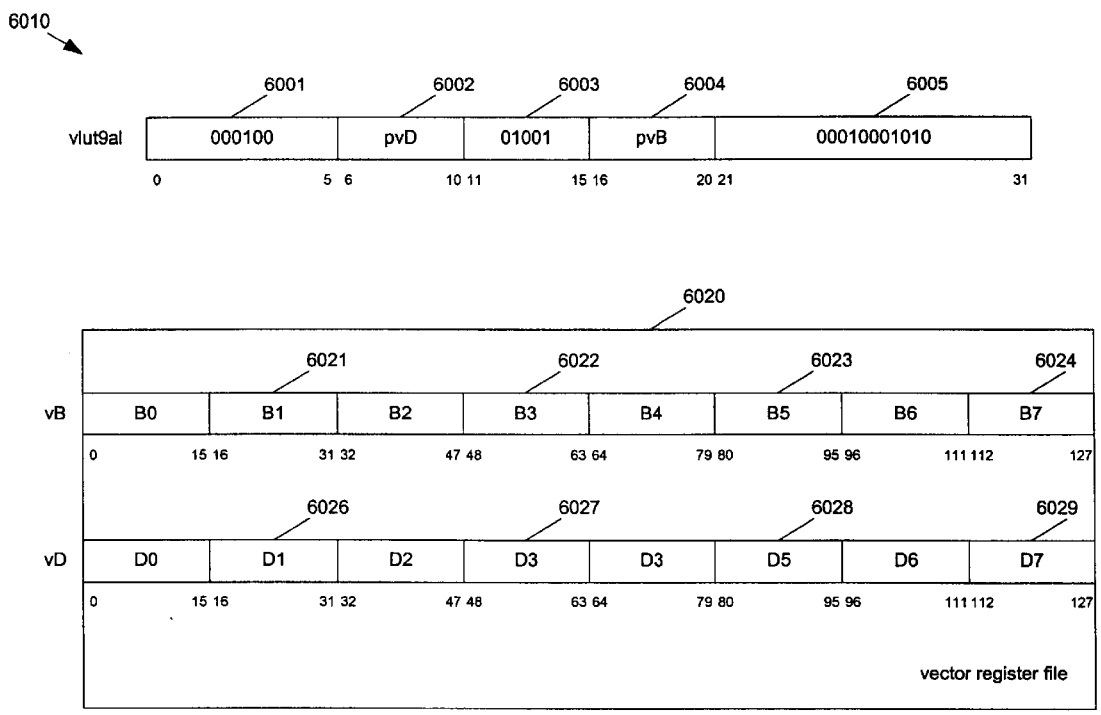
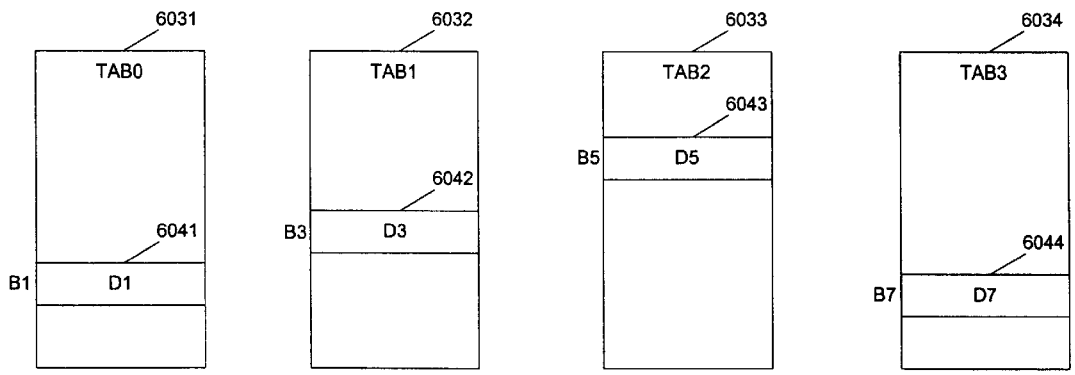
Fig. 40

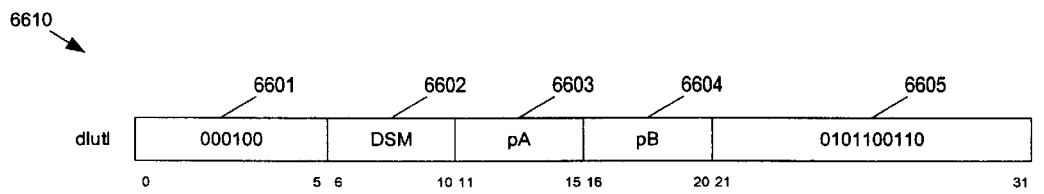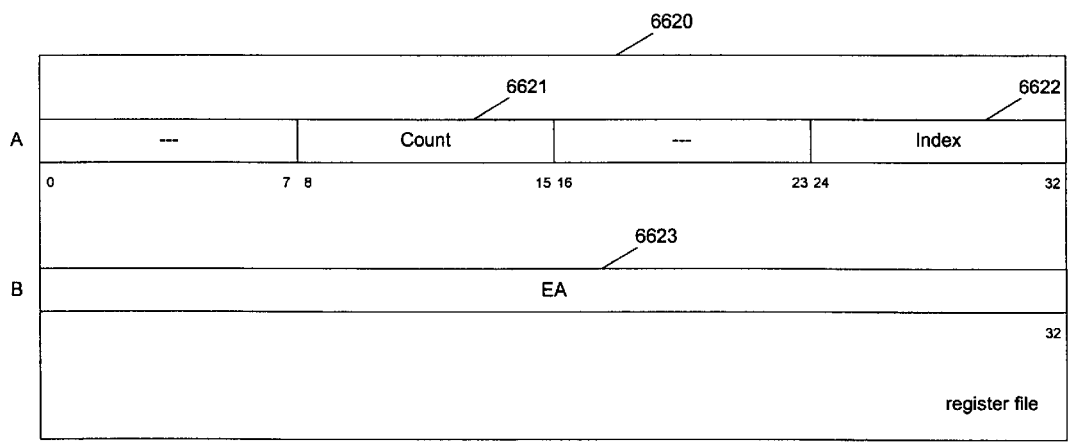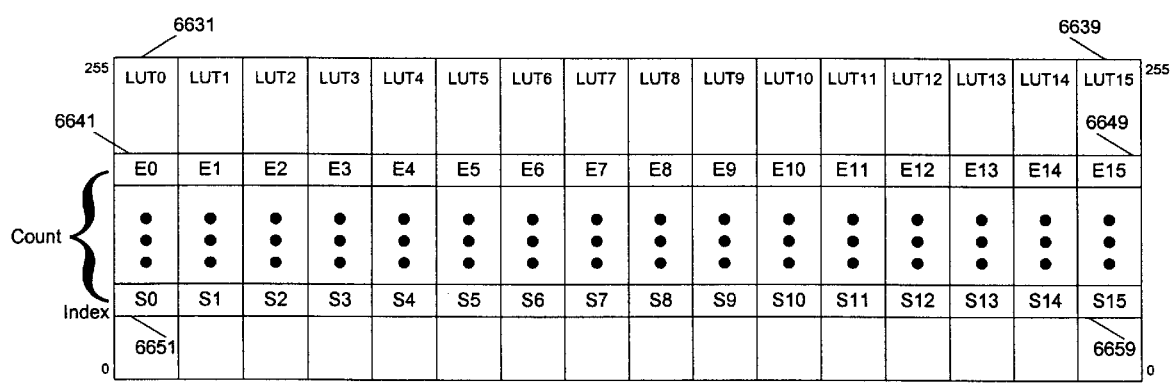
Fig. 46

| Index | T1 | | | | T2 | | | | T3 | | | | T4 | | | |
|---|---|---|---|---|---|---|---|---|---|---|---|---|---|---|---|---|
| | type | bits | run | level | type | bits | run | level | type | bits | run | level | type | bits | run | level |
| 00 | 4 | 2 | 0 | 1 | 4 | 6 | 3 | 1 | 4 | 9 | 11 | 1 | 4 | 10 | 5 | 3 |
| 01 | 4 | 2 | 0 | 1 | 4 | 6 | 3 | 1 | 4 | 9 | 11 | -1 | 4 | 10 | 5 | 3 |
| 02 | 4 | 2 | 0 | 1 | 4 | 6 | 3 | -1 | 4 | 9 | 12 | 1 | 4 | 10 | 5 | -3 |
| 03 | 4 | 2 | 0 | 1 | 4 | 6 | 3 | -1 | 4 | 9 | 12 | -1 | 4 | 10 | 5 | -3 |
| 04 | 4 | 2 | 0 | 1 | 4 | 6 | 4 | 1 | 4 | 9 | 13 | 1 | 4 | 10 | 3 | 4 |
| 05 | 4 | 2 | 0 | 1 | 4 | 6 | 4 | 1 | 4 | 9 | 13 | -1 | 4 | 10 | 3 | 4 |
| 06 | 4 | 2 | 0 | 1 | 4 | 6 | 4 | -1 | 4 | 9 | 14 | 1 | 4 | 10 | 3 | -4 |
| 07 | 4 | 2 | 0 | 1 | 4 | 6 | 4 | -1 | 4 | 9 | 14 | -1 | 4 | 10 | 3 | -4 |
| 08 | 4 | 2 | 0 | -1 | 4 | 6 | 0 | 7 | 4 | 9 | 5 | 2 | 4 | 10 | 3 | 5 |
| 09 | 4 | 2 | 0 | -1 | 4 | 6 | 0 | 7 | 4 | 9 | 5 | -2 | 4 | 10 | 3 | 5 |
| 0a | 4 | 2 | 0 | -1 | 4 | 6 | 0 | -7 | 4 | 9 | 6 | 2 | 4 | 10 | 3 | -5 |
| 0b | 4 | 2 | 0 | -1 | 4 | 6 | 0 | -7 | 4 | 9 | 6 | -2 | 4 | 10 | 3 | -5 |
| 0c | 4 | 2 | 0 | -1 | 4 | 6 | 0 | 8 | 4 | 9 | 3 | 3 | 4 | 10 | 2 | 6 |
| 0d | 4 | 2 | 0 | -1 | 4 | 6 | 0 | 8 | 4 | 9 | 3 | -3 | 4 | 10 | 2 | 6 |
| 0e | 4 | 2 | 0 | -1 | 4 | 6 | 0 | -8 | 4 | 9 | 4 | 3 | 4 | 10 | 2 | -6 |
| 0f | 4 | 2 | 0 | -1 | 4 | 6 | 0 | -8 | 4 | 9 | 4 | -3 | 4 | 10 | 2 | -6 |
| 10 | 4 | 3 | 0 | 2 | 4 | 7 | 5 | 1 | 4 | 9 | 2 | 4 | 4 | 10 | 1 | 9 |
| 11 | 4 | 3 | 0 | 2 | 4 | 7 | 5 | -1 | 4 | 9 | 2 | -4 | 4 | 10 | 1 | 9 |
| 12 | 4 | 3 | 0 | 2 | 4 | 7 | 6 | 1 | 4 | 9 | 2 | 5 | 4 | 10 | 1 | -9 |
| 13 | 4 | 3 | 0 | 2 | 4 | 7 | 6 | -1 | 4 | 9 | 2 | -5 | 4 | 10 | 1 | -9 |
| 14 | 4 | 3 | 0 | -2 | 4 | 7 | 2 | 2 | 4 | 9 | 1 | 8 | 4 | 10 | 1 | 10 |
| 15 | 4 | 3 | 0 | -2 | 4 | 7 | 2 | -2 | 4 | 9 | 1 | -8 | 4 | 10 | 1 | 10 |
| 16 | 4 | 3 | 0 | -2 | 4 | 7 | 1 | 3 | 4 | 9 | 0 | 18 | 4 | 10 | 1 | -10 |
| 17 | 4 | 3 | 0 | -2 | 4 | 7 | 1 | -3 | 4 | 9 | 0 | -18 | 4 | 10 | 1 | -10 |
| 18 | 1 | 3 | 0 | 0 | 4 | 7 | 1 | 4 | 4 | 9 | 0 | 19 | 4 | 10 | 1 | 11 |
| 19 | 1 | 3 | 0 | 0 | 4 | 7 | 1 | -4 | 4 | 9 | 0 | -19 | 4 | 10 | 1 | 11 |
| 1a | 1 | 3 | 0 | 0 | 4 | 7 | 0 | 9 | 4 | 9 | 0 | 20 | 4 | 10 | 1 | -11 |
| 1b | 1 | 3 | 0 | 0 | 4 | 7 | 0 | -9 | 4 | 9 | 0 | -20 | 4 | 10 | 1 | -11 |
| 1c | 4 | 4 | 1 | 1 | 4 | 7 | 0 | 10 | 4 | 9 | 0 | 21 | 4 | 10 | 0 | 0 |
| 1d | 4 | 4 | 1 | 1 | 4 | 7 | 0 | -10 | 4 | 9 | 0 | -21 | 4 | 10 | 0 | 0 |
| 1e | 4 | 4 | 1 | -1 | 4 | 7 | 0 | 11 | 4 | 9 | 0 | 22 | 4 | 10 | 1 | 0 |
| 1f | 4 | 4 | 1 | -1 | 4 | 7 | 0 | -11 | 4 | 9 | 0 | -22 | 4 | 10 | 1 | 0 |
| 20 | 4 | 4 | 0 | 3 | 5 | 8 | 7 | 1 | 0 | 0 | 0 | 0 | 4 | 11 | 6 | 3 |
| 21 | 4 | 4 | 0 | 3 | 5 | 8 | 8 | 1 | 0 | 0 | 0 | 0 | 4 | 11 | 6 | -3 |
| 22 | 4 | 4 | 0 | -3 | 5 | 8 | 9 | 1 | 0 | 0 | 0 | 0 | 4 | 11 | 4 | 4 |
| 23 | 4 | 4 | 0 | -3 | 5 | 8 | 10 | 1 | 0 | 0 | 0 | 0 | 4 | 11 | 4 | -4 |
| 24 | 4 | 4 | 0 | 4 | 5 | 8 | 3 | 2 | 0 | 0 | 0 | 0 | 4 | 11 | 3 | 6 |
| 25 | 4 | 4 | 0 | 4 | 5 | 8 | 4 | 2 | 0 | 0 | 0 | 0 | 4 | 11 | 3 | -6 |
| 26 | 4 | 4 | 0 | -4 | 5 | 8 | 2 | 3 | 0 | 0 | 0 | 0 | 4 | 11 | 1 | 12 |
| 27 | 4 | 4 | 0 | -4 | 5 | 8 | 1 | 5 | 0 | 0 | 0 | 0 | 4 | 11 | 1 | -12 |
| 28 | 4 | 5 | 2 | 1 | 5 | 8 | 1 | 6 | 0 | 0 | 0 | 0 | 4 | 11 | 1 | 13 |
| 29 | 4 | 5 | 2 | -1 | 5 | 8 | 1 | 7 | 0 | 0 | 0 | 0 | 4 | 11 | 1 | -13 |
| 2a | 4 | 5 | 1 | 2 | 5 | 8 | 0 | 12 | 0 | 0 | 0 | 0 | 4 | 11 | 1 | 14 |
| 2b | 4 | 5 | 1 | -2 | 5 | 8 | 0 | 13 | 0 | 0 | 0 | 0 | 4 | 11 | 1 | -14 |
| 2c | 4 | 5 | 0 | 5 | 5 | 8 | 0 | 14 | 0 | 0 | 0 | 0 | 4 | 11 | 2 | 0 |
| 2d | 4 | 5 | 0 | -5 | 5 | 8 | 0 | 15 | 0 | 0 | 0 | 0 | 4 | 11 | 3 | 0 |
| 2e | 4 | 5 | 0 | 6 | 5 | 8 | 0 | 16 | 0 | 0 | 0 | 0 | 4 | 11 | 4 | 0 |
| 2f | 4 | 5 | 0 | -6 | 5 | 8 | 0 | 17 | 0 | 0 | 0 | 0 | 4 | 11 | 5 | 0 |
| 30 | 0 | 0 | 0 | 0 | 0 | 0 | 0 | 0 | 0 | 0 | 0 | 0 | 5 | 12 | 7 | 2 |
| 31 | 0 | 0 | 0 | 0 | 0 | 0 | 0 | 0 | 0 | 0 | 0 | 0 | 5 | 12 | 8 | 2 |
| 32 | 0 | 0 | 0 | 0 | 0 | 0 | 0 | 0 | 0 | 0 | 0 | 0 | 5 | 12 | 9 | 2 |
| 33 | 0 | 0 | 0 | 0 | 0 | 0 | 0 | 0 | 0 | 0 | 0 | 0 | 5 | 12 | 10 | 2 |
| 34 | 0 | 0 | 0 | 0 | 0 | 0 | 0 | 0 | 0 | 0 | 0 | 0 | 5 | 12 | 7 | 3 |
| 35 | 0 | 0 | 0 | 0 | 0 | 0 | 0 | 0 | 0 | 0 | 0 | 0 | 5 | 12 | 8 | 3 |
| 36 | 0 | 0 | 0 | 0 | 0 | 0 | 0 | 0 | 0 | 0 | 0 | 0 | 5 | 12 | 4 | 5 |
| 37 | 0 | 0 | 0 | 0 | 0 | 0 | 0 | 0 | 0 | 0 | 0 | 0 | 5 | 12 | 3 | 7 |
| 38 | 0 | 0 | 0 | 0 | 0 | 0 | 0 | 0 | 0 | 0 | 0 | 0 | 5 | 12 | 2 | 7 |
| 39 | 0 | 0 | 0 | 0 | 0 | 0 | 0 | 0 | 0 | 0 | 0 | 0 | 5 | 12 | 2 | 8 |
| 3a | 0 | 0 | 0 | 0 | 0 | 0 | 0 | 0 | 0 | 0 | 0 | 0 | 5 | 12 | 2 | 9 |
| 3b | 0 | 0 | 0 | 0 | 0 | 0 | 0 | 0 | 0 | 0 | 0 | 0 | 5 | 12 | 2 | 10 |
| 3c | 0 | 0 | 0 | 0 | 2 | 12 | 0 | 0 | 0 | 0 | 0 | 0 | 5 | 12 | 2 | 11 |
| 3d | 0 | 0 | 0 | 0 | 2 | 12 | 0 | 0 | 0 | 0 | 0 | 0 | 5 | 12 | 1 | 15 |
| 3e | 0 | 0 | 0 | 0 | 3 | 15 | 0 | 0 | 0 | 0 | 0 | 0 | 5 | 12 | 1 | 16 |
| 3f | 0 | 0 | 0 | 0 | 3 | 15 | 0 | 0 | 0 | 0 | 0 | 0 | 5 | 12 | 1 | 17 |
| 40 | 0 | 0 | 0 | 0 | 0 | 0 | 0 | 0 | 0 | 0 | 0 | 0 | 0 | 0 | 0 | 0 |
| ... | 0 | 0 | 0 | 0 | 0 | 0 | 0 | 0 | 0 | 0 | 0 | 0 | 0 | 0 | 0 | 0 |
| ff | 0 | 0 | 0 | 0 | 0 | 0 | 0 | 0 | 0 | 0 | 0 | 0 | 0 | 0 | 0 | 0 |

Fig. 62

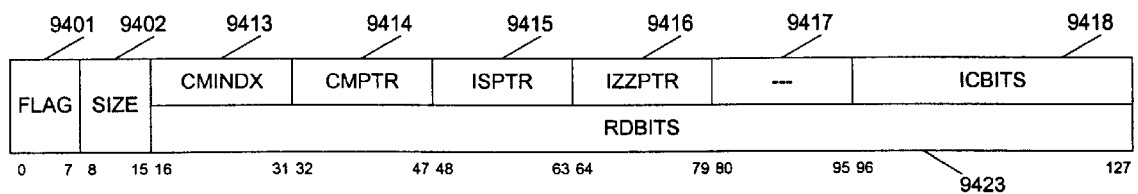
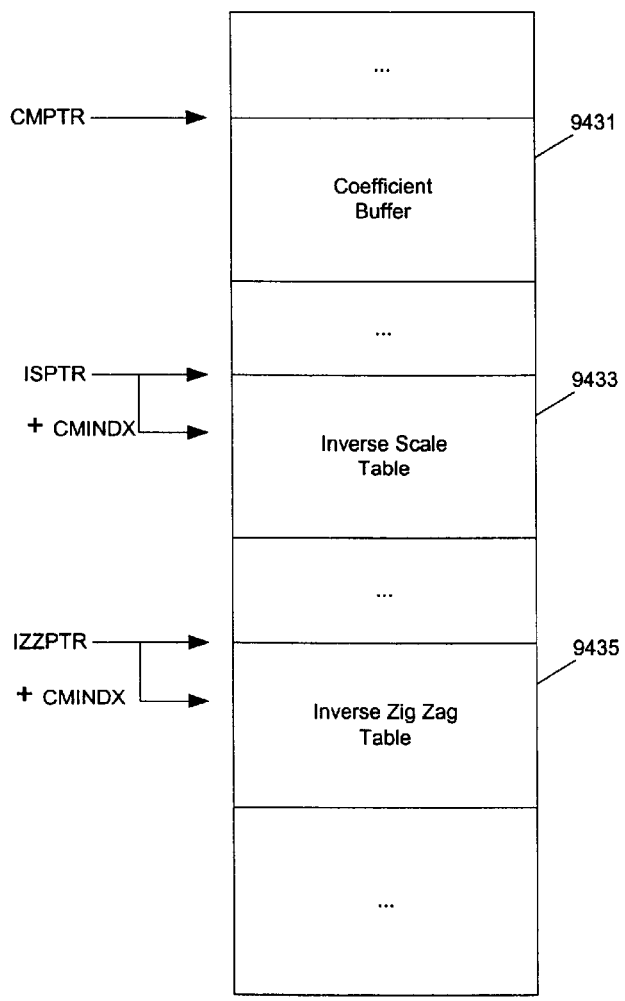
Fig. 74

|     | 0 | 7 | 15 | 23 | 31 | 39 | 47 | 55 | 63 | 71 | 79 | 87 | 95 | 103 | 111 | 119 | 127 |
|-----|---|---|----|----|----|----|----|----|----|----|----|----|----|-----|-----|-----|-----|
| vi0 | 0 | 0 | 1  | 1  | 2  | 2  | 3  | 3  | 4  | 4  | 5  | 5  | 6  | 6   | 7   | 7   |     |
| vi1 | 7 | 7 | 0  | 0  | 1  | 1  | 2  | 2  | 3  | 3  | 4  | 4  | 5  | 5   | 6   | 6   |     |
| vi2 | 6 | 6 | 7  | 7  | 0  | 0  | 1  | 1  | 2  | 2  | 3  | 3  | 4  | 4   | 5   | 5   |     |
| vi3 | 5 | 5 | 6  | 6  | 7  | 7  | 0  | 0  | 1  | 1  | 2  | 2  | 3  | 3   | 4   | 4   |     |
| vi4 | 4 | 4 | 5  | 5  | 6  | 6  | 7  | 7  | 0  | 0  | 1  | 1  | 2  | 2   | 3   | 3   |     |
| vi5 | 3 | 3 | 4  | 4  | 5  | 5  | 6  | 6  | 7  | 7  | 0  | 0  | 1  | 1   | 2   | 2   |     |
| vi6 | 2 | 2 | 3  | 3  | 4  | 4  | 5  | 5  | 6  | 6  | 7  | 7  | 0  | 0   | 1   | 1   |     |
| vi7 | 1 | 1 | 2  | 2  | 3  | 3  | 4  | 4  | 5  | 5  | 6  | 6  | 7  | 7   | 0   | 0   |     |

T0 T1 T2 T3 T4 T5 T6 T7 T8 T9 T10 T11 T12 T13 T14 T15

|     | 0 | 7 | 15 | 23 | 31 | 39 | 47 | 55 | 63 | 71 | 79 | 87 | 95 | 103 | 111 | 119 | 127 |
|-----|---|---|----|----|----|----|----|----|----|----|----|----|----|-----|-----|-----|-----|
| vj0 | 0 | 0 | 0  | 0  | 0  | 0  | 0  | 0  | 0  | 0  | 0  | 0  | 0  | 0   | 0   | 0   |     |
| vj1 | 1 | 1 | 1  | 1  | 1  | 1  | 1  | 1  | 1  | 1  | 1  | 1  | 1  | 1   | 1   | 1   |     |
| vj2 | 2 | 2 | 2  | 2  | 2  | 2  | 2  | 2  | 2  | 2  | 2  | 2  | 2  | 2   | 2   | 2   |     |
| vj3 | 3 | 3 | 3  | 3  | 3  | 3  | 3  | 3  | 3  | 3  | 3  | 3  | 3  | 3   | 3   | 3   |     |
| vj4 | 4 | 4 | 4  | 4  | 4  | 4  | 4  | 4  | 4  | 4  | 4  | 4  | 4  | 4   | 4   | 4   |     |
| vj5 | 5 | 5 | 5  | 5  | 5  | 5  | 5  | 5  | 5  | 5  | 5  | 5  | 5  | 5   | 5   | 5   |     |
| vj6 | 6 | 6 | 6  | 6  | 6  | 6  | 6  | 6  | 6  | 6  | 6  | 6  | 6  | 6   | 6   | 6   |     |
| vj7 | 7 | 7 | 7  | 7  | 7  | 7  | 7  | 7  | 7  | 7  | 7  | 7  | 7  | 7   | 7   | 7   |     |

METHOD AND APPARATUS FOR VARIABLE LENGTH DECODING AND ENCODING OF VIDEO STREAMS

FIELD OF THE INVENTION

The invention relates to data processing systems using vector processing and Very Long Instruction Word (VLIW) architecture, more particularly to variable length decoding and encoding of bit streams.

BACKGROUND OF THE INVENTION

FIG. 3 shows a typical computer system having at least one host processor 1301 and host memory 1302. The system core logic chip 1300, also known as a memory controller or a north bridge, facilitates data transfer between the host memory 1302 through a memory interface 1304, the host processor 1301 through a host interface 1303, graphics controller 1308 through a PCI-0/AGP interface 1306 and other peripherals such as input/output (I/O) controller 1309 through PCI-1 interface 1307. An IEEE-1394 bus 1310, also known as a FireWire bus, may be coupled to the I/O controller 1309. The FireWire bus 1310, in some applications, may be directly coupled to the system core logic chip 1300 through the PCI-1 interface 1307. The FireWire bus 1310 provides interfaces to other FireWire devices, such as FireWire storage devices (e.g., FireWire hard disks). Other components such as universal serial bus (USB), Ethernet device, etc., may be coupled to the system core logic 1300. Due to these interfaces, the system core logic 1300 requires a large number of pins. On the other hand, the logic required for the system core logic functions is relatively small. The large number of interface pins causes the area of the system core logic 1300 to become quite large. The small amount of logic combined with continuing advancement in silicon technology, results in the significant portion of that area being unused.

The concept of a media processor has been around for a while. A media processor typically refers to an engine designed for the processing of a combination of audio, video and graphics data. A media processor can also be used for other tasks that require similar processing features. The media processors have so far been designed as stand-alone processors and have enjoyed moderate success in processing video data. The media processors can be used in add-in boards to perform various tasks. FIG. 4A shows an example of a conventional media processor in a computer system. The system 1400 of FIG. 4A includes a host processor or processors 1401, host memory 1402, a graphics controller 1404, and a media processor 1405. The bus 1403 interconnects these various components together. Other peripherals may be connected to the bus 1403.

FIG. 5A shows an example of a conventional media processor. The media processor 1500 includes an input/output (I/O) interface, which receives and transmits data between the media processor and other components of the system, such as host processor and host memory 1506. The media processor 1500 may also include a cache memory 1504 for temporarily storing data before the instruction decoder 1502 decodes the instructions and transmits them to different functional units, such as vector processors 1503. The media processor 1500 may include one or more register files for storing input or output data of the functional execution units 1503.

A media processor may employ multiple functional units (e.g., adder, multiplier, shift, load/store units), and use very long instruction word (VLIW) programming. Depending on the target application, the media processor may have a combination of functional units of different kind and there may be more or fewer of these units. Some media processors only integrate vector-processing units (e.g., vector processors). Vector processors allow execution of a single instruction on multiple data elements. There are several vector processors available on the market (e.g., Motorola's AltiVec, SSE-2, etc.). The conventional media processors use the scalar processing unit available through the host processors. Thus, the vector data are processed by the vector processing units and the scalar data are processed by the scalar processing units through the host system. This arrangement may require the data to be transferred between the host system and the media processor, thus it may impact performance.

The conventional media processor may use very long instruction word (VLIW) programming. Depending on the target application, the media processor may have a combination of functional units of different kind and there may be more or few of the functional units. The VLIW contains one instruction slot for each of these units. The VLIW programming is based on issuing instructions to all of these functional units in the same clock cycle of the host processor. Not all instructions may need to be issued on each clock cycle. If an instruction slot in the VLIW instruction is not used in a particular cycle, it is assigned a code of no-operation (NOOP), but it still occupies bits in the VLIW instruction. This results in code expansion and therefore in memory, bandwidth, and instruction cache related inefficiencies.

Typically, a graphics controller may be coupled to the PCI bus. PCI bus supports multiple peripheral components and add-in cards at a peak bandwidth of 132 megabytes per second. Thus, PCI is capable of supporting full motion video playback at 30 frames per second, true color high-resolution graphics and 100 megabytes per second Ethernet local area networks. However, the emergence of high-bandwidth applications, such as three-dimensional (3-D) graphics applications, threatens to overload the PCI bus. As a result, a dedicated graphics bus slot, known as an accelerated graphics port (AGP), has been designed and integrated into the computer system, such as AGP interface 1306 of FIG. 3. AGP operates at higher frequency and transfers data at a rate up to 1 GB/sec. AGP's greater bandwidth will allow game and 3D application developers to store and retrieve larger, more realistic textures in system memory rather than video memory, without incurring a dramatic performance hit to the rest of the system.

Many computer systems, such as system 1300 of FIG. 3, use virtual memory systems to permit the host processor 1301 to address more memory than is physically present in the main memory 1302. A virtual memory system allows addressing of very large amounts of memory as though all of that memory were a part of the main memory of the computer system. A virtual memory system allows this even though actual main memory may consist of some substantially lesser amount of storage space than is addressable.

As a result, a system with a graphics accelerator connected to the AGP port of the system core logic normally requires graphics address re-mapping table (GART) to translate a virtual address space to the physical address. However, since the AGP address ranges are designed dedicated to the AGP accelerator, it is a fixed memory range that may not be shared with other components in the system.

In addition, the media processor in an AGP system normally uses mapped non-coherent memory access. Non-coherent memory operations are those operations where data goes directly to and from memory and is returned directly back to the media processor and never goes through the processor cache. On the other hand, a coherent memory system always goes through the host processor. The data of a coherent memory system may exist in the host processor's cache or in the host memory. Referring to FIG. 3, when a coherent memory access request is issued, the host processor 1301 checks whether the host processor's cache (not shown) contains newer data than the host memory 1302. If the host processor cache contains newer data, the host processor 1301 flushes its caches into the host memory 1302 before the data is read from the host memory. Lack of coherent access of the conventional approaches posts an inconvenience to the applications.

As graphics data processing is getting more complex, improvements in media data processing systems increase the ability to handle more complex processing.

Many applications, such as motion estimation for video images compressed in Motion Picture Expert Group (MPEG) standard, curve fitting, and others, require the computation of the sum of absolute difference of two vectors of numbers in order to determine a measurement of the distance (or difference) between the two vectors. If vector vA contains elements $$\{vA0, vA1, \ldots, vAn\},$$

and vector vB contains elements $$\{vB0, vB1, \ldots, vBn\},$$

the absolute difference |vA−vB| contains elements $$\{|vA0 - vB0|, |vA1 - vB1|, \ldots, |vAn - vBn|\}.$$

The sum of absolute difference of vA and vB is $$|vA0 - vB0| + |vA1 - vB1| + \ldots + |vAn - vBn|.$$

In one method according to the prior art, an instruction for vector maximum (Vec_max), an instruction for vector minimum (Vec_min), and an instruction for vector subtract (Vec_sub) are required to compute the absolute difference of two vectors using a vector processor. For example, the following sequence of instructions may be used to compute the absolute difference between vectors vA and vB.

$$\text{Vec\_max}(vMax, vA, vB)$$

$$\text{Vec\_min}(vMin, vA, vB)$$

$$\text{Vec\_sub}(vResult, vMax, vMin)$$

In the above instructions, Vec_max selects the larger ones from the elements of vector vA and the corresponding elements of vector vB to produce vector vMax; on the other hand, Vec_min selects the smaller ones from the elements of vA and the corresponding elements of vB to produce vector vMin; and Vec_sub subtracts vMin from vMax to produce vector vResult, which is the absolute difference of vectors vA and vB. Such a method takes two vector registers for the storage of intermediate results and three instructions to obtain the absolute difference of two vectors of numbers.

In another method according to the prior art, the following sequence of instructions is used to compute the absolute difference between vectors vA and vB.

$$\text{Vec\_sub}(vTemp0, vA, vB)$$

$$\text{Vec\_sub}(vTemp1, 0, vTemp0)$$

$$\text{Vec\_max}(vResult, vTemp0, vTemp1)$$

In the above instructions, Vec_sub first produces vector vTemp0=vA−vB, then, vector vTemp1=vB−vA; and Vec_max selects the positive ones from the elements of vTemp0=vA−vB and the corresponding elements of vTemp1=vB−vA to produce vector vResult, which is the absolute difference of vectors vA and vB. Such a method also takes two vector registers for the storage of intermediate results and three instructions to obtain the absolute difference of two vectors of numbers.

Since many applications, such as application programs for performing motion estimation and motion compensation in decoding video images encoded using an MPEG standard, require the computation of the sum of absolute difference of two vectors, it is desirable to have an efficient method to compute the absolute difference of two vectors.

Vector processors allow simultaneous processing of a vector of data elements using a single instruction. Table look-up for a vector of data elements maps the data elements of the vector into another vector of data elements using one or an array of tables. In one scenario, each data elements of a vector is looked up from a look-up table, and looking up the data element from the look-up table is independent of looking up other elements from other look-up tables and thus multiple look-ups are preformed sequentially over time.

In one embodiment of the prior art, a vector permutation instruction in a vector processor is used to implement table look-up for a vector of data elements. The instruction for vector permutation generates a new vector of data, vD, selected from two vectors of elements, vA and vB, according to a vector of index data, vI. For example, AltiVec, a vector processor by Motorola, implements vector permutation instruction Vec_perm. When executing $$\text{Vec\_perm}(vD, vA, vB, vI)$$

the vector processing unit receives vectors vA, vB, and vI from a vector register file and produces vector vD. Vectors vA and vB are vectors of 16 data elements. Vectors vI is a vector of 16 integer numbers, containing control information to select 16 numbers from the 32 numbers in vectors vA and vB into vector vD. Each of the 16 integer numbers is encoded with i) information determining whether to select entries from either vA or vB, and ii) information determining the index for selecting a particular entry from a vector (vA or vB).

While this approach can be used to perform table look-up for a vector of data from a single small look-up table, there are severe limitations in its practical applications in processing large look-up tables. The indices for the look-up tables must be preprocessed to generate the index information in vector vI. The size of the look-up table that can be used in a table look-up in a single instruction is restricted by the number of bits allocated to represent the index information in vector vI, and by the total number of data elements that can be held by vector registers vA and vB. In a typical vector processor, two vector registers (vA and vB) can hold only 32 8-bit data elements. In general, it is necessary to use a program of multiple sequential instructions to implement vector look-up using one or an array of look-up tables. Further, due to the limited size of a vector register file, only a part of look-up table entries may be loaded into the vector register file when large look-up tables are used. Thus, when a set of large look-up tables are used, table look-up for a vector of data elements requires repeatedly loading table entries into the vector register file. Thus, it can be a very inefficient operation.

There are hardware implementations for table look-up. For example, most display hardware incorporates table look-up functionalities for gamma correction of displayed images. However, such functionality is very limited; and such hardware cannot be used to perform general purpose table look-up for a vector of data elements from an array of look-up tables.

Since many applications, such as software programs for computing pixel values in image processing, require the mapping of a set of values to another set of values using a set of different tables, it is desirable to have an efficient method to perform table look-up for a vector of data elements.

Variable length coding is a coding technique often, used for lossless data compression. Codes of shorter lengths are assigned to frequently occurring fixed-length data to achieve data compression. Variable length encoding is widely used in compression of video data. For example, video images in accordance with JPEG, MPEG or DV standards are compressed using variable length encoding.

Variable length code words used in JPEG, MPEG, or DV compression schemes are typically from 2 to 16 bits in length. Thus, a single look-up table with 16-bit indices has potentially 64K entries. However, the majority of the 64K entries are redundant entries.

In one prior art embodiment, small look-up tables are arranged in a branched tree data structure with pointer logic to track the decoded value during decoding. A series of look-up operations using a number of small tables, typically, as many as four separate tables, are necessary in order to decode a code word.

To reduce the number of look-up operations and associated overhead, U.S. Pat. No. 6,219,457, incorporated by reference herein, describes a method for variable length decoding using only two look-up tables. A code word is first preprocessed to generate an index for a first look-up table to look up an entry for the generation of a pointer for a variable length code table. The entry looked up from the variable length table, using the pointer obtained from the first look-up table, provides information necessary to decode the code word. However, two sequential look-up operations, as well as associated overhead for preprocessing, are necessary to decode a code word.

Matrix transposition is a linear algebra operation commonly used in many fields of applications, such as in signal and image processing. The software implementations of matrix transposition are computationally expensive. When implemented on a scalar CPU, matrix transposition is performed by reading the elements of a matrix one element at a time and storing them in a transposed order.

The amount of computation can be greatly reduced by utilizing vector processing units. The efficiency of vector processing depends on the vector width and the flexibility of the instruction set supported by the execution units. One efficient method for matrix transposition on a vector processor (e.g., AltiVec by Motorola with vectors of 128-bit width) uses a series of vector merge instructions. An vector merge instruction interleaves halves of the elements from two vector registers to generate a new vector. Similarly, U.S. Pat. No. 5,875,355 describes methods to transpose a matrix using various data restructuring instructions.

U.S. Pat. No. 6,021,420 describes a matrix transposition device using a plurality of storage devices which is arranged so as to be able to input and output column vectors in parallel. However, the device described in U.S. Pat. No. 6,021,420 is specialized for matrix transposition and is difficult to be adapted for other applications.

An image can be represented by a matrix of points referred to as pixels. Each pixel has an associated color. Typically, a color may be represented by three components. The three different components used to represent the color define a color space. Many color spaces are presently used in various applications. For example, in computer graphics colors are represented in a RGB color space, where a color is represented by the levels of Red (R), Green (G), and Blue (B). In television equipment, colors are presented in a YUV space, where a color is represented by the levels of intensity (Y) and color differences (U and V). A YCrCb color space is a scaled and offset version of the YUV color space color, where the Y component represents luminance (intensity or picture brightness), the Cb component represents the scaled difference between the blue value and the luminance (Y), and the Cr component represents the scaled difference between the red value and the luminance (Y). Since digitized YCrCb components occupy less bandwidth when compared to digitized RGB (Red-Green-Blue) components, compressed video signals (e.g., DV signals) represent colors in a YCrCb space. The YCrCb color space was developed as part of a world-wide digital component video standard. However, many imaging and displaying devices generally use colors in a RGB space. Thus, a multimedia system must convert a video image from a YCrCb color space to a computer image in a RGB color space. Other commonly used color spaces include HLS, HSI, and HSV. Therefore, it is necessary to convert colors represented in one color space into colors represented in another color space for a set of pixels in an image. For a video stream, it is necessary to convert the color components for each frame of images in the video stream.

There are many techniques for color space conversion. For example, U.S. Pat. No. 5,510,852 describes a method and apparatus for performing color space conversion between digitized YCrCb components and digitized RGB components using a color look up table unit which is provided with transformation component values based on a selected one of two sets of conversions. A plurality of adders are coupled to the lookup table unit so as to receive the outputs thereof and generate individual color components of converted space by adding the transformation component values corresponding to each of the individual color components of converted space relative to the color components of original space. However, since dedicated hardware is required to perform color space conversion according to U.S. Pat. No. 5,510,852, such an approach is generally costly and is difficult to adapt to different configurations.

Blending two images into a new image is a common operation in many applications. For example, a video editing application may blend the images from two different video streams to create a new video stream with special effects. The general blending equation for computing an attribute of a pixel in a new image using those in two source images can be written as:

$$D = K1*S1 + K2*S2$$

where D is the resulting attribute of the pixel; S1 and S2 are the attributes of the pixel in the source images; and K1 and K2 are the blending factors for the corresponding source images.

The blending factors may be constants, but are more generally functions of alpha1 and/or alpha2. In the most common case, K1 equals alpha1 and K2 equals one minus alpha1. The alpha values, known as "alpha" in the graphics world and "key" in the video world, generally represent the desired opacity of the associated image pixel. Generally, the alpha value is not constant over an entire image.

Blending is generally implemented using 32 bit, IEEE 754 compliant floating point arithmetic to avoid visually distracting artifacts. However, video source data, including "key", is usually supplied in 8 or 10 bit integer format for each attribute; hence it is normally required to convert the integer source data to floating point data before applying the general blend equation and then convert the result back to integer data post blending.

To edit video streams, a video editing software application may be required to decode in real time several video streams in order to create video effects, such as blending of video sequences, picture in picture, titling, etc. The resulting uncompressed video images obtained after editing need to be compressed for storage. Compression/decompression of video data is an expensive operation. Add-in-boards are frequently used to accelerate the process of compressing or decompressing video data. Since such add-in-boards are quite expensive, video editing so far has been in the domain for video professionals. Consumer video editing software applications implemented on general purpose processors are slow and suffer from poor quality due to massive computation requirements.

The DV format, such as DV25 or DV50, due to its linear nature (i.e., the consecutive frames of video data are encoded in their display order), relatively low information loss (by using high bit rate coding) and the constant bit rate (i.e., each compressed frame has a constant size) is a preferred format for video editing on the desktop computers. Most of the digital video cameras produce DV bit streams. The compression and decompression processes of DV video streams are briefly outlined below.

DV compression belongs to a family of constant bit rate block based transform coding techniques. The input to a DV encoder is a 29.97 frames per second digital video stream in YUV color space. DV standards support various sampling structures in YUV color space, such as 4:1:1, 4:2:0 and 4:2:2 image sampling structures. An input video stream is processed in the units of 8×8 two-dimensional blocks of pixels. Blocks are organized into macro blocks, each consisting of four or six 8×8 pixel blocks. Macro blocks are organized into segments. A segment comprises 5 macro blocks (e.g., 30 blocks) and is compressed into a constant 400-byte bit stream.

Following the traditional transform coding approach, each pixel block is transformed into frequency domain using Forward Discrete Cosine Transformation (FDCT). The transformed coefficients are further quantized and entropy coded with variable length code words. Each compressed macro block in a segment has a header and a number of fixed size blocks (e.g., 4 luminance blocks and 2 chrominance blocks). In a segment, the code words for each block are concatenated before being distributed into the corresponding compressed-data area for the block in pass 1. In pass 2, the remaining of the blocks after the pass 1 operation that cannot be fitted into the corresponding compressed-data area are distributed in to their corresponding compressed macro block. In pass 3, the remainder after the pass 2 operation are distributed into the video segment.

The decompression process creates pixel data from a DV bit stream by performing reverse operations, namely Variable Length Decoding (VLD), Inverse Scaling (IS) and Inverse Discrete Cosine Transform (IDCT). Since code words are distributed in a segment in 3 passes, three corresponding passes of VLD operations can be used to recover all the information encoded using variable length code words.

The documentation of standards IEC 61834 and SHE 314M contains detailed descriptions about DV standards. Other video standards and image formats, such as MPEG and JPEG, also involves discrete cosine transformation, quantization, and variable length decoding. The general procedure to compress and decompress such video streams or images are the same.

Various implementations of DV decoders currently exist in the industry. Some dedicated chipsets are used in hardware implementations; and there are software applications for general purpose processors. The drawbacks of the hardware implementations using dedicated chipsets are the high cost, lack of scalability, and lack of compatibility with other components in video systems. The drawback of the software decoders on the general purpose CPUs is that the performance of a decoder highly depends on the computing environment, such as the run time usages of the CPU, memory, cache, and V/O devices. The instruction sets of general purpose processors are not well suited for processing encoded bit streams.

Variable Length Decoding (VLD), when implemented on a general purpose processor, is limited in performance by the operations for table look-up and conditional branch. The Huffman code used in a DV video stream can be up to 16 bits in length. One of the most efficient methods to perform VLD on a general purpose processor is to use a single look-up table. However, the single look-up table contains 64K entries, each entry consisting of a triplet of {run, level, code length}. Since each entry stored in system memory may require 16 bits, the single look-up table may require 128 Kbytes of system memory. The look-up table may be resident in the system memory. A single look-up table approach is highly inefficient from caching point of view. The cache miss penalty can dramatically reduce the performance. Multi-table approaches reduce the amount of memory required by the look-up table by looking-up sequentially in a number of smaller look-up tables, and thus suffers from increased execution time due to multiple sequential look-up operations and associated overheads.

The video editing applications require decoding several video streams simultaneously. Further, with High Definition TV (HDTV), the amount of processing power required for decompression can be very high. Thus, it is desirable to have efficient methods and apparatuses for variable length decoding bit streams.

SUMMARY OF THE INVENTION

Methods and apparatuses for decoding a compressed video stream are described here.

In one aspect of the invention, a method to decode a variable length encoded bit stream includes: concurrently processing first data obtained from variable length decoding a first code word in a register while variable length decoding a second code word in the register. In one example, processing the first data includes: looking up an inverse zigzag index; computing an Inverse Direct Cosine Transformation (IDCT) coefficient; storing the IDCT coefficient in a buffer in a transposed inverse zigzag order; and branching conditionally based on a condition encountered in variable length decoding the first code word.

In another aspect of the invention, a method to decode a variable length encoded bit stream on a processing engine having an instruction cache and local memory include: loading a first set of instructions into the instruction cache; loading first data into the local memory; generating second data from the first data by executing the first set of instructions; loading the second data from the local memory into first memory external to the processing engine; loading a second set of instructions into the instruction cache; loading the second data from the first memory into the local memory; and generating third data from the second data by executing the second set of instructions. In one example, the first set of instruction is for Macro Block Address Generation; and the second set of instruction is for Variable Length Decoding and Inverse Discrete Cosine Transformation. In another example, the first set of instruction is for Variable Length Decoding; and the second set of instruction is for Inverse Discrete Cosine Transformation.

In another aspect of the invention, a method to decode a variable length encoded bit stream on a processing engine having local memory includes: concurrently loading a first result generated from first data from the local memory into first memory external to the processing engine using a first at least one Direct Memory Access (DMA) channel, while generating a second result from second data in the local memory, and while loading third data into the local memory using a second at least one DMA channel. In one example, the first, second, and third data are Inverse Direct Cosine Transformation (IDCT) coefficients; and the first and second results are decompressed video streams. In another example, the first, second, and third data are compressed bit streams; and the first and second results are Inverse Direct Cosine Transformation (IDCT) coefficients.

The present invention includes apparatuses which perform these methods, including data processing systems which perform these methods and computer readable media which when executed on data processing systems cause the systems to perform these methods.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

FIG. 26 shows an example of latency of instructions used in the present invention.

FIG. 29 shows an example of the interrupt control registers of the invention.

FIG. 40 illustrates data representations for the execution of an instruction for performing table look-up of a vector of data elements according to one embodiment of the present invention.

FIG. 46 illustrates data representations for the execution of a method to load entries in look-up units using DMA controllers according to one embodiment of the present invention.

FIG. 62 shows look-up tables for variable length decoding code words encoded using DV standard according to one embodiment of the present invention.

FIG. 74 shows a data structure for storing either remaining bits or incomplete code bits.

FIG. 76 shows examples of indices that may be used in a plurality of look up tables to change the positions of the elements within columns.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention in detail.

Figure 1:
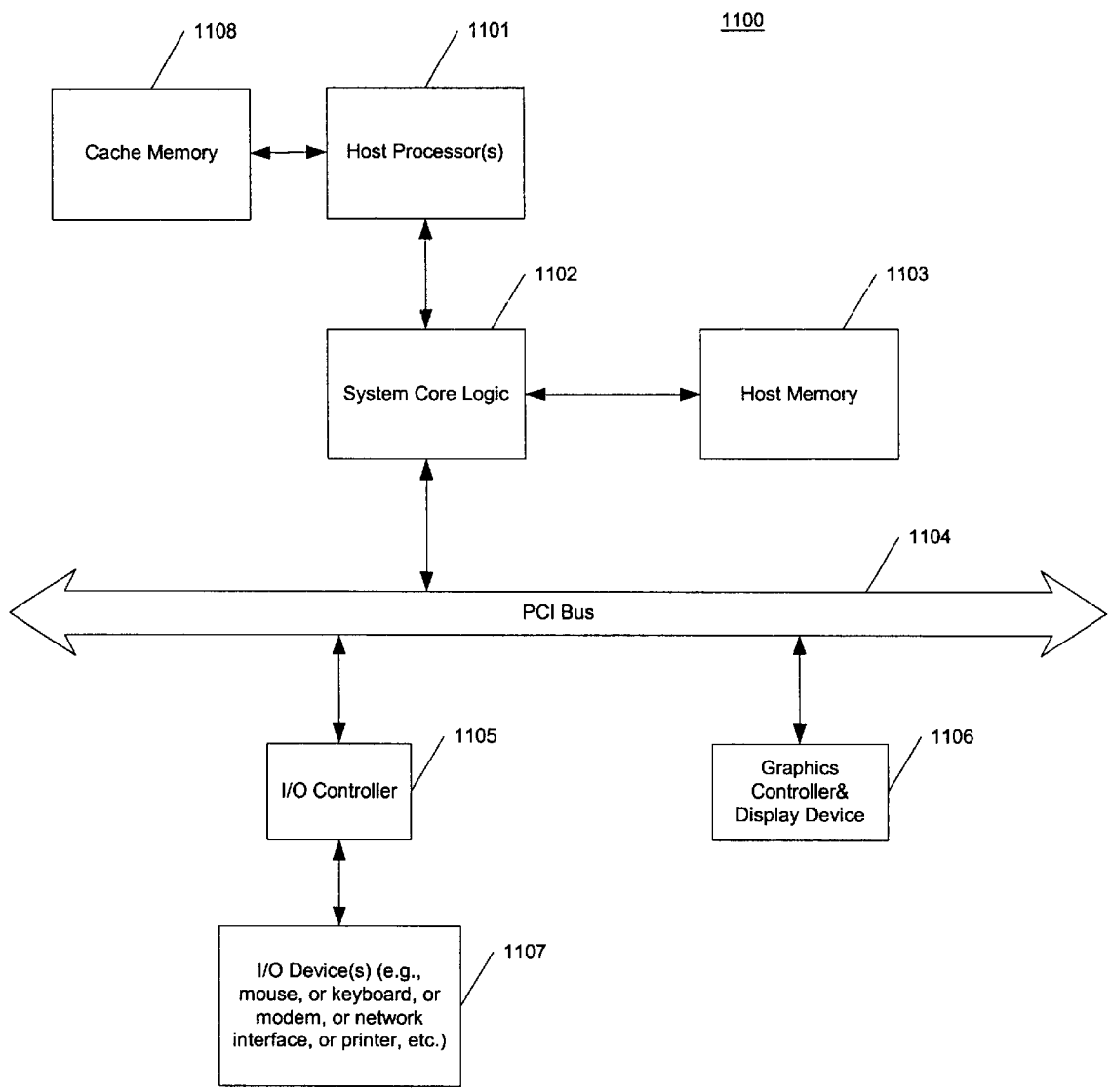
FIG. 1 shows a configuration of a computer system, which may be used by the present invention.

FIG. 1 shows an example of a typical computer system, which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be an Apple Macintosh computer.

As shown in FIG. 1, the computer system 1100, which is a form of a data processing system, includes a memory controller 1102 which is coupled to a host processor or processors 1101 and a host memory 1103 which may include a read only memory (ROM), volatile random access memory (RAM), and a non-volatile memory. The host processor 1101, is coupled to cache memory 1108 as shown in the example of FIG. 1. The core logic 1102 may also be coupled to the bus 1104. The bus 1104 interconnects the system to PCI peripheral components, such as a display controller and display device 1106 and to peripheral devices such as input/output (I/O) devices which may be mice, keyboards, modems, network interfaces, printers and other devices which are well known in the art. Typically, the input/output devices 1107 are coupled to the system through input/output controllers 1105. The bus 1104 may include one or more buses connected to each other through various bridges, controllers and/or adapters as is well known in the art. In one embodiment the I/O controller 1105 includes a USB (Universal Serial Bus) adapter for controlling USB peripherals.

FIG. 1 also shows a system core logic chip 1102 providing interfaces to the host processor 1101 and host memory 1103. The system core logic chip 1102 also acts as a bridge between the bus 1104 and the host processor 1101 and the host memory 1103. The system core logic 1102 is also known as a memory controller or a north bridge. A typical graphics controller 1106 receives graphics data from the host processor 1101 and the host memory 1103 through the system core logic 1102 and the bus 1104.

Figure 2:
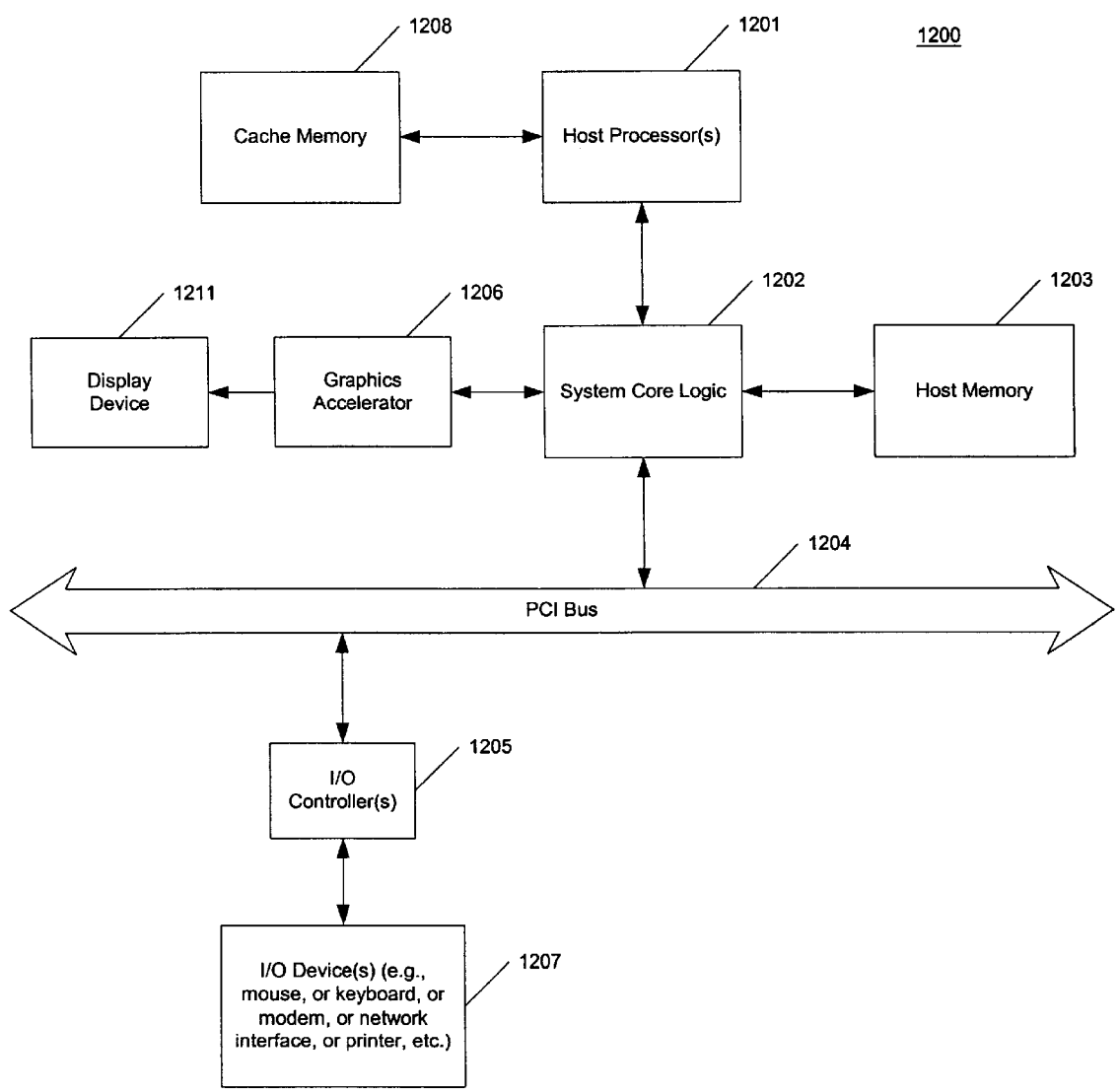
FIG. 2 shows another configuration of a computer system, which may be used by the present invention.
Figure 3:
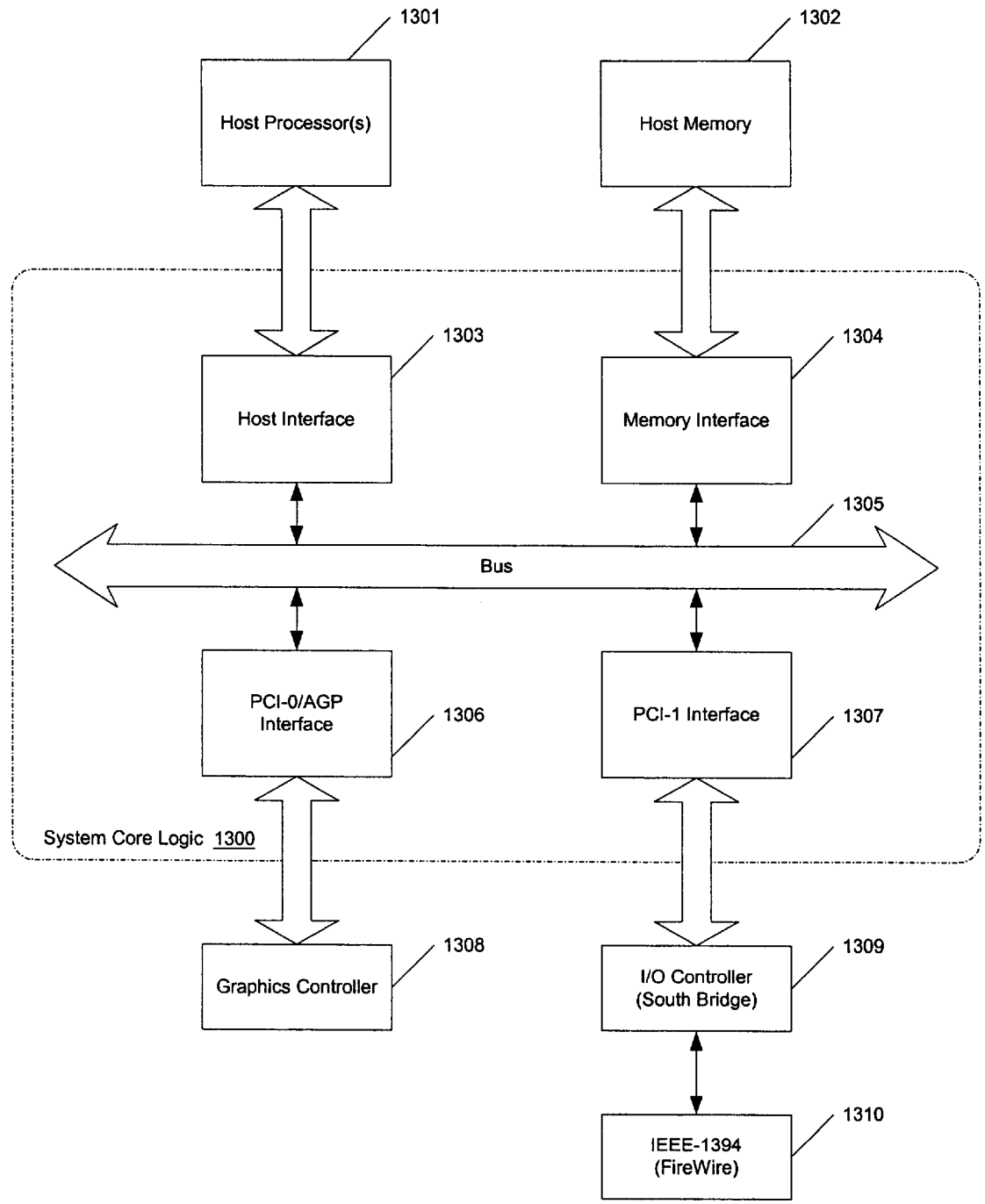
FIG. 3 shows a typical computer system.

FIG. 2 shows another example of a typical computer system, which may be used with the present invention. The system 1200 of FIG. 2 includes a host processor or processors 1201 coupled to a system core logic 1202, a host memory 1203 coupled to the system core logic 1202. The bus 1204 interconnects these various components together and also interconnects these components 1201 and 1203 to a display controller and to peripheral devices such as input/output (I/O) devices 1207 through an I/O controller 1205. The bus 1204 may be a peripheral component interconnect (PCI) bus. A graphics controller 1206 is coupled to the system core logic 1202 through an interface such as accelerated graphics port (AGP) interface integrated with the system core logic 1202. The graphics controller 1206 is typically coupled to a display device 1211, such as a monitor or TV station. The graphics controller 1206 may be connected to an input of a video editing system.

Figure 4A:
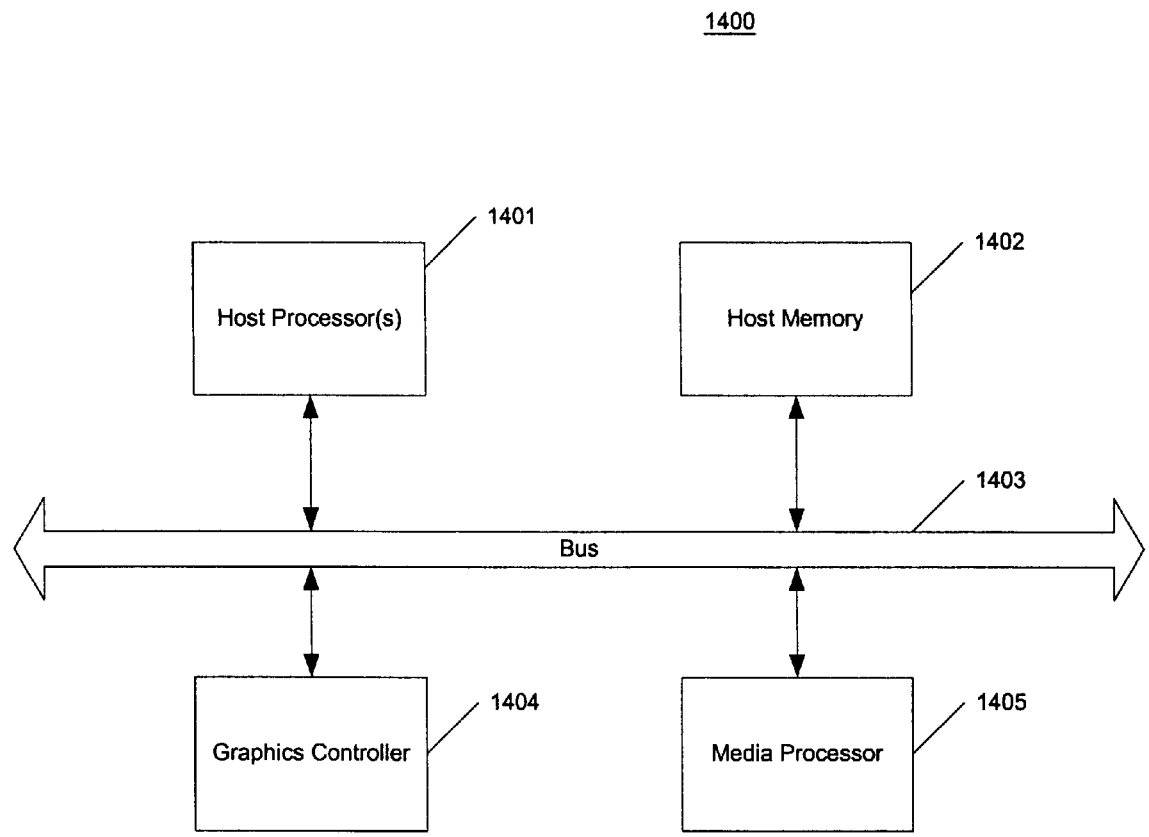
FIG. 4A shows a media processor used in a compute system.
Figure 4B:
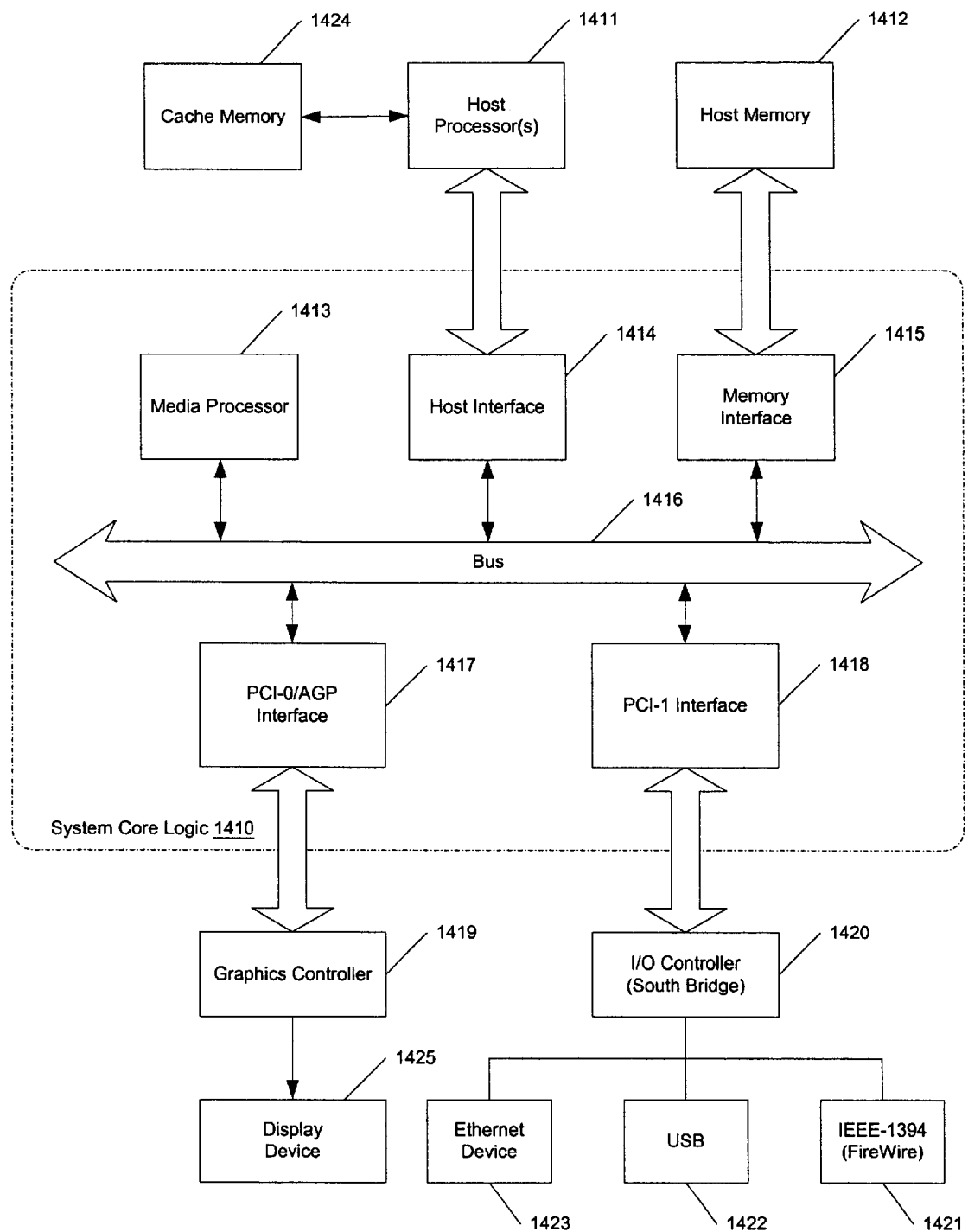
FIG. 4B shows an embodiment of the present invention.

The present invention in one embodiment integrates a media processor in a system core logic chip such as system core logic 1102 of FIG. 1 or 1202 of FIG. 2. The system core logic chip typically is memory controller and is referred to as a north bridge. FIG. 4B shows an example of one embodiment of the present invention. The system core logic 1410, which may be implemented as a single chip (integrated circuit) or multiple chips, includes a host interface 1414 coupled to the host processor 1411. The host interface 1414 provides accesses between the host processor 1411 and the logic 1410. The logic 1410 also includes a memory interface 1415 for controlling and accessing the host memory 1412 from the logic 1410. A media processor 1413 is integrated in the logic 1410. In one embodiment, this integration means that if logic 1410 is contained all on one chip (IC) then the media processor 1413 is on the same IC (e.g., same monolithic integrated circuit substrate). The logic 1410 also may include a PCI-0/AGP interface 1417. In one embodiment, the PCI-0/AGP interface may provide an interface to other external PCI devices. In another embodiment, the PCI-0/AGP interface 1417 may serve as an accelerated graphics port (AGP) coupled to an external graphics controller 1419. The graphics controller 1419 may be coupled to a display device 1425, such as a monitor or a TV station. The graphics controller 1419 may be coupled to an input of a video editing system. The logic 1410 may include a PCI-1 interface 1418. The PCI-1 interface may be coupled to another PCI device or it can be coupled to an input/output (I/O) controller 1420, also known as south bridge. Together, the north bridge and the south bridge may be referred to as a chipset. The I/O controller 1420 may provide as a bridge to other PCI buses which may connect more PCI devices, such as an Ethernet device, a modem, etc. In one embodiment, an IEEE-1394 bus 1421, also known as FireWire bus, may be coupled to the I/O controller 1420. In another embodiment, the FireWire bus 1421 may be directly coupled to the system core logic chip 1410 through PCI like interface. A bus 1416 interconnects all components together. In an alternative embodiment, the logic 1410 may include interfaces to many other components of the system, such as universal serial bus (USB), Ethernet device, etc. Other configurations may exist. One of the advantages of the present invention is that a media processor is built on a conventional system core logic chip which has more unused space. As a result, the cost of the system has been reduced, by combining a conventional system core logic with a media processor into a single-chip of a chipset.

As shown in FIG. 4B, in one embodiment, the media processor 1413 communicates with the host processor 1411 through the host interface 1414 and accesses the host memory 1412 through the memory interface 1415. The media processor 1413, in one embodiment, processes data autonomously and asynchronously to the host processor 1411. In another embodiment, the media processor 1413 communicates with the host processor 1411 through an interrupt mechanism. A software program executed by the host processor 1411 may control the interrupt mechanism. The media processor, in one embodiment, is capable of processing multiple media data streams simultaneously. Each media data stream may be a time related sequence of data representing related images (or audio data or both related image and audio data such as a motion picture). Thus, for example, a first image and a second image are related by a first time (e.g., the first image is shown 1 second, at normal playback speed, before the second image) and a third image and a fourth image are related by a second time (e.g., the third image is show, at normal play back speed, 2 seconds before the fourth image), and the third image is shown 1 second before the second image. It will be appreciated that these time durations (e.g., 1 second) are used for discussion purpose only that other times may be used. Often, information specifying such times is included in the media data stream which are processed by the media processor. Such media data streams may be referred to as time based media. Time based media include Quicktime movies and Quicktime streaming movies, and examples of time based media are provided in U.S. Pat. No. 6,134,243, which is hereby incorporated herein by reference.

Figure 5A:
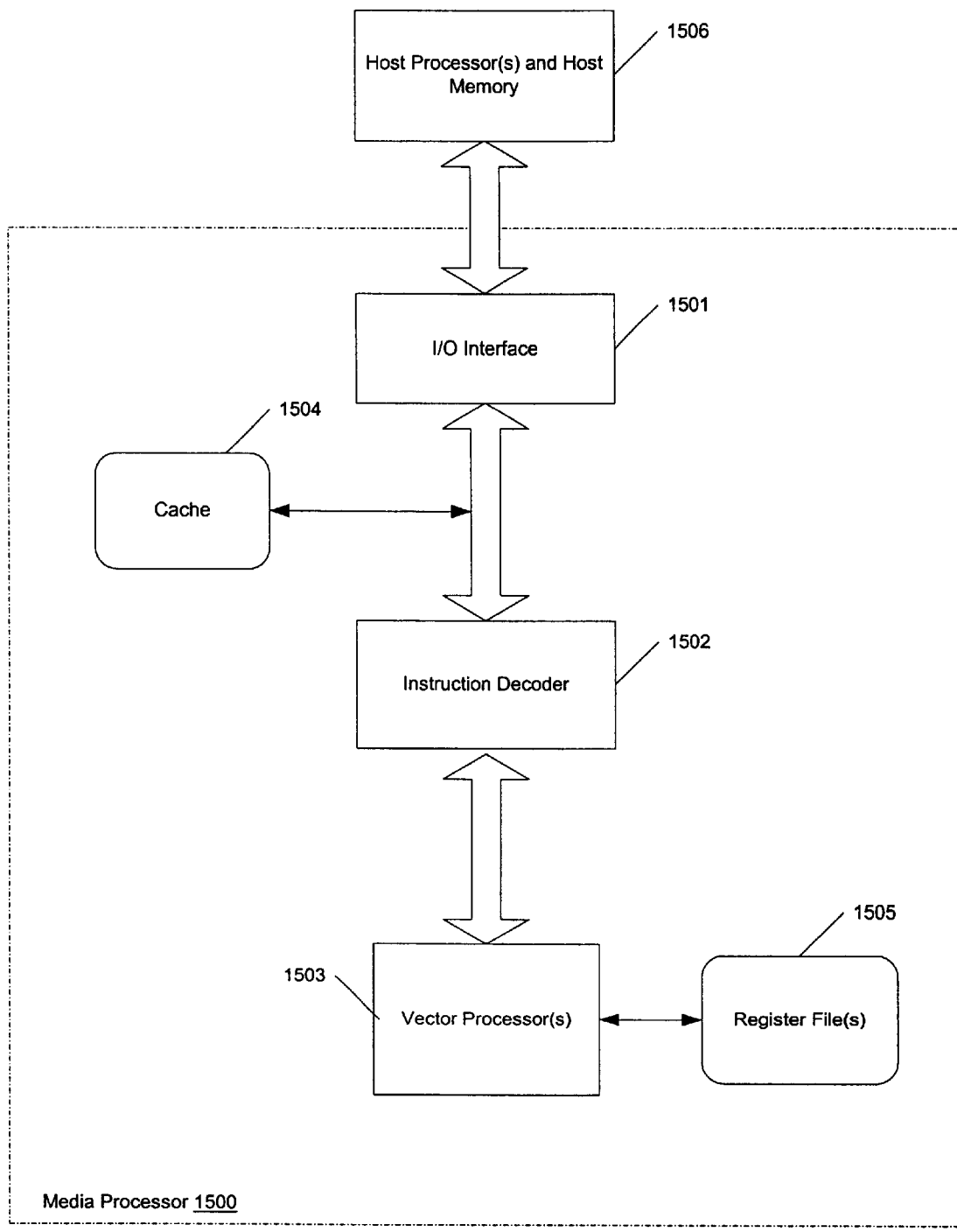
FIG. 5A shows a conventional media processor.
Figure 5B:
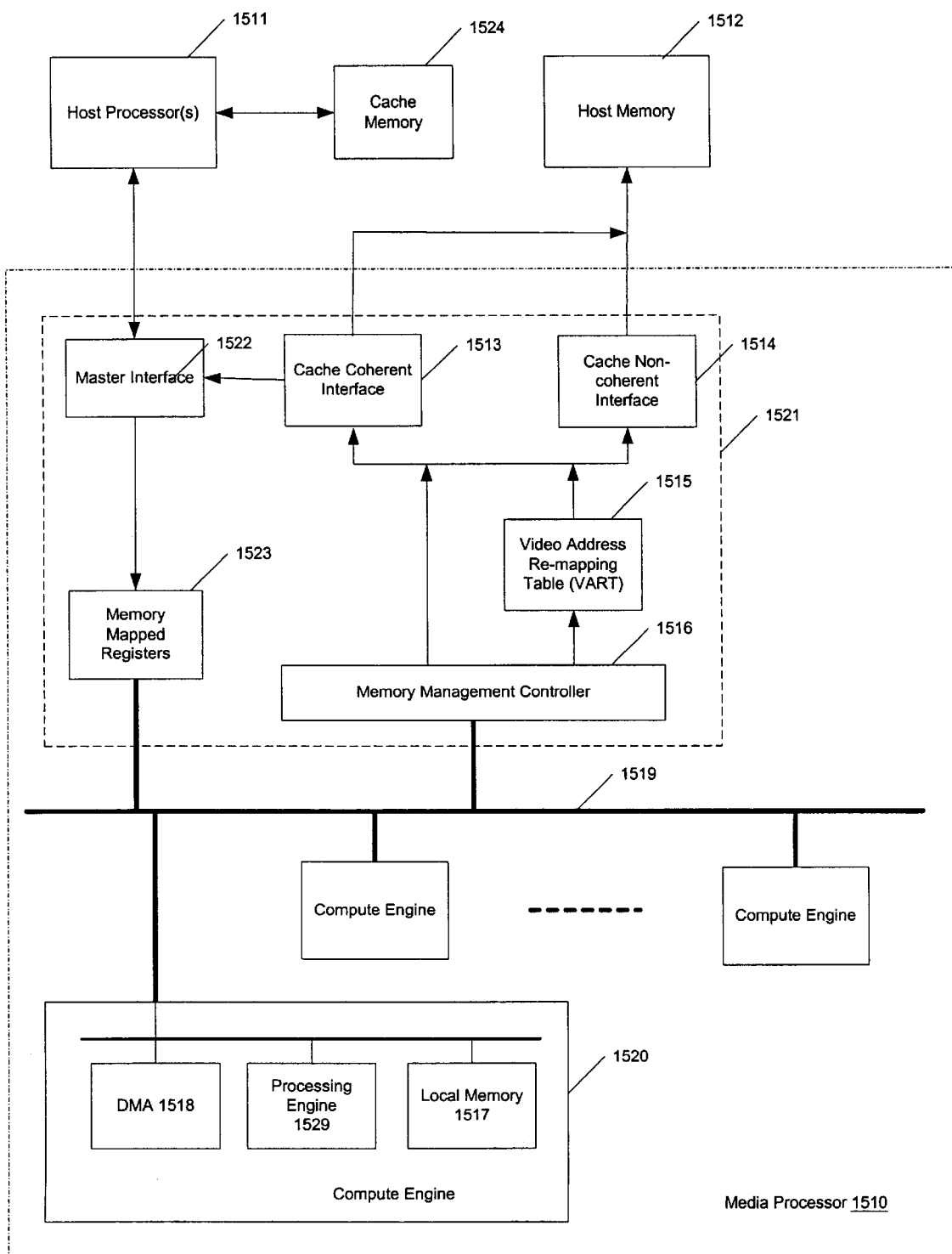
FIG. 5B shows another embodiment of the present invention.

FIG. 5B shows an example of one embodiment of a media processor of the present invention. The media processor 1510 can be used as the media processor 1413 of FIG. 4B. Referring to FIG. 5B, the media processor 1510 may contain multiple compute engines such as compute engine 1520. Multiple compute engines including compute engine 1520 are coupled to a chip interconnect 1519. The number of the compute engines is scalable and may be determined by the particular requirements for system performance versus chip size and cost. The media processor 1510 also includes a stream interface 1521 for gathering and distributing requests to and from the compute engine 1520 and the rest of the system.

The stream interface 1521 contains a memory mapping mechanism to convert linear logical addresses used by the compute engine 1520 to physical address for snooping and accessing memory. In one embodiment, the memory mapping mechanism contains a video address re-mapping table (VART) 1515, which is further described below, coupled to a memory management controller (MMC) 1516. The MMC 1516 receives a memory access request and determines whether such request needs to be mapped from a logical address to a physical address. If the memory request does not need to be mapped, the MMC 1516 will send the request to the coherent stream interface 1513 or the non-coherent stream interface 1514 directly. If the memory request needs to be mapped, the MMC 1516 will send the request to the VART 1515 for translation from logical addresses to physical addresses. The stream interface 1521 may also contain a compute engine to compute engine interface (not shown) providing accesses among the multiple compute engines.

One of the advantages of the media processor of one embodiment of the present invention is that both cache coherent and cache non-coherent interfaces are integrated in the single-chip north bridge which includes the media processor and the memory controller. This feature provides more flexibility over a conventional media processor. A conventional media processor normally uses mapped non-coherent memory access only. Cache non-coherent memory operations are those operations where data goes directly to and from memory and is returned directly back to the media processor and never goes through a processor cache. With cache non-coherent memory access, the data in the main memory may not be synchronized with those in the host processor's cache memory. A coherency between the host processor's cache memory and the main memory must be maintained (e.g., by software program), such that the data in the host processor's cache memory are synchronized with those in the main memory. On the other hand, a cache coherent memory system always goes through the host processor. The data of a cache coherent memory system may exist in the host processor's cache memory or in the host memory. Referring to FIG. 5B, when a coherent memory access request is issued, the host processor 1511 checks whether the host processor cache memory 1524 contains newer data than the host memory 1512. If the host processor cache 1524 has newer data, the host processor 1511 flushes its caches into the host memory 1512 before the data being read from the host memory 1512. With cache coherent memory system, the coherency between the host processor's cache memory 1524 and the host main memory 1512 is maintained by the host processor. However, cache coherent memory access is normally slower than cache non-coherent memory access. The present invention, in one embodiment, integrates both cache coherent and cache non-coherent interface for both memory accesses into the north bridge chip of the north/south bridge chipset, which provides great flexibility over a conventional design.

Figure 6:
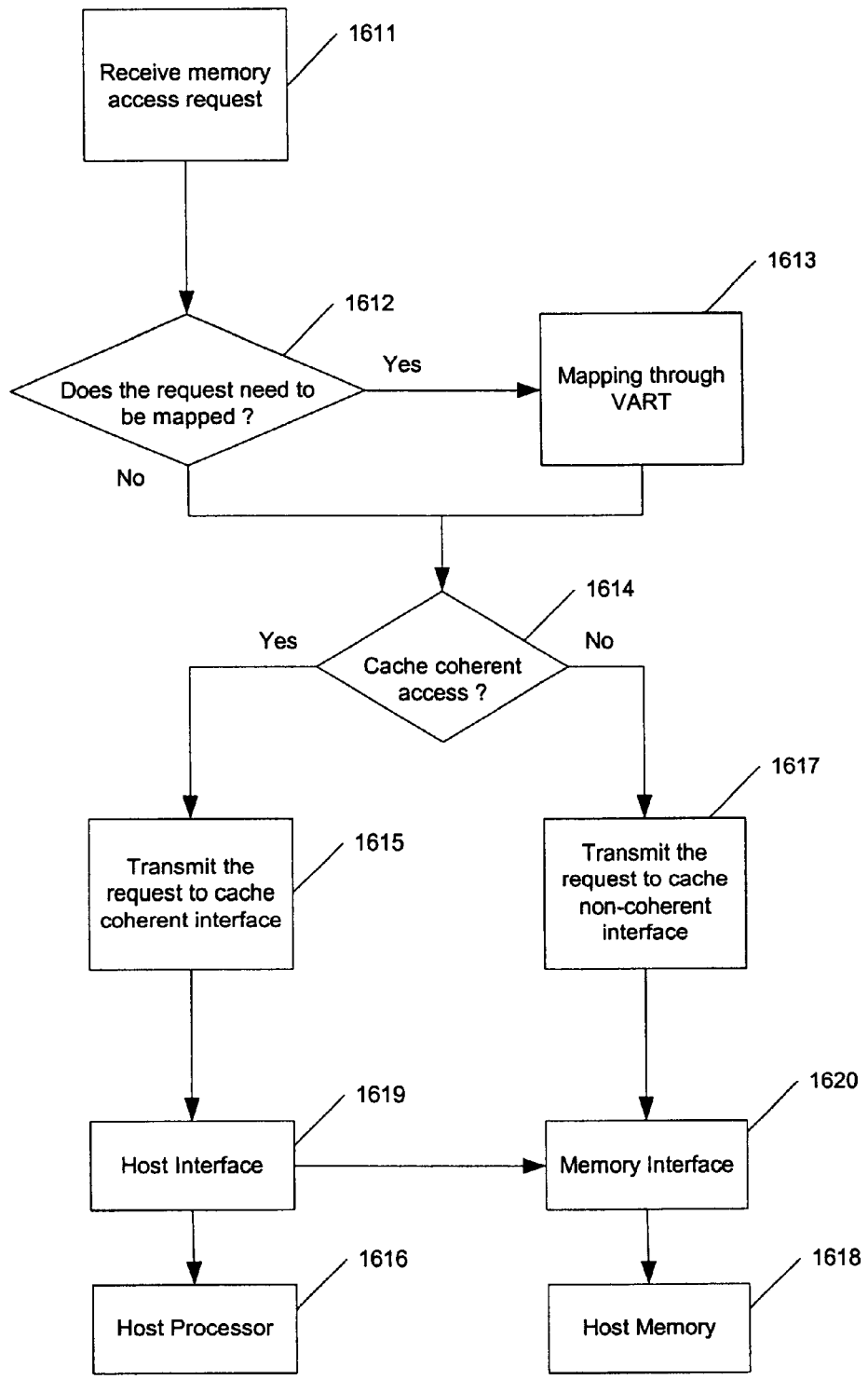
FIG. 6 shows another method for memory access used in one embodiment of the present invention.

FIG. 6 shows a method used in an alternative embodiment of the present invention, such as the one shown in FIG. 4B. Referring to FIG. 6, the cache coherent interface receives a cache coherent access request in operation 1615, the cache coherent interface transmits the request to the host interface 1619. The host interface 1619 sends a cache coherency message to the host processor 1616. During the memory read access, the host processor 1616 checks whether its cache contains newer data than the host memory 1618. If the host processor's cache contains newer data than the host memory, the host processor flushes its cache to the host memory 1618. Then the cache coherent interface 1615 reads the data from the host processor's cache. During the memory write access, the cache coherent interface 1615 writes the data to the host memory 1618, thereafter, upon receiving the cache coherency message, the host processor 1616 refreshes its cache from the host memory 1618 to synchronize the data between its cache and the host memory. Upon receiving the cache coherency message, the host interface 1619 also snoops the request for cache coherency violations. If the violations occur, an error message will be generated through an interrupt mechanism.

Figure 7:
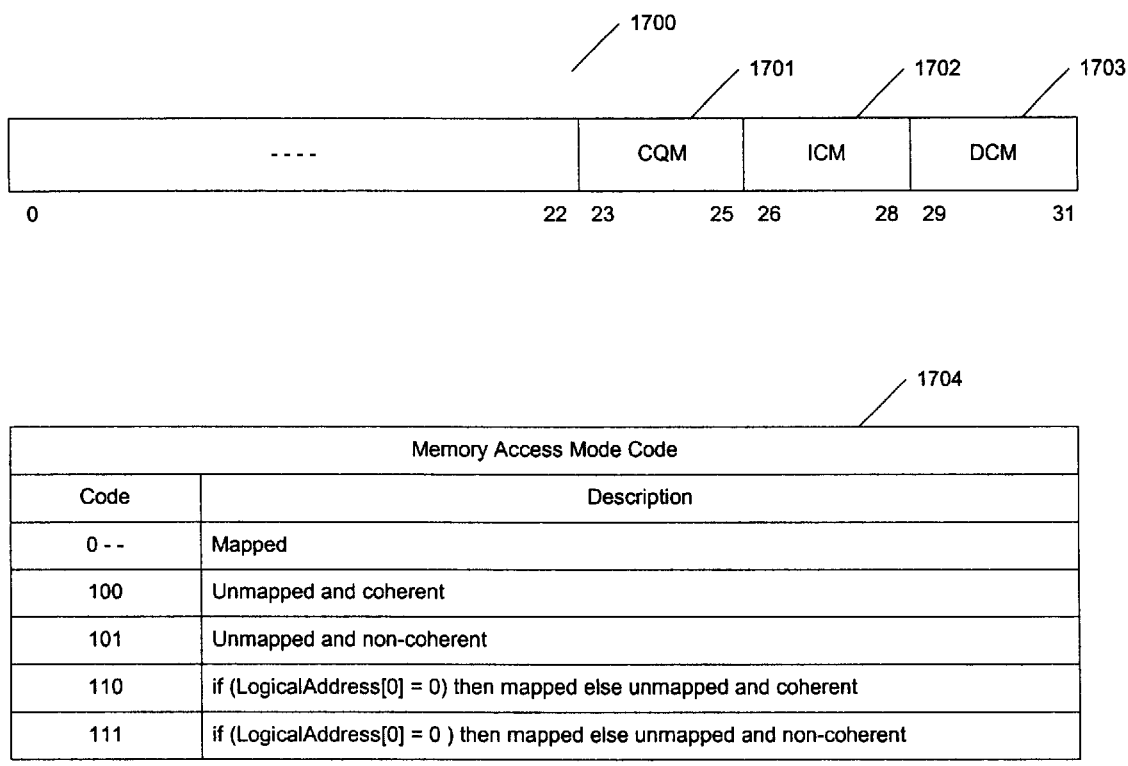
FIG. 7 shows one embodiment of memory controller used in an embodiment of the present invention.

The memory requests of FIG. 6 come from three sources: command queue fetch mode (CQM), instruction cache fill mode (ICM), and direct memory access (DMA) mode (DCM). The MMC 1516 of FIG. 5B may comprise a memory management control register (MMCR). In another embodiment, each compute engine such as compute engine 1520 of FIG. 5B comprises its own MMCR. The MMCR determines the type of the request sent to memory. FIG. 7 shows the layout of one embodiment of a MMCR. The MMCR 1700 contains 32 bits. The MMCR 1700 comprises three separate codes for each of the three sources of the memory requests. The CQM code 1701 occupies bit 23 to bit 25, the ICM code 1702 occupies bit 26 to bit 28, and DCM code 1703 occupies bit 29 to bit 31. These codes specify whether the request is mapped/unmapped and coherent/non-coherent, as described in table 1704. In an alternative embodiment, bit 0 of the logical address may specify whether the request is mapped/unmapped and coherent/non-coherent. For mapped addresses the fields in the VART table entry may determine if the access is coherent or non-coherent. The host processor such as host processor 1511 of FIG. 5B updates the MMCR through a memory mapped address such as memory mapped registers 1523, through the master interface 1522 of FIG. 5B. The fields of the MMCR are initially undefined; they must be loaded before a memory access can occur.

The memory mapping mechanism of FIG. 5B also determines attributes to control cache coherency. As shown in FIG. 5B, the stream interface 1521 also contains a coherent stream (CS) interface 1513 and a non-coherent stream (NCS) interface 1514. For the CS interface, requests are sent to the host processor 1511 to be snooped by the host processor's caches. CS requests are used for memory data that may reside in the host processor's caches or the data that may reside in the targeted memory mapped addresses. NCS requests are sent directly to the host memory 1512 and are used for data requests that require high bandwidth. Such coherency is maintained through software. Thus, the software is responsible for synchronizing the host caches and the host memory. The stream interface 1521 may also include a master interface 1522. The master interface 1522 provides the host processor 1511 with the ability to control the operation of the compute engine 1520. In one embodiment, the host processor 1511 controls the operation of the compute engine 1520 through a set of memory mapped registers 1523. Among other things, these memory mapped registers 1523 define a command queue, which is described further below, from which commands or routines are sent to the compute engine 1520, MMCR as described above and various interrupt control mechanisms.

Figure 8:
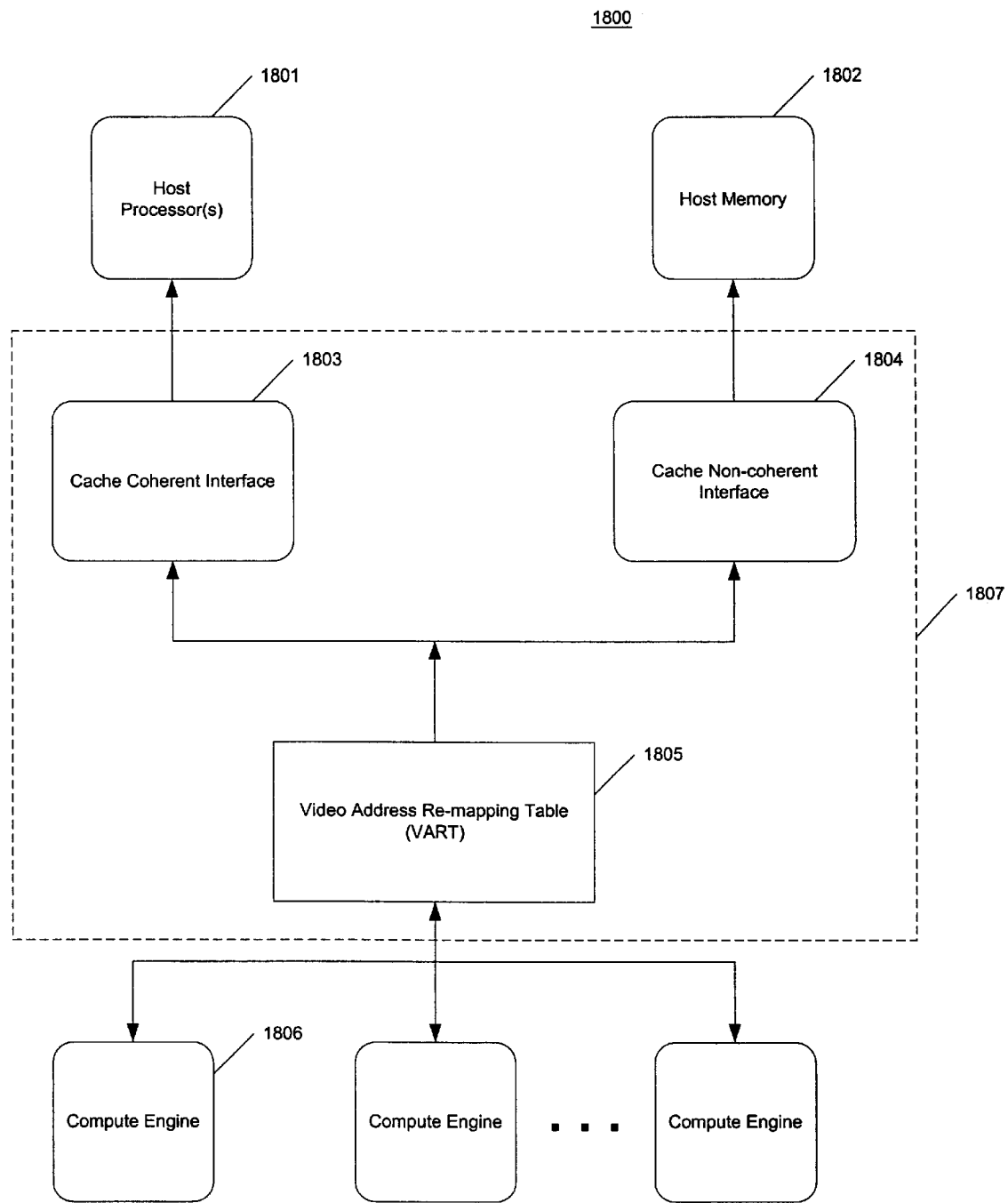
FIG. 8 shows an embodiment of memory interfaces used in the present invention.

Memory access requests from compute engines are labeled as being mapped or unmapped. Unmapped requests are also labeled as being coherent or non-coherent. Mapped requests undergo a mapping from their linear logical address provided by the compute engine, such as compute engine 1806 of FIG. 8. The mapping also determines if the request is coherent or non-coherent, which is described further below. Referring to FIG. 8, a mapped request from the compute engine 1806 is sent to a video address re-mapping table (VART) 1805 for translation from a linear logical address to a physical address. The VART 1805 then determines whether the request is coherent, if so, the VART 1805 sends the request to the coherent interface 1803 and then out to the host processor 1801. If the request is non-coherent, the VART 1805 sends the request to non-coherent interface 1804 and then out to the host memory 1802. Coherent and non-coherent interfaces and the VART are part of the stream interface 1807.

In a modern computer system, two address spaces are present. The logical address space and the physical address space. The logical address space is the address space accessed by the software running on the host and there is a logical address space accessed by the software running at the video stream processor (VSP) such as the media processor 1510. The physical address space is a set of address ranges occupied by the system hardware devices and system memory. The address re-mapping tables provide the mapping between the logical addresses used by the software in order to access physical devices at their physical addresses. VART is the table that maps logical addresses used by the VSP engine to the physical addresses of the main memory and other system devices.

In one embodiment of the invention, the tables are located in the main memory and addressed by their physical address without any address translation. Different devices may access the same physical location using different logical address, provided that these logical addresses are mapped to the same physical space by a re-mapping table. It may be possible for VSP engine to directly access other physical devices, such as AGP or PCI devices, when the proper mapping is provided by the VART. The memory management software which is part of the operating system (OS) kernel software is responsible for allocating physical memory, assigning to some logical addresses and storing the mapping information in the address re-mapping tables. For the VSP devices, the physical memory regions must be allocated and mapped to logical addresses prior to any VSP command execution that will access that memory regions. The system software sets up the VART entries accordingly. The memory mapping should stay valid until the command execution is completed. When the shared memory ranges are no longer needed by the VSP, the host or other devices, the physical memory may be freed and the corresponding VART entries are invalidated. Pages are the usual mechanism used for addressing information in a memory system. An example of logical to physical address mapping from a VSP is described further below.

The video address mapping table (VART) is made up of table entries. Each table entry corresponds to a logical page in the address space assigned to the media processor. The table entry contains information about the corresponding physical memory page number as well as if the memory access is cache coherent. The system software is responsible for maintaining VART, whether a page is allocated for use by the media processor, the system software creates a corresponding entry in the VART, and marks it as valid. When the page is freed, the VART entry is marked invalid.

Figure 11:
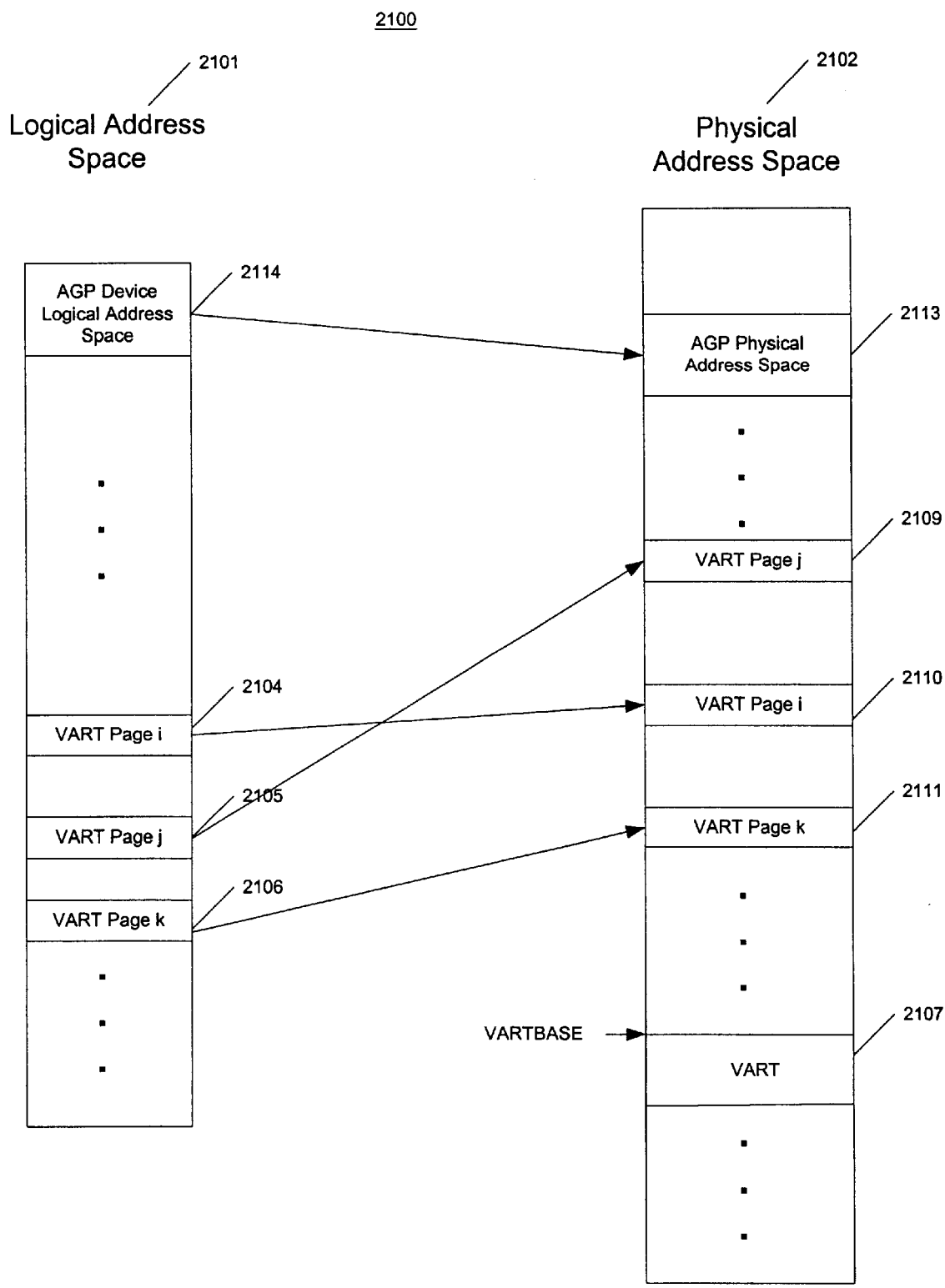
FIG. 11 shows a configuration of a memory mapping used in one embodiment of the present invention.

Physical addresses are allocated in pages (e.g., each page has 4096 bytes). Pages are the usual mechanism used for addressing information in a logical memory system. Pages are numbered and both physical and logical addresses often include a page number and an offset into the page. As an example, referring to FIG. 11, the VART 2107 contains entries that include the addresses of pages i, j, and k. Each VART page in the logical address space has a corresponding page in physical memory space. For example, VART page 2104 has a corresponding physical page 2110. In this example, the VART 2107 contains valid entries for mapping pages i 2104, page j 2105, and page k 2106 in the logical address space into corresponding physical page i 2110, page j 2109, and page k 2111 respectively. When a request for mapping is received, the logical page frame number (LPN) will be extracted from a logical address of address space 2101. The VART entry corresponding to the LPN will be extracted. If a valid entry is found, the PPN will be extracted and the physical address will be determined and the logical address is mapped to a physical address.

One of the advantages of the VART 2107 in the present invention is that the video device address space can be overlapped the logical address space 2101. Such video device address space can be shared by other devices, or the host processor such as host processor 1511 of FIG. 5B. On the other hand, a conventional graphics controller coupled to an accelerated graphics port (AGP) has its own dedicated address space. In general, such address space is allocated by the software during the boot time of the system. Such address space cannot be used by any other components of the system. System software indicates the access to the corresponding physical memory by different devices. If the video stream processor (VSP) address space overlaps the system address space, only one address may need to be allocated. On the other hand, if the address spaces are disjoint, the system software may use two logical addresses to access some logical page of physical memory. As a result, such address space cannot be used by others, even though the AGP graphics device is not using them. This limitation posts an inconvenience to the memory management, as well as the cost of the memory bandwidth of the host system.

A conventional graphics address re-mapping table (GART), such as GART 2108 can only map a dedicated graphics accelerator address space such as AGP device address space 2114. Unlike GART, the VART of the present invention can map a logical address space located almost anywhere in the logical address space 2101. In an alternative embodiment of a system of the invention, the system includes a VART in addition to a GART and host maintained tables. In fact, in one embodiment, the video device address space 2103 can be the same range as the AGP device address space 2114. This advantage provides more flexibilities and bandwidth to the system.

When a media processor of the present invention processes multiple media data, the application software or the system software is responsible to allocate enough memory resources for the processing. In one embodiment, a large block of memory may be pre-allocated before any data processing occurs. In another embodiment, the memory allocation may be performed dynamically as needed. When a page is allocated for use by VSP, the system software updates the VART entry corresponding to the LPN of its logical address with the PPN of the newly allocated physical memory page. After processing the media data, if the physical memory page is no longer needed, the physical memory page is released back to the main memory and the corresponding entry of the VART is marked invalid.

Figure 9:
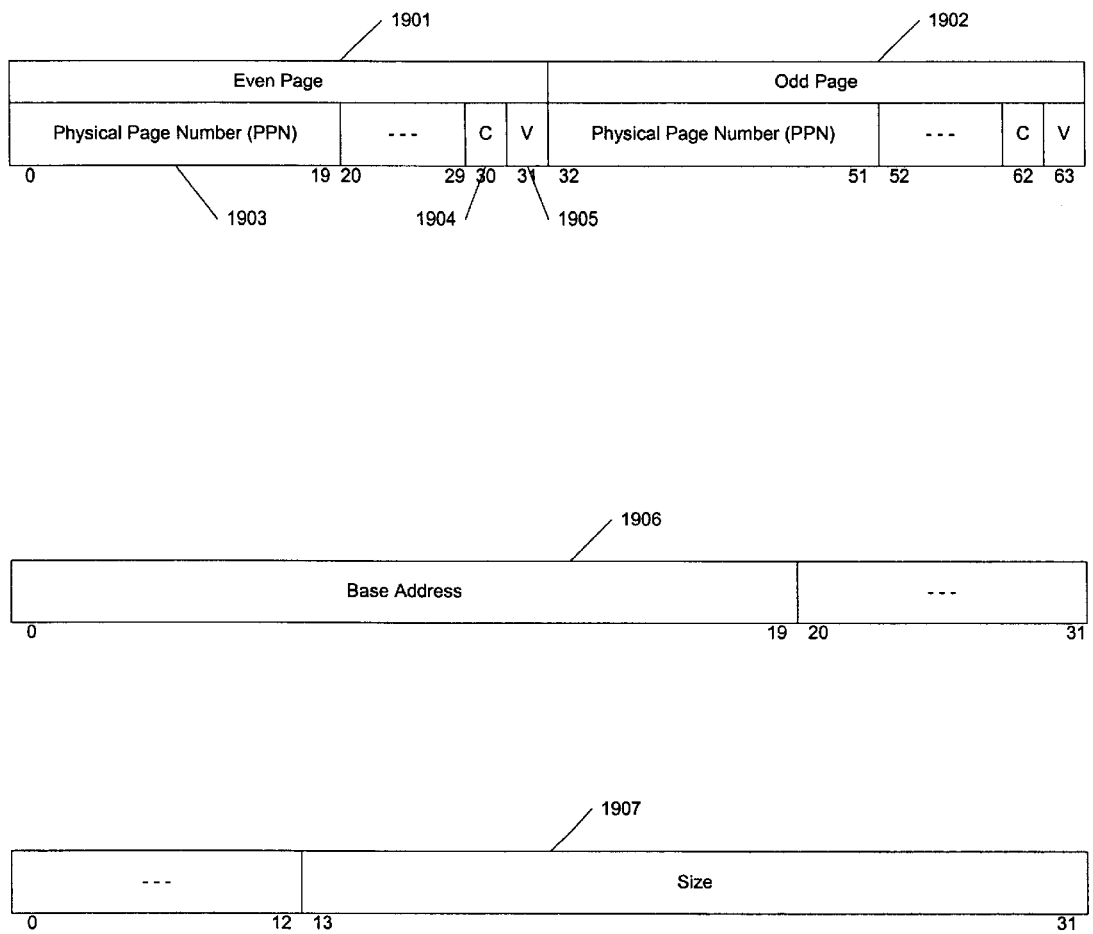
FIG. 9 shows an example of an entry in one embodiment of the memory address re-mapping table of the present invention.

The VART normally comprises a VART base register (VARTBASE) and a VART size register (VARTSIZE). FIG. 9 shows an embodiment of a VART entry, as well as VARTBASE and VARTSIZE. Referring to FIG. 9, VARTBASE 1906 defines the location of the VART and the VARTSIZE 1907 defines how big the VART is in 64-bit words. Both VARTBASE and VARTSIZE comprise 19-bit data. In one embodiment, VARTBASE occupies from bit0 to bit19 and VARTSIZE occupies from bit13 to bit 31. Each VART entry maps two 4K-Byte pages, including an even page 1901 and an odd page 1902. Each entry of even or odd page contains a physical page frame number (PPN), which occupies from bit0 to bit19. The entry also contains a coherent bit (C-bit), which indicates whether the mapping is coherent access. A logical value of one indicates the mapping is coherent. The entry further contains a valid bit (V-bit) indicating whether the entry is valid. A logical value of one indicates the entry is valid. The V-bit is initially set to invalid (e.g., logical value of zero), until a physical memory page is allocated and the VART is updated. These bits may be set by a software program that allocates the pages.

A logical address (LA) that needs to be mapped contains a logical page frame number (LPN) and an offset. A typical LPN has 19 bits, from bit0 to bit18. Bit 20 to bit 31 are the offset of the logical address. Before a mapping takes place, the LPN will be compared with the VARTSIZE register to determine if the request is out of boundary of the VART. If the request does not fit in the VART, a VART out-of-bound exception is set and an interrupt is issued. The out-of-bound exception is described as follow:

$$OutOfBoundException=(Size<=LA\ [0:18])$$

where the Size value is extracted from the VARTSIZE register, VARTSIZE[13:31]. The LPN is extracted from the logical address. If the request bits in the VART, LA[0:9] are added to the VARTBASE and the value at these locations concatenated to LA[10:18] to form the physical address location of the logical address. The VART PTE address is described as follow:

$$VART\ PTE\ Address=((LPN[0:9]+VARTBASE)\|LPN[10:18])<<3$$

The VART PIE is fetched and the even or odd page entry is selected based on LPN[19]. The valid bit is checked and if it is found to be not valid, a VART entry exception is set. The exception is issued through an interrupt mechanism. If the entry is found to be valid, the physical page frame number (PPN) is concatenated to the offset of the logical address [20:31] bits to form the physical address. A request is sent to the coherent interface if the C-Bit of the entry is set to logical value of one, otherwise the request is sent to the non-coherent interface.

Figure 12:
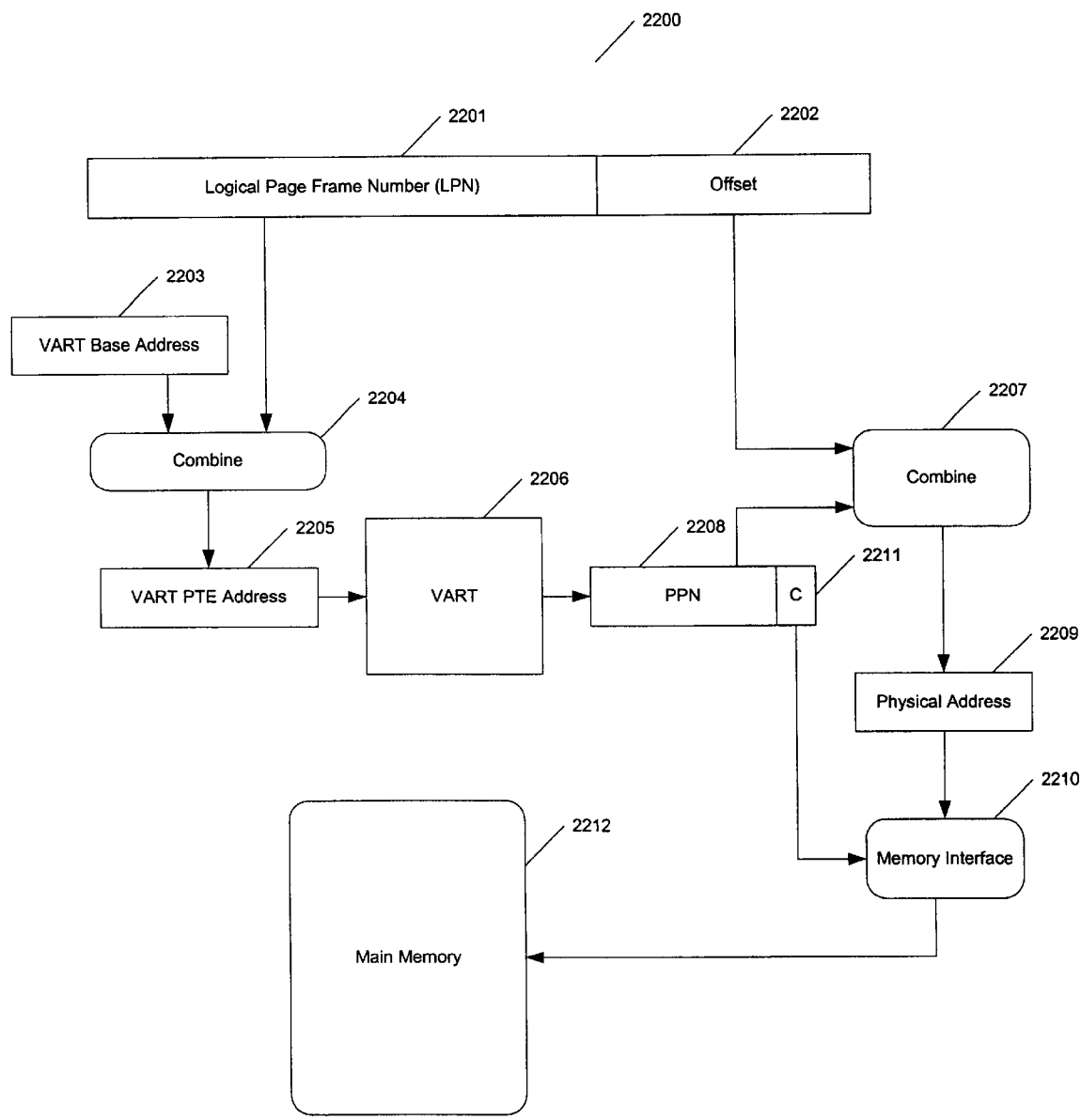
FIG. 12 shows an embodiment of a method accessing the memory address re-mapping table.
Figure 13:
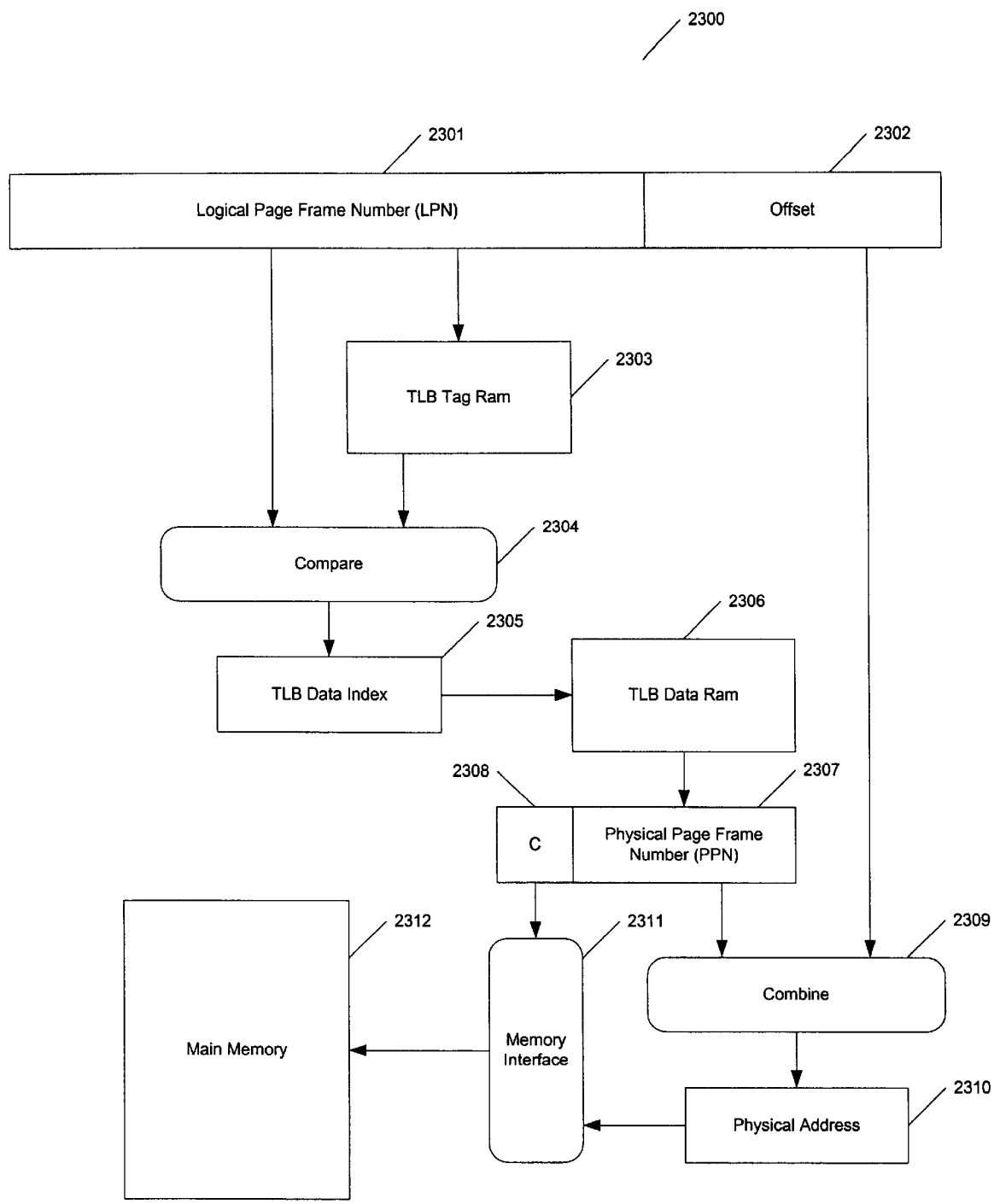
FIG. 13 shows another embodiment of a method accessing the memory address re-mapping table.

FIG. 12 shows a method used in one embodiment of the present invention to map a logical address to a physical address. Referring to FIG. 12, a logical address 2200 contains a logical page frame number (LPN) 2201 and an offset 2202. The LPN 2201 is retrieved from the logical address 2200 and is combined 2204 with the VARTBASE 2203 to form a VART PTE address 2205. Based on the PTE address 2205, an entry is fetched from the corresponding entry address 2205 of the VART. A physical page frame number (PPN) 2208 is retrieved from the entry. Then the PPN 2208 will be combined 2207 with the original offset 2202 of the logical address 2200 to form a physical address 2209. The request will be checked whether the request is intended for coherent access or for non-coherent access, based on the C-Bit 2211 of the PTE entry of the VART 2206. The request will be sent to a proper memory interface 2210, coherent or non-coherent interface. Finally, the request will be sent through either coherent or non-coherent interface to the main memory 2212.

Figure 15:
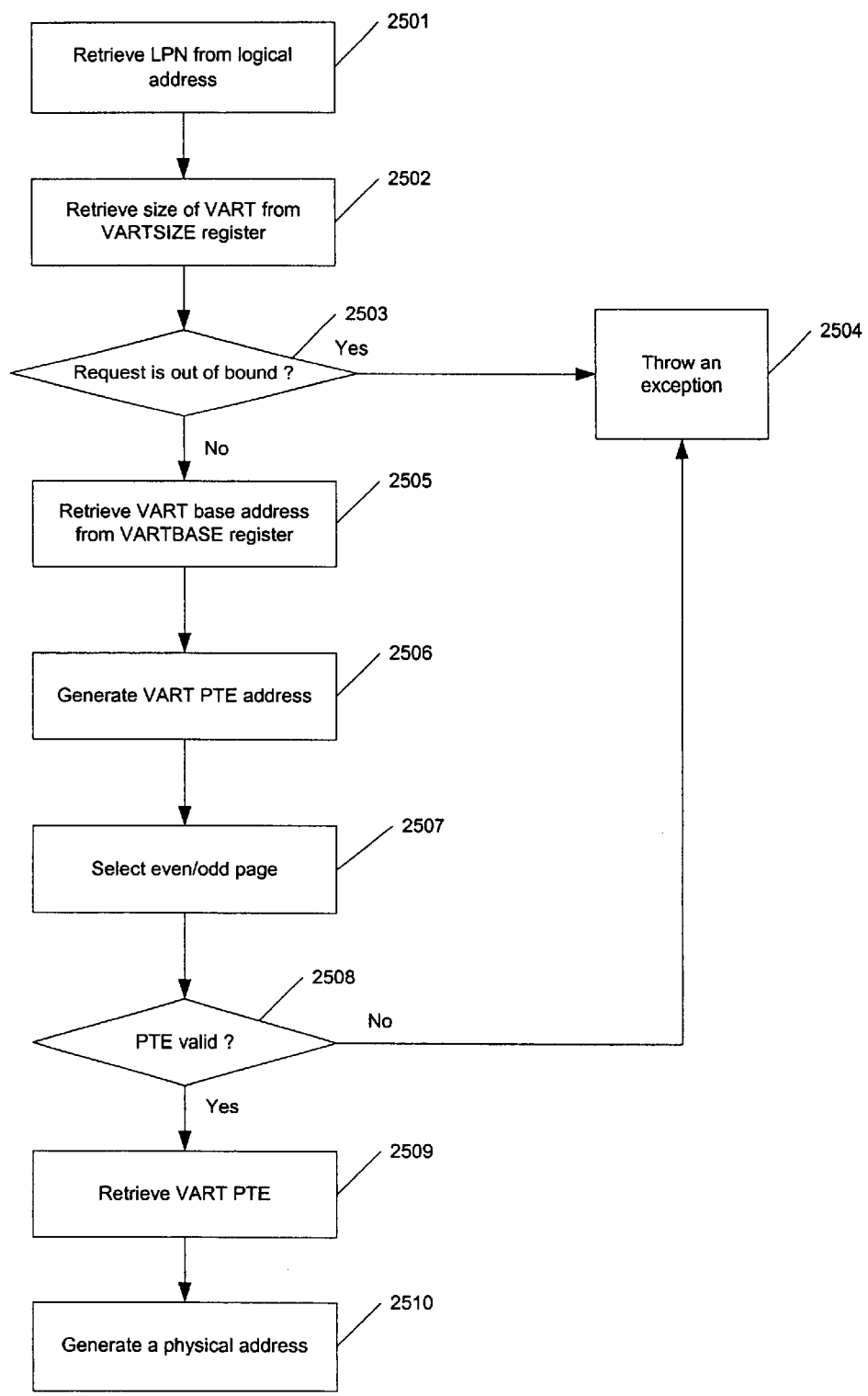
FIG. 15 shows yet another aspect of an embodiment of a method accessing the memory address re-mapping table.
Figure 16:
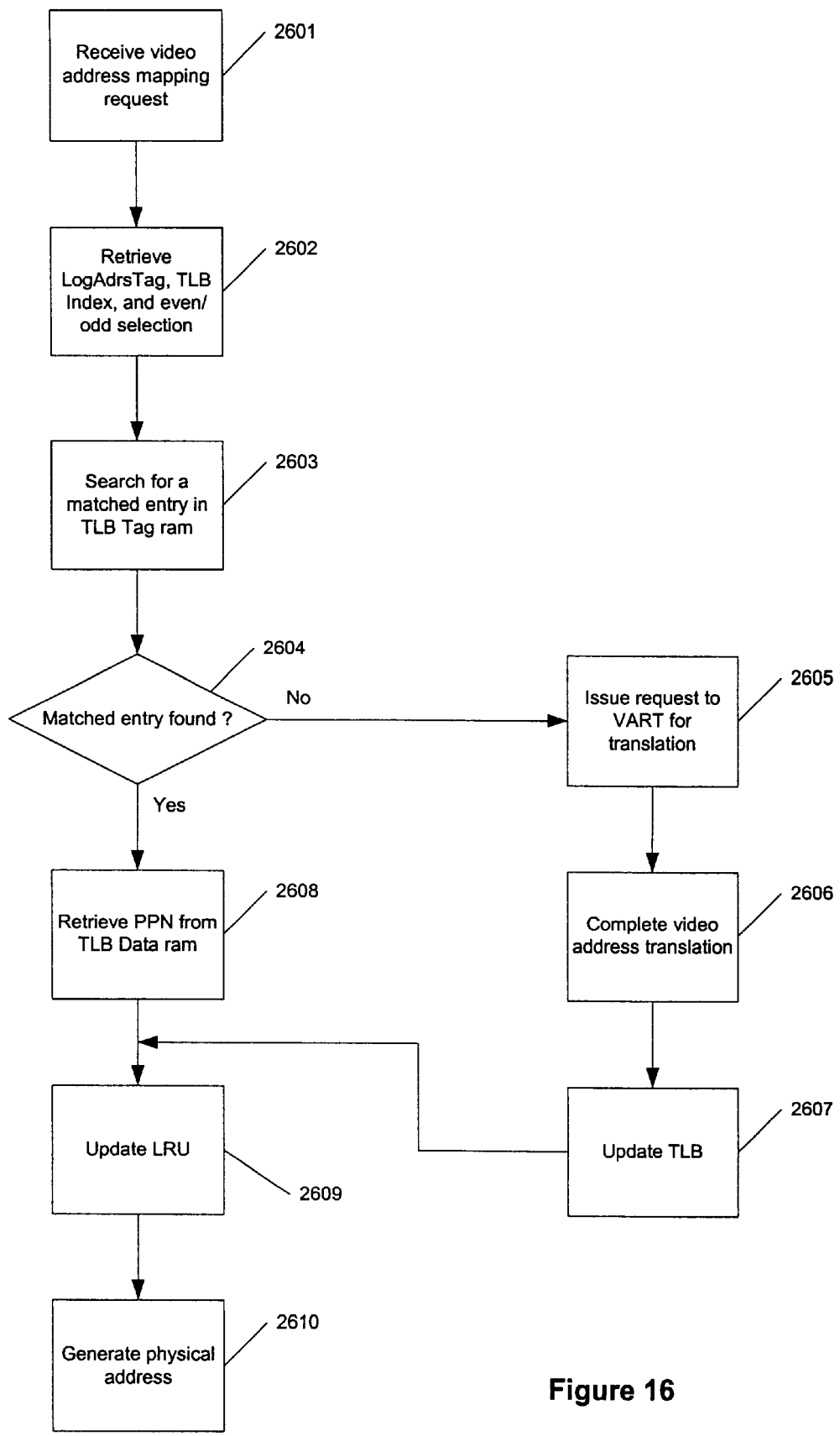
FIG. 16 shows yet another aspect of an embodiment of a method accessing the memory address re-mapping table.

FIG. 15 shows a method of mapping a logical address to a physical address through the VART. Referring to FIG. 15, the method starts with retrieving 2501 the LPN from the logical address and retrieving 2502 the size of the VART from VARTSIZE register. The LPN is compared with the size of the VART in operation 2503. If the LPN value is greater than the size of the VART, an exception will be thrown 2504 through an interrupt mechanism. If the LPN can fit in the VART, the base address of the VART will extracted 2505 from the VARTBASE register. The base address of the VART and the LPN will be combined to generate 2506 a VART PTE address. The entry of the VART corresponding to the PTE address is fetched. The entry of VART contains an even page and an odd page. The even or odd page is selected 2507 based on the page selection bit (e.g., bit 19 of the logical address) of the logical address. The page entry is checked 2508 whether such entry is valid by checking the valid bit V-Bit of the page entry of the VART. If the page entry is not valid, an exception will be issued 2504. If the page entry is valid, the physical page frame number (PPN) will be retrieved 2509 from the PTE. A physical address is then generated 1520 by combining the PPN of the PTE of VART with the offset of the logical address.

Any memory access from a compute engine (e.g., compute engine 1520 of the media processor 1510 in FIG. 5B) that results in an exception is aborted and a memory access exception is sent to the requesting compute engine. Recently used accesses to the VART are cached in the VART table look-aside buffer (TLB). The VART TLB is a cache memory of recently used VART table entries. It comprises a 128-entry TLBTag ram in a 4-way set-associative arrangement (32 sets of 4 ways per set), and a corresponding 256-entry TLBData ram. Each TLB entry is capable of mapping 2 logical addresses using 2 entries of the TLBData ram. This gives the TLB the capability of mapping a total of 256 pages, while saving some memory bandwidth for the TLB.

Figure 10A:
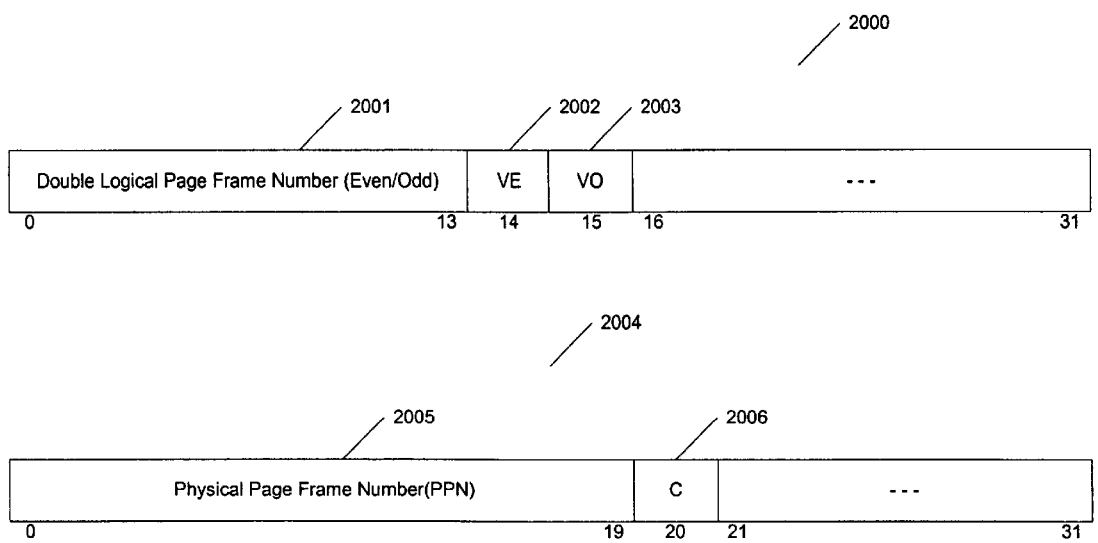
FIG. 10A shows another example of an entry in one embodiment of the memory address re-mapping table of the present invention.

FIG. 10A shows an example of a layout of the VART TLB including TLBTag and TLBData entries, used in one embodiment of the present invention. Each entry of the TLBTag ram, such as TLB Tag entry 2000, comprises a logical page frame number (LPN) tag bits [0:13] 2001 and two valid bits: even page valid bit VE bit 2002 and odd page valid bit VO bit 2003, corresponding to the even and odd page frames of the VART entry. Each entry of the TLBData ram, such as TLB Data entry 2004, comprises a physical page frame number (PPN) [0:19] 2005 and a C-Bit 2006 for coherency. The VART TLB is accessible through memory-mapped addresses.

The translation process using the TLB consists of splitting the logical address into three fields: bits [0:13] are the logical address tag (LogAdrsTag), bits [14:18] are the TLB index bits (TLBIndex [0:4]), and bit [19] is the even/odd page selection bit. The TLBIndex accesses the four sets of TLBTag entries. The TLBTags from the 4 ways are compared to the LogAdrsTag fields. On entries that match, the even or odd valid bit is selected based upon the even/odd page selection bit (e.g., bit 19) of the logical address. If the entry is valid, then the way number is encoded and used along with the TLBIndex and the even/odd selection bit to access the 256-entry TLBData ram. The odd or even PPN and C-Bit is selected from the TLBData ram and used to complete the mapping. The page frame number is concatenated to the offset of the logical address (bits [20:31]) to complete the physical address. A request is sent to the coherent interface if the C-Bit of the entry has a logical value of one, otherwise the request is sent to the non-coherent interface. If there is no matched entry found in the VART TLB, the VART table entry will be used to complete the mapping and the TLB entry will be updated.

The VART TLB also includes a least recently used (LRU) replacement mechanism to determine which entry is updated. An entry is considered "used" when a valid mapped request hits in the entry. The initial state (after the TLB is invalidated) of a set of four entries is the order (0,1,2,3) where way-0 is the LRU and the way-3 is the most recently used (MRU). The entry of TLB with lower order is replaced with the one with higher order.

Figure 14:
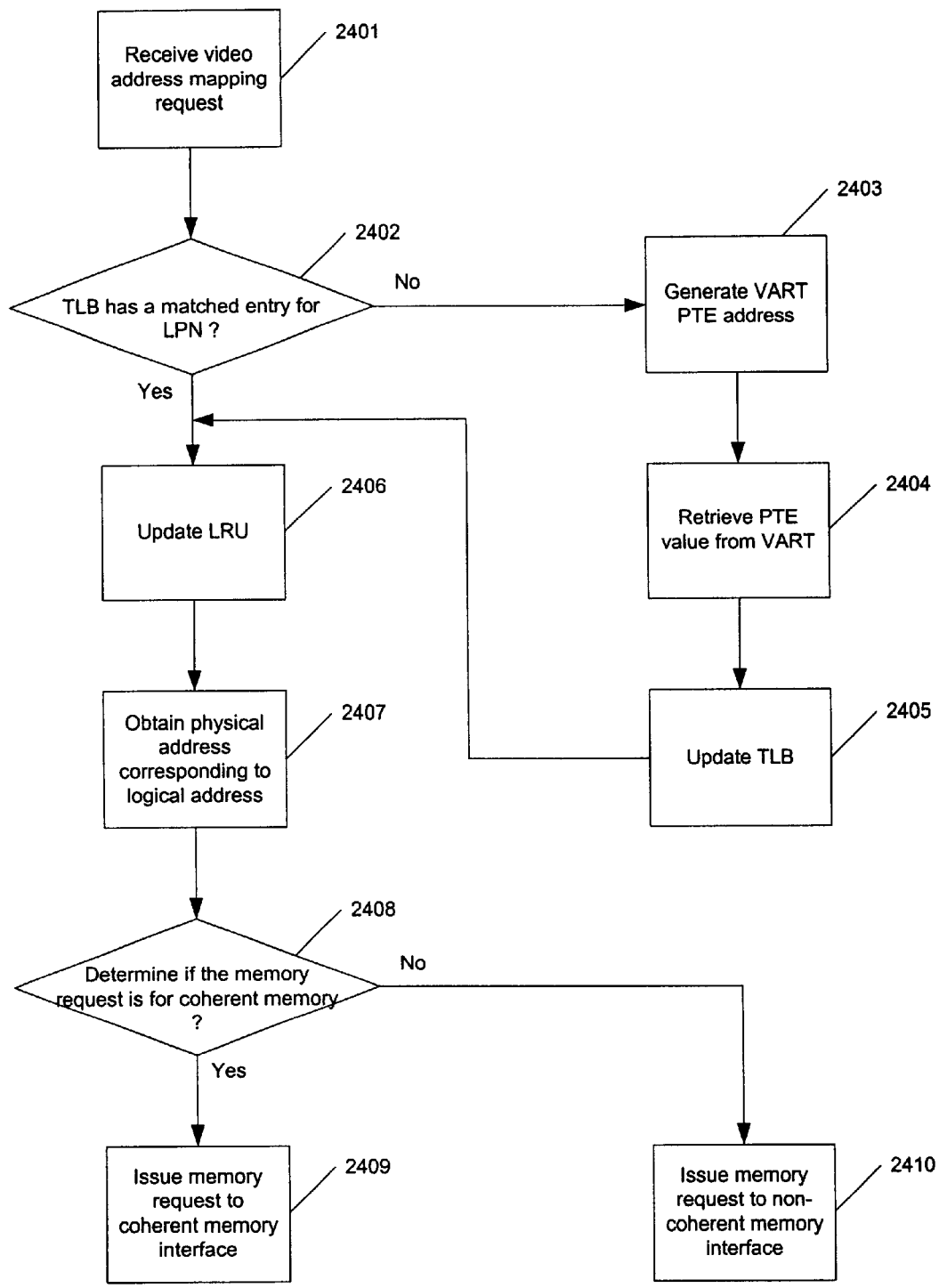
FIG. 14 shows yet another embodiment of a method accessing the memory address re-mapping table.

FIG. 14 shows a method for mapping a logical address to a physical address with a VART TLB, used in one embodiment of the present invention. Upon receiving an address-mapping request in 2401, the VART TLB will be searched 2402 to find an entry matching the logical page frame number (LPN) of the logical address. If the VART TLB is missed (e.g., a matched entry is not found), a VART PTE address is generated 2403 from the LPN and a PPN is fetched 2404 from the corresponding PTE entry of the VART. After the corresponding PTE is found, the VART TLB will be updated to cache the PTE used. If the VART TLB is hit (e.g., a matched entry is found), the PPN will be fetched directly from the TLB. Then the LRU is updated 2406 and a physical address is generated 2407 from the PPN and the offset of the logical address. After the physical address is generated, a C-Bit either from the VART PTE or the VART TLB entry is checked 2408 to determine whether the request is for coherent access. If the request is for coherent access, the request is sent 2409 to a coherent interface; otherwise the request is sent 2410 to a non-coherent interface.

It is important to note that the VART of the present invention can map the logical address anywhere in the system address space, which space can be shared with other components in the system. The VART can also map a dedicated address space such as AGP device address range, in which case, the AGP address space cannot be shared with other components in the system. It is also important to note that the configuration of the VART in the present invention can be used in a co-processor to the host processor, a stand-alone processor, or a processor integrated in a system core logic chip such as the system core logic chip 1410 of FIG. 4B.

Figure 10B:
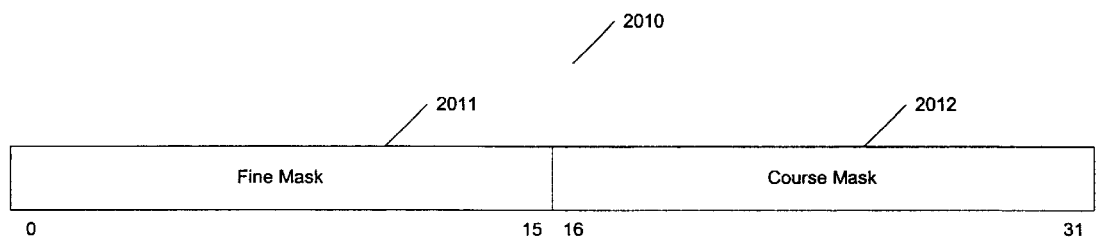
FIG. 10B shows an example of a PCI-0 mask register used in one embodiment of the present invention.

After mapping an address through the VART, an address decoding is performed to determine if the address is valid and whether the request should be sent to memory, PCI-0, or another compute engine. If an address is determined to be invalid, a memory address exception is generated through an interrupt mechanism. If the access is to memory (e.g., high order bit is zero), any address is valid. If the access is to another compute engine (e.g., high order byte matches the compute engine's ID in a control register), the address is checked to make sure it is a valid compute engine. If the access is to PCI-0 (e.g., high order bit is non-zero and high order byte does not match the compute engine's ID), the address is checked for the validity against the PCI-0 address mask register. This register is located in PCI-0 and is accessible through system address mapping. This register defines the valid address space for PCI-0. The format of the PCI-0 mask register is shown as 2010 of FIG. 10B.

Figure 17:
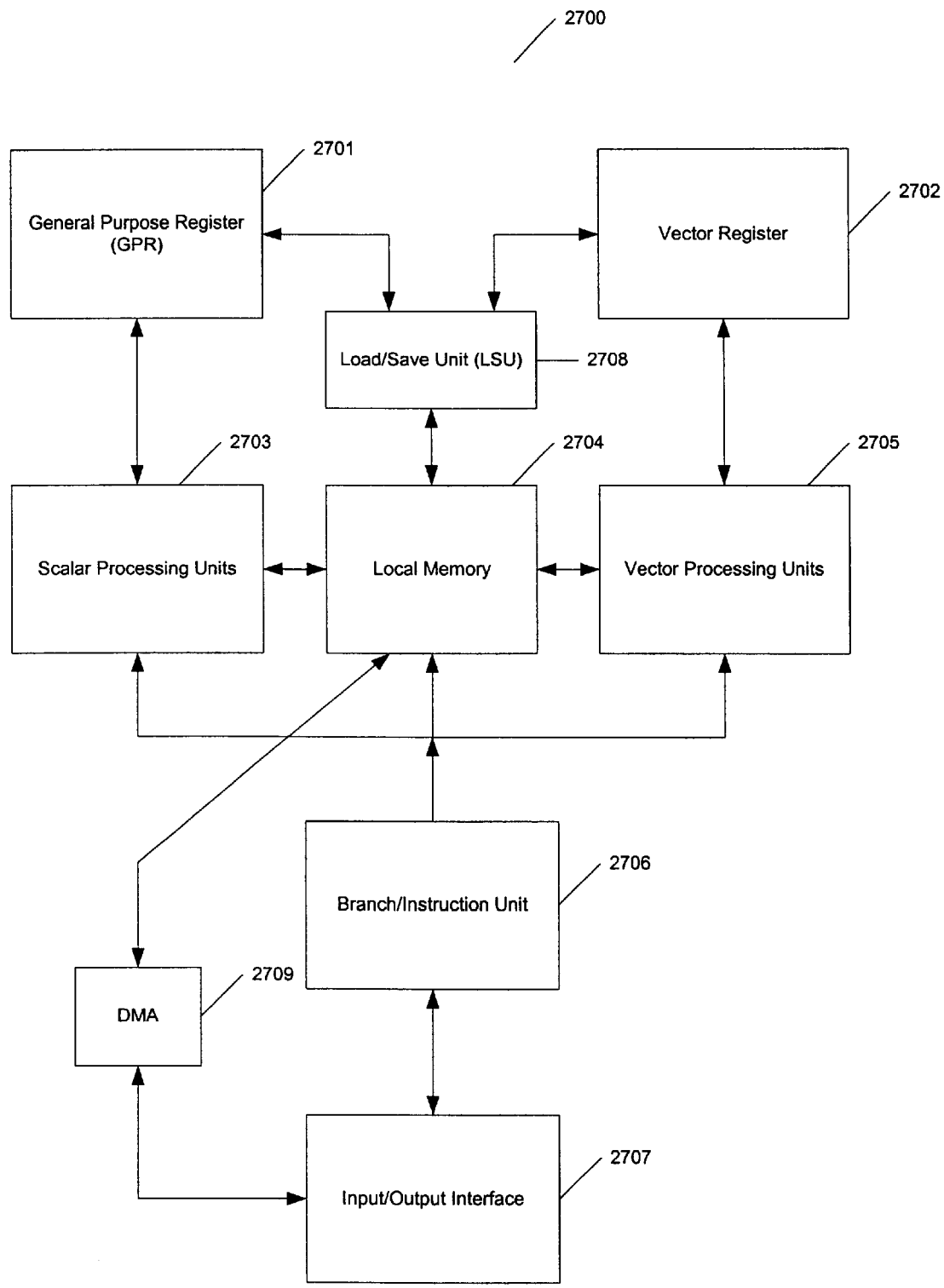
FIG. 17 shows an example of a compute engine used in one embodiment of the present invention.

The media processor of the present invention such as media processor 1510 of FIG. 5B has multiple compute engines such as compute engine 1520. Each engine can process multiple media data simultaneously. FIG. 17 shows an example of an embodiment of a compute engine of the present invention. The compute engine 2700 comprises an input and output (I/O) interface 2707 receiving and transmitting media data from and to the rest of the system. The I/O interface 2707 receives the data from the system (e.g., host memory) and transmits the data to the branch and instruction unit 2706. The branch and instruction unit 2706 decodes the instruction and load the data into a local memory location 2704. The branch and instruction unit 2706 then dispatches the instructions to the scalar processing units 2703 and vector processing units 2705. Scalar processing unit 2703 processes the scalar data operation (e.g., integer arithmetic operation) and vector processing unit 2705 processes vector data operation (e.g., vector adds or subtract). The source and destination operand may be stored in register files. Scalar processing units use general-purpose register (GPR) files 2701 and vector-processing units use a vector register (VR) files 2702.

One of the advantages of one embodiment of the present invention is that both scalar unit and vector unit are integrated in the media processor.

Figure 18:
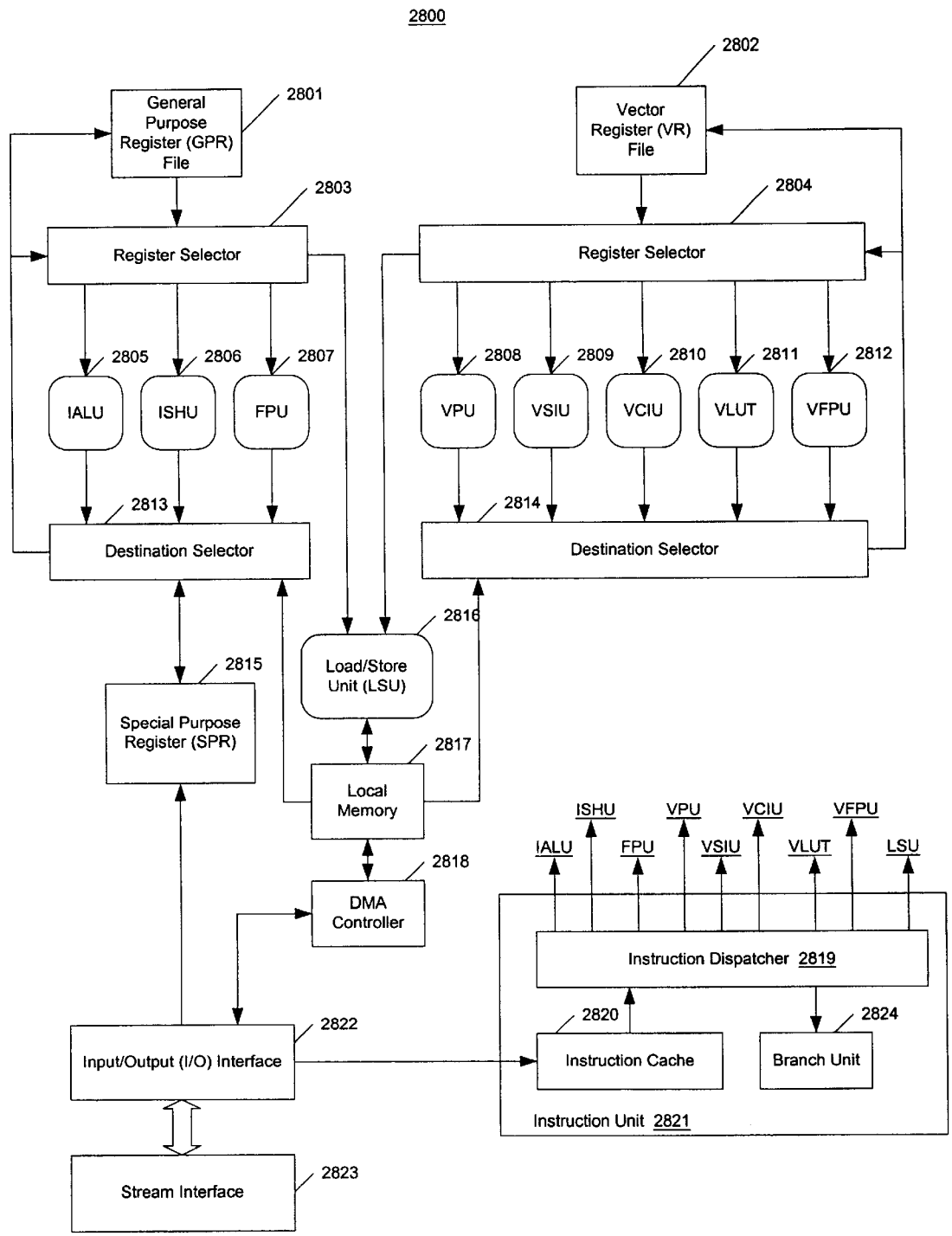
FIG. 18 shows another embodiment of a compute engine used in the present invention.

FIG. 18 shows a detailed depiction of an embodiment of a compute engine of the present invention. Referring to FIG. 18, the compute engine 2800, also known as video geometry engine (VEO), can be considered as a VLIW processor executing a set of instructions. Such instructions can be a subset of the G4 instruction set used by a Macintosh computer with extensions. The compute engine 2800 does not perform any hardware instruction scheduling. All codes run on the compute engine are assumed to have correct resource and dependency scheduling.

Each compute engine consists of a set of functional units. In one embodiment, there may be eight functional units integrated in the compute engine 2800: integer arithmetic/ logical unit (IALU) 2805, integer shift unit (ISHU) 2806, load/store unit (LSU) 2816, vector permute unit (VPU) 2808, vector simple integer unit (VSIU) 2809, vector complex integer unit (VCIU) 2810, vector look-up table unit (VLUT) 2811, and branch/instruction unit (BRU) 2821. There are six storage elements in the compute engine 2800: general purpose register file (GPR) 2801, vector register file (VR) 2802, look-up table (LUT) (not shown, located in the VLUT 2811), local memory 2817, instruction cache 2820, and special purpose registers (SPR). In another embodiment, the compute engine 2800 also includes a floating-point unit (FPU) 2807 and vector floating-point unit (VFPU) 2812. In a further embodiment, the compute engine 2800 may also include a floating-point register file (not shown), for floating-point data processing. It is useful to note that a compute engine may contain all or a subset of the above-functional units. Furthermore, more than one functional unit of a kind may be included. For example, in one embodiment, a compute engine may comprise one IALU, two ISHU, one LSU, and one BRU units.

The integer arithmetic/logic unit (IALU) 2805 executes simple scalar integer arithmetic (e.g., addition and subtraction, etc.), and logical operations. These are pipelined to dispatch in a single clock cycle. The IALU 2805 also executes complex scalar arithmetic instructions such as multiplication and division in multiple clock cycles. Source and destination data is accessed from the GPR 2801. The integer shift unit (ISHU) 2806 executes scalar bit shift and rotate operations. These are pipelined for single clock cycle dispatch. Source and destination data is accessed from the GPR 2801.

The load/store unit (LSU) 2816 executes the instructions for loading and storing scalar data for the GPR file 2801, and loading and storing vector data for the VR file 2802. The load and store data comes from the local memory 2817. The source operands needed for address generation are read from the GPR file 2801. Load data is read from the local memory 2817 and written to the GPR file 2801 or the VR file 2802 for scalar and vector store instructions. Store data is read from the GPR file 2801 or VR file 2802 for scalar and vector load instructions and written to the local memory 2817. The LSU 2816 also executes DMA reading and writing instructions between the local memory 2817 and the main memory, such as memory 1203 of FIG. 2, and between the main memory and the look-up table within the VLUT 2811

The vector permute unit (VPU) 2808 executes the vector permute instructions and variations and vector byte shift/ rotate instructions. Source and destination data is accessed from the VR file 2802. The vector simple integer unit (VSIU) 2809 executes vector addition, subtraction and bit shifting instructions, etc., operating on byte, half-word and word format. All sources and destinations are accessed from the VR file 2802. The vector complex integer unit (VCIU) 2810 executes vector multiplication, multiplication-addition, and summation (e.g., addition of more than two values) instructions. Most operations are performed on byte, half-word, and word format. All source and destinations are accessed from the VR file 2802. The FPU 2807 and VFPU 2812 are provided for high precision processing of media data.

The vector look-up table unit (VLUT) 2811 executes the variable length decoding instructions and the look-up table read and writes instructions. The VLUT 2811 can be used to advantageously map a vector of values into another vector of values, based on a look-up table. The VLUT 2811 provides efficient table look-up for a vector of data values to be mapped using a single look-up table or multiple look-up tables. The VLUT also supports various sizes of look-up indices and table entries. There are several look-up modes available. All sources and destinations are accessed from the VR file 2802.

The instruction/branch unit 2821 contains all the functions for handling instruction control and dispatch. It contains the program counter and the branch unit for determining where to fetch the next instructions. The instruction unit 2821 also contains an instruction cache memory 2820 for buffering the instruction from the main memory. The instruction unit 2821 further may contain a set of memory-mapped registers accessible from the host processor for starting and stopping the compute engine 2800. The instruction unit 2821 receives the instruction stream from the I/O interface 2822 and stores the instruction stream data in the instruction cache 2820. The instruction dispatcher 2819 then decodes the instruction stream according to an instruction priority scheme and dispatches the instructions to the corresponding functional units.

The compute engine 2800 also includes an input and output (I/O) interface block 2822. The I/O interface handles requests for data to and from system memory and I/O space for instruction cache fills, local memory reads and writes, look-up table fills, and command fetches. The I/O interface also handles the requests from the host processor and other compute engines for accessing the compute engine's control registers and local memory.

The general purpose register file (GPR) 2801 has multiple entries to hold source operands and destinations for the IALU 2805, ISHU 2806, and the scalar load/store instructions, and the address sources for vector load/store unit (LSU) 2816 instructions. In one embodiment, the GPR 2801 is 32-entry by 32-bit file, and it has six read ports and two write ports. In another embodiment, the GPR 2801 also holds the source operands and destinations for FPU 2807. Other configurations of the GPR may exist.

The vector register file (VR) 2802 has multiple entries to hold source operands and destinations for the VPU 2808, VSIU 2809, VCIU 2810, VLUT 2811, and vector load/store unit (LSU) 2816 instructions. In one embodiment, the VR 2802 is a 32-entry by 128-bit file, and it has six read ports and two write ports. In another embodiment, the VR 2802 also holds the source operands and destinations for VFPU 2812. Other configurations of the VR may exist.

The scalar processing units 2805–2807 read the inputs from the GPR 2801. The locations of the GPR 2801 are selected by the register selector 2803. The scalar processing units 2805–2807 also write the outputs to the GPR 2801. The locations of the GPR 2801 are selected by the destination selector 2813. Similarly, the vector processing units 2808–2812 read the inputs from the VR 2802. The locations of the VR 2802 are selected by the register selector 2804. The vector processing units 2808–2812 also write the outputs to the VR 2802. The locations of the VR 2802 are selected by the destination selector 2814.

In another embodiment, the compute engine 2800 may include a direct memory access (DMA) controller 2818 providing streaming access to and from the local memory 2817 and the host memory such as the host memory 1512 of FIG. 5B. The DMA controller 2818 is responsible to transfer data between the host memory and the local memory 2816. The DMA 2818 may also transfer data of a look-up table from the host memory to a look-up table memory in the VLUT 2811. The DMA operation can be operated autonomously and asynchronously to the host processor, or the compute engine in the media processor.

The compute engine 2800 may further include a special purpose register (SPR) file 2815. The SPR file 2815 contains multiple registers storing specific information about some transactions, for example, command queue instruction pointer (CIP). Other registers store miscellaneous information such as version information of the compute engine.

Figure 19A:
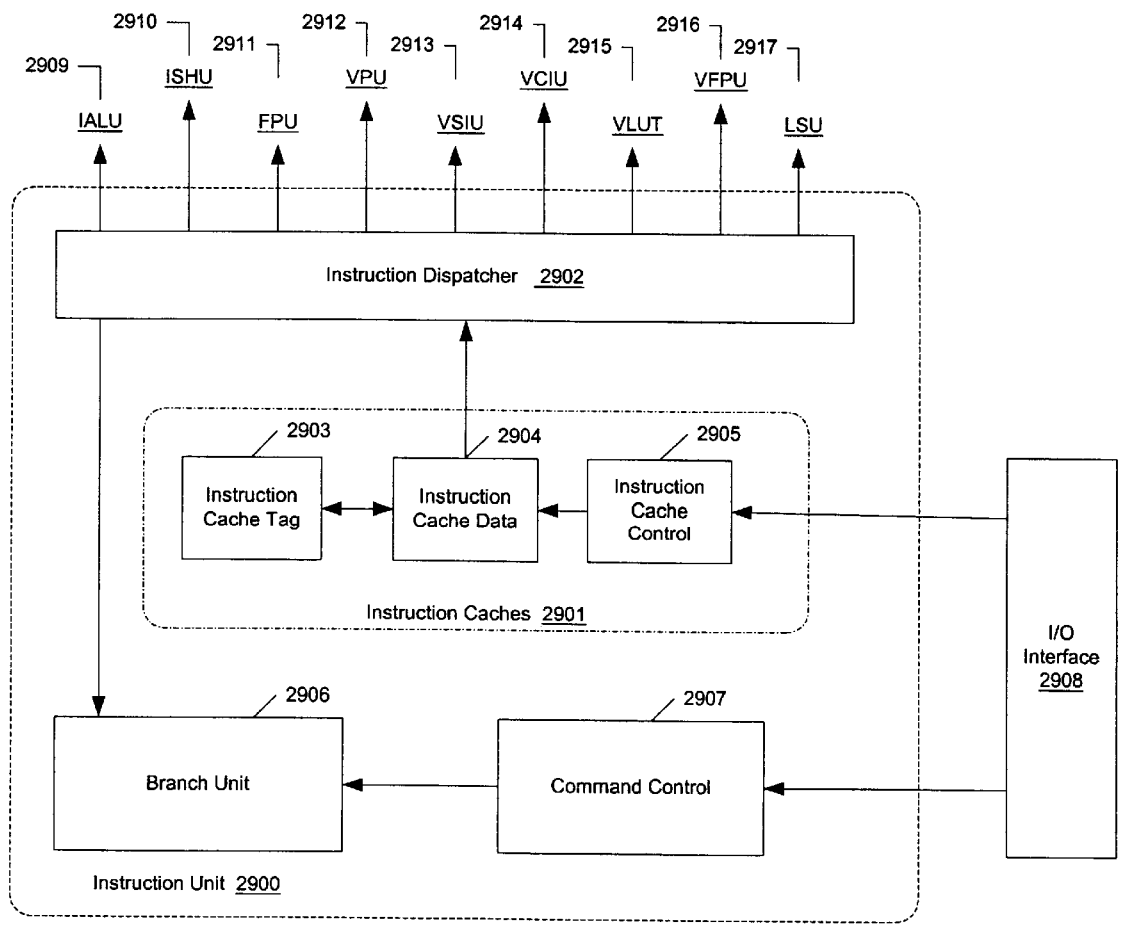
FIG. 19A shows an embodiment of an instruction unit of a compute engine used in the present invention.

FIG. 19A shows an example of an instruction unit used by one embodiment of the present invention. Referring to FIG. 19A, the instruction unit 2900 of FIG. 19A includes a command controller 2907. The command controller 2907 provides the command instruction pointer (CIP), the command data pointer (CDP) of the instructions and data from a command queue, which is further described below, through the I/O interface 2908. The branch unit 2906 controls the instructions or routines whether the instructions should be branched. The instructions are then fetched from the main memory into instruction caches 2901. The instruction caches 2901 include an instruction cache tag ram 2903 and data rams 2904. The instruction cache control 2905 generates a control signal to the cache memory in order to update instruction cache tag and data rams during the refills. The instruction cache control 2905 also issues cache refill requests to the stream interface of the compute engine, through the I/O interface 2908, because of the instruction cache miss or an instruction of instruction stream touch command.

The instruction caches (ICache) 2901 include an ICache tag ram and an ICache data ram. In one embodiment, ICache tag ram 2903 contains 64 entries. Each entry of the ICache tag ram contains 20 bits; there are 19 bits of tag and one bit for valid flag. Bits [19:24] of the program counter (PC) register are used to address one of the 64 entries in the ICache tag ram 2903. If the entry is valid and the 19 bits of the ICache tag match to 19 most significant bits of the PC register, the ICache hit is considered and the corresponding ICache data are sent to the instruction dispatcher 2902, from the ICache data ram 2904. The ICache tag memory 2903 contains a virtual address for mapped instruction fetches or a physical address for unmapped instruction fetches. ICache may be direct mapped and may occupy 8K bytes of address space (64 entries of 128 bytes, 32 instructions each). Instructions that are exactly 64 lines apart from each other may be mapped to the same cache entry. The ICache is filled one line at a time. A line size may be 128 bytes or 32 instructions. When an instruction fetch generates a miss (e.g., ICache tag does not match or ICache tag is invalid), the corresponding line is fetched from the memory and the ICache tag and valid bit will be updated. When the "instruction stream touch" command is issued, more than one sequential line can be fetched from the memory. The software may issue the instruction stream touch command and specify the number of lines to be fetched.

The program counter (PC) register is maintained by the branch unit 2906. The PC register is used to access the ICache. The PC register selects the cache line and compares with the ICache tag. The instruction dispatcher 2902 receives the instructions from the ICache data memory 2904 and dispatches the instructions to appropriate functional units 2909–2916. The instruction dispatcher 2902 dispatches the instructions based on a programmable priority scheme, which is described further below.

Figure 19B:
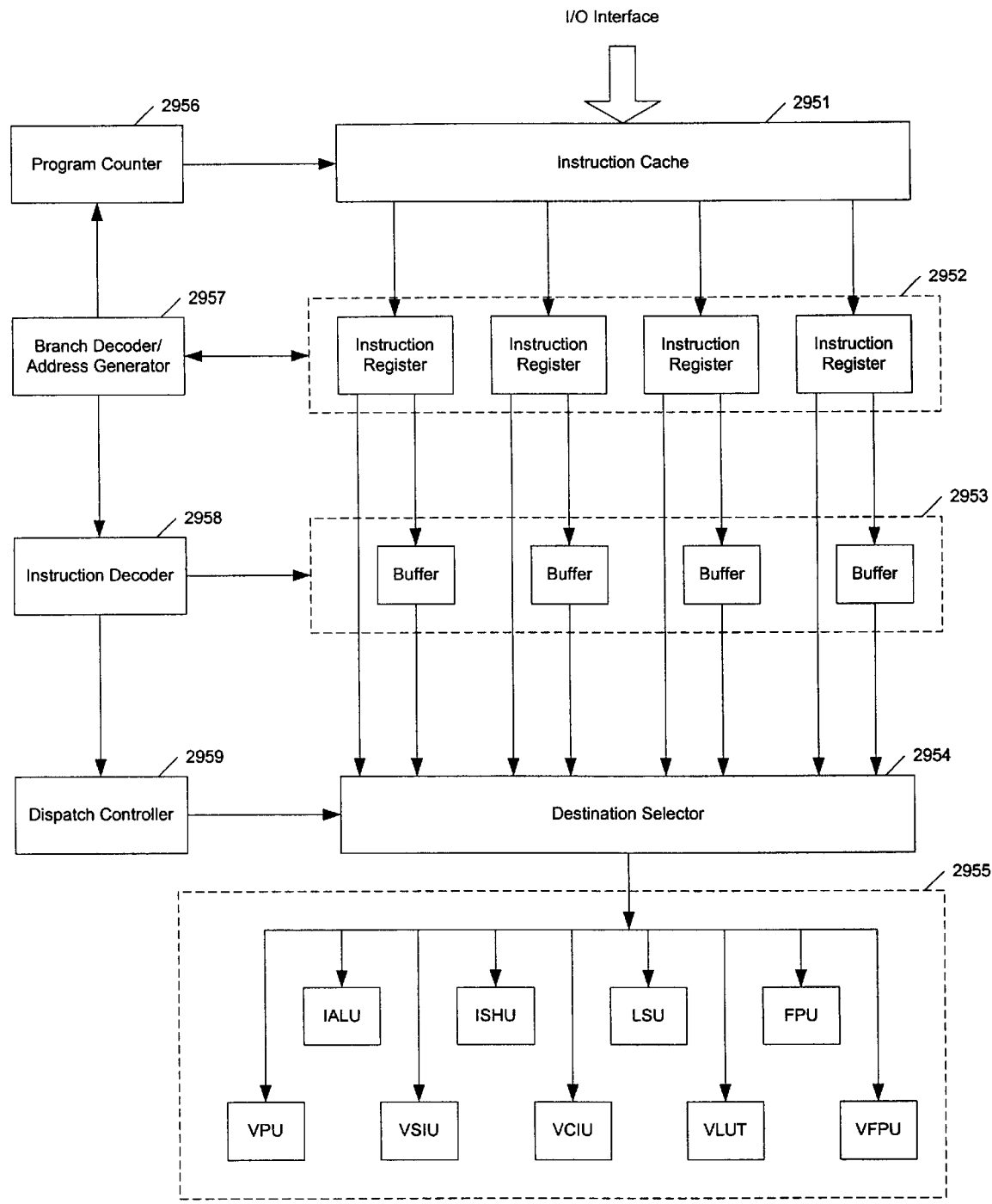
FIG. 19B shows another embodiment of an instruction unit of a compute engine used in the present invention.

FIG. 19B shows another embodiment of an instruction unit. Referring to FIG. 19B, the instruction unit receives instruction stream from the I/O interface through DMA operation to the instruction cache memory 2951. Then the instructions are stored in instruction registers 2952 to be analyzed by the branch decoder/address generator 2957. The branch decoder detects the branch condition based on the priorities of the instructions and their latencies information when executed. Once the branch decoder detects the branch conditions, the branch decoder instructs the program counter to update the address in which the next instruction should be fetched. The instruction unit also includes an instruction decoder 2958 to receive instructions from either instruction registers 2952 or the instruction buffers 2953, and construct an instruction group based on their priorities. The dispatch controller 2959 then instructs the destination selector 2954 to select the designated function units 2955 to execute the instruction group. The instruction decoder 2958 also detects when additional stalling cycle should be in placed. When the instruction fetching is stalled, the instructions pending to be executed may be stored in the instruction buffers 2953, until the previous instructions have been fully executed and the instruction fetching resumes.

Figure 20A:
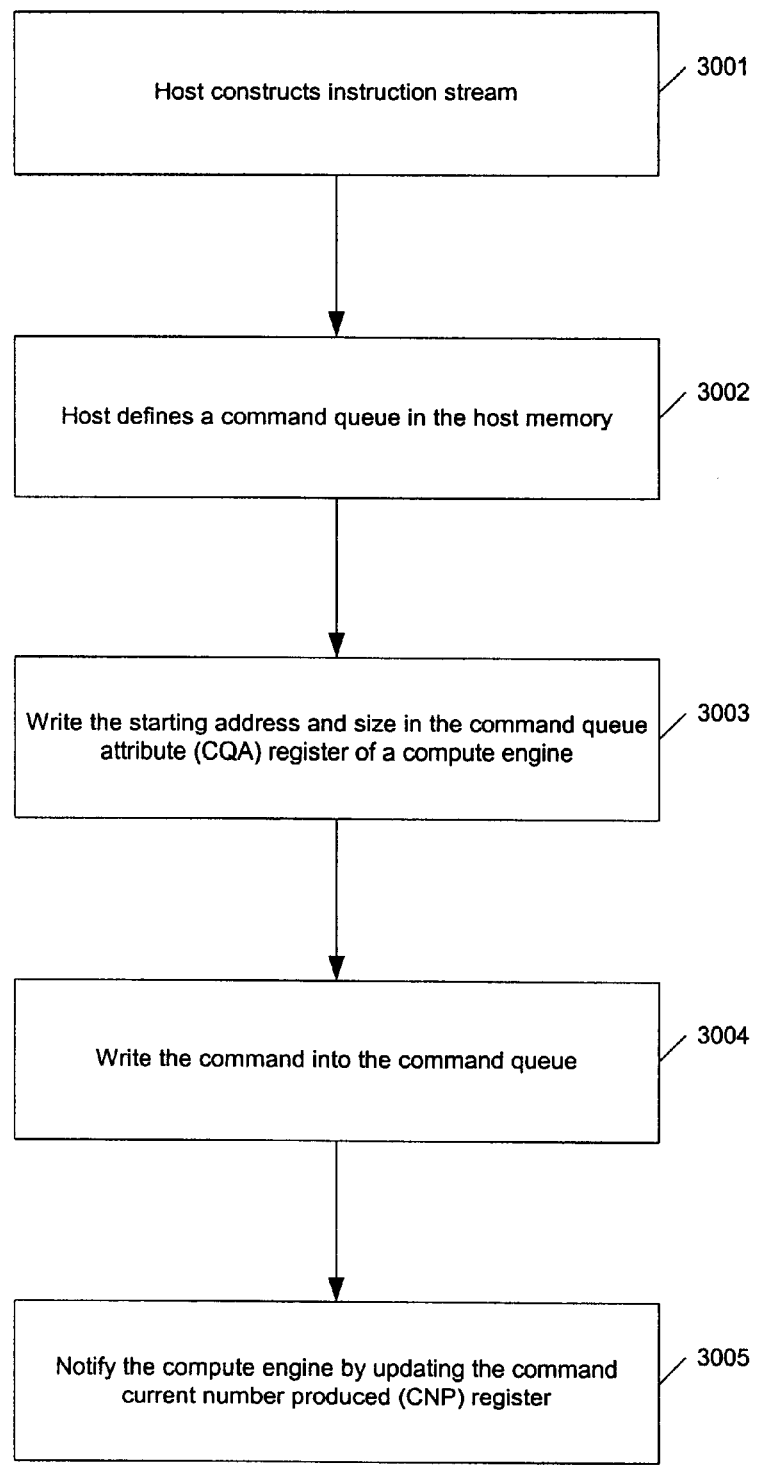
FIG. 20A shows a method accessing a command queue used in one embodiment of the present invention.

FIG. 20A shows a method of constructing a command queue in the main memory. An application software or a system software executed by the host constructs 3001 an instruction stream containing multiple instructions. The host then defines 3002 an area as a command queue in the host main memory. The host then writes 3003 the starting address of the next command stored in the command queue, into a command queue attribute (CQA) register of the compute engine that executes the instructions. In one embodiment, the host writes to the CQA register of the compute engine through a set of memory-mapped addresses. Next, the host writes 3004 the command into the command queue in the main memory. A command consists of an instruction priority and pointer corresponding data pointer. The host then updates 3005 the command current number produced (CNP) register, which in turn notify the compute engine that there is a new command available to be fetched.

Figure 20B:
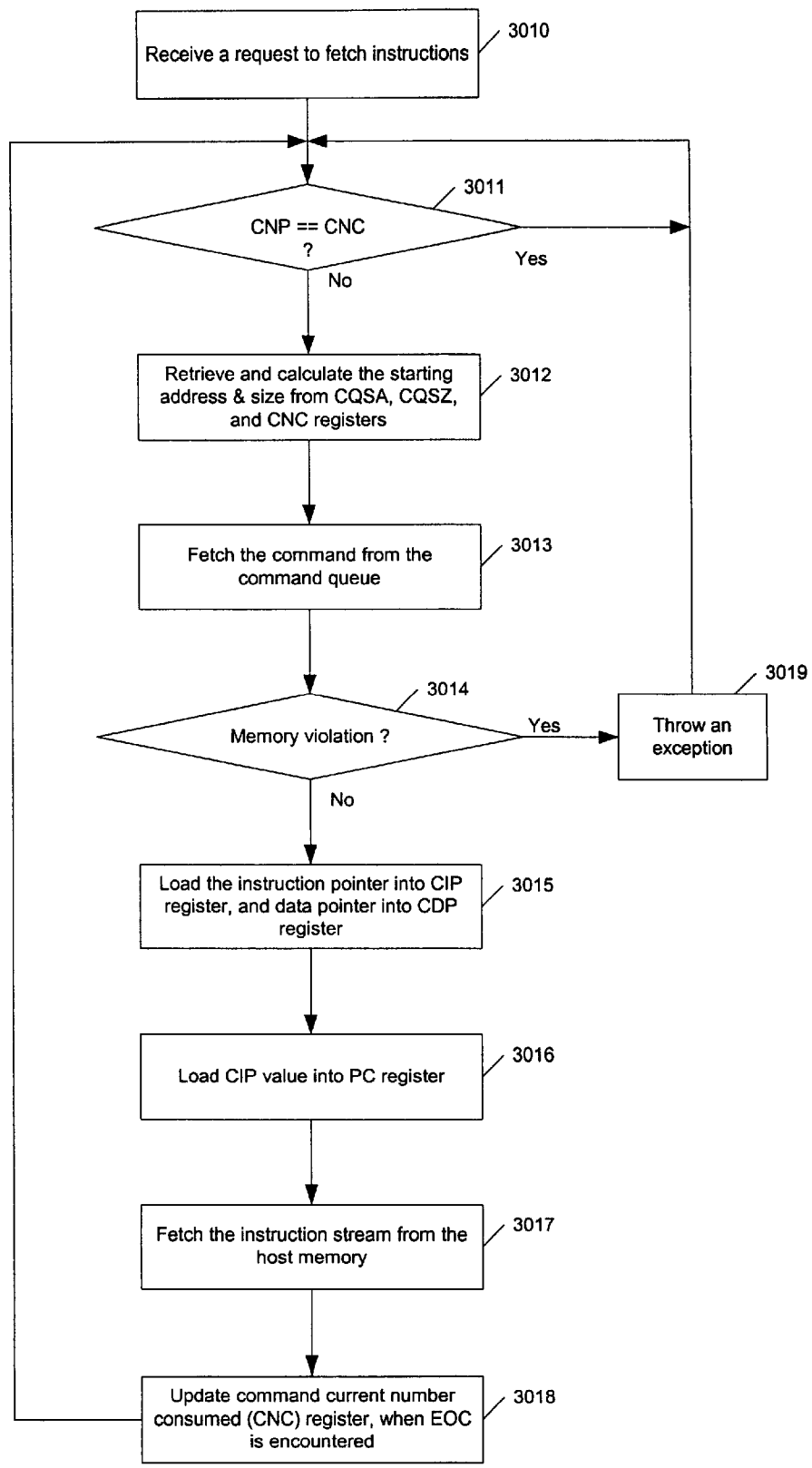
FIG. 20B shows another method accessing a command queue used in one embodiment of the present invention.

On the other hand, as shown in FIG. 20B, the compute engine that receives and executes the instructions is notified 3010 by the host that a new command is ready to be fetched. Referring to FIG. 20B, the compute engine compares 3011 the current number produced (CNP) register with the current number consumed (CNC) register to determine if there is a new command entered in the command queue. If the CNP is matched with the CNC, there is no new command entered in the command queue. Thus the compute engine enters into idle and waiting for the next command. If the CNP does not match the CNC, it means a new command has been entered in the command queue. The compute engine then retrieves 3013 the start address and the size of the command from the CQA register and the CNC. Then the command is fetched 3013 from the main memory based on the starting address and the size of the command queue calculated from the CQA register. In one embodiment, the command fetch may be through an address mapping scheme, such as the video address re-mapping table (VART) 1515 of FIG. 5B. Such memory access may be through a coherent interface such as the coherent interface 1513 of FIG. 5B, or a non-coherent interface such as the non-coherent interface 1514 of FIG. 5B. Next, the memory access is checked 3014 whether a memory access violation occurs. If there is a violation as result of the memory mapping (e.g., through VART), an error message is generated 3019, by issuing an exception through an interrupt mechanism. If no memory access violation occurred, the instruction pointer is loaded into the command instruction pointer (CIP) register in operation 3015. The instruction pointer value of CIP register in turn is loaded into the program counter (PC) register and the data pointer value of CDP register is loaded into the general-purpose register (GPR), in operation 3016. Then the instructions are fetched 3017 from the main memory into the instruction caches, based on the instruction pointer and data pointer values loaded in CIP and CDP registers. After the instructions have been fetched from the main memory, the CNC register is updated 3018 until an end of command (EOC) is received. The instruction fetching continues until the values in CNC and CNP are matched, in which case, there are no more new commands or instructions available in the command queue. In such cases, the instruction unit goes into idle stage until the CNC and CNP does not match, in which case, the instruction unit starts a new instruction fetching again.

Figure 22:
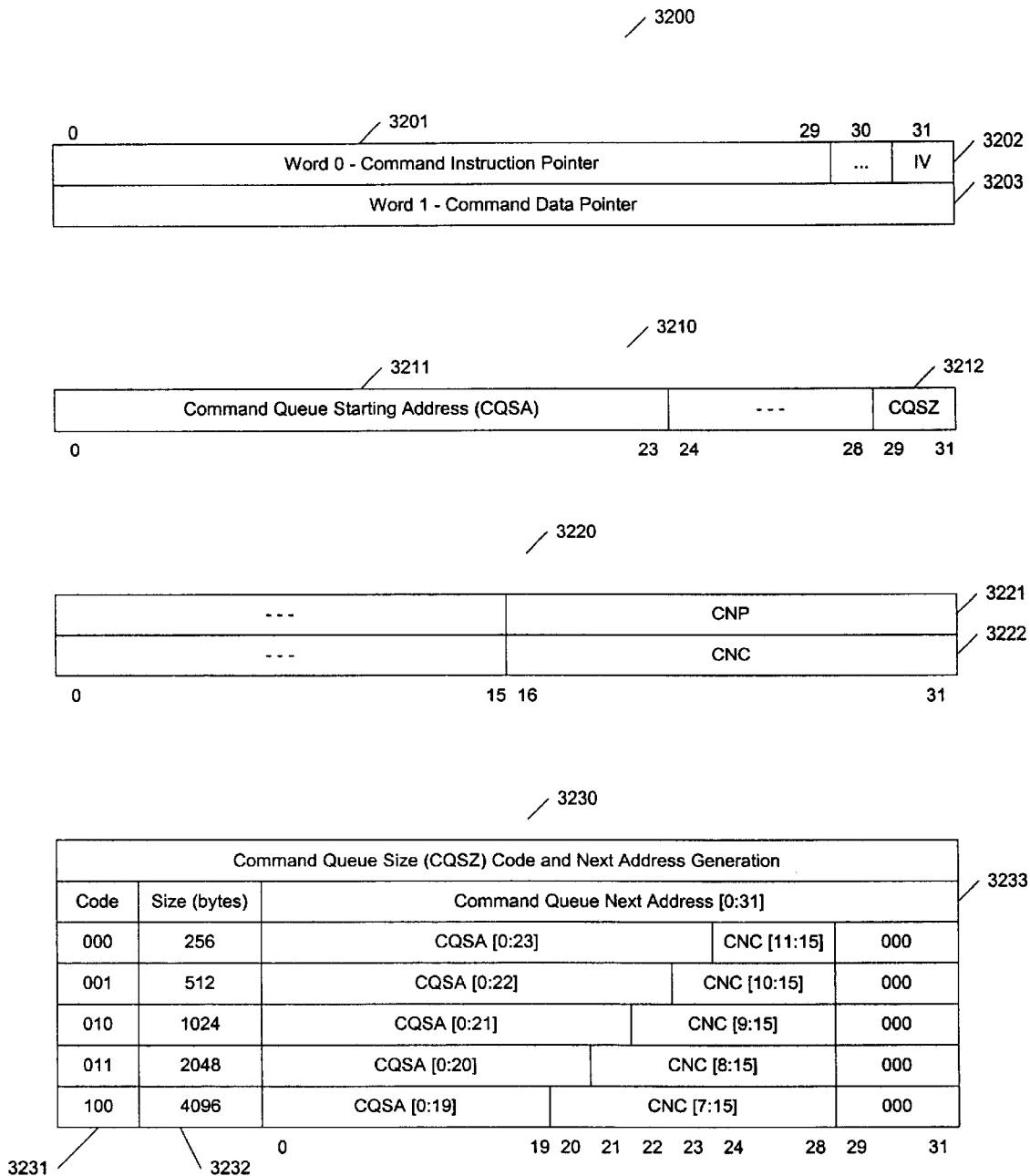
FIG. 22 shows an example of a command queue entry of the present invention.

Two counters are provided in a compute engine to keep track of the number of commands produced by the host and consumed by the compute engine: the command queue number produced (CNP) and command queue number consumed (CNC). The CNP and CNC are 16-bit registers each, as shown as 3220 of FIG. 22. The host has access to CNP for updating whenever it adds commands to the command queue. The compute engine increments the CNC when a command is fetched. Whenever the CNP and CNC are not equal, there are commands in the command queue waiting to be processed. The host reads the CNC register to determine the progress a compute engine has made on the commands in the queue and to determine the space left in the command queue. The host accesses the CNP and CNC as memory-mapped registers. They can be accessed individually with the format shown in 3220 of FIG. 22, or together for controlling the stopping and starting of command processing for command queue switching, which is described further below. The low order bits of the CNC are used as an index into the command queue. These bits concatenated with the command queue starting address (CQSA) bits form the address from which the next command will be fetched. Table 3230 of FIG. 22 shows that the starting address of the next command queue address 3233 is formed by the CQSA and CNC registers. The number of bits taken from the CNC and CQSA registers depends on the size based on the command queue size code (CQSZ). Each CQSZ code 3231 has a corresponding size in bytes such as 3232.

Figure 21:
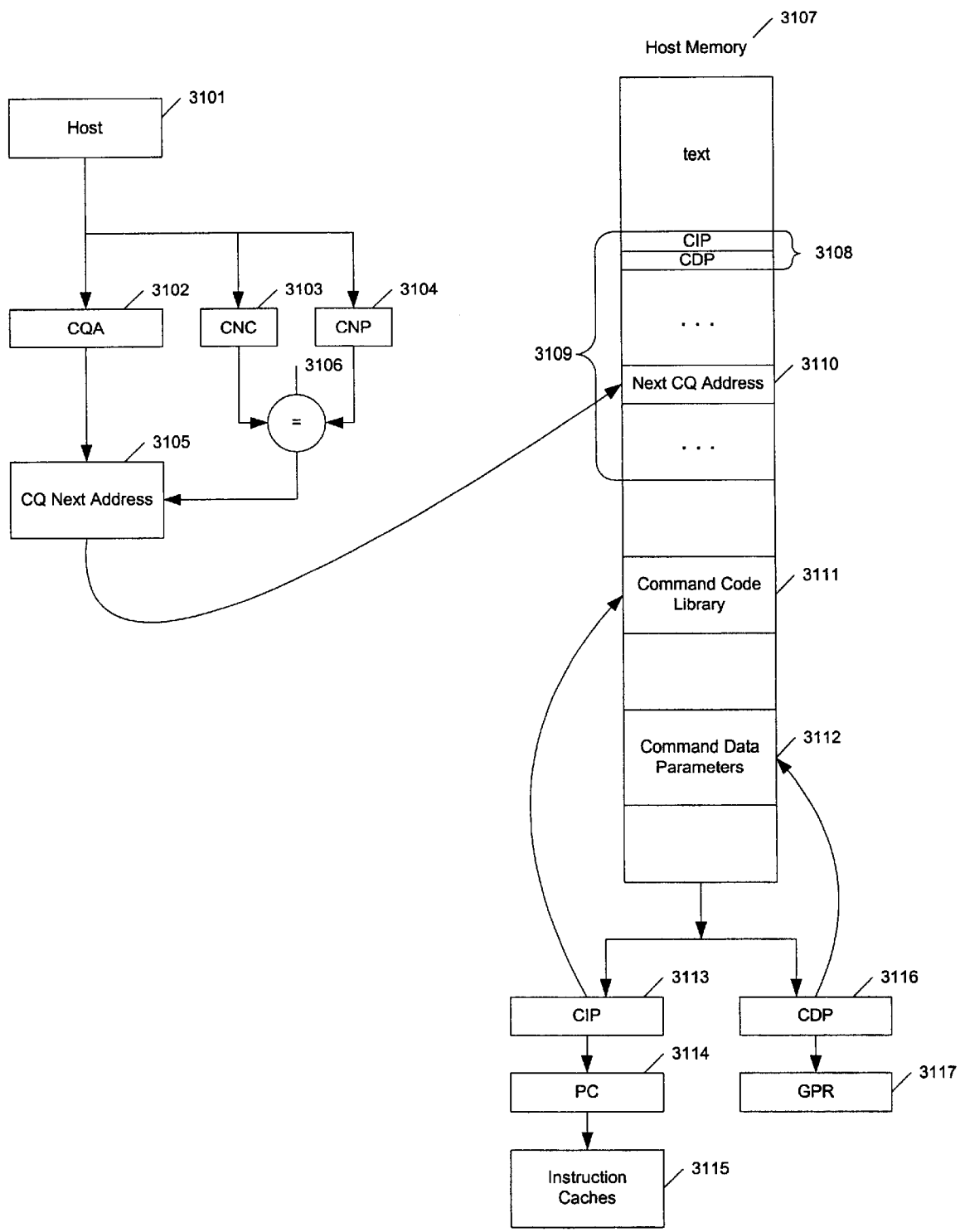
FIG. 21 shows an embodiment of a configuration of a command queue used in the present invention.

The compute engine interacts with host system by being sent a series of commands (e.g., subroutines) from the host. A queue of these commands is set up in memory and the compute engine is directed to this command queue (CQ) through a set of control registers accessible through memory-mapped addresses. FIG. 21 shows an example of an embodiment of the architecture of a command queue used in an aspect of the present invention. Referring to FIGS. 21 and 22, the command queue 3109 is defined by the host system in the main memory 3107. Each command, such as command 3108, consists of two 32-bit words aligned on a double word boundary. The first word is the command instruction address pointer (CIP) 3201 pointing to a location of the command code library 3111. The second word is the command data address pointer (CDP) 3203 and 3112 pointing to a location of the command data parameters section 3110. The CIP is the starting address of instructions executed by a compute engine for this command such as command 3108. When the command is executed, instruction fetching begins at the location pointed by the CIP. The CIP word also contains a invalidate (IV) bit 3202. If the IV bit has a logical value one, the instruction cache is flushed before the command being executed. The CDP 3203 is a general-purpose 32-bit data being used by the command. In one embodiment, it could be used as an address to the data section in the memory such as data section 3112 for this command. The data section is where typical arguments for this command (e.g., pointers to data, block addresses, number of blocks, etc.) would reside.

Each compute engine receives commands from a separate main memory based circular queue. The command queue start address and size is determined by the driver and communicated to a compute engine by writing into its command queue attribute register (CQA), as shown as 3210 of FIG. 22. Referring to FIG. 22, the CQA contains a 24-bit starting address CQSA 3211, and a 3-bit code 3212 specifying the size of the command queue (CQSZ). The size of the queue is limited to power of two starting at 256 bytes (e.g., 32 commands) and ending at 4096 bytes (e.g., 512 commands). The starting address may be aligned on the boundary specified by the queue size. The CQA register is accessible as a special purpose register (SPR).

Referring to FIG. 21, when the host 3101 generates a command queue, it writes the starting address and size of the command queue to a command queue attribute (CQA) register 3102 of a compute engine that will execute the command, through a set of memory-mapped addresses. The host then writes the command into the command queue 3109, at a location such as command 3108. It next updates the command current number produced (CNP) register 3104, which in turn notifies the compute engine that there is a new command available in the command queue 3109. When the value in the CNP 3104 does not match the one in current number consumed (CNC) register 3103, the compute engine calculates the next command starting address 3105 in the command queue and fetches the command out of the command queue based on the calculated address such as address 3110. The command 3110 contains a CIP and CDP value. The CIP value is loaded into the CIP register 3113 and the CDP value is loaded into the CDP register 3116. The CIP register is pointing to the command code library 3111 and the CDP register is pointing to the command data section 3112. The CIP value is then loaded into the program counter (PC) register 3114 and the instructions are fetched into the instruction caches 3115. The CDP value can be moved to the general purpose register (GPR) 3117 where it can be used, for example, as a base register to access data parameters associated with the command. When the command has been executed, as indicated by an end of command (EOC) instruction, CNC is incremented and the CNC 3103 and CNP 3104 registers are again compared to determine if there are more commands to process. If a command fetching results in a memory access violation, such as one from the VART, the memory access exception is thrown through an interrupt mechanism and the command fetching is stopped.

Command queue switching is defined as the process of switching from executing commands from one queue to executing commands from another queue. Switching between command queues can only occur at command boundaries. This can be accomplished by changing the location of the command queue by updating the CQA register. During the transaction between executing commands from one queue and switching to another, a special memory-mapped read of the command counters (CQCNTRS) may be used. The read returns the current values of the CNP and CNC registers and also clears the CNP and CNC registers. It also causes the compute engine to stop fetching commands when the current command has completed, since the CNP and CNC are equal. Once the CNP and CNC are cleared, the host can modify the CQA and then update the CNP and possible CNC. When the current command has completed, the next command is fetched using the new queue attributes. CQCNTRS is a 32-bit register, wherein higher 16 bits contain CNC and lower 16 bits contain CNP.

The instruction stream used in the present invention is made up of instruction groups. In one embodiment, an instruction group contains up to four instructions. Each instruction is assigned a corresponding priority number. This feature greatly improves the usability of the instruction caches over a convention very long instruction word (VLIW) dispatching. In a conventional VLIW type of processor implementation, the approach to specifying the instructions in memory and the cache is to align the four 32-bit operations on 128-bit memory boundaries. Full 128-bit wide instructions are then issued on each cycle with the four 32-bit operations being sent to four execution units every cycle. If four operations are not available to be issued every cycle then a no-operation (NOOP) operations are sent to the execution units. These NOOP operations take up a 32-bit operation slot and cause the code to become long and the instruction cache efficiency to be low.

Figure 23:
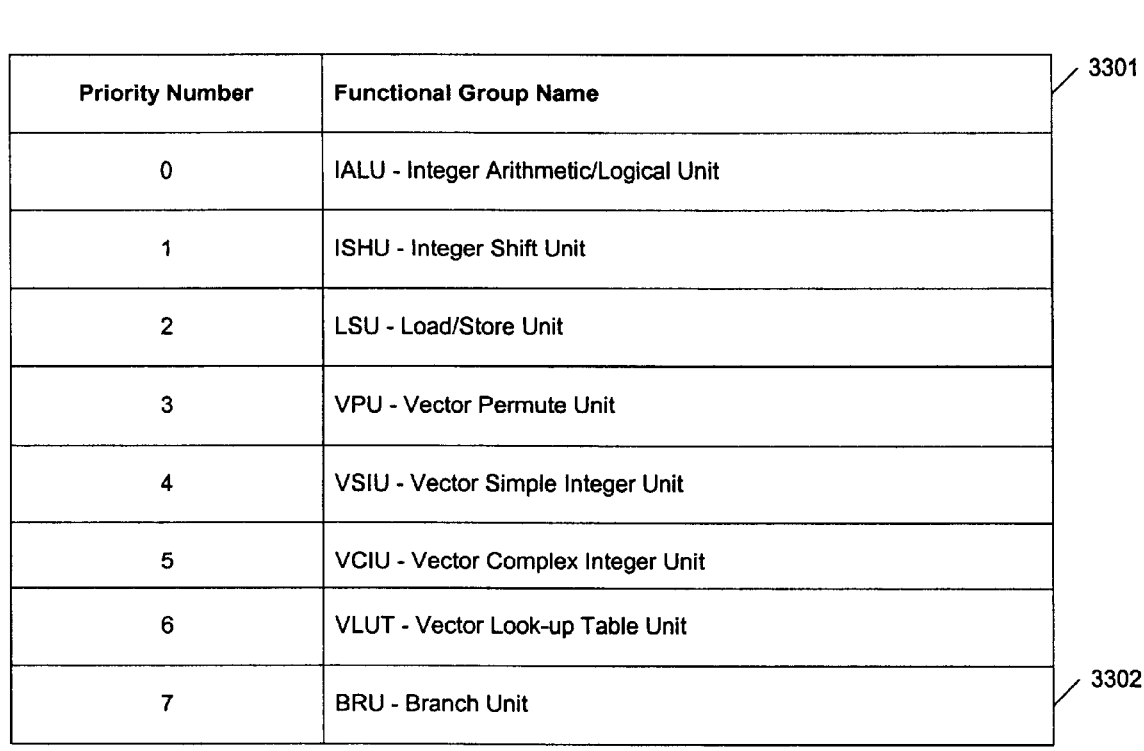
FIG. 23 shows an example of the instruction priorities used in one embodiment of the present invention.

Unlike the conventional approach, the present invention assigns each instruction a corresponding priority number based on the functional unit to which it belongs. FIG. 23 shows an example of a table 3300 that defines the priorities for the instructions executed in each functional unit, the branch instruction is dispatched earlier than any other instructions. The integer arithmetic/logical (IALU) unit 3301 has the lowest priority. Other configurations may exist.

The instructions in the present invention are packed into a group. When the group is completed, the group along with all instructions in the group is dispatched in the same cycle. The instruction group is considered completed, if one of the following two conditions occurs:

If the next instruction in the stream has a instruction order ID number equal or lower then the current one; or If the current instruction group contains up to a predetermined number of instructions.

In one embodiment, the predetermined number of instructions can be up to four instructions. The above conditions are based on the assumption that there are no more than one functional units of a kind in a compute engine. In another embodiment, there may be more than one functional units of a kind, in which case, more than one instruction with the same priority are allowed, as long as the number of instructions with the same priority does not exceed the number of the functional units of the same kind. The branch unit instruction that will execute as a no-operation is defined to insure that if the two conditions above are not met, the no-operation (NOOP) instruction must be used to force one of the conditions. As an example, consider the following code:

| Group 1: | {ADD, LW, VPERM, VADD} |
| Group 2: | {SUB, STW} |
| Group 3: | {VPERM} |

The VPERM (vector permute) instruction in Group 3 wants to be issued in a cycle after Group 2. However, since the priority of VPERM is higher than the STW instruction in Group 2, the VPERM will be dispatched in Group 2. To force the VPERM into Group 3, a NOOP instruction is needed as following:

| Group 1: | {ADD, LW, VPERM, VADD} |
| Group 2: | {SUB, SLW, NOOP} |
| Group 3: | {VPERM} |

Figure 24:
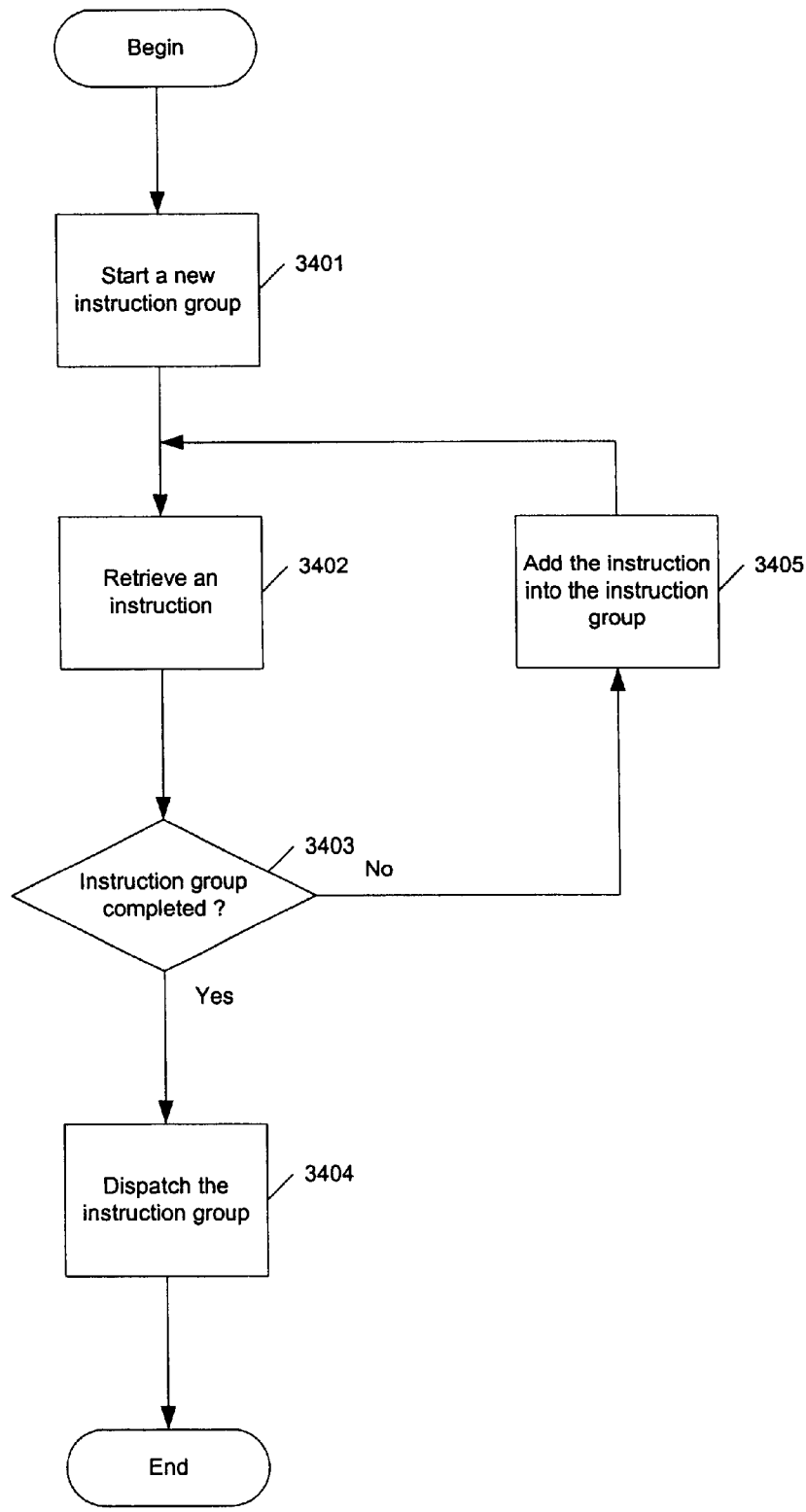
FIG. 24 shows an embodiment of dispatching instructions of the present invention.

FIG. 24 shows a method used in one embodiment of the present invention to dispatch instructions in groups. The method starts with a new instruction group in 3401. When an instruction is received 3402, the instruction unit checks 3403 whether the current instruction group is completed. If the current instruction group is completed, the instruction group is dispatched 3404 and the new instruction will be dispatched in the next group. If the current instruction group is not completed, the new instruction is added 3405 to the current instruction group.

Figure 25:
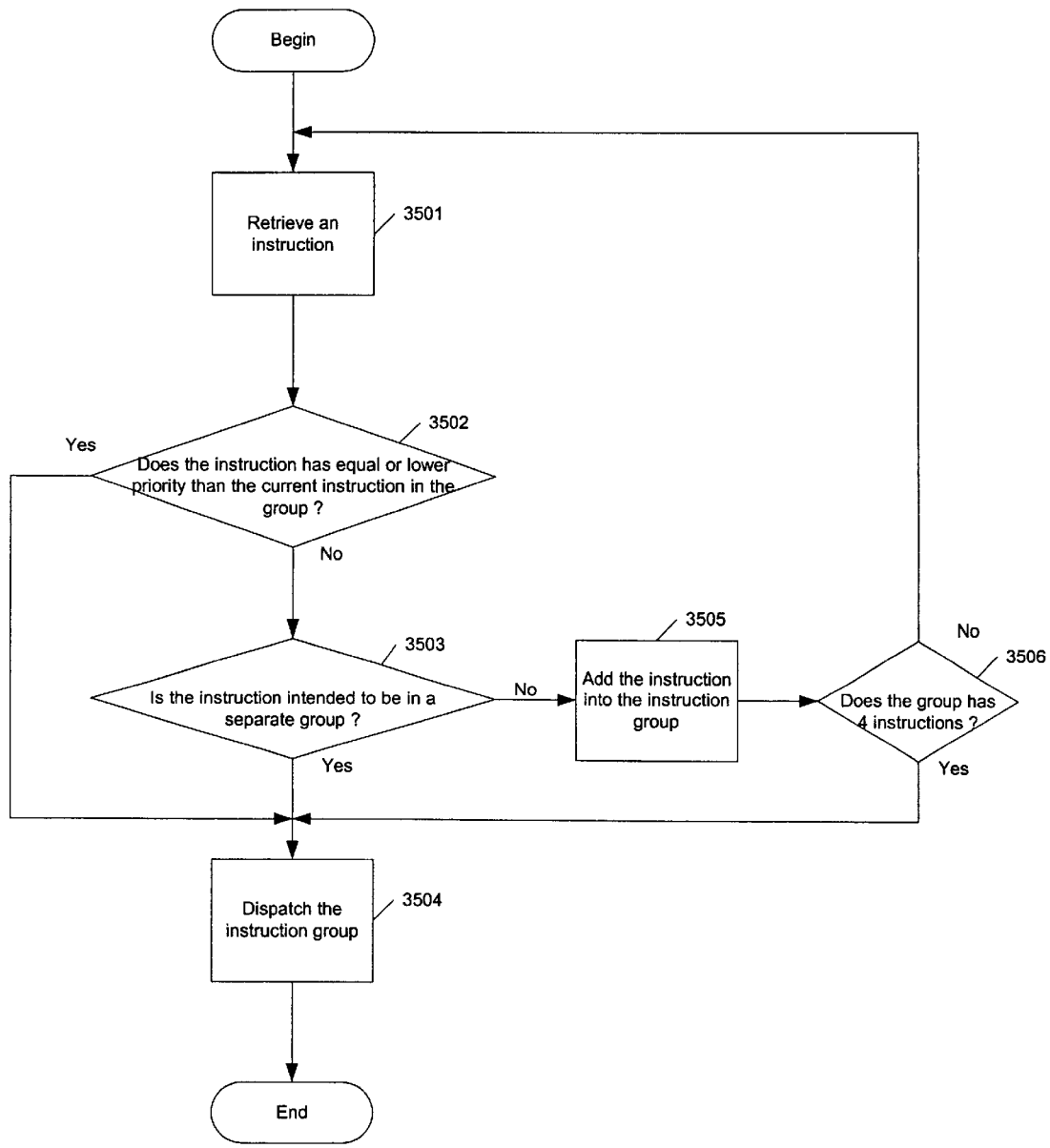
FIG. 25 shows another embodiment of dispatching instructions of the present invention.

FIG. 25 shows a method used in one embodiment of the present invention to complete an instruction group. When a new instruction is received in 3501, the instruction unit checks 3502 if the new instruction has equal or lower priority than the current instruction in the group. If the new instruction has equal or lower order ID number than the current instruction in the group, the group is dispatched 3504 and the new instruction is added into the next instruction group. If the new instruction has higher order ID number than the current instruction in the group, it is added to the current group. The current instruction group is then checked if the number of instructions in the group is equal to a predetermined number of instructions (e.g., four instructions). If so, the current group is dispatched 3504, otherwise, a next instruction from the instruction stream is fetched to complete the current instruction group.

The goal of the instruction priority scheme provided by the present invention is to reduce the size of the code. However, it is not expected that there are always four instructions issued on each clock cycle due to many reasons, such as resource conflicts, or unavailability of the previous results. The instruction priority scheme of the present invention is able to compress the code into a small one. For example, assuming the following operation is performed: vector A and vector B are added and result is written into C. The vectors A and B need to be loaded from local memory such as local memory 2817 of FIG. 18 into registers v4 and v5 of VR 2802. The result needs to be written into register v6. Following sequences of operations will be performed:

| | |
|---|---|
| Cycle 1: | Load vector A into v4 |
| Cycle 2: | Load vector B into v5 |
| Cycle 3: | Wait for results of load operations |
| Cycle 4: | Wait, results of first load is available, but not the second one |
| Cycle 5: | Perform vector addition |
| Cycle 6: | Wait for result of vector addition |
| Cycle 7: | Result of vector addition is available, store into C |

The code will have the following instructions:
    <load_vector><load_vector><noop><noop><noop><vector_add>
    <noop><noop><store_vector>

The instruction dispatch unit will break it down into the following instruction groups:

| | |
|---|---|
| Group 1: | <load_vector> |
| Group 2: | <load_vector><noop> |
| Group 3: | <noop> |
| Group 4: | <noop> |
| Group 5: | <vector_add><noop> |
| Group 6: | <noop> |
| Group 7: | <store_vector> |

The <noop> in Group 2 will force a new instruction group, Group 3.

The compute engine of the present invention is designed so that instructions within an instruction group are dispatched on the same cycle. However, there is no guarantee of the number of cycles (due to instruction cache stalling, branch stalling, etc.) that can occur between instruction groups. Each instruction executed in a functional unit has a latency. The resources being used by an instruction are considered as in-use and are not available for another instruction until the resources become available. The destination target address for an instruction is considered to be in-use from the cycle after the instruction is issued until the cycle before its latency number. A non-branch unit instruction may not be issued until the sources that the instruction specifies and the target destinations are not in-use. Since the number of cycles due to stalling is unknown, enough instruction groups must be issued to avoid the resource conflicts, even if the instruction group just contains a NOOP instruction. When a stall in the instruction pipeline occurs, there may be a potential for destination bus conflicts going to the GPR and VR, the hardware detects these conditions and inserts additional stall cycles to insure the correct operation without conflicts.

The latency of an operation is defined as the number of cycles before an instruction can be dispatched that uses the results of a previous operation. The dispatch rate indicates how many delay cycles are needed before an instruction can be issued to the same functional unit. The table 3600 in FIG. 26 shows an example of the latency and dispatch rate corresponding to each functional unit with different instructions. A value of one of the dispatch rate indicates the instruction can be issued on the next cycle. The latencies of the functional units are operation dependent. In one embodiment, the latencies of the operations on a particular functional unit may be the same.

The branch unit instructions are dispatched and executed earlier than other units so that the flow of instructions to the other units is not broken. The hardware keeps track of resources being used or altered by the non-branch instructions. The hardware stalls the execution of a branch unit instruction if the resources required by the branch instruction are in-use by the non-branch instructions, until the resources are available. Thus, the branch instruction may not be in the same instruction group with an instruction that uses or alters a resource required by the branch instruction. A branch instruction may be placed in the next instruction group following the altering instruction. For optimal performance, a branch instruction may be placed far enough after the altering instructions so that other instructions can be executed instead of stalling the dispatching. The branch dependent latency is defined as the latency between the altering instruction and the affected branch instruction. In one embodiment, the branch dependent latency is defined as the sum of the latency of the altering instruction plus five.

Figure 27:
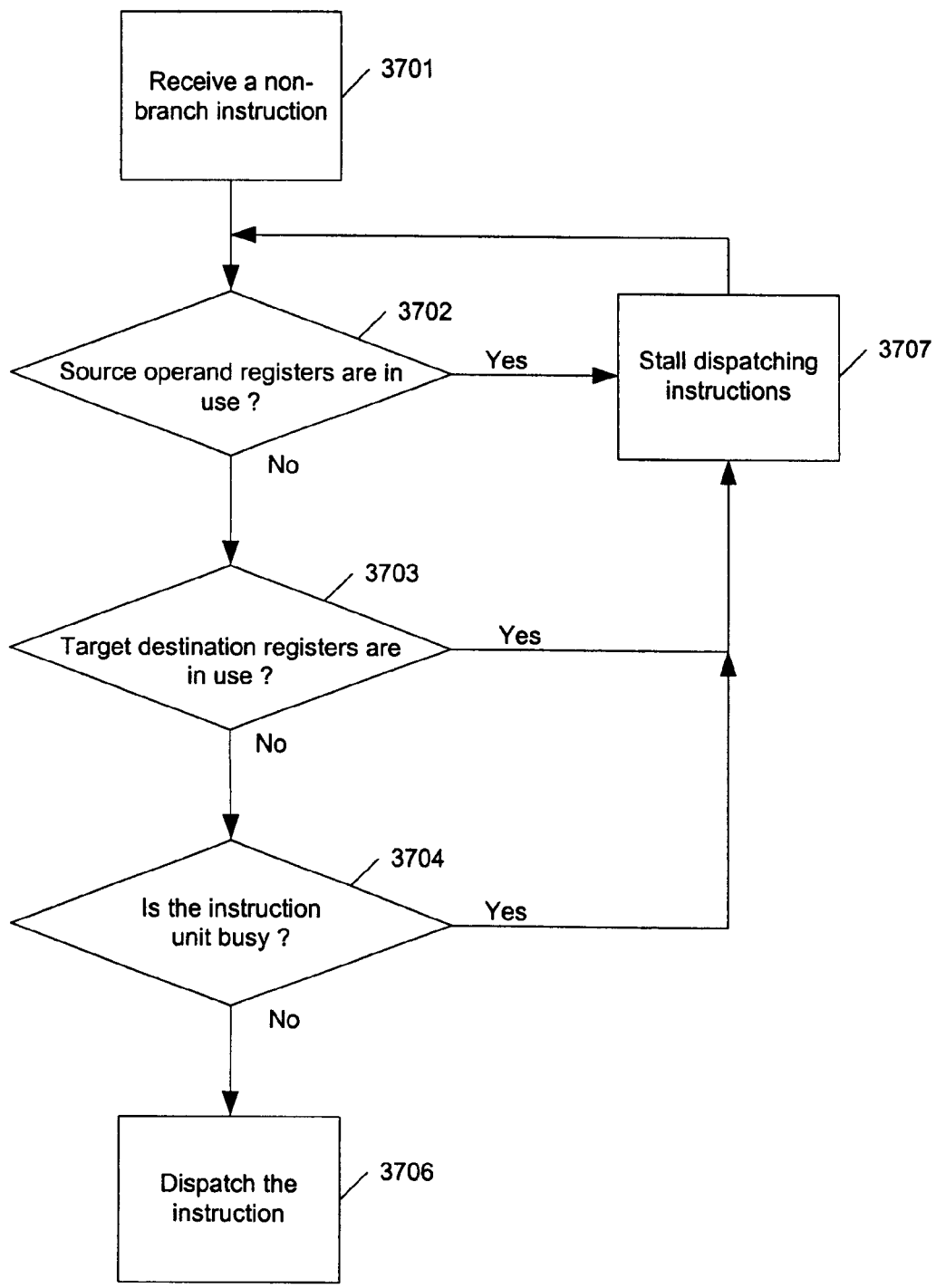
FIG. 27 shows yet another embodiment of dispatching instructions of the present invention.

FIG. 27 shows a method of dispatching a non-branch unit instruction. When a non-branch instruction is received 3701, the source operand registers required by the instruction are checked 3701 whether such resources are in-use by other instructions. If the source resources are in-use, an instruction stall occurs in operation 3707. If the source resources are available, the target destination registers required by the instruction are checked 3703 whether such resources are in-use by other instructions. If the target destination resources are in-use, a stall occurs. If both source and target destination resources are available, the availability of the functional unit is checked if it is available (e.g., issue rate is less than allowed request rate) for instruction being dispatched. Otherwise stalling is continued.

Figure 28:
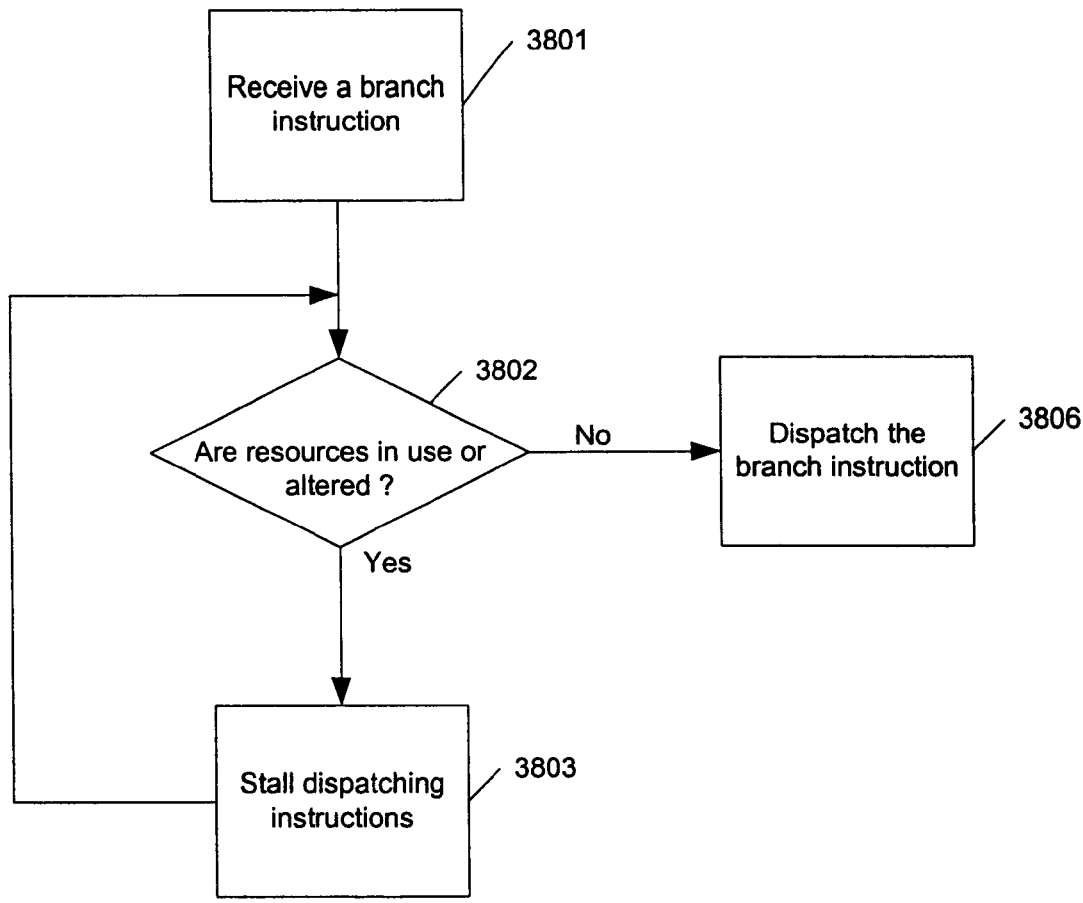
FIG. 28 shows yet another embodiment of dispatching instructions of the present invention.

FIG. 28 shows a method used to dispatch a branch unit instruction in an embodiment of the present invention. When a branch instruction is received 3801, all of the resources required by the branch instruction are checked 3802 whether such resources are in-use or altered by other non-branch instructions. If the resources are available, the branch instruction is dispatched 3806. If the resources required by the branch instruction are in-use or altered by other non-branch instructions, an instruction stall occurs until the resources become available. In one embodiment, such resources may include the condition register, link register, counter register, and the instruction cache control register.

Source resources are corresponding to input operands and the destination resources are corresponding to output operands. For example, for an instruction of "add r1, r2, r3", which is corresponding to "r1=(r2+r3)", r1 is the destination and r2 and r3 are the sources. When the instruction is issued, r1 is marked "in-use". Assuming that the latency of add instruction is two clock cycles, consider the following codes:

$$\text{add } r1, r2, r3 \quad /^* r1 = (r2 + r3)^* /$$

$$\text{subf } r5, r4, r1 \quad /^* r5 = (r1 - r4)^* /$$

Since r1 will be "in-use" in the first instruction, when subf is encountered, the instruction dispatch unit will stall until r1,used by the first instruction, is no longer in-use. Similarly, a stall will occur in the following codes:

$$\text{add } r1, r2, r3 \quad /^* r1 = (r2 + r3)^* /$$

$$\text{subf } r1, r4, r5 \quad /^* r1 = (r5 - r4)^* /$$

where r1 is used in the first instruction and it will not be available for the second instruction, until r1 is no longer in-use by the first instruction. A register is marked in-use by setting a state bit in the register.

A compute engine can be interrupted from the host through a memory-mapped address. An interrupt is sent to the host after various exception conditions or through a software programmable interrupt. A compute engine can be interrupted through a memory-mapped read of its program counter (PC). This read causes a program counter exception to occur which causes instruction fetching to stop. FIG. 29 shows an example of the PC register and state. The PC along with a most significant 2-bit state (PSt) is returned to the requesting host. Commands and instruction fetching would resume only after the host clears the exception condition. The PC register 3900 is a 30 bit address pointing to the location where instruction execution would have continued if the exception did not occur. Table 3901 shows the PC states with corresponding descriptions.

Figure 30:
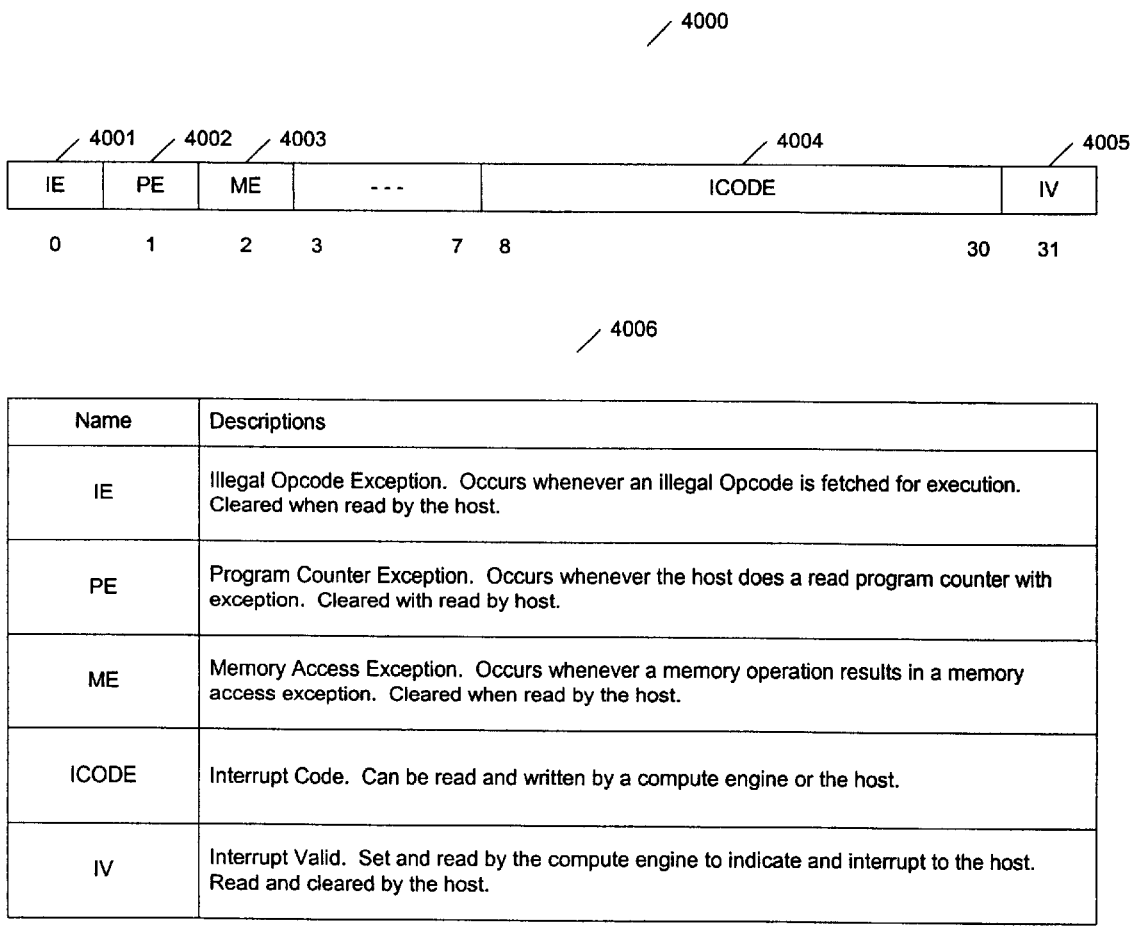
FIG. 30 shows another example of the interrupt control registers of the invention.

Individual compute engine interrupts and exceptions to the host are handled through the compute engine's interrupt register, as shown as register 4000 of FIG. 30. Referring to FIG. 30, interrupt register 4000 contains exception flags 4001–4003 and a software generated interrupt valid 4005 and code field 4004. The interrupt register bits [0:7] (VEOINT) contain the exception flags (e.g., IE 4001, PE 4002, and ME 4003) that are set due to various exception conditions. Table 4006 shows an example of such conditions. When any of the exception flags are on, instruction fetching is disabled and the compute engine is put in a wait state. These bits may be read only and cannot be written from the host or the compute engine. The instruction code (ICODE) 4004 and valid (IV) fields 4005 are used to generate an interrupt from software to the host. The ICODE and IV bits can be read and written from the compute engine code. The method for a compute engine to generate an interrupt is a software convention. When the compute engine wants to generate an interrupt, it should first read the VEOINT register to see if there is an outstanding interrupt. If so, the compute engine should wait until the host has handled the previous interrupt. Otherwise, the VEOINT should be written with the VEOINT bit active (e.g., logical value of one) and the ICODE field reflecting the nature of the interrupt. The host will detect an interrupt through a dedicated signal coming from the media processor and reacts properly by invoking a special exception handler. Besides the individual compute engine interrupts/exceptions to the host, additional interrupts can be generated due to VART exceptions.

Figure 31:
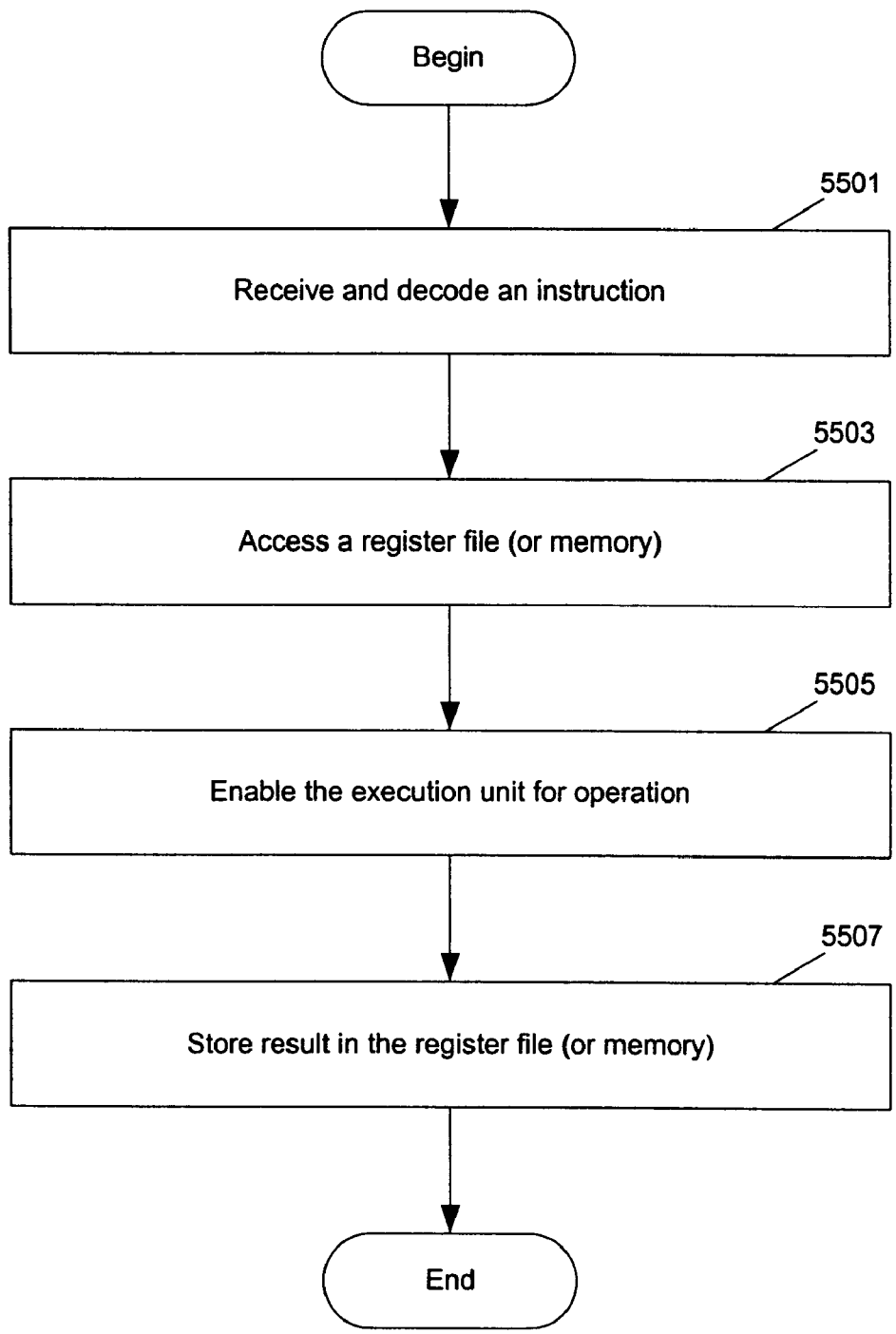
FIG. 31 shows a flow diagram illustrating the general steps used by a processor to manipulate data in executing an instruction according to one embodiment of the invention.

FIG. 31 shows a flow diagram illustrating the general steps used by a processor to manipulate data in executing an instruction according to one embodiment of the invention. In operation 5501, an instruction decoder (e.g., instruction dispatcher 2819 in FIG. 18) receives an instruction (e.g., from instruction cache 2820 in FIG. 18) and decodes the instruction to determine the operations to be performed.

In operation 5503, register files (e.g., register file 2801, vector register file 2802, special purpose register file 2815 in FIG. 18) or memory (e.g., local memory 2817, or system memory 1412) are accessed to retrieve data required for the processing of the instruction. In this operation Direct Memory Access (DMA) controller (e.g., DMA controller 2818) may be used to transfer data from system memory.

In operation 5505, the execution unit (e.g., Vector Simple Integer Unit (VSIU) 2809, Vector Look up Table Unit (VLUT) 2811, or Vector Complex Integer Unit (VCIU) 2810) is enabled to perform the operation on the data accessed in operation 5503. The result is stored into the register file (e.g., vector register file 2802) or into memory (e.g., local memory 2817, or system memory 1412) according to the requirements of the instruction.

In one embodiment of the present invention, data to be processed are first loaded into local memory 2817. A vector of data is loaded into the vector register file before an instruction is executed. After the execution of an instruction is complete, the results stored in the vector register are transferred into the local memory 2817.

At least one embodiment of the present invention seeks to compute the vector of absolute differences of two vectors of numbers (i.e., the absolute difference of the two vectors) by using a single instruction in an execution unit.

Figure 32:
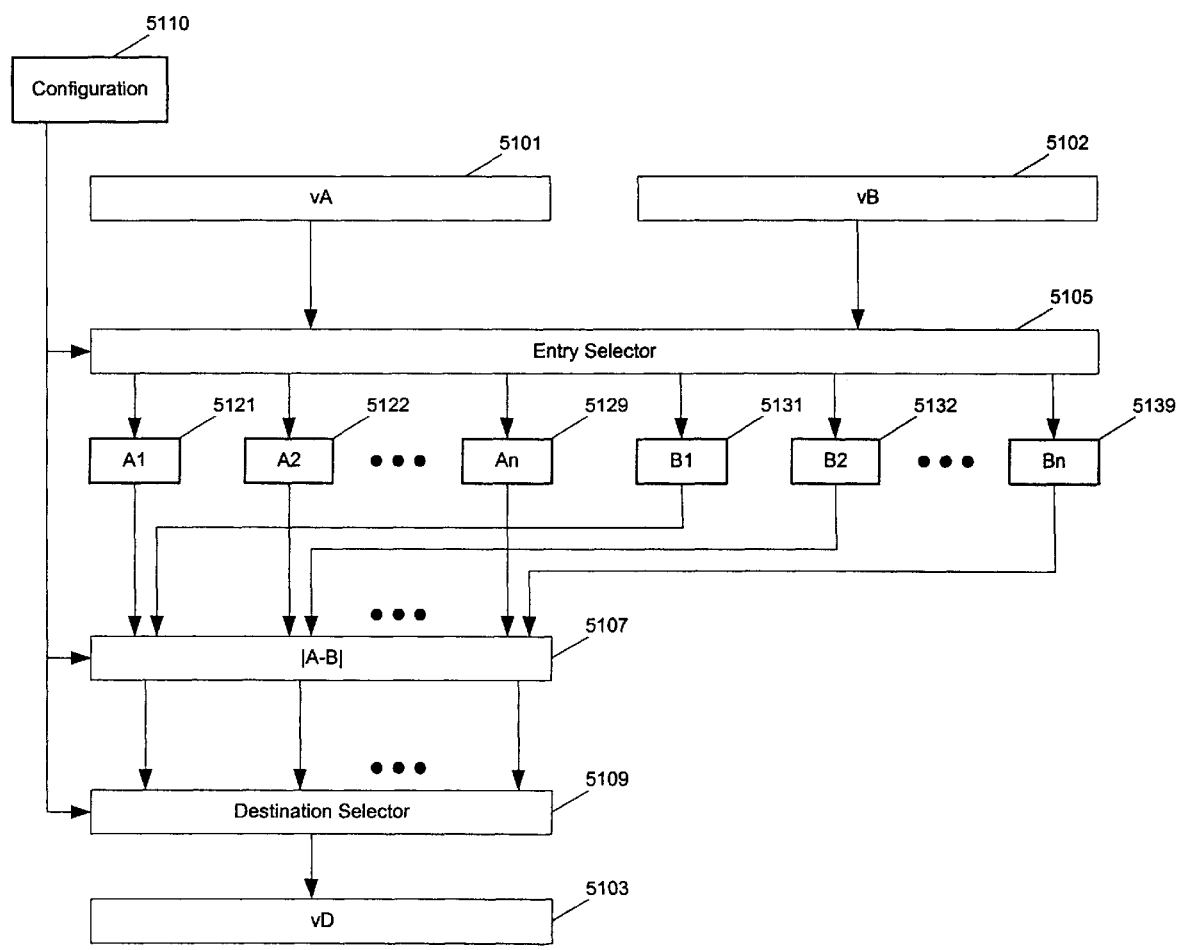
FIG. 32 illustrates a block diagram representation of a circuit for the execution of a method to compute an absolute difference of two vectors of numbers according to one embodiment of the present invention.

FIG. 32 illustrates a block diagram representation of a circuit for the execution of a method to compute an absolute difference of two vectors of numbers according to one embodiment of the present invention. The vectors of numbers, vA and vB, are stored in two entries (5101 and 5102) of a vector register file. After the execution unit receives control information from the instruction dispatcher, entry selector 5105 selects the elements of the vectors from vA and vB. In one embodiment of the present invention, an entry of a vector register file (or, a vector register) contains 128 bit, which may contain 16 8-bit numbers, or 8 16-bit numbers, or 4 32-bit numbers. These numbers can be signed or unsigned. According to configuration 5110 specified by the instruction, entry selector 5105 fetches elements 5121, 5122, . . . , 5129 of vector vA from entry 5101 and elements 5131, 5132, . . . , 5139 of vector vB from entry 5102. These elements are processed by logic unit 5107 to computer the absolute differences of the elements. Destination selector 5109 outputs the result of the absolute differences into entry 5103 of the vector register file.

Figure 33:
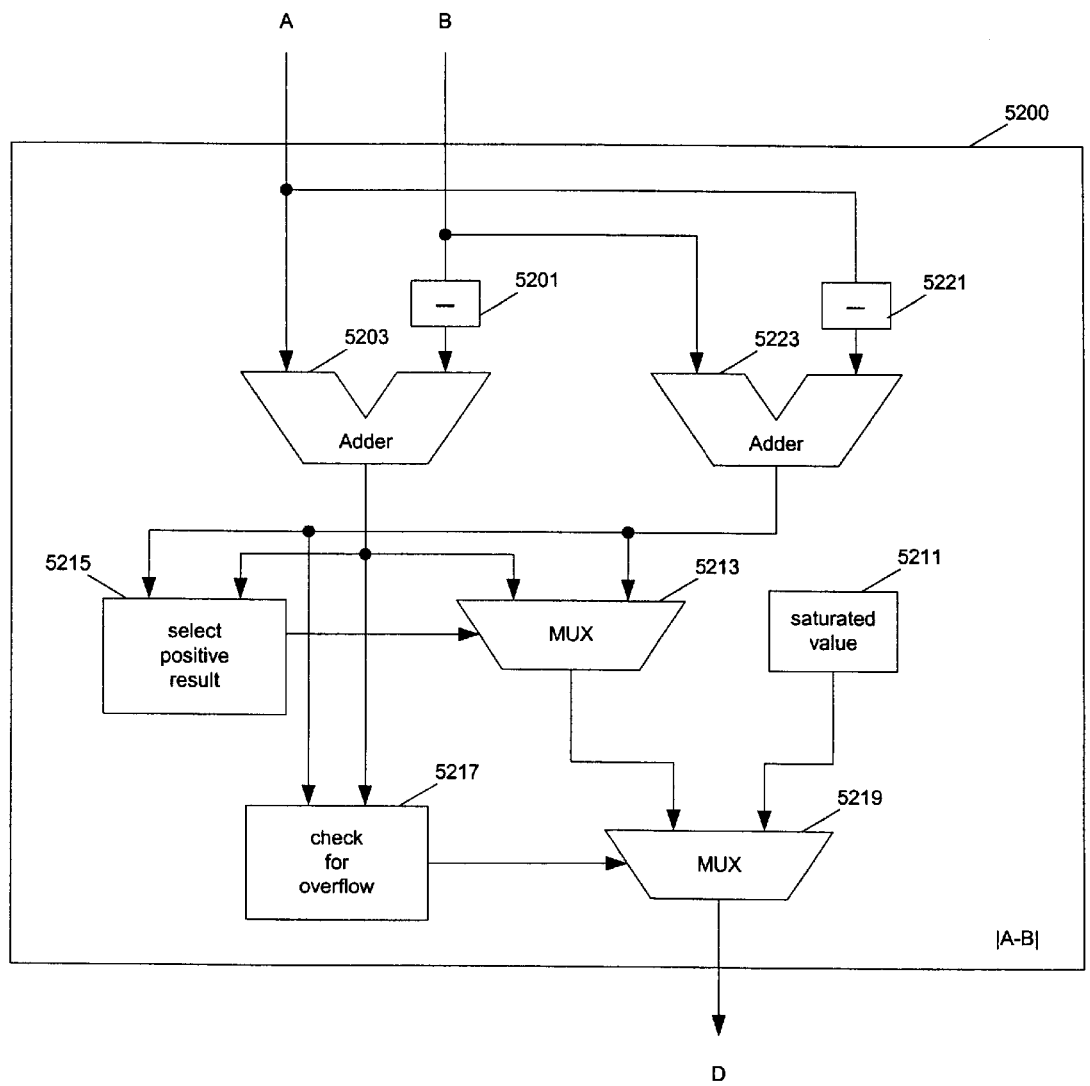
FIG. 33 illustrates a block diagram representation of a circuit for the execution of a method to compute an absolute difference of two numbers according to one embodiment of the present invention.

FIG. 33 illustrates a block diagram representation of a circuit for the execution of a method to compute an absolute difference of two numbers according to one embodiment of the present invention. Input numbers A and B are sent into execution unit 5200 to produce the absolute difference D=|A−B|. Invertors 5201 and 5221 change the sign of the input numbers so that the adders 5203 and 5223 produce A−B and B−A. Logic unit 5215 generates a selection signal from the output of the adders 5203 and 5223, causing multiplexer 5213 to select a positive number from A−B and B−A. When logic unit 5217 determines that the selected result does not overflow, multiplexer 5219 selects the output (|A−B|) from multiplexer 5213 as result D; otherwise, the multiplexer 5219 selects the saturated value (e.g., a value with all bits being set to 1) as result D.

Logic unit 5215 examines the carryout of adder 5203. If there is a carryout, B is larger than A, and the selection signal generated by logic unit 5215 selects the result from adder 5223; otherwise, A is larger than B, and the selection signal selects the result from adder 5203.

For signed number, logic unit 5215 examines the sign bit (the most significant bit) of the output of adder 5223. If the sign bit is high, A is larger than B, and the selection signal generated by logic unit 5215 selects the result from adder 5203; otherwise, B is larger than A, and the selection signal selects the result from adder 5223.

For unsigned numbers, the absolute difference of two numbers is always less or equal to the larger one of the input numbers. Thus, there cannot be an overflow, and the operation will never saturate.

For signed numbers, logic unit 5217 checks the results of both adders 5203 and 5223. The carryout and carryin of the sign bit of each result are examined. If the carryout of the sign bit of one of the result is low and the carryin of the same bit is high, an overflow occurs. When an overflow is detected, logic unit 5217 generates a signal to cause multiplexer 5219 to select a saturated value as result D.

Figure 34:
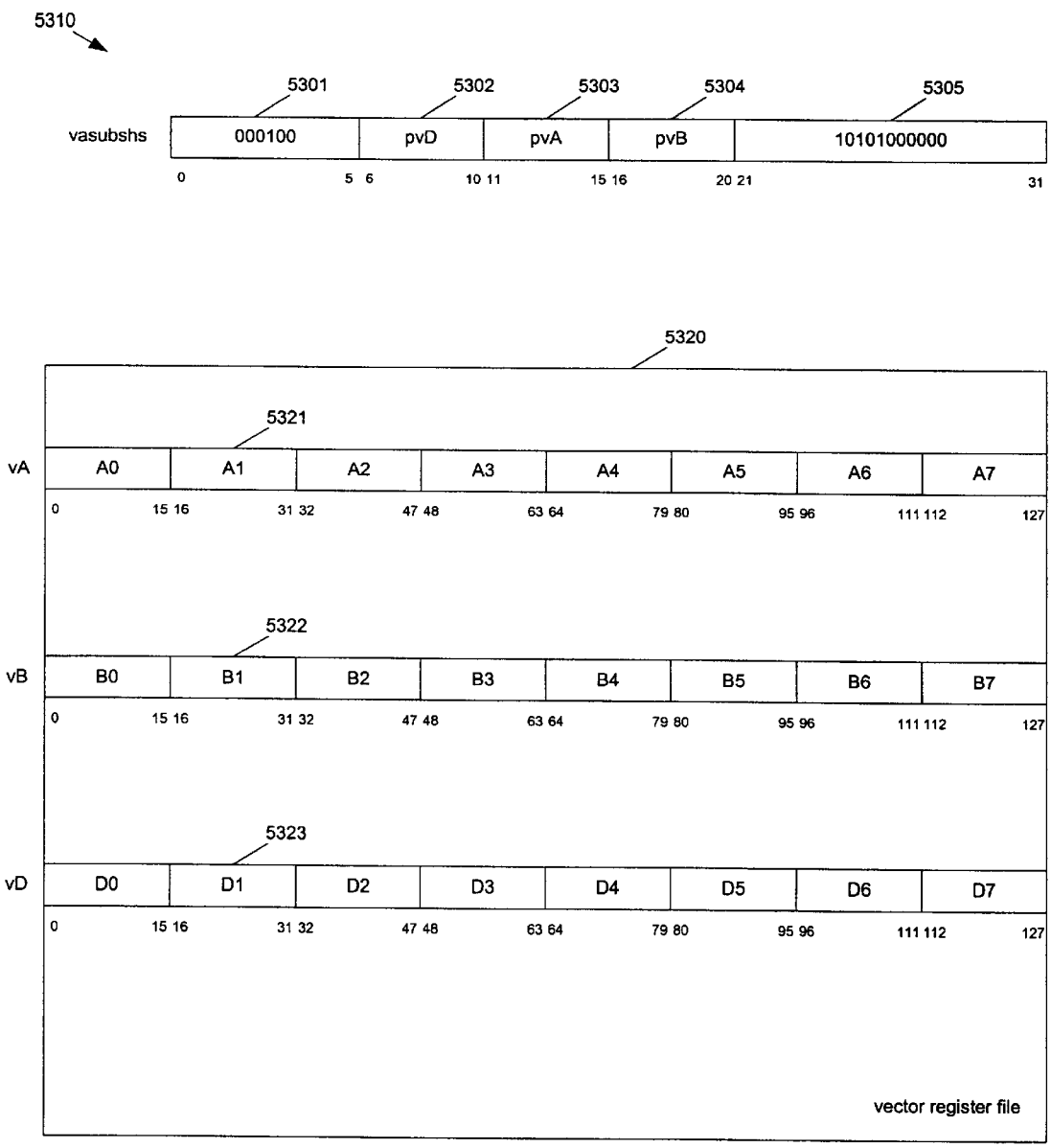
FIG. 34 illustrates data representations for the execution of an instruction for the computation of absolute difference of two vectors of numbers according to one embodiment of the present invention.

FIG. 34 illustrates data representations for the execution of an instruction for the computation of absolute difference of two vectors of numbers according to one embodiment of the present invention. Instruction 5310 illustrates the data representation in instruction vasubshs for the evaluation of the absolute difference of two vectors of numbers, each of which is a signed halfword (16 bits). Vector register file 5320 contains a number of entries (e.g., 32 entries). Each of the entry has 128 bits, which can hold 8 halfwords. Vectors vA, vB and vD, each having 8 halfword numbers, are stored in three entries of the vector register file (i.e., 3 vector registers). For example, the second number of vA, A1, is stored in bit segment 5321; the second number of vB, B1, is stored in segment 5322; and the result, D1=|A1−B1|, is stored in segment 5323. The addresses of these entries for vectors vA, vB, and vD are specified in instruction 5310. Three 5-bit segments 5302, 5303, and 5304 in instruction 5310 are used to encode the addresses of the entries in the vector register file for vectors vA, vB and vD. Segments 5301 and 5305 are used to encode the identification of the instruction.

While FIG. 34 illustrates an example in which each number is a halfword, other instructions can be implemented where each element of the vectors is a byte (8 bits), or a word (32 bits), etc. For example, when a register file with 128-bit entries is used, an absolute difference of vectors of 16 8-bit signed or unsigned numbers can be evaluated using a single instruction. The numbers can be signed or unsigned, integers or floating-point numbers. It will be apparent to one skilled in the art that instructions can also be implemented for register files with entries of more than 128 bits each, where more elements can be processed in a single instruction.

Figure 35:
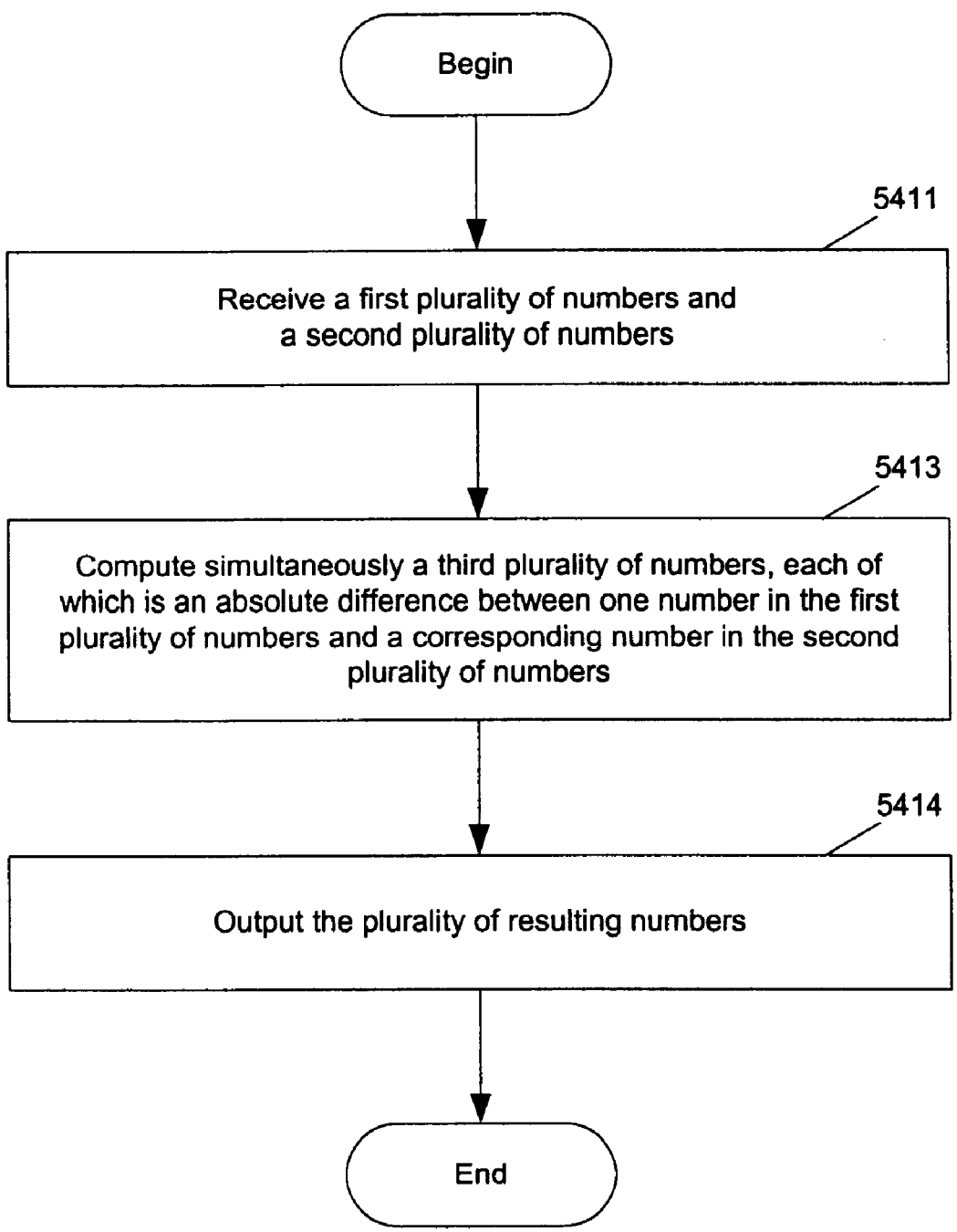
FIG. 35 shows a flow diagram for a method of computing the absolute difference of two vectors of numbers according to one embodiment of the present invention.

FIG. 35 shows a flow diagram for a method of computing the absolute difference of two vectors of numbers according to one embodiment of the present invention. In operation 5411, the execution unit receives two vectors of numbers from a register file. Then, the execution unit simultaneously computes the absolute difference of the two input vectors of numbers in operation 5413. In operation 5414, the resulting vector that contains the absolute differences of the corresponding elements of the two vectors of numbers is stored in an entry of the register file.

Figure 36:
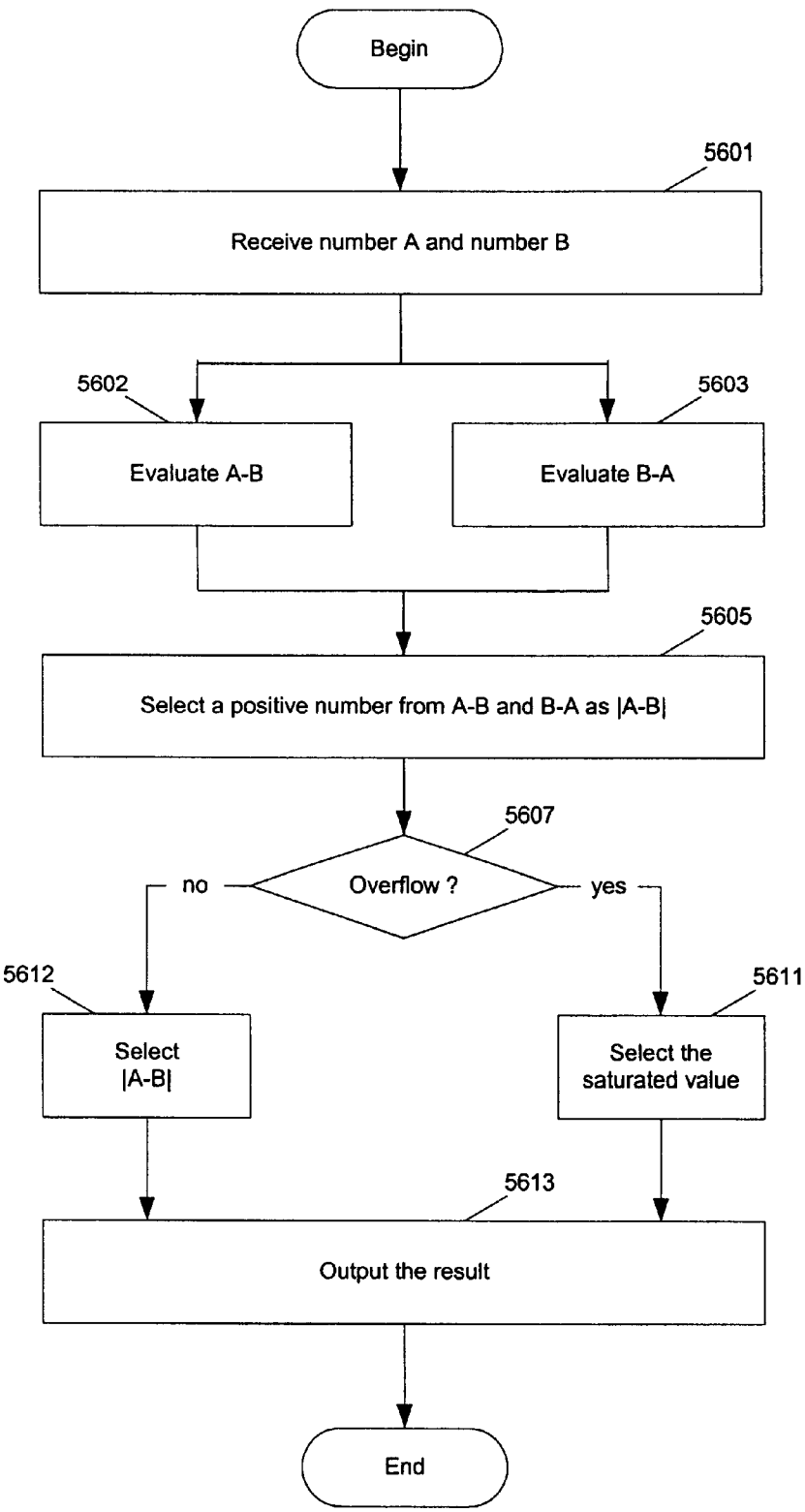
FIG. 36 shows a flow diagram for a method of computing the absolute difference of two numbers according to one embodiment of the present invention.

FIG. 36 shows a flow diagram for a method of computing the absolute difference of two numbers according to one embodiment of the present invention. After receiving numbers A and B in operation 5601, operations 5602 and 5603 evaluate A−B and B−A simultaneously. In operation 5605 a positive number is selected from A−B and B−A as |A−B|. Then, operation 5607 checks if overflow occurs during the evaluation of A−B and B−A. If an overflow is detected, a saturated value is selected as the result in operation 5611; otherwise, |A−B| is selected as the result. Operation 5613 outputs the result. The method illustrated in FIG. 36 can be used for the evaluation of absolute difference of vectors of signed, unsigned, or floating point numbers. While FIG. 36 shows a preferred embodiment, other embodiments may also be implemented. For example, in one embodiment, A−B is first evaluated. Then, the sign of the resulting number is examined. Then, −(A−B) is evaluated. If it is determined that A−B is negative, −(A−B) is selected as the result, otherwise, A−B is selected as the result. Note that the overflow detection (operations 5607, 5612 and 5611) for saturation of results (e.g., operations 5607, 5612 and 5611) can be optional.

One embodiment of the present invention is a code sequence to perform the Sum of Absolute Differences (SAD) of pixel data. A SAD of pixel data is a measure of the closeness of the attributes of two vectors of pixels. It is commonly used in algorithms for image processing, such as for de-interlacing, motion estimation and pull down detection. The following code sequence loads vectors of pixel attributes from memory, computes the absolute difference of the vectors of pixel attributes, and sums up the absolute differences to produce a scalar measure, SAD. The blocks of 8-bit pixel attributes are stored line after line with 16 pixels per line. The scalar and vector units of a computer engine (e.g., computer engine 2800 in FIG. 18) work in parallel. To compute the SAD, the Integer Arithmetic/Logic Unit (IALU 2805) increases the index for accessing the data in memory; the Load/Store Unit (LSU 2816) loads data from memory into vector resisters; the Vector Simple Integer Unit (VSIU 2809) produces a vector absolute differences; and the Vector Complex Integer Unit (VCIU 2810) sums the vector of absolute differences into SAD.

Although the following code sequence illustrates only the computation of SAD for vectors of 16 pixels with 8-bit attributes, it will be apparent to one skilled in the art that this method may be used in computing SAD for vectors of various sizes and vectors of pixel attributes of various data sizes, and also for other applications such as iteratively solving large systems of equations and fitting a curve to a number of points in image reconstruction from projection data.

In the following code sequence, rBase represents the pointer to the memory where the block of pixel attributes resides; rIndex is the index for accessing the current vector of 16 pixels; v0, v1, v2, and v3 are vectors of 8-bit pixel data; vZero represents a vector of zeros; and instructions saddi, lvx, vasubub, vsum4ubs and vsumsws have single cycle latency.

```
{       saddi(rIndex, rIndex, 16)  //  IALU:  increase rIndex by 16
        lvx ( v0, rBase, rIndex)   //  LSU:   load v0
}  //   group A1
{       saddi(rIndex, rIndex, 16)  //  IALU:  increase rIndex by 16
        lvx ( v1, rBase, rIndex)   //  LSU:   load v1
}  //   group A2
{       saddi(rIndex, rIndex, 16)  //  IALU:  increase rIndex by 16
        lvx ( v2, rBase, rIndex)   //  LSU:   load v2
        vasubub(v7, v0, v1)        //  VSIU:  compute v7=|v0−v1|
}  //   group A3
{       saddi(rIndex, rIndex, 16)  //  IALU:  increase rIndex by 16
        lvx ( v3, rBase, rIndex)   //  LSU:   load v3
```

```
        vsum4ubs(v7, v7, vZero)  // VCIU: partial sum v7 of
                                         elements in v7
} // group A4
{       vasubub(v8, v2, v3)      // VSIU: compute v8=|v2-v3|
        vsumsws(v7, v7, vZero)   // VCIU: sum elements of v7
} // group A5
```

When instructions in group A1 are executed, LSU loads the first vector of 16 8-bit pixel data into vector register v0 by executing the lvx instruction; and, by executing the saddi instruction, IALU increases rIndex by 16 so that rIndex points to the vector of next 16 8-bit pixel data, which will be loaded when the instructions in group A2 are executed. In group A2, LSU loads the second vector of pixel data into vector register v1; and IALU updates rIndex. In group A3, VSIU computes the absolute difference of v0 and v1 by executing the vasubub instruction; and LSU loads the third vector into vector register v2, while IALU updates rIndex.

Instruction vsum4ubs partially sums a vector of data elements. For example, if vA contains 16 8-bit data elements $$\{vA0, vA1, vA2, vA3, vA4, vA5, vA6, vA7,$$
$$vA8, vA9, vA10, vA11, vA12, vA13, vA14, vA15\},$$

and vB contains 4 32-bit data elements $$\{vB0, vB1, vB2, vB3\},$$

the execution of instruction vsum4ubs(vD, vA, vB) produces vector vD which contains 4 32-bit data elements $$\{vD0, vD1, vD2, vD3\},$$

where $$vD0 = vB0 + vA0 + vA1 + vA2 + vA3;$$
$$vD1 = vB1 + vA4 + vA5 + vA6 + vA7;$$
$$vD2 = vB2 + vA8 + vA9 + vA10 + vA11;\ \text{and}$$
$$vD3 = vB3 + vA12 + vA13 + vA14 + vA15.$$

In group A_b 4, VCIU partially sums the 16 8-bit absolute differences stored in v7 into 4 32-bit partial sums by executing the vsum4ubs instruction. At the same time, the forth vector is loaded into v3 by LSU, and rIndex is updated again by IALU.

Instruction vsumsws is used to sum a vector of data elements. For example, if vA contains 4 32-bit data elements $$\{vA0, vA1, vA2, vA3\},$$

and vB contains 4 32-bit data elements $$\{vB0, vB1, vB2, vB3\},$$

vsumsws(vD, vA, vB) produces vD which contains 32-bit data elements $$\{vD0, vD1, vD2, vD3\},$$

where $$vD0 = vB0 + vA0 + vA1 + vA2 + vA3.$$

In group A5, VSIU computes the absolute difference between v2 and v3; and, by executing the vsumsws instruction, VCIU produces the sum of absolute difference of v0 and v1.

In the above code sequence, a SAD is computed in 3 cycles in average, since updating indices and loading vectors of pixel attributes are done in parallel with the computations of the SAD. Thus, a method of computing a sum of absolute difference (SAD) according to an embodiment of the present invention is much more efficient than prior art methods.

At least one embodiment of the present invention seeks to perform vector table look-up by using a single instruction in an execution unit. The execution unit has a bank of look-up memory, comprising a number of look-up units, which can be configured into a number of look-up tables in a fashion indicated by an instruction in order to simultaneously look up a vector of data elements. Each of the data elements is looked up from one of the look-up tables. A look-up unit will be understood to be a memory unit that can be individually addressed and accessed, independent of the operations of the other memory units. A look-up unit can be used as a look-up table, However, in at least one embodiment of the present invention, a number of look-up units are combined to form a look-up table, according to the configuration specified by the instruction.

Figure 37:
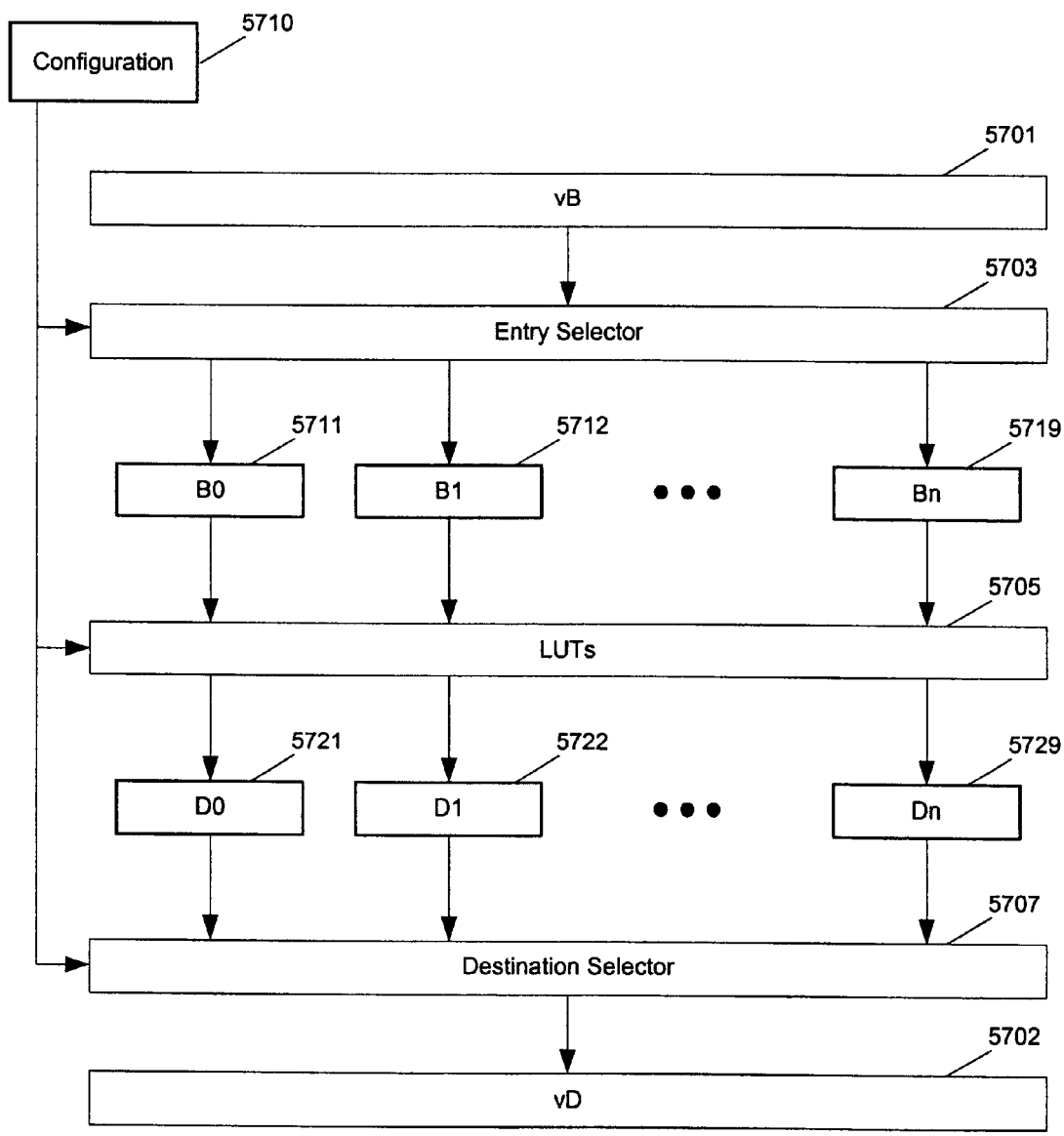
FIG. 37 illustrates a block diagram representation of a circuit for the execution of a method to perform table look-up of a vector of data elements according to one embodiment of the present invention.

FIG. 37 illustrates a block diagram representation of a circuit for the execution of a method to perform table look-up of a vector of data elements according to one embodiment of the present invention. Entry 5701 in a vector register file contains a vector of indices, vB, for a vector look-up operation. After the execution unit receives control information from an instruction dispatcher, entry selector 5703 selects the indices from vB. In one embodiment of the present invention, an entry of a vector register file contains 128 bits, which may contain 16 8-bit indices, or 8 16-bit indices. According to configuration 5710 specified by the instruction, entry selector 5703 fetches indices 5711, 5712, . . . , 5719 from entry 5701. These indices are used by look-up units 5705 to select the entries 5721, 5722, . . . , 5729 from the look-up tables according to configuration 5710 specified by the instruction. Destination selector 5707 outputs the result of the vector look-up operation into entry 5702 of the vector register file.

Figure 38:
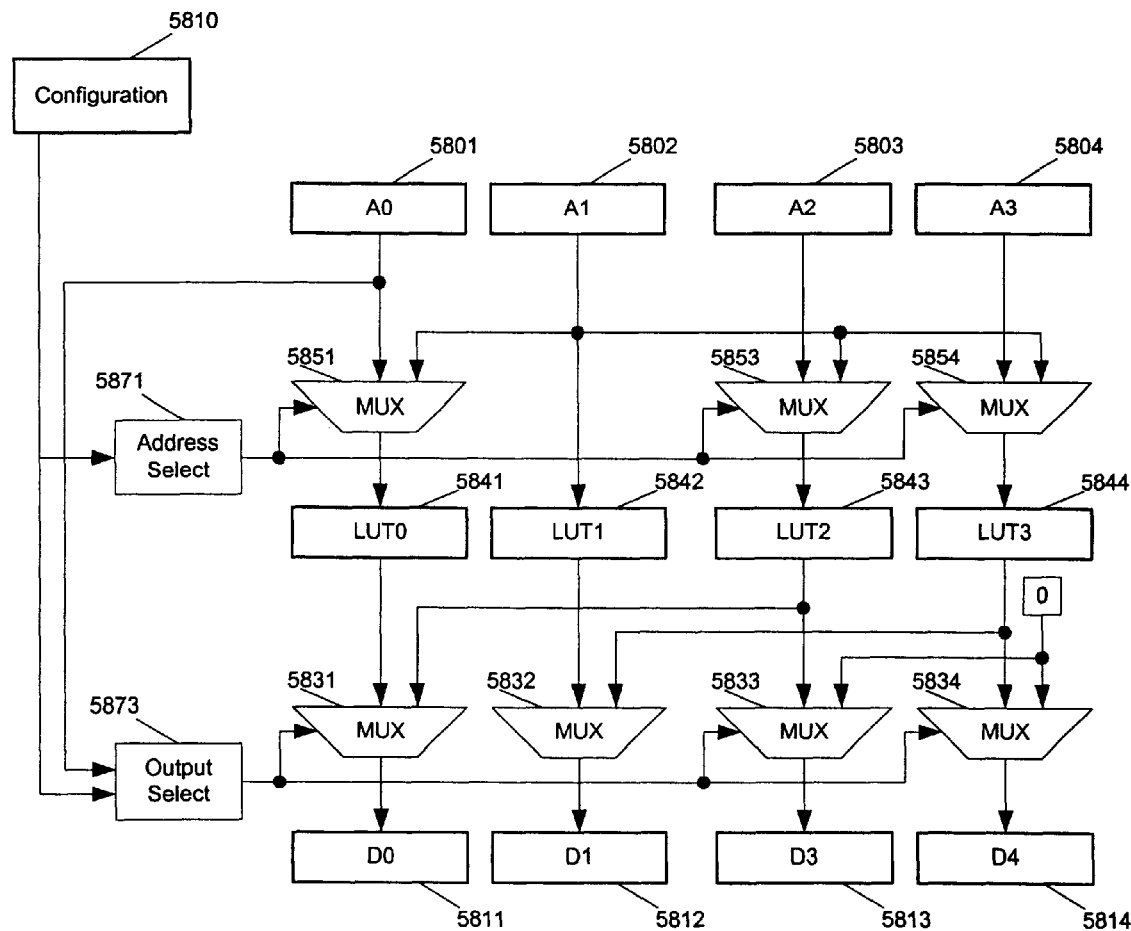
FIG. 38 illustrates a block diagram representation of a circuit for configuring look-up units into different look-up tables according to one embodiment of the present invention.

FIG. 38 illustrates a block diagram representation of a circuit for configuring look-up units into different look-up tables according to one embodiment of the present invention. In one embodiment of the present invention, memory for the storage of entries of look-up tables, i.e., look-up memory, contains a number of look-up units. Each of the look-up units 5841–5844 (LUT0–LUT3) contains 256 8-bit entries. Each of indices 5801–5804 (A0–A3) is 8-bit. Thus, a single 8-bit index can be used to look up any element in a look-up unit.

In one configuration as specified by configuration 5810, indices A0–A3 are used independently in 4 look-up tables to look up for 4 entries 5811–5814 (D0–D3). Look-up units LUT0–LUT3 are used as 4 look up tables. In this configuration, logic unit 5871 generates a selection signal causing multiplexer 5851, 5853, and 5854 to select index A0

(5801) for look-up unit LUT0 (5841), A2 for LUT2, and A3 for LUT3. Logic unit 5873 generates a selection signal causing multiplexer 5831, 5832, 5833, and 5834 to select the result from LUT0 to entry D0 (5801), LUT1 to D1, LUT2 to D2, and LUT3 to D3. Thus, 4 elements (D0–D3) are looked up simultaneously from 4 look-up tables using 4 8-bit indices (A0–A1) using a single instruction. Each of the look-up tables has 256 8-bit entries, In another configuration (5810) specified by an instruction, look-up units LUT0–LUT3 are combined into a single table with 512 16-bit entries. LUT0 and LUT1 contain the upper and lower 8 bits of the first 256 entries; LUT2 and LUT3 contain the upper and lower 8 bits of the rest of the entries. In this case, 9-bit indices are necessary in order to look up an arbitrary located element from a table. A0 and A1 are combined to store a 9-bit index, where A1 (5802) contains the lower 8 bits of the index, and A0 contains the remaining bits. Logic unit 5871 generates a signal causing multiplexer 5851, 5853, and 5854 to select bits in A1 to be used in look-up units LUT0, LUT2, and LUT3. Logic unit 5873 generates a selection signal causing multiplexers 5831, 5832, 5833, and 5834 to select the results from LUT0 and LUT1 to D0 and D1 when the index bit in A0 is 0, and to select the results from LUT2 and LUT3 to D0 and D1 when the index bit in A0 is 1. Zero is selected for D3 and D4. Thus, a 9-bit index stored in A0 and A1 can be used to look up an entry in a table of 512 16-bit entries. The result of the look-up operation is stored in D0 and D1; and the 4 look-up units LUT0–LUT3 are combined into a single look-up table. It will be appreciated that a number of units as shown in FIG. 38 may be used in order to look up simultaneously a vector of data elements. For example, when 4 units of those shown in FIG. 38 is used, a vector of 16 8-bit elements can be looked up simultaneously from 16 256-entry tables in one configuration; and a vector of 4 16-bit elements can be looked up simultaneously from 4 512-entry tables in another configuration.

Figure 39:
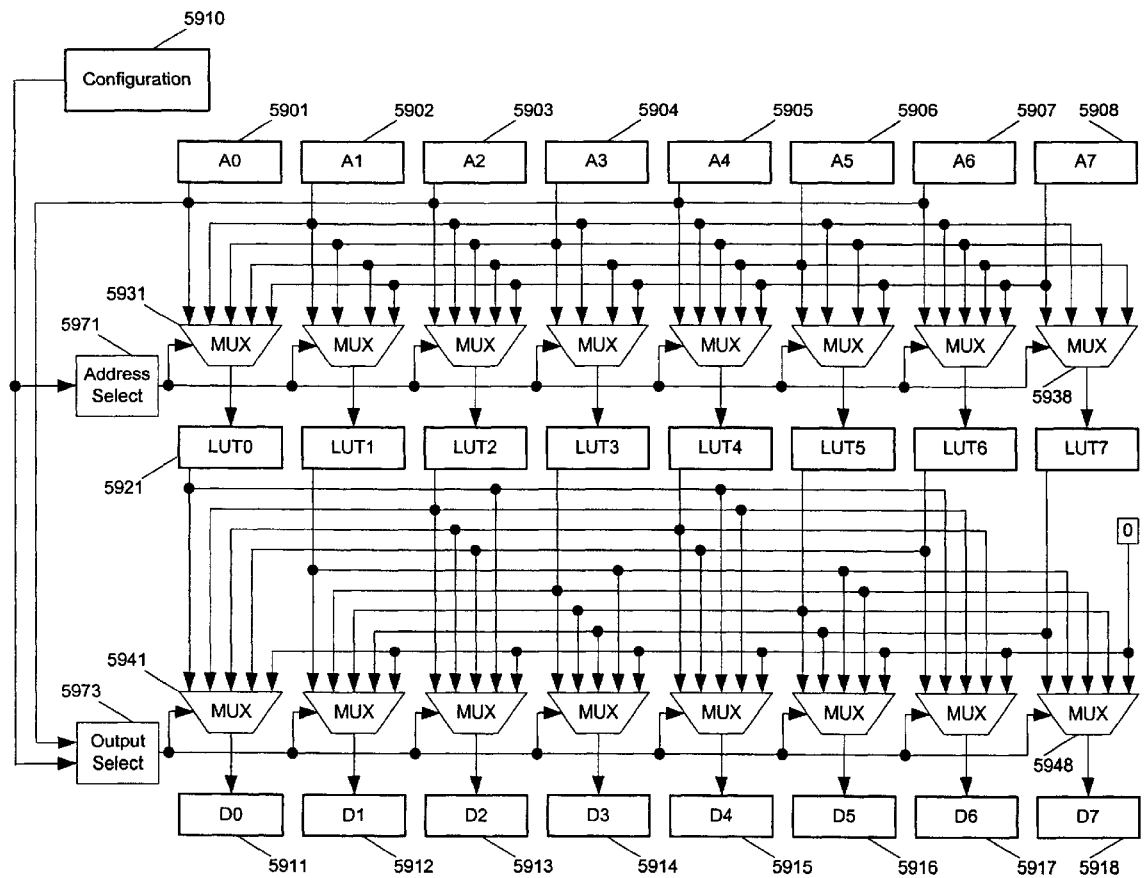
FIG. 39 illustrates another block diagram representation of a circuit for configuring look-up units into different look-up tables according to one embodiment of the present invention.

FIG. 39 illustrates another block diagram representation of a circuit for configuring look-up units into different look-up tables according to one embodiment of the present invention. In one configuration, 8 look-up units LUT0–LUT7 are used as 8 independent look-up tables, each of which contains 256 8-bit entries. Eight 8-bit indices A0–A7 are used to simultaneously look up 8 16-bit entries into D0–D8, each from a corresponding look-up table.

In another configuration, look-up units LUT0–LUT7 are used as 2 independent look-up tables, each of which contains 512 16-bit entries. LUT0 and LUT1 contain the upper and lower 8 bits of the first 256 entries of the first table; and LUT2 and LUT3 contain the upper and lower 8 bits of the rest of the entries of the first table. Similarly, LUT4–LUT7 contain the entries of the second table. Two 9-bit indices stored in A0–A7 are used to select 2 16-bit entries into D0–D7. For example, in one configuration, the first index is stored in A0 and A1, and the second index is store in A4 and A5, where the lower 8 bits of the first and second indices are stored in A1 and A5. According to configuration 5910, logic unit 5971 generates a control signal causing the multiplexers (e.g., 5931, 5938) to select A1 for LUT0–LUT3 and A5 for LUT4–LUT7. According to configuration 5910 and the bits in A0 and A4, logic unit 5973 generates signals causing the multiplexers (e.g., 5941, 5948) to select look-up results from LUT0–LUT7 into D0–D7. For instance, when A4 is 0, the results from LUT4 and LUT5 are selected into D4 and D5, and zero is selected into D6 and D7; when A4 is 1, the results from LUT6 and LUT7 are selected into D4 and D5, and zero is selected into D6 and D7. Similarly, the first index can be stored in A2 and A3, and the second index can be stored in A6 and A7, where the lower 8 bits of the first and second indices are stored in A3 and A7. Two 16-bit results of the look-up operation can be stored in D2, D3, D6, and D7. Thus, two 9-bit indices can be used to simultaneously look up two 16-bit entries from two 512-entry tables.

In another configuration, look-up units LUT0–LUT7 are used as a single look-up table containing 1024 16-bit entries. LUT0 and LUT1 contain the upper and lower 8 bits of entries 1–256; LUT2 and LUT3 contain entries 257–512; LUT4 and LUT5 contain entries 512–768; and LUT6 and LUT7 contain entries 769–1024. A 10-bit index is stored in A0–A7 to select a 16-bit data from the table into D0–D7. For example, the lower 8 bit of the index is stored in A1, and the rest of the bits are stored in A0. Logic unit 5971 generates a selection signal causing the multiplexers to select A1 for LUT0–LUT7. Logic unit 5973 selects zero into D2–D7, and selects a result from LUT0–LUT7 into D0 and D1 according to the index bits in A0. Thus, a 10-bit index can be used to look up a 16-bit entry from a 1024-entry table. It will be appreciated that if a vector register has 128 bits, two units as shown in FIG. 39 may be used to simultaneously look up a vector of 16 8-bit elements from 16 256-entry tables in one configuration; a vector of 4 16-bit elements from 4 512-entry tables in another configuration; and a vector of 2 16-bit elements from 2 1024-entry tables in another configuration.

FIG. 38–39 illustrates two examples of circuits for dynamically configuring look-up units into a number of look-up tables according to a configuration signal. It will be apparent to one skilled in the art that the method illustrated in FIG. 38–39 can be used for designing circuits where the look-up units have a different size, or where there are a different number of look-up units, or where there are different combinations of configurations.

FIG. 40 illustrates data representations for the execution of an instruction for performing table look-up of a vector of data elements according to one embodiment of the present invention. Instruction 6010 illustrates the data representation in instruction vlut9al for looking up a vector of 4 16-bit data from 4 512-entry look-up tables using 4 9-bit indices. Vector register file 6020 contains a number of entries (e.g., 32 entries). Each of the entry has 128 bits, which can hold 8 halfwords. Vectors vB and vD, each having 8 halfword numbers, are stored in two entries of the vector register file. The four 9-bit indices (B1, B3, B5, B7) are stored in bit segments 6021, 6022, 6023 and 6024 in an entry for vB. The address of vB is specified in bit segment 6004 in instruction 6010. The entries of the look-up tables 6031–6034 (TAB0–TAB3) are pre-loaded into look-up units before the execution of the instruction. In one embodiment of the present invention, 16 look-up units are configured into look-up tables TAB0–TAB3 according to the instruction. Each of 16 look-up units contains 256 8-bit entries. During the execution of the instruction, table entries 6041–6044 are selected and stored in bit segments 6026, 6027, 6028, and 6029 of an entry vD in the vector register file. The address of vD in the vector register file is specified by bit segment 6002 in instruction 6010. Bit segments 6001, 6004, and 6005 specify the identity of the instruction, including the configuration for the look-up tables. Thus, four data elements can be looked up simultaneously from four different tables of 512 16-bit entries using a single instruction, vlut9al.

While FIG. 40 illustrates an example in which each index has 9 bits and each table has 512 16-bit entries, other instructions can be implemented where each index has 8 bits, or 10 bits, and each table has 256 8-bit entries, or 1024 16-bit entries, or others. It will be apparent to one skilled in the art that instructions can also be implemented for register files where each entry has more than 128 bits, and where the look-up units have more memory capacities, such that more look-up operations may be performed simultaneously in a single instruction.

Figure 41:
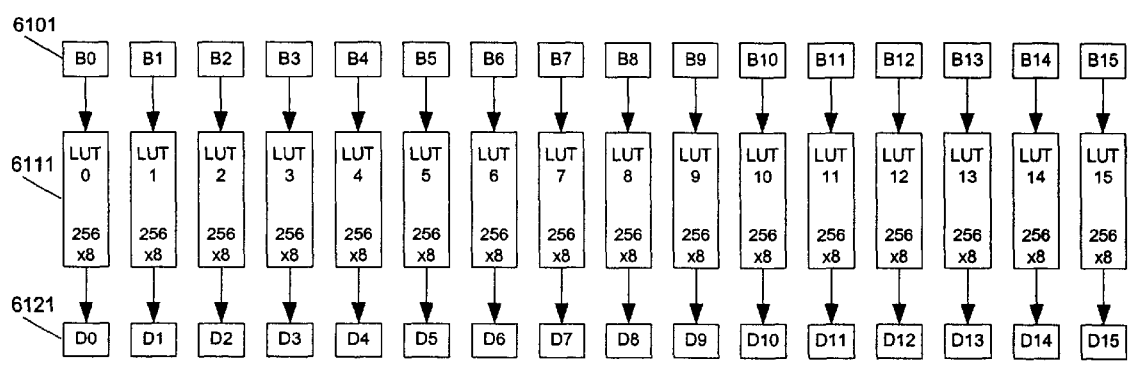
FIGS. 41–43 illustrate block diagram representations of circuits for performing table look-up of vectors of different sizes using a set of look up units according to one embodiment of the present invention.
Figure 42:
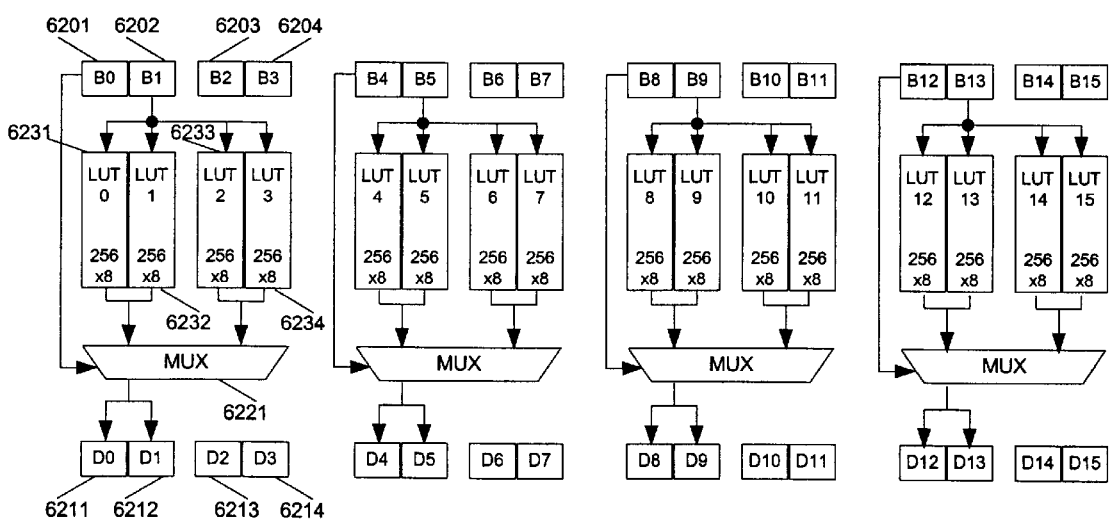
Figure 43:
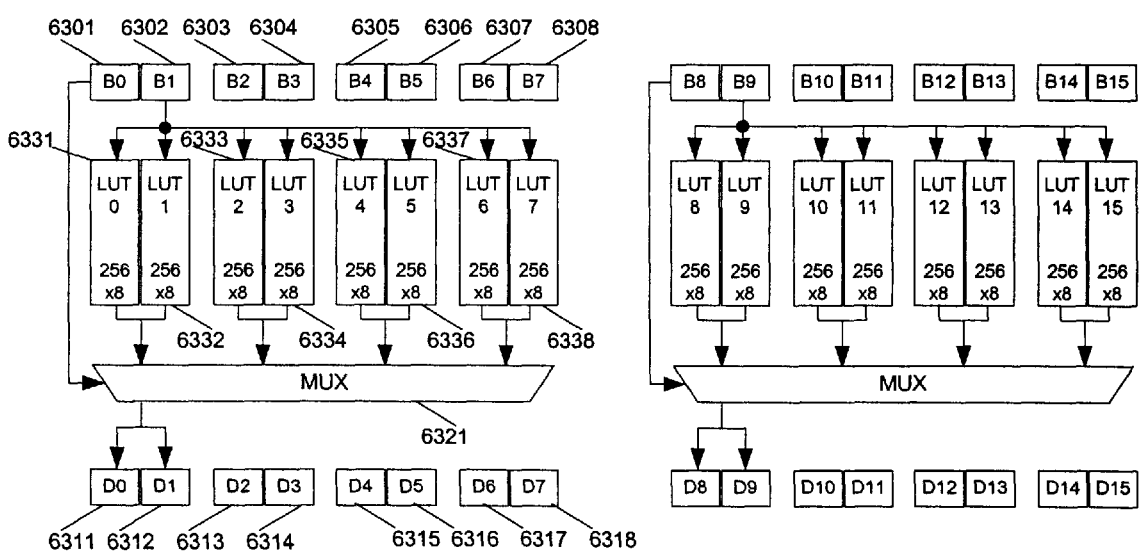

FIGS. 41–43 illustrate block diagram representations of circuits for performing table look-up of vectors of different sizes using a set of look up units according to one embodiment of the present invention. FIG. 41 shows a configuration where 16 8-bit indices are used in 16 look-up units to simultaneously look up 16 8-bit data using a single instruction. For example, index B0 (6101) is used in LUT0 (6111), used as a table of 256 8-bit entries, to look-up an entry and store it in D0 (6121).

FIG. 42 shows a configuration where 4 9-bit indices are used in 16 took-up units to simultaneously look up four 16-bit data using a single instruction. For example, an index is stored in B0 and B1 (6201 and 6202). B1 contains the lower 8-bits of the index; and B0 contains the remaining bit. B1 is used to look up data in look-up units 6231–6234 (LUT0–LUT3). Two successive look-up units are combined for storing the lower and higher 8-bit bit segments of table entries. For example, an entry in LUT0 contains the higher 8 bits of a 16-bit table entry; a corresponding entry in LUT1 contains the lower 8 bits of the 16-bit table entry; and these two entries from LUT0 and LUT1 can be combined to represent the 16-bit table entry. Multiplexer 6221 selects a result from the output of LUT0–LUT3 into D0 and D1 (6211 and 6212), depending the state of the index bit in B0. D1 contains the lower 8 bits of the result; and D0 contains the higher 8 bits of the result. When B0 is 0, the index is in the range of 0 to 255, and the results from LUT0 and LUT1 are selected; otherwise, the index is in the range of 256–511, and the results from LUT2 and LUT3 are selected. LUT1 and LUT3 contain the lower 8 bits of the 512 table entries, and LUT0 and LUT2 contain the higher 8 bits of the 512 table entries. In this configuration, bit segments 6203 and 6204 are not used; and 6213 and 6214 are set to zero.

FIG. 43 shows a configuration where 2 10-bit indices are used in 16 look-up units to simultaneously look up 2 16-bit data using a single instruction. For example, an index is stored in B0 and B1 (6301 and 6302). B1 contains the lower 8-bits of the index; and B0 contains the remaining two bits. B1 is used to look up data in look-up units 6331–6338 (LUT0–LUT7). Multiplexer 6321 selects a result from the output of LUT0–LUT7 into D0 and D1 (6311 and 6312), depending the index bits in B0. D1 contains the lower 8 bits of the result; and D0 contains the higher 8 bits of the result. When B0 is 0, the index is in the range of 0 to 255, and the results from LUT0 and LUT1 are selected; when B0 is 1, the index is in the range of 256–511, and the results from LUT2 and LUT3 are selected; when B0 is 2, the index is in the range of 512–767, and the results from LUT4 and LUT5 are selected; when B0 is 3, the index is in the range of 768–1023, and the results from LUT6 and LUT7 are selected. LUT1, LUT3, LUT5 and LUT7 contain the lower 8 bits of the 1024 table entries, and LUT0, LUT2, LUT4 and LUT6 contain the higher 8 bits of the 1024 table entries. In this configuration, bit segments 6303–6308 are not used; and 6313–6318 are set to zero.

Figure 44:
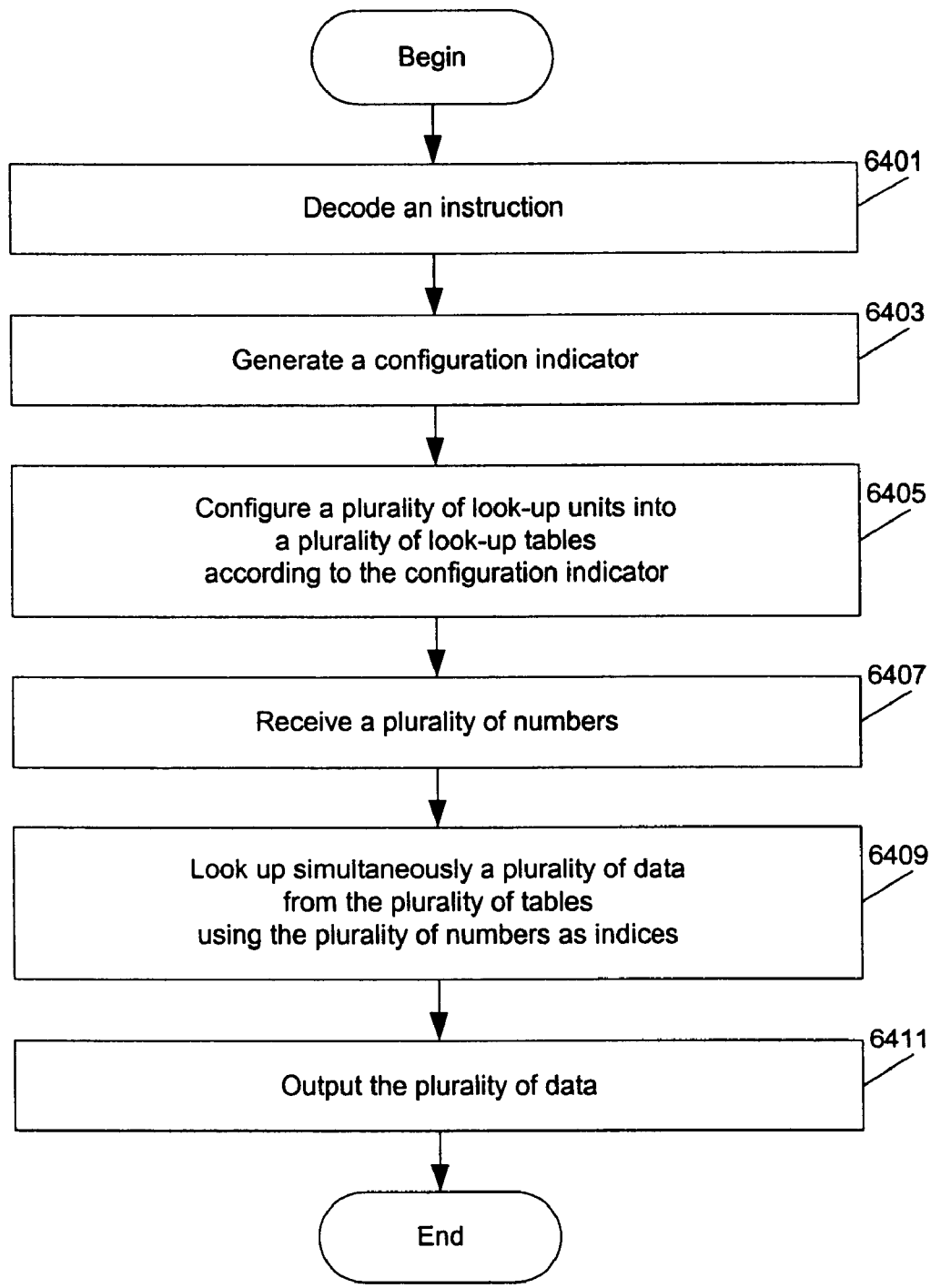
FIG. 44 shows a flow diagram for a method to perform table look-up of a vector of data elements according to one embodiment of the present invention.

FIG. 44 shows a flow diagram for a method to perform table look-up of a vector of data elements according to one embodiment of the present invention. In operation 6401, the instruction is decoded (e.g., by instruction dispatcher 2819, or by instruction decoder 1502). A configuration indicator is generated in operation 6403. The configuration indicator indicates how to configure the look-up units into a number of look-up tables for the execution of the instruction. According to the configuration indicator, operation 6405 configures the look-up units into look-up tables. In operation 6407, a vector of numbers are received as indices for the vector look-up operation using the look-up tables. Operation 6409 simultaneously looks up a vector of data elements, each data element from one of the look-up tables using a corresponding index. Since the look-up tables are configured from the plurality of look-up units according to the configuration indicator, indices are typically generated from the plurality of numbers for look-up operations in the look-up units, and the results from the look up units are selected and combined into the plurality of data elements. For some configuration, only a subset of the plurality of look-up units is used to form the look-up tables. Operation 6411 outputs the vector of looked-up data into a register file (or memory).

Figure 45:
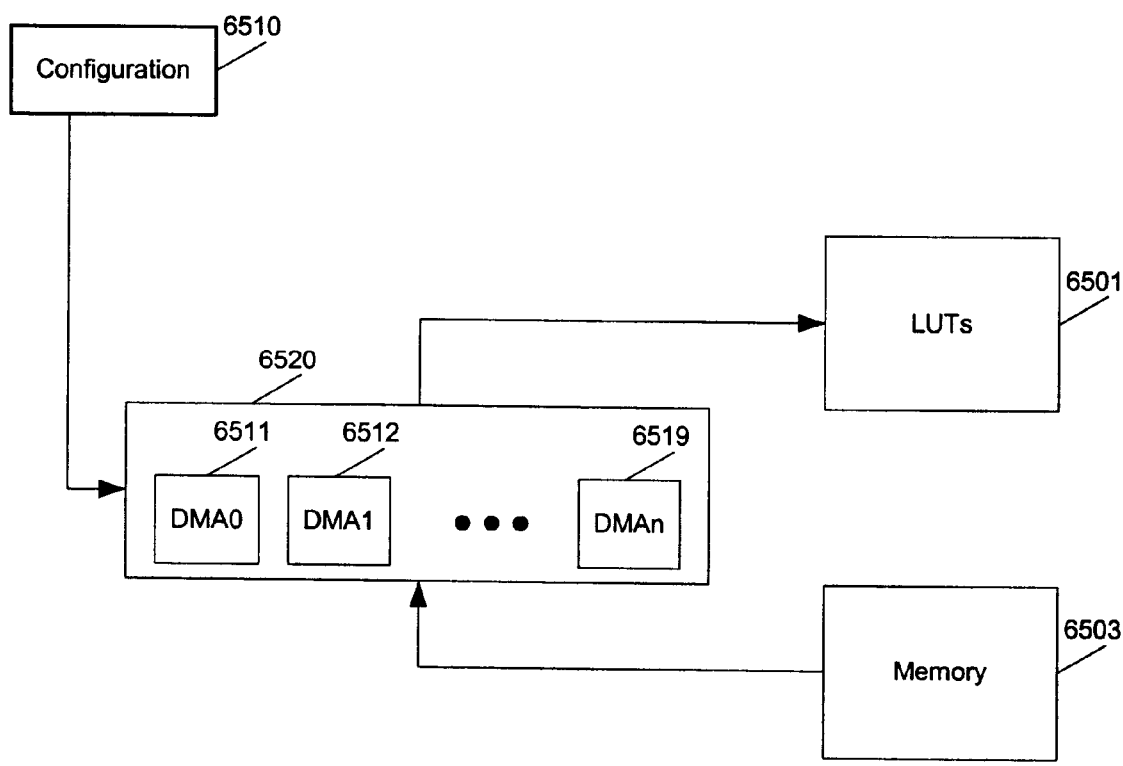
FIG. 45 illustrates a block diagram representation of a circuit for the execution of a method to load entries in look-up units using DMA controllers according to one embodiment of the present invention.

FIG. 45 illustrates a block diagram representation of a circuit for the execution of a method to load entries in look-up units using DMA controllers according to one embodiment of the present invention. Configuration 6510, specified by an instruction, selects a DMA controller from a number of DMA controllers to load table entries from a location in memory 6503 into look-up units 6501. These look-up units can be configured into look-up tables of different sizes, as illustrated in FIGS. 38, 39, 41–43 so that simultaneous look-up of a vector of data elements can be performed. In one embodiment of the present invention, one of the DMA controllers 6520 is DMA controller 2818 in a compute engine in FIG. 18, and memory 6503 is host memory 1412 in FIG. 4B.

FIG. 46 illustrates data representations for the execution of a method to load entries in look-up units using DMA controllers according to one embodiment of the present invention. Instruction 6610 illustrates the data representation in instruction dlutl. Bit segment 6602 specifies the DMA controller to be used in loading the entries. Bit segments 6601 and 6605 specify the identification of the instruction. Bit segments 6603 and 6604 contain two indices of entries A and B in register file 6620 (e.g., general purpose register file 2801 in FIG. 18). Entry B contains Effective Address (EA) 6623 indicating the base address of the data in memory 6503. Entry A contains bit segment 6621 which specifies a count indicating the number of entries to be loaded in each of the look-up units. Segment 6622 specifies an index, which indicates the position of the first entry to be loaded in the look up units. Thus, the count and the index determine the location of the entries to be loaded in the look-up units. For example, the index (6622) indicates that entries start from entry 6651 (S0) in look-up unit 6631 (LUT0) will be loaded using the instruction. The count (6621) determines that the last entry to be load in LUT0 is entry 6641 (E0). The same index and count also specifies that the entries between entry 6659 (S15) and entry 6649 (E15) will be loaded for look-up unit 6639 (LUT 15).

Although Figure: 46 illustrates an example instruction of loading 16 look-up units using a DMA controller, it will be appreciated that other instructions may be implemented to load the look-up units in different fashions, such as loading a number of entries in a selected number of look-up units only.

Figure 47:
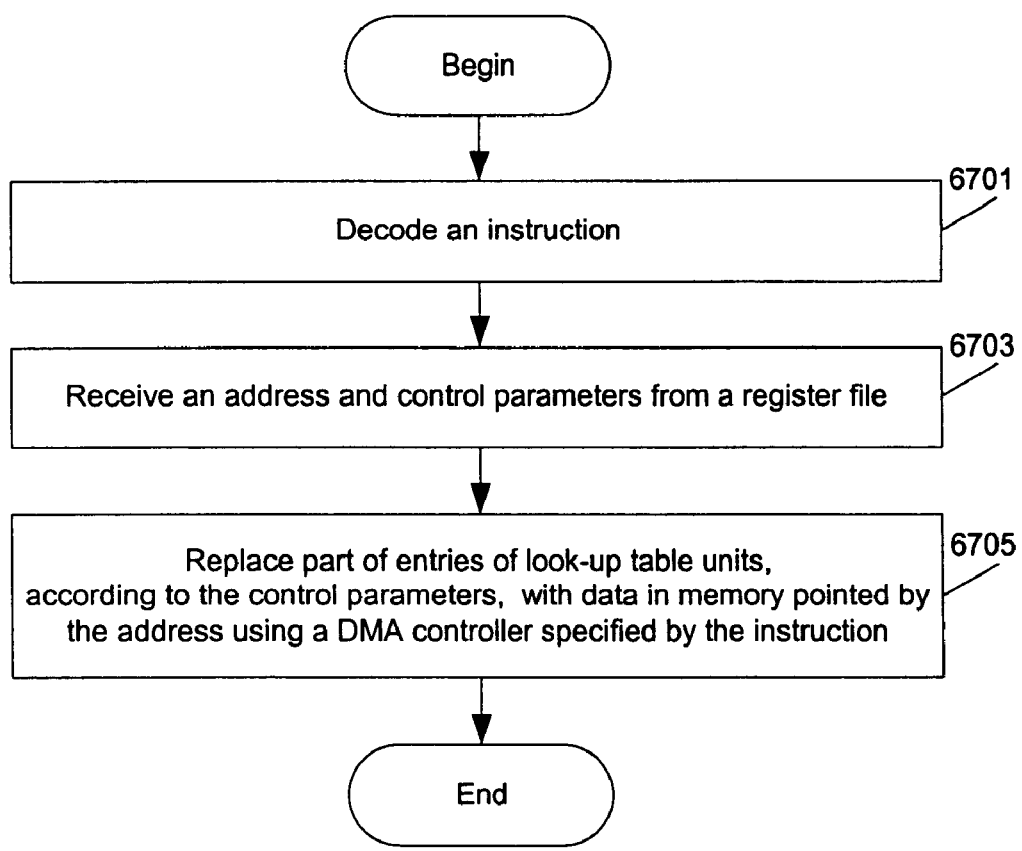
FIG. 47 shows a flow diagram for a method to load entries in look-up units using DMA controllers according to one embodiment of the present invention.

FIG. 47 shows a flow diagram for a method to load entries in look-up units using DMA controllers according to one embodiment of the present invention. After an instruction is decoded in operation 6701, an address indicating the location of the entries in memory 6503 is retrieved from a register file in operation 6703. A number of control parameters, such as count 6621 and index 6622, are also retrieved from the register file. In operation 6705, a DMA controller specified by the instruction loads the entries from memory 6503 into look-up units 6501.

Figure 48:
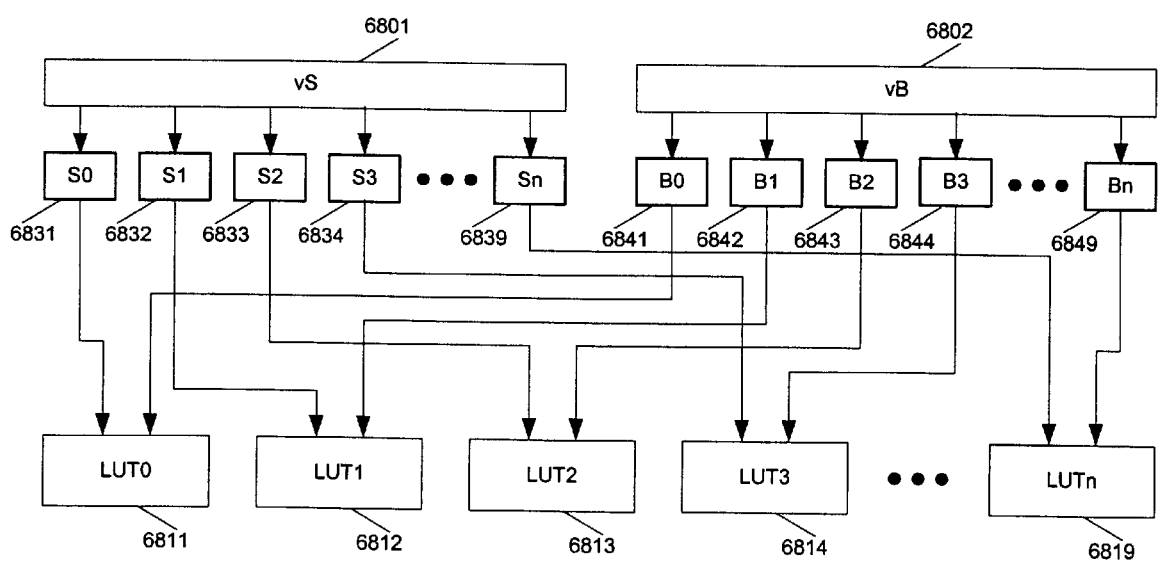
FIG. 48 illustrates a block diagram representation of a circuit for the execution of a method to set entries in look-up tables according to one embodiment of the present invention.

FIG. 48 illustrates a block diagram representation of a circuit for the execution of a method to set entries in look-up tables according to one embodiment of the present invention. The vectors of 8-bit numbers, vS and vB, are stored in two entries (6801 and 6802) of a vector register file (e.g., vector register file 2802 in FIG. 18). After the execution unit receives control information from the instruction dispatcher, 8-bit indices 6831 (S0), 6832 (S1), . . . , and 6839 (Sn) are selected from entry 6801 for vS. 8-bit data items 6841 (B0), 6842 (B1), . . . , 6849 (Bn) are selected from entry vB (6802). The entries in look-up tables 6811–6819, pointed to by indices S0–Sn, are simultaneously replaced by the corresponding data items (B0–Bn). For example, an entry indexed by S0 in LUT0 is replaced by data item B0; and an entry indexed by Sn in LUTn is replaced by data item Bn.

Figure 49:
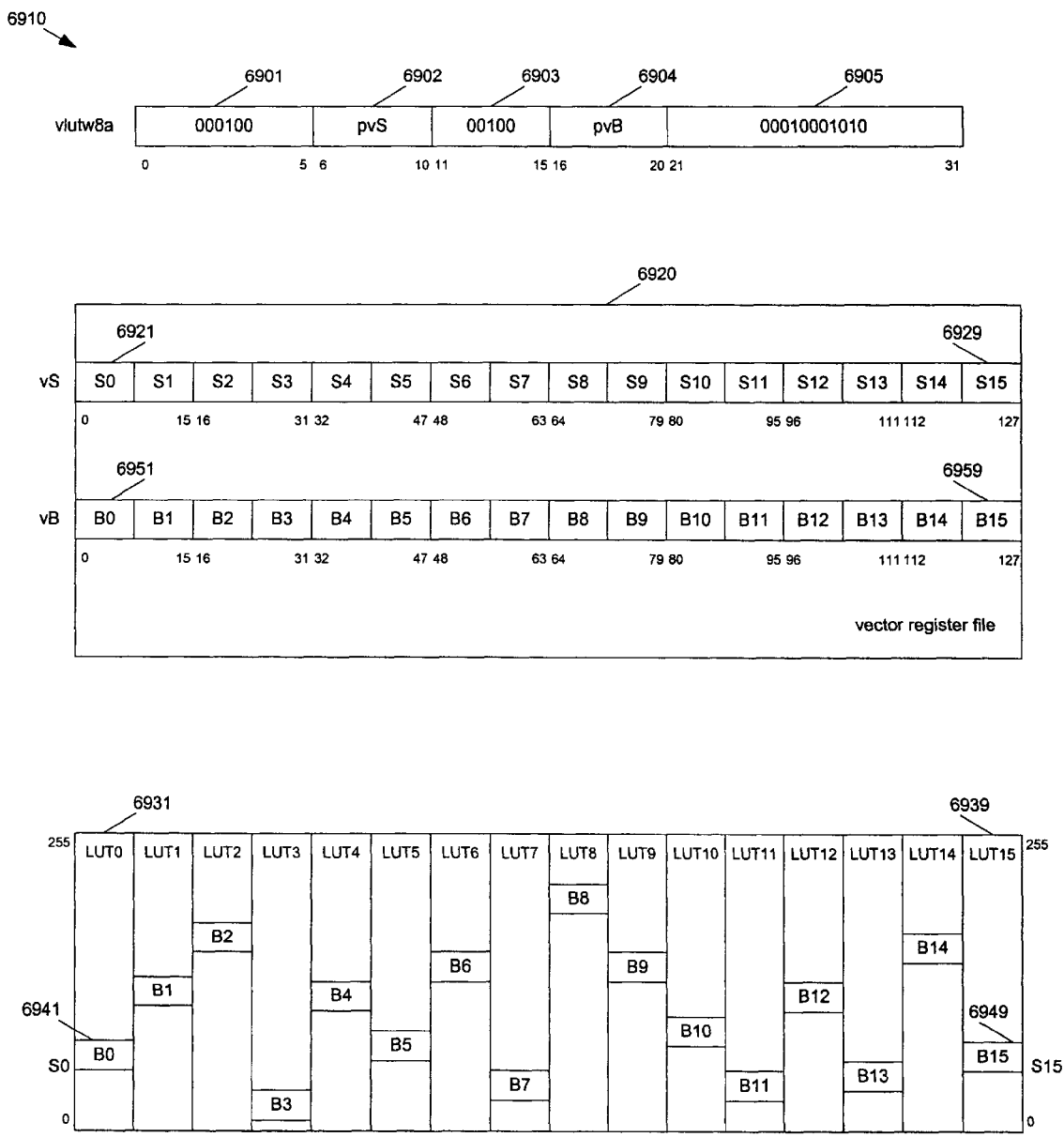
FIG. 49 illustrates data representations for the execution of a method to set entries in look-up tables according to one embodiment of the present invention.

FIG. 49 illustrates data representations for the execution of a method to set entries in look-up tables according to one embodiment of the present invention. Instruction 6910 illustrates the data representation in instruction vlutw8a. In vector register file 6920, bit segments 6902 and 6903 contain the addresses of two entries, vS and vB. Entry vS contains 16 8-bit indices; and entry vB contains 16 8-bit entries. For example, bit segment 6921 contains index S0; and bit segment 6951 contains data item B0. After the execution of the instruction, the data items in entry vB replace the corresponding entries of the look-up units indexed by the indices in vS. For example, entry 6941 in look-up unit 6931 (LUT0), indexed by S0, is replaced by B0; similarly, entry 6949 in look-up unit 6939 (LUT16), indexed by S15, is replaced by B15.

Figure 50:
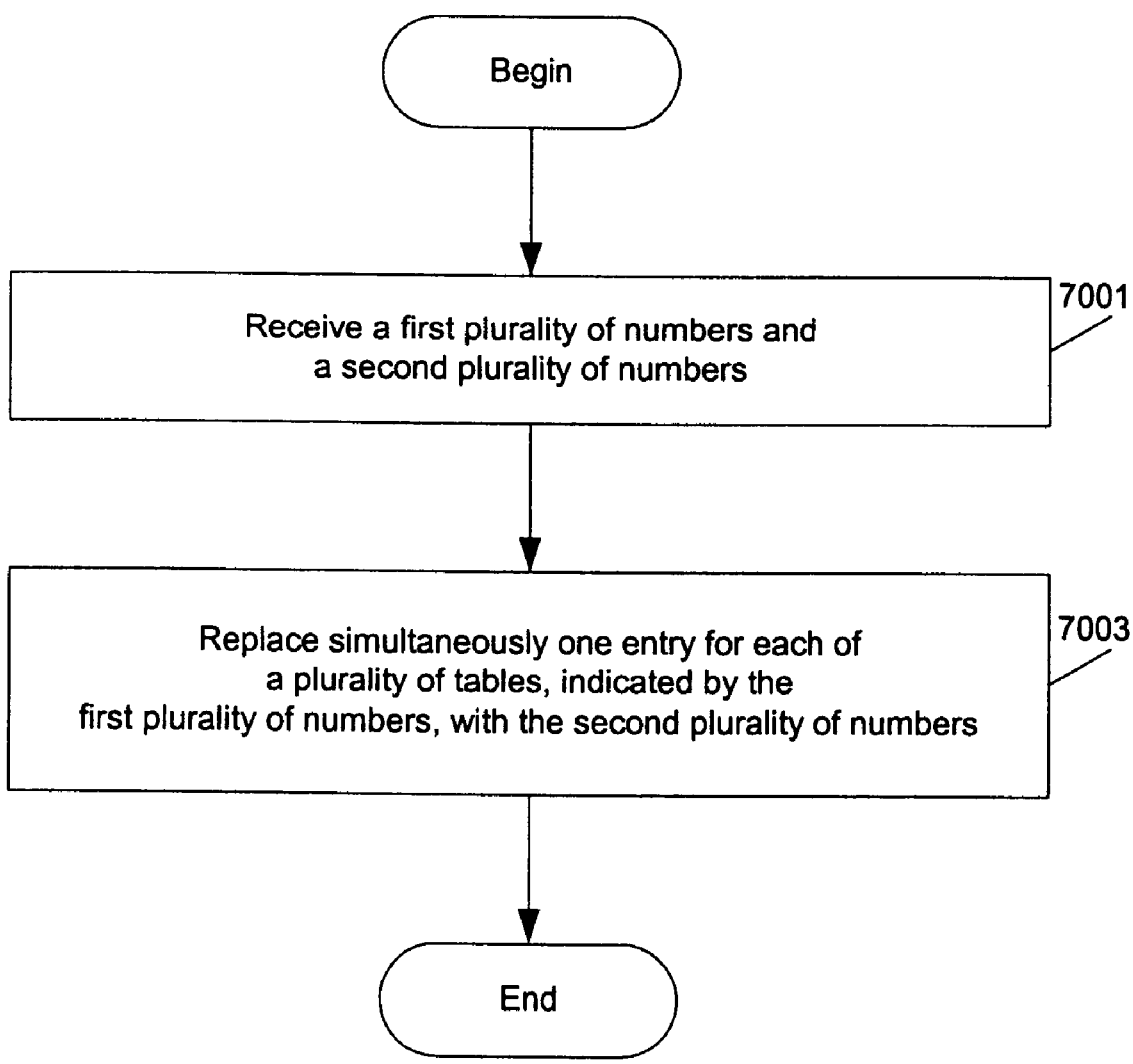
FIG. 50 shows a flow diagram for a method to set entries in look-up tables according to one embodiment of the present invention.

FIG. 50 shows a flow diagram for a method to set entries in look-up tables according to one embodiment of the present invention. In operation 7001, the execution unit receives a vector of indices and a vector of data items. Operation 7003 simultaneously replaces one entry in each of a number of look-up tables with a corresponding data item in the vector of data items. Each of the entry being replaced is being pointed to by a corresponding index in the vector of indices.

A least one embodiment of the present invention seeks to perform a generic operation for variable length decoding by using a single instruction in an execution unit. The execution unit simultaneously performs all the table look-up operations for variable length decoding a code word in the single instruction. The execution unit has look-up memory which can be configured into a number of look-up tables in a fashion indicated by the instruction in order to simultaneously look up a vector of data elements, each from one of the look-up tables. In one embodiment of the present invention, the look-up memory comprises a number of look-up units. The execution unit further processes the data items selected from the look-up tables to provide a decoded value. By parallel processing the look-up operations, a method according to the present invention dramatically increases the performance for variable length decoding.

Figure 51:
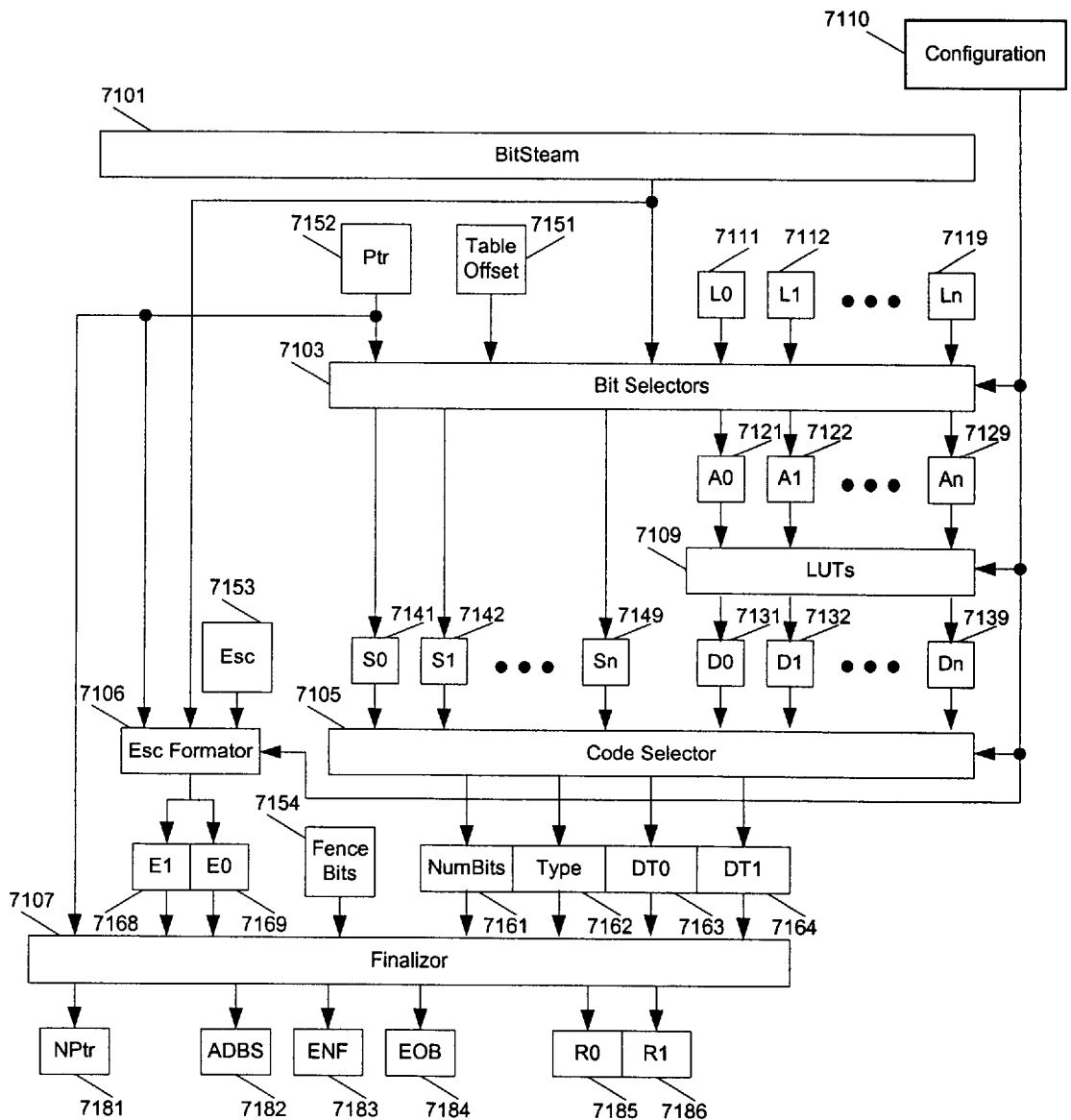
FIG. 51 illustrates a block diagram representation of a circuit for the execution of a method to perform variable length decoding according to one embodiment of the present invention.
Figure 54:
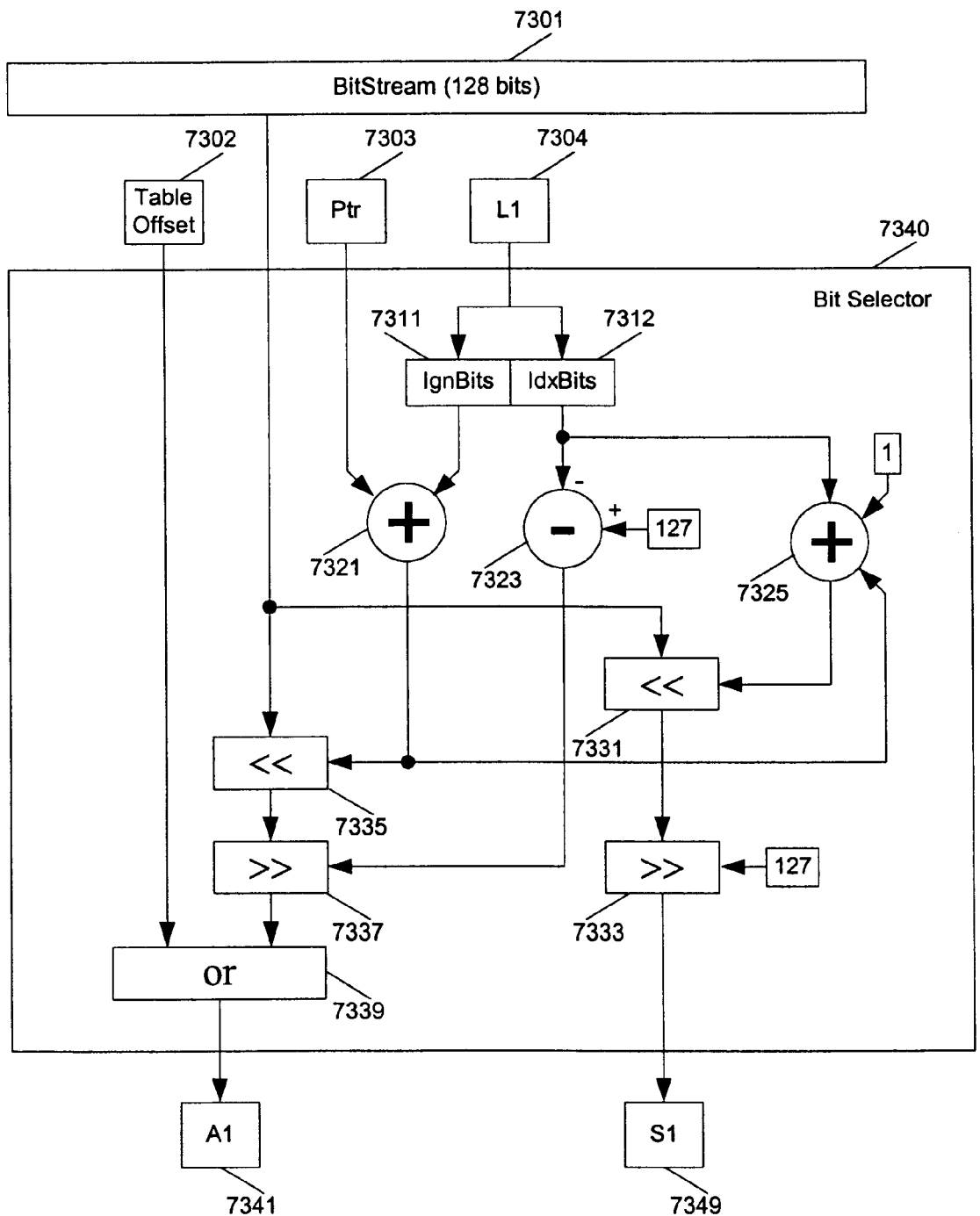
FIG. 54 illustrates a detailed block diagram representation of a circuit to select a segment of bits from a bit stream according to one embodiment of the present invention.

FIG. 51 illustrates a block diagram representation of a circuit for the execution of a method to perform variable length decoding according to one embodiment of the present invention. A bit stream is stored in entry 7101 in a vector register file. The bit stream contains a number of code words to be decoded. Bit pointer 7152, table offset 7151, escape format 7153, and fence bits 7154 are stored in other entries of the vector register file. After the execution unit receives control information for the instruction dispatcher, bit selectors 7103 select a number of bit segments from bit stream 7101 to generate indices 7121, 7122, . . . , 7129 for look-up tables 7109 using local control information 7111, 7112, . . . , 7119. Bit pointer 7152 indicates the position of the starting bit of the current code word in the bit stream. Local control information 7111, 7112, . . . , 7119 are stored in an entry of the vector register file. Each of the local control information indicates a location and a length of the bit segment to be selected from the bit stream to construct the index. Table offset 7151 is combined with the bit segments selected by bit selectors 7103 to generate the indices. The details of one embodiment of the bit selector are illustrated in FIG. 54, and will be described in the following paragraphs.

Figure 55:
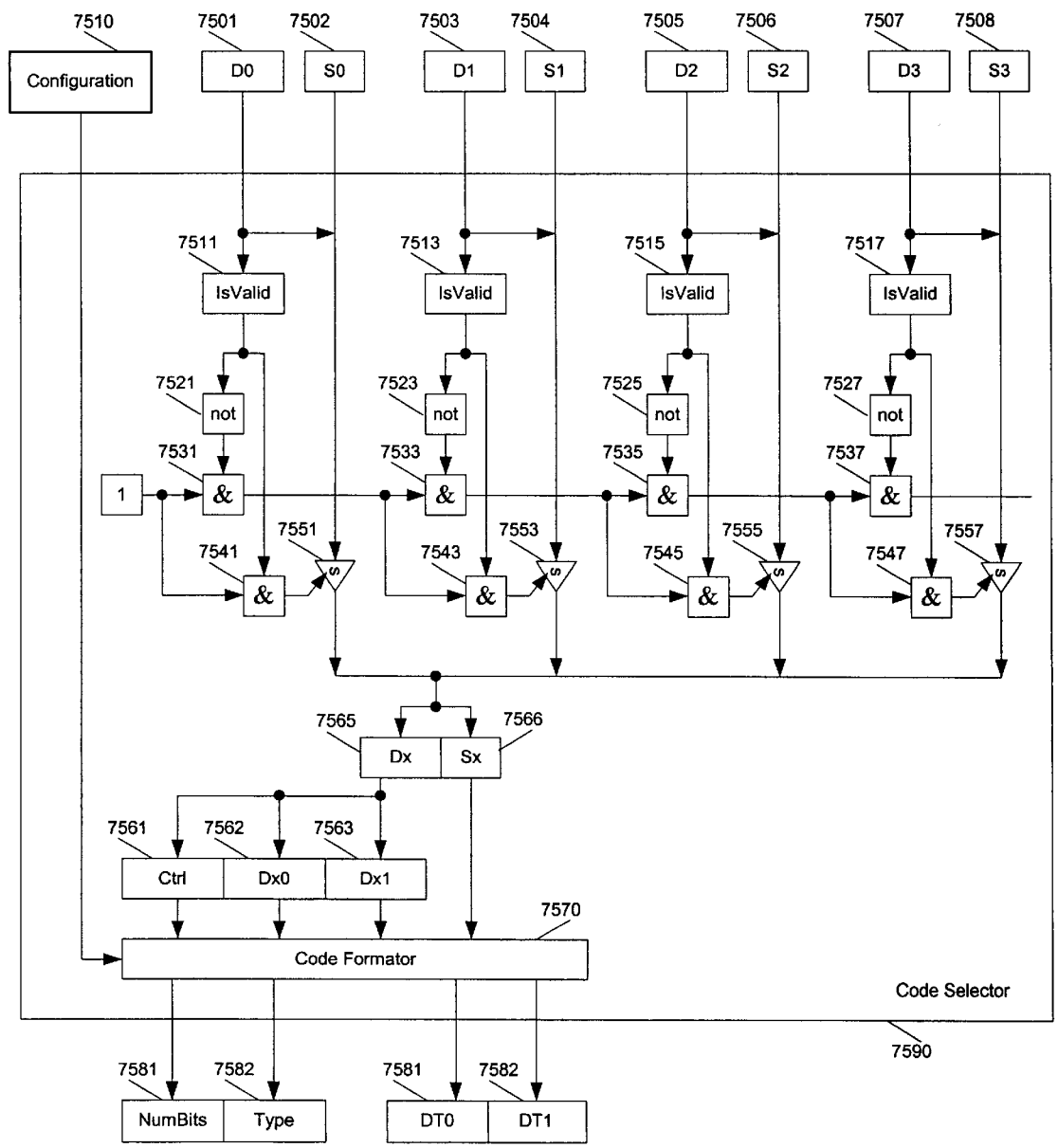
FIG. 55 illustrates a detailed block diagram representation of a circuit to select a valid data from the look-up results of a number of look-up tables according to one embodiment of the present invention.

A number of look-up units 7109 are configured into a number of look-up tables according to the configuration signal from the instruction. Code selector 7105 combines data entries 7131, 7132, . . . , 7139, looked up from the look-up tables (7109), and sign bits 7141, 7142, . . . , 7149, selected by bit selectors 7103, to produces an intermediate result, which includes: i) halfword data DT0 (7163) and DT1 (7164); ii) data type 7162 (Type); and iii) the number of bits of the current code word (NumBits 7161) (if a valid data entry is found in the look-up tables). At the same time, escape formator 7106 formats a segment of bits into halfword escape data E1 (7168) and E0 (7169) according to escape format 7153, assuming that the current code word is for escape data. Finally, finalizor 7107 combines fence bits 7154 with intermediate results 7161–7164, and escape data 7168 and 7169 into: i) new bit pointer 7181 (NPtr), which is the position of the starting bit of the next code word in the bit stream; ii) adjust bit stream indicator 7182 (ADBS), which indicates whether there are in fact enough bits in the bit stream for the current code word; iii) entry not found indicator 7183 (ENF), which is set when there is no valid entry found in the look-up tables, iv) end of block indicator 7184 (EOB), which indicates whether the end of block condition is met, and v) resulting decoded data 7185 and 7186 (R0 and R1). The details of one embodiment of the code selector 7105 are illustrated in FIG. 55; escape formator 7106 illustrated in FIG. 57; and finalizor 7107 illustrated in FIG. 59.

Although FIG. 51 illustrates only one escape formator, it will be appreciated that a number of escape data can be formatted according to a number of escape formats by using a number of escape formator in parallel (or by using an escape formator to sequentially format the escaped data according to the escape formats).

Figure 52:
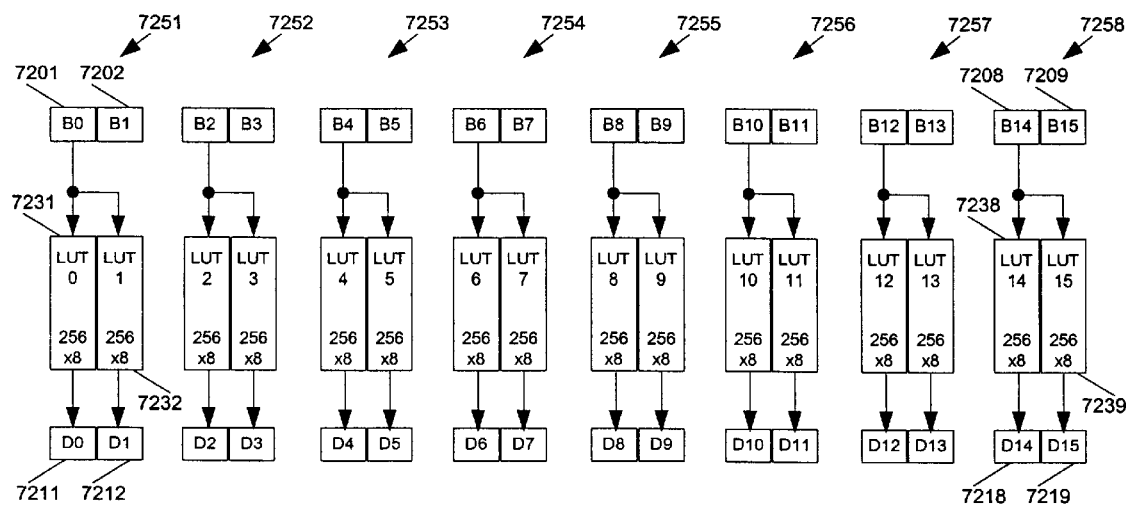
FIGS. 52–53 illustrate block diagram representations of circuits for performing variable length decoding using a set of look up units according to one embodiment of the present invention.
Figure 53:
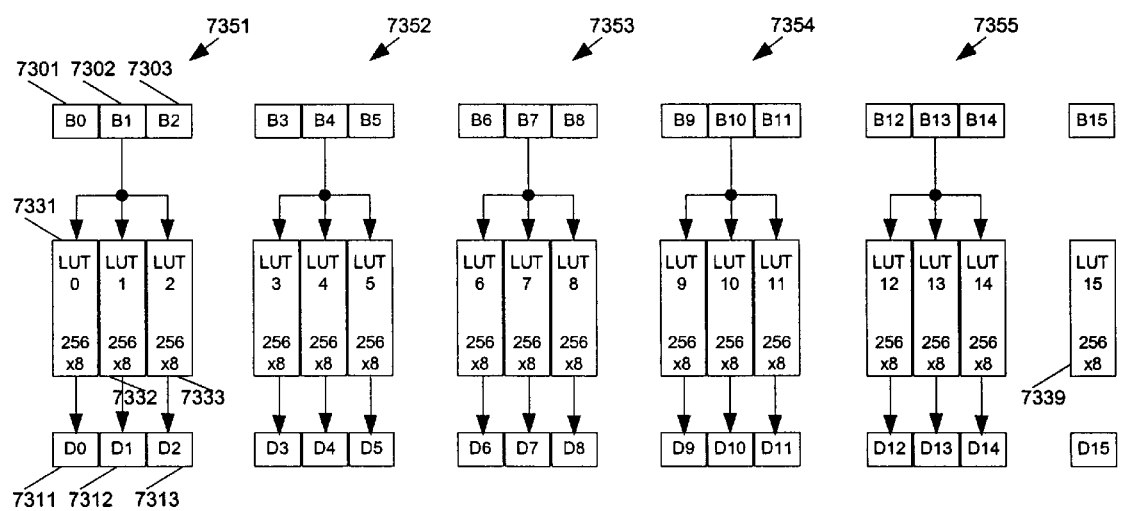

FIGS. 52–53 illustrate block diagram representations of circuits for performing variable length decoding using a set of look up units according to one embodiment of the present invention.

FIG. 52 illustrates one configuration in which 16 look-up units are configured into 8 look-up tables 7251–7258. Each of the tables contains 256 16-bit entries. For example, an 8-bit index is stored in B0 (7201). Look-up unit 7231 (LUT0) contains the lower 8 bits of the entries; and LUT1 (7232) contains the upper 8 bits of the entries. The 8-bit index in B0 is used to simultaneously look up the lower and upper 8 bits of the entry. The lower 8 bits of the result are stored in D0 (7211); and the upper 8 bits of the result are stored in D1 (7212).

FIG. 53 illustrates one configuration in which 16 look-up units are configured into 5 look-up tables 7351–7355. Each of the tables contains 256 24-bit entries. For example, an 8-bit index is stored in B1 (7302). Look-up unit 7331 (LUT0) contains bits 0–7 of the entries; LUT1 (7332) contains bits 8–15 of the entries; and LUT2 (7333) contains bits 16–23 of the entries. The 8-bit index in B0 is used to simultaneously look up bits 0–7, 8–15, 16–23 of the entry. Bits 0–7 of the result are stored in D0 (7311); bits 8–15 of the result are stored in D1 (7312); and bits 16–23 of the result are stored in D2 (7313). In this configuration, LUT15 (7339) is not used.

FIG. 54 illustrates a detailed block diagram representation of a circuit to select a segment of bits from a bit stream according to one embodiment of the present invention. Local control information 7304 (L1) contains: i) IgnBits 7311, which indicates the number of bits to be ignored starting from the bit pointed to by bit pointer 7303 (Ptr), and ii) IdxBits 7312, which indicates the number of bits to be taken from bit stream 7301. Entry 7301 in a vector register file contains 128 bits of the bitstream of code words to be decoded. Ptr 7303 points to the first bit of the current code word to be decoded in bit stream 7301. The shifters 7335 and 7337 select from the bit stream a bit segments of a length specified by IdxBits 7312, starting from the bit pointed to by Ptr+IgnBits. The selected bit segment is combined with table offset 7302 using operation 7339 to produce index A1 (7341). Similarly, shifters 7331 and 7333 are used to obtain the sign bit, which immediately follows the bit segments specified by local control information 7304 (IgnBits 7311 and IdxBits 7312). The sign bit is selected into S1 (7349). While FIG. 54 illustrates one embodiment of a bit selector 7340, it will be apparent to one skilled in the art that many variations of the bit selector may be implemented to carry out the same function as in FIG. 54.

FIG. 55 illustrates a detailed block diagram representation of a circuit to select a valid data from the look-up results of a number of look-up tables according to one embodiment of the present invention. Code selector 7590 selects and formats a valid data using data entries 7501, 7503, 7505, 7507 and their associated sign bits 7502, 7504, 7506, 7508. A typical data entry Dx from a 3-byte look-up table contains: i) control data Ctrl (7561); ii) halfword data Dx0 (7562) and Dx1 (7563). Control data Ctrl contains: i) NumBits (7581), which indicates the number of bits for a code word corresponding to data entry Dx; and ii) Type 7582, which indicates the type of data entry Dx. Logic unit 7511 determines from the control data of D0 (7501) if the data (D0) is valid. When the data is of a valid type, logic unit 7531 outputs zero to suppress the results of other look-up tables from entering into Dx and Sx (7565 and 7566). At the same time, logic unit 7541 produces a signal causing gate 7551 to output data entry D0 (7501) and its associated sign bit S0 (7502) into Dx and Sx. When the data (D0) is not valid, logic unit 7541 generates a signal causing gate 7551 to prevent D0 and S0 from entering into Dx and Sx. At the same time, logic unit 7513 output a signal to enable the selection of result from D1 and S1. Thus, when D0 is not valid, logic units 7513, 7523, 7533, 7543 and 7553 selects D1 and S1 into Dx and Sx if D1 is valid. When both D0 and D1 are not valid, D2 and D3 may be selected in a similar fashion. Thus, the result in D0 has the highest priority, and the result in D3 has the lowest priority. A valid result with the highest priority is selected into Dx. In one embodiment of the present invention, when no entry is valid, the last entry is selected into Dx and Sx. Code Formator 7570 extracts NumBits 7581, Type 7582, DT0 and DT1 from the selected code Dx with its associated sign bit 7566. Details of code formator 7570 are illustrated in FIG. 56.

Figure 56:
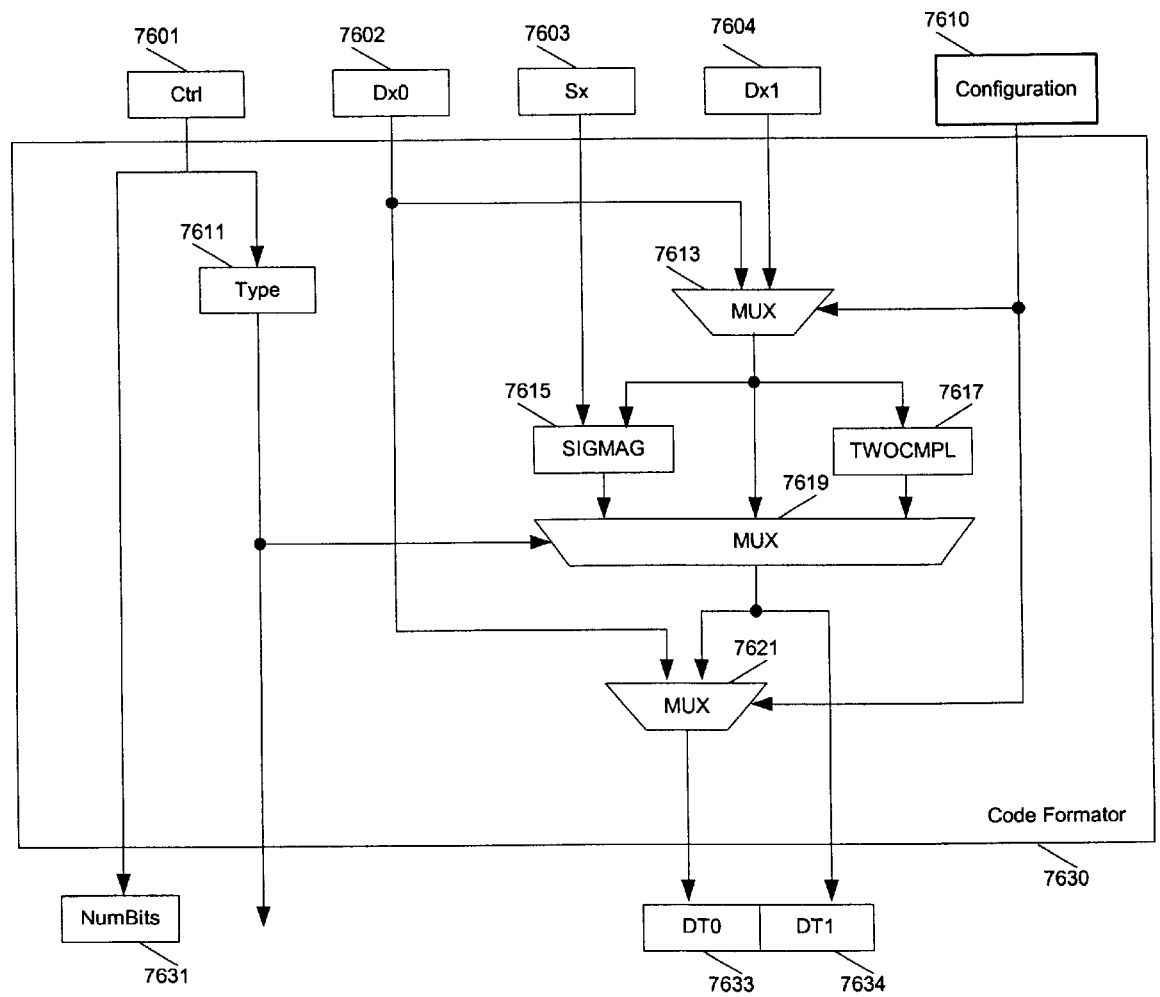
FIG. 56 illustrates a detailed block diagram representation of a circuit to format a valid data from a look-up table according to one embodiment of the present invention.

FIG. 56 illustrates a detailed block diagram representation of a circuit to format a valid data from a look-up table according to one embodiment of the present invention. According to configure 7610, multiplexer 7613 selects a halfword from data entries 7602 and 7604 to perform formatting. When the configuration determines that the entry is a 2-byte data item, Dx0 is selected; when the configuration determines that the entry is a 3-byte data item, Dx1 is selected. Logic unit 7615 formats the selected data assuming the data is of type sign magnitude. Logic unit 7617 formats the selected data assuming the data is of type two complement. Ctrl 7601 contains NumBits 7631 and Type 7611. The type of data entry 7611 causes multiplexer 7619 to select a correctly formatted data. When the configuration is for 2-byte data entry, multiplexer 7621 selects the formatted data into DT0 (7633); when the configuration is for 3-byte data entry, multiplexer 7621 selects Dx0 (7602) into DT0 (7633). Thus, code formator 7630 formats Dx0 and Dx1 into DT0 and DT1 according to the type of the data specified in control data 7601.

Figure 57:
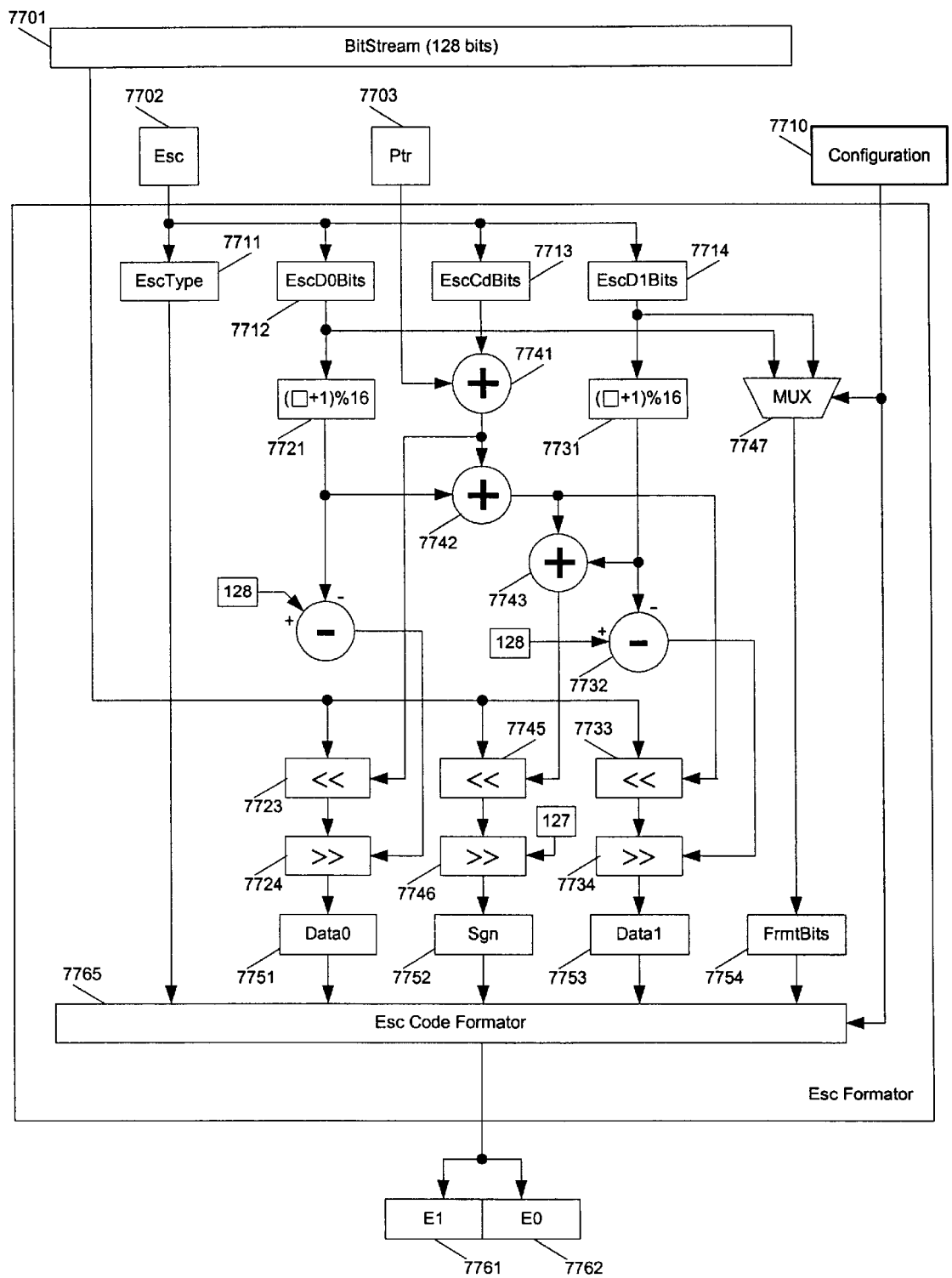
FIG. 57 illustrates a detailed block diagram representation of a circuit to format an escaped data from a bit stream according to one embodiment of the present invention.
Figure 58:
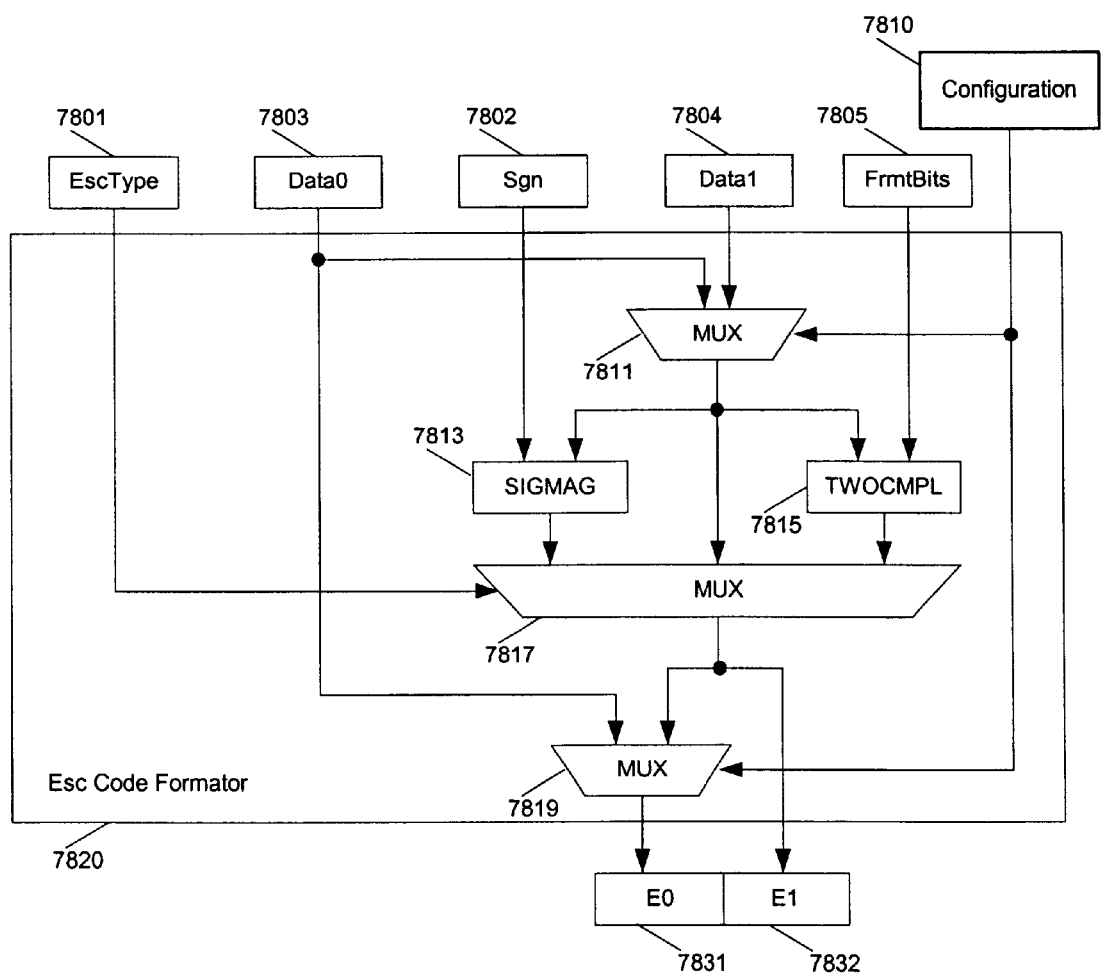
FIG. 58 illustrates a detailed block diagram representation of a circuit to format an escaped data obtained from a bit stream according to one embodiment of the present invention.

FIG. 57 illustrates a detailed block diagram representation of a circuit to format an escape data from a bit stream according to one embodiment of the present invention. Escape data format 7702 (Esc) contains: i) EscType 7711, which specifies the type of the escape data; ii) EscD0Bits 7712 and EscD1Bits 7714, which specify the numbers of bits in bit stream 7701 for the first and second halfwords of data; and iii) EscCdBits 7713, which specifies the number of bits of the escape symbol. Logic units 7721 and 7731 perform modulo 16 operations. Shifters 7723 and 7724 select the first halfword Data0 (7751) from bit stream 7701; shifters 7733 and 7734 select the second halfword Data1 (7753) from the bit steam; and shifters 7745 and 7746 select the sign bit Sgn (7752) of the escape data. Multiplexer 7747 selects FrmtBits 7754 from EscD0Bits and EscD1Bits. When the configuration is for 2-byte data entry, multiplexer 7747 selects EscD0Bits as FrmtBits, since Data0 will be formatted by Esc Code Formator 7765 in this configuration; when the configuration is for 3-byte data entry, multiplexer 7747 selects EscD1Bits as FrmtBits, since Data1 will be formatted by Esc Code Formator 7765 in this configuration. Esc code formator 7765 formats Data0 and Data1 into E1 and E0 (7761, 7762) according to EscType 7711, Sgn 7752, and FrmtBits 7754. FIG. 58 illustrates the detail of Esc code formator 7765.

FIG. 58 illustrates a detailed block diagram representation of a circuit to format an escape data obtained from a bit stream according to one embodiment of the present invention. Multiplexer 7811 selects data from Data0 (7803) and Data1 (7804) to perform formatting. When the configuration is for 2-byte data entry, multiplexer 7811 selects Data0; when the configuration is for 3-byte data entry, multiplexer 7811 selects Data1. Logic unit 7813 formats the selected data assuming the data is of type sign magnitude. Logic unit 7815 formats the selected data assuming the data is of type two complement. EscType 7801 causes multiplexer 7619 to select a correctly formatted data. When the configuration is for 2-byte data entry, multiplexer 7819 selects the formatted data into E0 (7831); when the configuration is for 3-byte data entry, multiplexer 7819 selects Data0 (7803) into E0. Thus, Esc code formator 7820 formats Data0 and Data1 into E0 and E1 according to the type information 7801.

Figure 59:
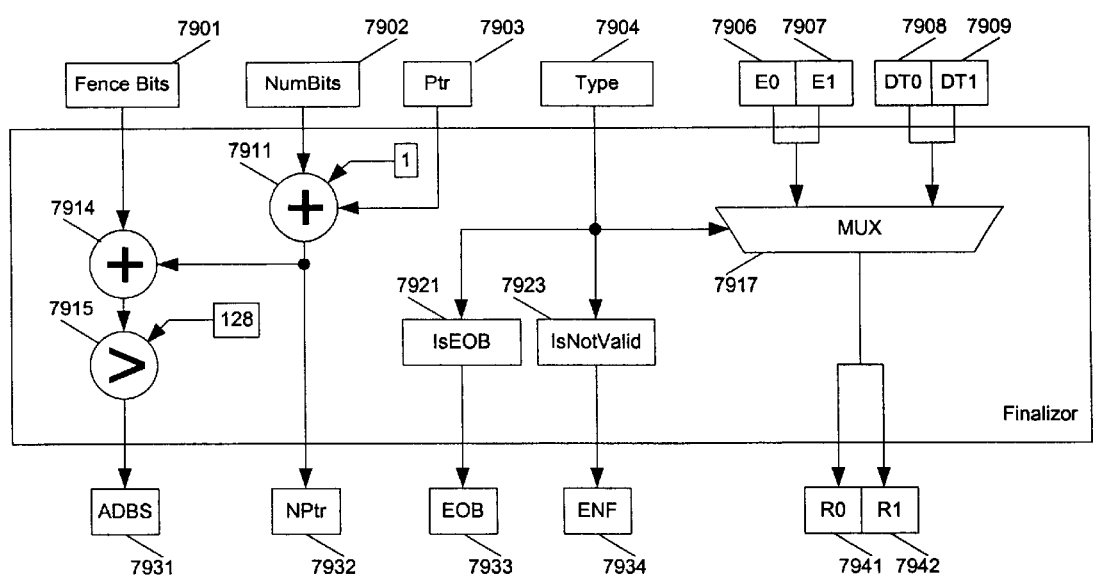
FIG. 59 illustrates a detailed block diagram representation of a circuit to generate the result of variable length decoding using the escaped data and the data from look-up tables according to one embodiment of the present invention.

FIG. 59 illustrates a detailed block diagram representation of a circuit to generate the result of variable length decoding using the escape data and the data from look-up tables according to one embodiment of the present invention. Type 7904 obtained from code formator 7630 of code selector 7590 (or 7105) decides whether the current code word is for an escape data item. If it is for an escape data item, multiplexer 7917 selects the formatted escape data E0 and E1 (7906, 7907) as result R0 and R1 (7941, 7942);

otherwise, formatted data DT0 and DT1 (7908, 7909) obtained from look-up tables are selected into R0 and R1. At the same time, logic unit 7921 sets end of block indicator 7933 (EOB) by determining if Type 7904 is for a code word representing the end of block condition; logic unit 7923 sets entry not found indicator 7934 (ENF) by checking if Type 7904 is for a valid code word. Meanwhile, adder 7911 sums up NumBits 7902 and Ptr 7903 into NPtr (7932), which points to the starting bit of the next code word. Adder 7914 sums NPtr and fence bits (7901) in order to determine if the result of the look-up is in fact based on valid bits in the bit stream. When the sum is smaller than 128, tester 7915 unsets ADBS (7931) indicating that there are enough valid bits in the bit stream to decode the current code word, and the decoded result is valid; otherwise, ADBS is set to indicate that there are not enough valid bits in the bit stream to decode the current code word, and the bit stream must be adjusted.

Figure 60:
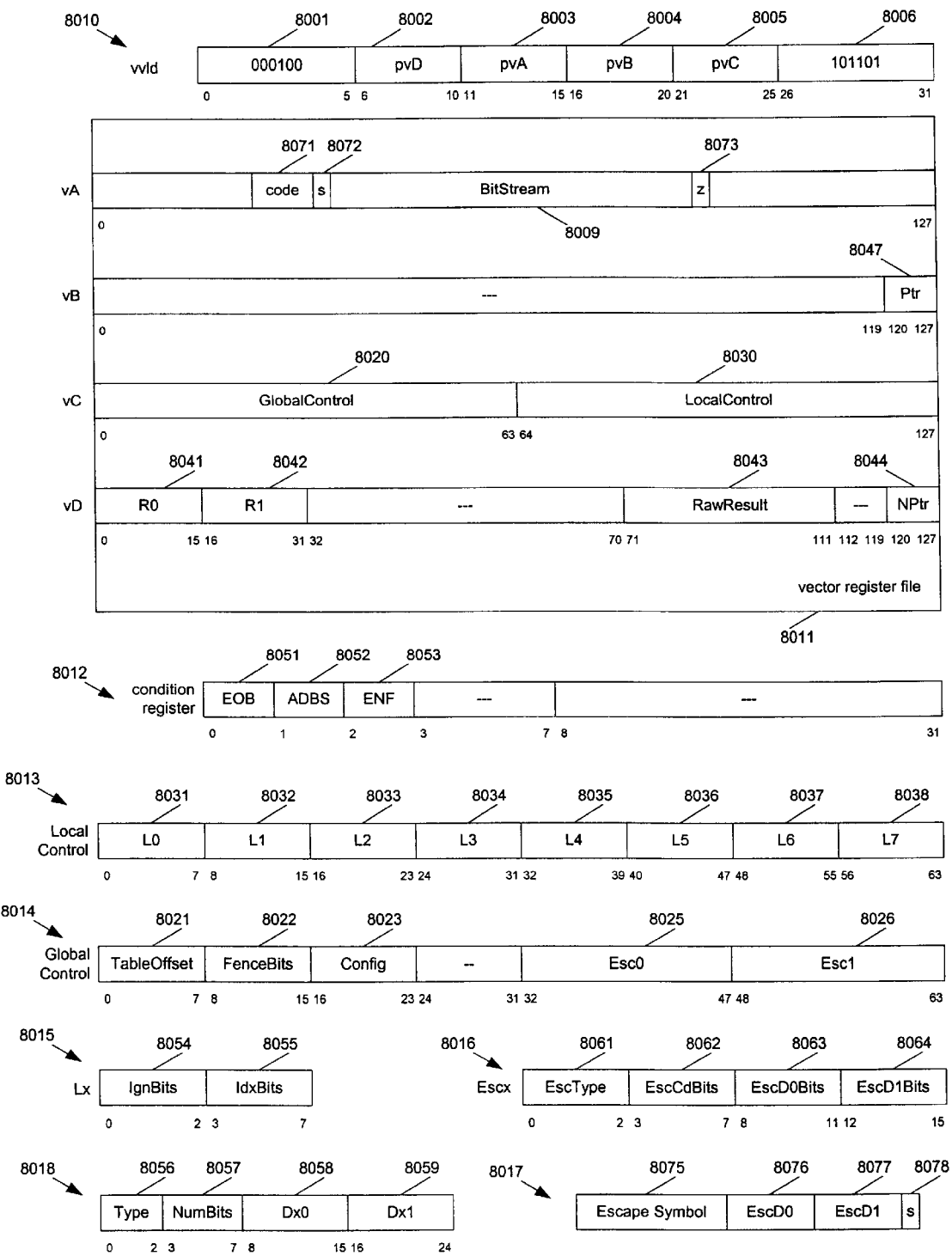
FIG. 60 illustrates data representations for the execution of a method to perform variable length decoding according to one embodiment of the present invention.

FIG. 60 illustrates data representations for the execution of a method to perform variable length decoding according to one embodiment of the present invention. Instruction 8010 illustrates the data representation in instruction vvld for the variable length decoding of a code word in a bit stream. Bit segments 8001 and 8006 contain the identification of the instruction. Bit segments 8002, 8003, 8004, and 8005 contain the addresses of four entries in a vector register file 8011. Segment 8003 contains an address for entry vA, which contains bit stream 8009. Bit segment 8071 represents the bits for a code word to be decoded. Typically, a sign bit 8072 follows immediately the bits for a code word (8071), although some code words have no associated sign bit. Bit 8073 represents the last valid bit for code words in the bit stream. The bit pointer (Ptr) points to the position of the first bit of code 8071 and is stored in segment 8047 in entry vB. The address of entry vB is specified in segment 8004 in instruction vvld (8010). The number of bits between bit 8073 and the last bit in entry vA is FenceBits, which is stored in bit segment 8022 of entry vC. The address of entry vC is specified in segment 8005 in instruction vvld. FenceBits is stored in segment 8020 in vC for global control signal. In addition to FenceBits, Global control signal 8014 contains: i) TableOffset 8021, which is used in generating indices for table look-up operations; ii) Config 8023, which indicates whether entries in look-up tables are 2-byte data or 3-byte data; and iii) Esc0 8025 and Esc1 8026, which specify two formats of escape data. Each of the escape formats (Esc0 or Esc1) has the data representation 8016 and contains: i) EscType 8061 indicating the type of the escape data (e.g., two complement, zero fill, or sign magnitude); ii) EscCdBits 8062 indicating the number of bits used for the escape symbol; and iii) EscD0Bits 8063 and EscD1Bits 8064 which are the numbers of bits for the first and second halfword escape data. Segment 8017 represents a typical escape data element in a bit stream. Escape symbol 8075 is a code word indicating that an escape data (8076 and 8077) follows immediately after the symbol. EscD0 and EscD1 (8076, 8077) are the bit segments representing the first and second halfword data of the escape data. Sign bit 8078 follows immediately after the bit segments (8076, 8077).

The bit segment (8030) for local control signal 8013 contains information for 8 bit segments, L0, L1, ..., L7 (8031–8038). Each local control information Lx (8015) contains: i) IgnBits (8054) indicating the number of bits to be ignored after the bit pointed to by Ptr (8047); and ii) IdxBits (8055) indicating the number of bits of the bit segment to be used in the construction of the index for one of the look-up tables.

Segment 8002 in instruction vvld (8010) specifies the address of entry vD in the vector register file (8011). After the execution of the instruction, the first and second halfword decoded values are stored in R0 and R1 (8041, 8042) in vD. NPtr (8044) stores the bit pointer pointing to the first bit of the next code word to be decoded. RawResult (8043) stores the decoded values before being formatted according to the data type (e.g., two complement, sign magnitude).

Condition register 8012 stores the indicators for various conditions encountered during the decoding, including: i) EOB, indicating whether the current code word represents the end of block condition; ii) ADBS, indicating whether it is necessary to adjust bit stream in order to decode the current code word; and iii) ENF (Entry No Found), indicating if no valid entry is found in the look-up tables for the specified local controls.

A typical entry from a look-up table has data representation 8018. Corresponding to Ctrl 7561 in FIG. 55, the first byte of the entry contains: i) Type 8056 indicating the type of the entry (e.g., invalid codeword, valid codeword, EOB, escape data, etc.), and ii) NumBits 8057 indicating the total number of bits used by the current code word. The second and the third bytes (8058 and 8059) contain the decoded data. In one configuration, the look-up tables contain only 16-bit entries. In this case the third byte is not relevant.

While FIG. 60 illustrates one embodiment of the data representation for the execution of an instruction to perform variable length decoding, it will be apparent to one skilled in the art that many variations of the data representation may be used for the instruction described above.

Figure 61:
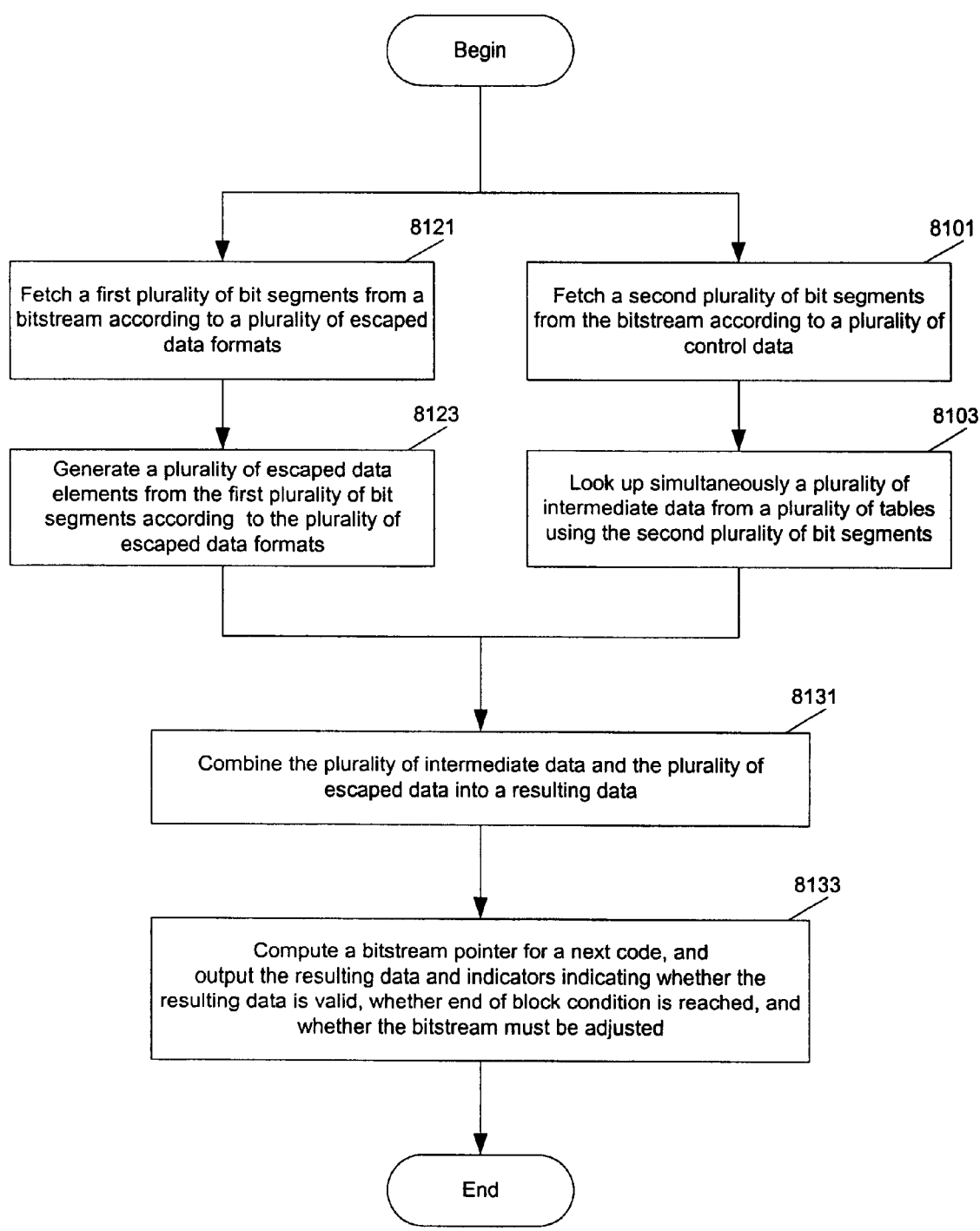
FIG. 61 shows a flow diagram for a method to perform variable length decoding according to one embodiment of the present invention.

FIG. 61 shows a flow diagram for a method to perform variable length decoding according to one embodiment of the present invention. Operation 8121 fetches a plurality of bit segments from a bit stream according to a plurality of escape data formats (obtained from input vector registers). Operation 8123 generates a plurality of escape data from the bit segments obtained in operation 8121 according to the escape data formats. In parallel to operations 8121 and 8123, operation 8101 fetches bit segments from the bit stream according to a plurality of local control data. The bit segments obtained in operation 8101 are used to construct indices which are simultaneously used to look up data entries from a plurality of tables. Operation 8131 combines the data entries looked up from tables with the escape data into a resulting data. Operation 8133 outputs: i) the decoded value; ii) a new pointer pointing to the starting bit of the next code word; iii) an ENF indicator indicating whether a valid entry is found in the look-up tables; iv) an EOB indicator indicating whether an end of block condition is found; and v) an ADBS indictor indicating whether the bit stream must be adjusted in order to correctly decode the current code word. In one embodiment of the present invention, the operations in FIG. 61 are performed by an execution unit for the execution of a single instruction.

FIG. 62 shows look-up tables for variable length decoding code words encoded using DV standard according to one embodiment of the present invention. Four look-up tables are used (T1, T2, T3, and T4). Each table entry contains information about type, bits, run and level, corresponding to Type 8056, NumBits 8057, Dx0 8058, and Dx1 8059 respectively. In one embodiment of the present invention, type 0 represents invalid entries; type 1 represents the end of block condition (EOB); type 2 represents Esc0 (Escape data); type 3 represents Esc1 (Escape data); type 4 represents two complement; and type 5 represents sign magnitude.

To use the look-up tables in FIG. 62, Config 8023 in global control 8014 (in FIG. 60) is set to 3 to configure the look-up units into 5 look-up tables, each having 256 3-byte entries. FIG. 53 illustrates such a configuration. The tables in FIG. 62 are loaded into the look-up units for the first four look-up tables, while the look-up units for the fifth look-up table are loaded with zeroes.

Since look-up tables shown in FIG. 62 use only the memory in the look-up tables associated with the lower 64 addresses (i.e., 0–63), it will be appreciated that look-up tables for other operations can use the rest of the memory. Thus, multiple sets of look-up tables, which may be for different purpose, may co-exist in the look-up units. This allows the use of multiple sets of look-up tables in a sequence of instructions, without having to load the tables multiple times.

To use the look-up tables in FIG. 62, the control information in vector vC (GlobalControl 8020 and LocalControl 8030 in FIG. 30) are:

```
Table Offset = 0;        // bits 0–7 in the vC
                         // register
Fence Bits = 0;          // bits 9–15
Config = 3;              // bits 21–23
Esc0 = {                 // for {run, 0} pairs
    EscType = 3;         // bits 32–34 (Zero Fill)
    EscCdBits = 7;       // bits 35–39
    EscD0Bits = 5;       // bits 40–43
    EscD1Bits = 15;      // bits 44–47
}
Esc1 = {                 // for {0, amp} pairs
    EscType = 1;         // bits 48–50 (Two
                         // Complement)
    EscCdBits = 7;       // bits 51–55
    EscD0Bits = 15;      // bits 56–59
    EscD1Bits = 7;       // bits 60–63
}
L0 = {                   // T1 control data
    IgnBits = 0;         // bits 64–68
    IdxBits = 5;         // bits 69–71
}
L1 = {                   // T2 control data
    IgnBits = 2;         // bits 72–76
    IdxBits = 5;         // bits 77–79
}
L2 = {                   // T3 control data
    IgnBits = 4;         // bits 80–84
    IdxBits = 5;         // bits 85–87
}
L3 = {                   // T4 control data
    IgnBits = 6;         // bits 88–92
    IdxBits = 5;         // bits 93–95
}
L4 = {                   // zero
    IgnBits = 0;         // bits 96–100
    IdxBits = 0;         // bits 101–103
}
L5 = {                   // not used
    IgnBits = 0;         // bits 104–108
    IdxBits = 0;         // bits 109–111
}
L6 = {                   // not used
    IgnBits = 0;         // bits 112–116
    IdxBits = 0;         // bits 117–119
}
L7 = {                   // not used
    IgnBits = 0;         // bits 120–124
    IdxBits = 0;         // bits 125–127
}
```

After packing, GlobalControl (8013 in FIG. 60) is $$0x00000300675f47f7;$$

and LocalControl (8014 in FIG. 60) is $$0x0515253500000000.$$

Thus, the control information in vector vC (8020 and 8030 in FIG. 30) is $$vC = 0x00000300675f47f70515253500000000.$$

The control information typically remains the same in a decoding loop.

The following sequence of instructions decode a bit stream loaded in a vector register until all tokens are decoded (e.g., EOB or End Of Block), or end of bit stream (e.g., ADBS or ADjust Bit Stream) is reached, or error in decoding (e.g., ENF or Entry Not Found) is detected. While a Vector Look Up Table Unit (e.g., VLUT 2811 in FIG. 18) is decoding a code word, other processing units (e.g., LSU 2816, BRU 2824, IALU 2805 in FIG. 18) are used to look up inverse zigzag table and inverse scale table to compute an IDCT coefficient using the decoded values from a previous code word.

```
//
//   Vector vld loop example
//
//   Vector register usage:
//   vA        right justified bitstream (0 fence bits - always)
//   vB        current and next bit pointers
//   vC        vvld control information (initialized)
//
//   Scalar register usage:
//   rScratch  pointer to a scratch area
//   rZztab    pointer to the inverse zigzag look-up table
//   rIstab    pointer to inverse scale table
//   rIDCT     pointer to storage area for IDCT coefficients
//   rRun      currently decoded run
//   rLevel    currently decoded level
//   rTzzt     temporary
//   rTist     temporary
//   rPtr      coefficient pointer
//   rTmp      for updating coefficient pointer
{    vvld(vB, vA, vB, vC);        // VLUT: variable length
                                  //   decoding
}    // group B0
label__LOOP:
{    stv(vB, rScratch, 0);        // LSU: store decoded result
                                  //   in the scratch area
     vvld(vB, vA, vB, vC);        // VLUT: decode next code
                                  //   word
}    // group B1
{    sadd(rTzzt, rZztab, rPtr);   // IALU: compute offset into
                                  //   inverse zigzag table
     lhz(rRun, rScratch, 0);      // LSU: load decoded run
}    // group B2
{    sadd(rTist, rIstab, rPtr);   // IALU: compute offset into
                                  //   inverse scale table
     lhz(rLevel, rScratch, 2);    // LSU: load decoded level
     bceob(label__EOB);           // BRU: conditional branch
                                  //   on EOB
}    // group B3
{    sadd(rTmp, rPtr, rRun);      // IALU: prepare rPtr update
     lbzx(rTist, rRun, rTist);    // LSU: load inverse scale
     bcnoentry(label__ENF);       // BRU: conditional branch
                                  //   on ENF
}    // group B4
{    ss1w(rLevel, rLevel, rTist); // IALU: inverse scale
                                  //   coefficient
     lbzx(rTzzt, rRun, rTzzt);    // LSU: load zigzag index
     bcadbs(label__ADBS);         // BRU: conditional branch
                                  //   on ADBS
}    // group B5
```

-continued

```
{   saddi(rPtr, rTmp, 1);              // IALU: update rPtr
    sthx(rLevel, rIDCT, rTzzt);        // LSU: store resulting
                                       //      IDCT coefficient
    bc(label__LOOP);                   // BRU: unconditional branch
}   // group B6
// process End Of Block (EOB)
label__EOB:
    . . .
// process ADjust Bit Stream (ADBS)
label__ADBS:
    . . .
// process Entry Not Found (ENF)
label__ENF:
    . . .
```

When the instructions in group B0 are executed, VLUT performs a variable length decoding operation by executing the vvld instruction. Before the execution of the vvld instruction, look-up tables (e.g., T1–T4 in FIG. 62) are loaded into look-up units; a bit stream is loaded into vector register vA; control information for vvld is loaded in vector register vC; and a bit pointer, pointing to the first bit of the first code word in vA, is stored in vector register vB. The bit stream in vA is right justified so that the input for fence bits is always 0. After the execution of the vvld instruction, the decoded run and level are stored in the vector register vB. The bit pointer in vB is updated to point to the next code word.

The decode loop starts with instruction group B1. In group B1, LSU stores the decoded run and level in a temporary area defined by the address in register rScratch. At the same time, VLUT starts to decode the next code word in vA.

While VLUT decoding the next code word in vA, other processing units receives instructions in group B2–B6 to process the decoded run and level, stored at the scratch area, to compute an IDCT coefficient.

In group B2, IALU computes offset rTzzt to the inverse zigzag look-up table by adding pointer rZztab to coefficient pointer rPtr. Pointer rZztab points to the inverse zigzag look-up table; and rPtr represents an index to the current entry in the look-up table. At the same time, LSU loads the decoded run (rRun) from the scratch area.

In group B3, IALU computes offset rTzzt to the inverse scale look-up table by adding pointer rIstab (pointer to the inverse scale look-up table) to coefficient pointer rPtr. LSU loads the decoded level (rLevel) from the scratch area. At same time, BRU checks if EOB is detected during decoding the code word. If EOB is detected, BRU branches into label__EOB.

In group B4, IALU increases rPtr by rRun and stores the result in rTmp. LSU loads the inverse scale from the look-up table pointed by rTist with an offset rRun and saves the result in rTist. BRU conditionally branches on condition ENF.

In group B5, IALU left shifts the decoded level (rLevel) to generate an IDCT coefficient and stores the result in rLevel. LSU loads the zigzag index into register rTzzt. BRU conditionally branches on condition ADBS.

In group B6, IALU updates coefficient pointer rPtr. LSU stores the IDCT coefficient in the buffer area rIDCT using the pointer rTzzt looked up from the inverse zigzag table.

In one embodiment of the present invention, a vector register contains 128 bits and can always accommodate one compressed DV block. When BRU conditionally branches on condition EOB or ADBS, the un-decoded data in the vector register file is stored for later use. In the above code sequence, a code word is decoded in 6 cycles. In parallel with variable length decoding operations, IDCT coefficients are computed and stored in an array suitable for the Inverse Discrete Cosine Transformation. Thus, a method for variable length decoding compressed video images according to present invention is very efficient. Note that different implementations may have different latencies and dispatch rates for various instructions. Once the latencies and dispatch rates are determined, the methods of the present invention can be implemented accordingly using different code sequences.

At least one embodiment of the present invention seeks to utilize random access capability of a vector look up unit (e.g., updating and looking up entries in look up tables in a vector look up unit using a set of indices) to transpose a matrix efficiently. It will be understood that the elements of a matrix do not have to represent numbers.

Figure 75:
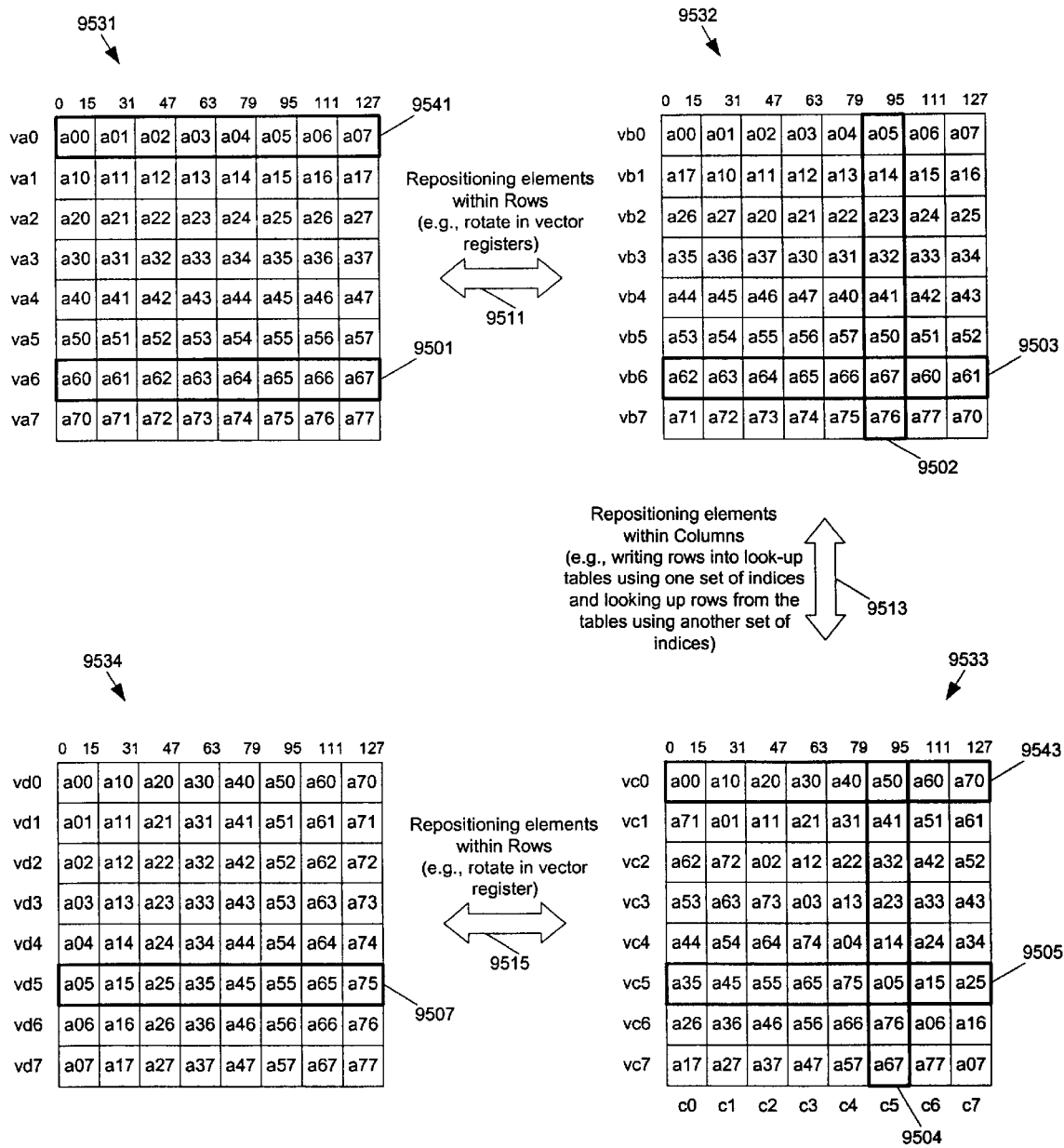
FIG. 75 shows methods to transpose a matrix using operations that change the positions of the elements within rows or within columns.

FIG. 75 shows methods to transpose a matrix using operations that change the positions of elements within rows or within columns. In FIG. 75, operations 9511, 9513 and 9515 transpose matrix 9531 into matrix 9534. Operation 9511 repositions elements within rows to generate matrix 9532. For example, row 9501 (vector va6) may be rotated in a vector register to generate row 9503 (vector vb6). Operation 9513 repositions elements within rows to generate matrix 9533. For example, elements in column 9502 may be rearranged to generate column 9504 (column c5). In one embodiment of the present invention, operation 9513 is performed by writing matrix 9532 one row at a time into a vector of look up unit using one set of indices and looking up matrix 9533 one row at a time from the vector look up unit using another set of indices. More details are described below.

Operation 9515 repositions elements within rows to generate matrix 9534. For example, row 9505 (vector vc5) is rotated in a vector register to generate row 9507 (vector vc5).

In one embodiment of the present invention, each vector register can hold 128 bits (i.e., the vector width is 128 bits). Thus, a vector register can hold 8 16-bit elements. For example, vector 9501 can be stored and rotated in a vector register to generate vector 9503. A vector look up units can hold 16 look up tables, each of which contains 256 8-bit data items. An 8-bit bit segment of a matrix element can be stored and looked up from one look up table, and the other 8-bit bit segment of the matrix element can be stored and looked up from another look up table. FIG. 76 shows examples of indices that may be used in a plurality of look-up tables to change the positions of elements within columns. Indices 9633 may be used to write rows of matrix 9532 into the 16 look up tables; and indices 9631 may be used to look up rows of matrix 9533 from the 16 look up tables. For example, indices 9607 may be used to write row 9503 into the look up tables. The element (a67) of row 9503 and column 9502 are written into look up table T10 and T11. The lower 8 bits of a67 are written into table T10; and the upper 8 bits of a67 is written into table T11. Similarly, indices 9601 may be used to look up row 9505 from the look up tables. Thus, after using indices 9613 to write the elements into tables T10 and T11 and using indices 9611 to look up elements from tables T10 and T11, the positions of the elements of column 9502 is changed to those in column 9504.

In a reverse order, operations 9515, 9513 and 9511 transpose matrix 9534 into matrix 9531. Thus, indices 9631 can be used to write the rows of matrix 9533 into the vector look up unit, and indices 9633 can be used to look up the rows of matrix 9532 from the vector look up unit.

Notice that a row of indices 9633 may be computed by adding a row of constants to another row indices. For example, row 9607 can be computed by adding a row of ones to row 9605. Similarly, a row of indices 9631 may be computed by rotating another row of indices. For example, row 9603 can be obtained by rotating row 9601. Thus, the indices 9631 and 9633 may be generated using simple vector operations from two vectors of indices.

FIG. 76 illustrates examples of indices which may be used to repositioning the elements within columns. Using the indices shown in FIG. 76, a matrix (e.g., matrix 9532) is written into a rectangular area in the vector look up unit. However, other indices may also be used to repositioning the elements without having to store the matrix in a rectangular area in the vector look up unit. In general, any set of indices that do not map two different elements into a same location in the vector look up unit can be used to store the rows of a matrix into the vector look up unit; and a corresponding set of indices can be used to look up the rows such that the elements in the columns are positioned at desirable locations. Since the elements of each column are written in a look up table, a set of indices can be constructed to look up rows of elements such that the elements in the columns are in any given orders.

While rotating in a vector register is a preferred way to repositioning the elements within rows, other vector operations may also be used to repositioning the elements, such as vector permutation operations.

Although FIGS. 75 and 76 illustrate examples where each element of the matrix is a 16-bit data item (e.g., integer or floating point number), the methods illustrated in FIGS. 75 and 76 can also be used to transpose matrices of elements of other data sizes, such as 8-bit or 32-bit. In a 128-bit vector processor, a 16×16 8-bit matrix can be transposed where an 8-bit element is written into and looked up from an 8-bit look-up table; and a 4×4 32-bit matrix can be transposed where a 32-bit element is split into 4 8-bit segments, each of which is written into and looked up from an 8-bit look-up table. The indices used for writing or looking up matrix elements depend on the data size of the elements of the matrix. For example, four indices are used in four 8-bit look up tables for 4 8-bit segments of a 32-bit element; 2 indices are used in two 8-bit look up tables for 2 8-bit segments of a 16-bit element; and one index is used for an 8-bit element.

Figure 77:
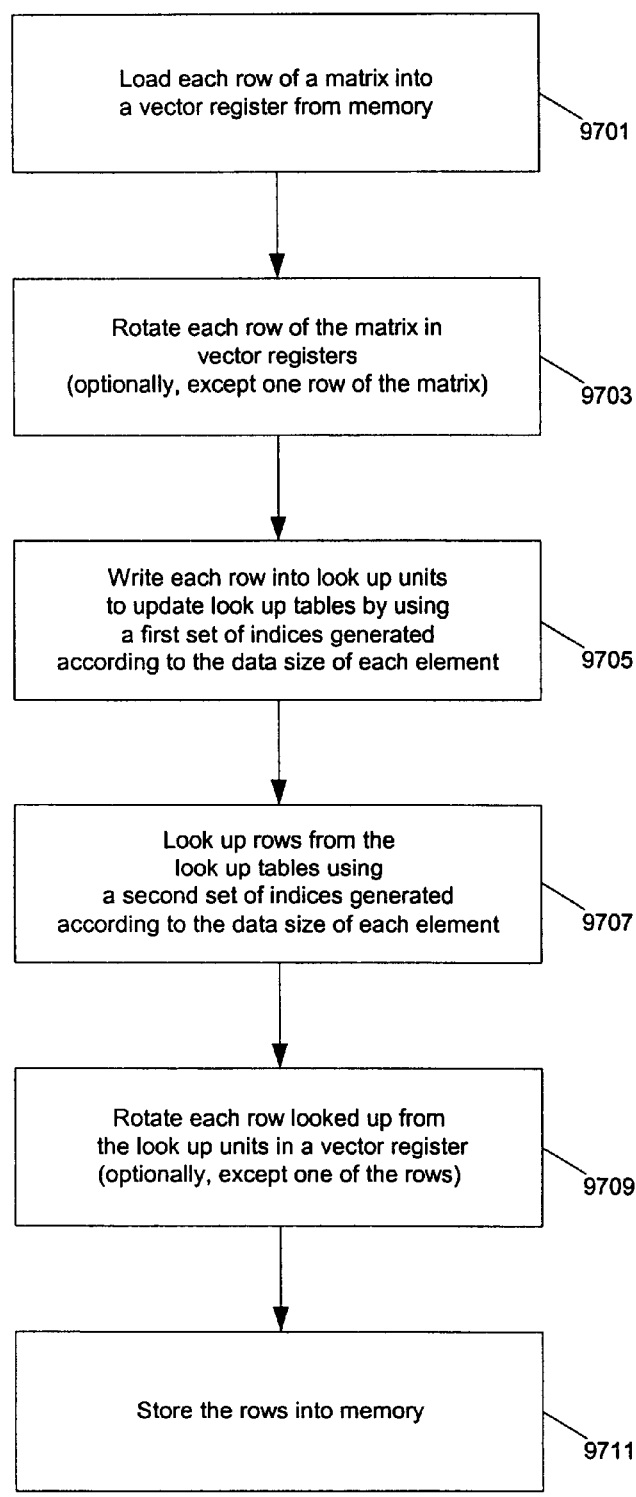
FIG. 77 shows a method to transpose a matrix using a vector processor according to one embodiment of the present invention.

FIG. 77 shows a method to transpose a matrix using a vector processor according to one embodiment of the present invention. Operation 9701 loads each row of a matrix from memory (e.g., local memory 2817 in FIG. 18 or host memory 1512 in FIG. 5B) into a vector register (e.g., an entry in vector register file 2802). Operation 9703 repositions the elements within each row by rotating each row of the matrix in the vector registers (optionally, except one row of the matrix). In some embodiments, it is not necessary to reposition the elements in one of the rows of the matrix (e.g., row 9541). Operation 9705 writes each row into the vector look up unit using a set of indices generated according to the data size of the elements of the matrix. An instruction such as that illustrated in FIG. 49 may be used to write the row into the vector look up unit. After all rows are written into look up tables, operation 9707 looks up rows from the look up units using another set of indices generated according to the data size of the elements of the matrix. An instruction such as that illustrated in FIG. 41 may be used to look up the rows. The rows looked up from the look up tables are rotated (optionally, except one of the rows) to obtain the rows of the transposed matrix. In some embodiments, it is not necessary to change the positions of the elements in one of the rows of the matrix (e.g., row 9543).

It will be appreciated that it is not necessary to load or rotate all the rows before rotating the rows or writing the rows into look up units. A row can be first loaded, rotated and written into the vector look up unit before another row is processed. Operations 9701, 9703 and 9705 may be performed on different rows of the matrix in parallel using a number of execution units. Similarly, operations 9707, 9709 and 9711 may be performed on different rows in parallel.

Figure 78:
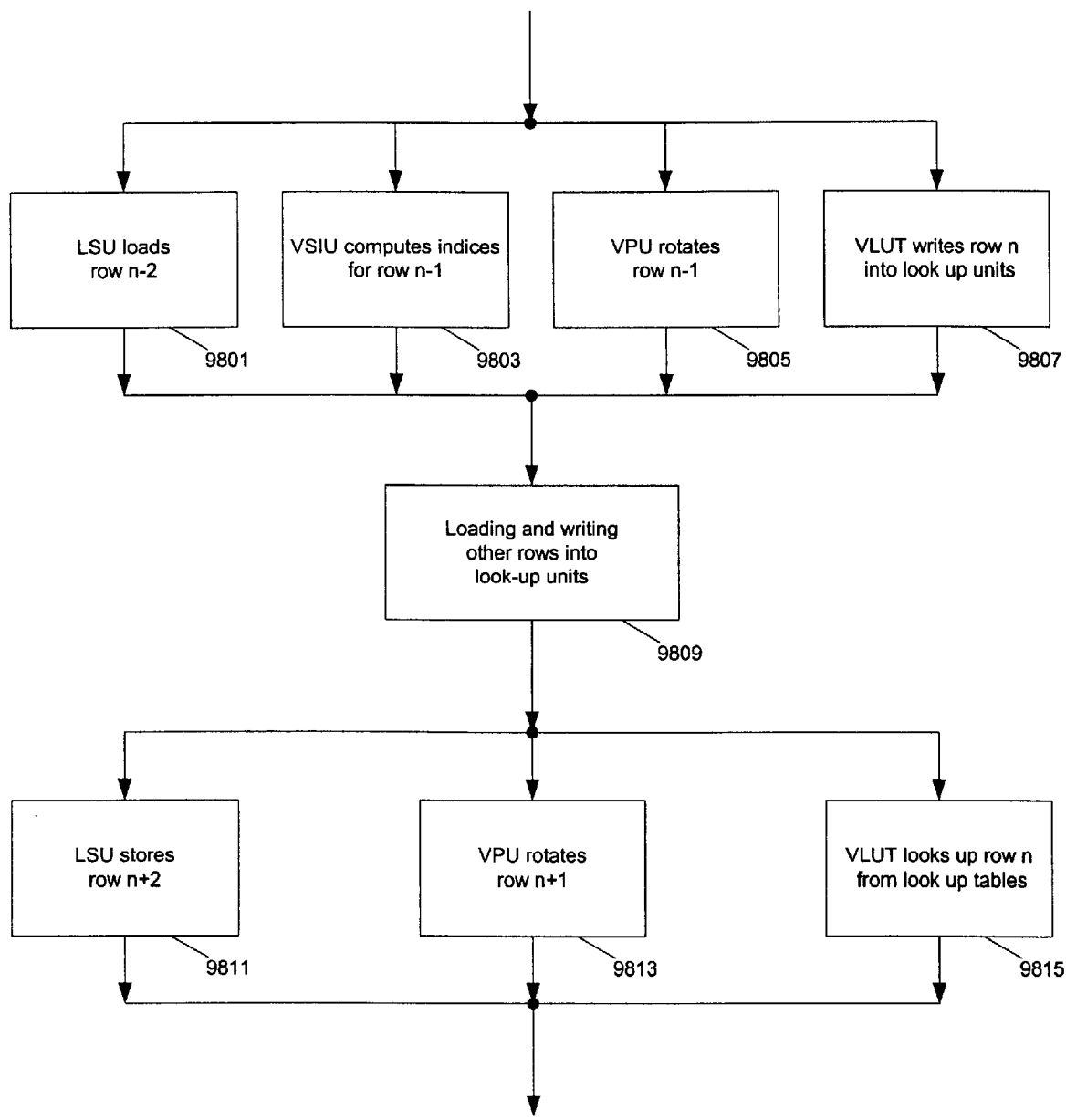
FIG. 78 shows a flow chart for a method to transpose a matrix using a VLIW processor according to one embodiment of the present invention.

FIG. 78 shows a flow chart for a method to transpose a matrix using a VLIW processor according to one embodiment of the present invention. A plurality of execution units (e.g., LSU 2816, VSIU 2809, VPU 2808, VLUT 2811 shown in FIG. 18) may be used to in parallel for matrix transposition. For example, while VLUT writes row n into look up units to update look up tables in operation 9807, VPU may rotate row n−1 in operation 9805; VSIU may computes indices for writing row n−1 in operation 9803 (e.g., by adding a vector of ones to the vector of indices for row n); and LSU may load row n−2 from memory in operation 9801. While VLUT looks up row n from look up tables in operation 9815 using pre-calculated (or pre-loaded) indices, VPU may rotate row n+1 looked up from VLUT in operation 9813; and LSU may store row n−2 of the transposed matrix into memory in operation 9811. Alternative, the VSIU may calculate indices for looking up row n−1 (e.g., by adding a vector of ones to the vector of indices for row n) in parallel with operation 9815; in this case, operation 9803 is not performed and operation 9807 uses pre-calculated indices.

One embodiment of the present invention is a code sequence to perform the transposition of an 8×8 16-bit matrix. In the following code sequence, various execution units execute the instructions in each group of instructions concurrently. Vector vone is a vector of ones. Vectors vi0, vi1, . . . , vi7 are the indices shown in FIG. 76. Before the execution of instruction group C1, vectors va0, va1, . . . , va7 contains the rows of the matrix (e.g., matrix 9531 in FIG. 75); and vector vj is a vector of zeroes. After the execution of group C16, vectors va0, va1, . . . , va7 contains the rows of the transposed matrix (e.g., matrix 9534 in f75). In instruction group C1, a vector of ones is added by VSIU to vj to generate the index for writing va1; VPU rotates va1 left by 14 bytes; and VLUT updates the vector look up unit using the data entries in vector va0 indexed by indices in vector vj. In group C1, the vector that needs no rotation is written into the look up units first. In group C16, the last vector (va0) that needs no rotation is looked up by VLUT, while VPU performs the last rotation operation on vector va1. Thus, only 16 cycles are required to transpose an 8×8 matrix.

```
{       vaddubs(vj, vj, vone);          // VSIU computes index for va1
        vsldoi(va1, va1, va1, 14);      // VPU rotates va1 left by 14 bytes
        vlutw8a(va0, vj);               // VLUT writes va0
}   //  group C1
{       vaddubs(vj, vj, vone);          // VSIU computes index for va2
        vsldoi(va2, va2, va2, 12);      // VPU rotates va2 left by 12 bytes
        vlutw8a(va1, vj);               // VLUT writes va1
}   //  group C2
{       vaddubs(vj, vj, vone);          // VSIU computes index for va3
        vsldoi(va3, va3, va3, 10);      // VPU rotates va3 left by 10 bytes
        vlutw8a(va2, vj);               // VLUT writes va2
}   //  group C3
{       vaddubs(vj, vj, vone);          // VSIU computes index for va4
        vsldoi(va4, va4, va4, 8);       // VPU rotates va4 left by 8 bytes
        vlutw8a(va3, vj);               // VLUT writes va3
}   //  group C4
{       vaddubs(vj, vj, vone);          // VSIU computes index for va5
```

-continued

```
              vsldoi(va5, va5, va5, 6);      // VPU rotates va5 left by 6 bytes
              vlutw8a(va4, vj);              // VLUT writes va4
        //    group C5
{             vaddubs(vj, vj, vone);         // VSIU computes index for va6
              vsldoi(va6, va6, va6, 4);      // VPU rotates va6 left by 4 bytes
              vlutw8a(va5, vj);              // VLUT writes va5
}       //    group C6
{             vaddubs(vj, vj, vone);         // VSIU computes index for va7
              vsldoi(va7, va7, va7, 2);      // VPU rotates va7 left by 2 bytes
              vlutw8a(va6, vj);              // VLUT writes va6
}       //    group C7
{             vlutw8a(va7, vj);              // VLUT writes va7
}       //    group C8
{             vlut8a(va7, vi7);              // VLUT looks up va7
}       //    group C9
{             vsldoi(va7, va7, va7, 14);     // VPU rotates va7 left by 14 bytes
              vlut8a(va6, vi6);              // VLUT looks up va6
}       //    group C10
{             vsldoi(va6, va6, va6, 12);     // VPU rotates va6 left by 12 bytes
              vlut8a(va5, vi5);              // VLUT looks up va5
}       //    group C11
{             vsldoi(va5, va5, va5; 10);     // VPU rotates va5 left by 10 bytes
              vlut8a(va4, vi4);              // VLUT looks up va4
}       //    group C12
{             vsldoi(va4, va4, va4, 8);      // VPU rotates va4 left by 8 bytes
              vlut8a(va3, vi3);              // VLUT looks up va3
}       //    group C13
{             vsldoi(va3, va3, va3, 6);      // VPU rotates va3 left by 6 bytes
              vlut8a(va2, vi2);              // VLUT looks up va2
}       //    group C14
{             vsldoi(va2, va2, va2, 4);      // VPU rotates va2 left by 4 bytes
              vlut8a(va1, vi1);              // VLUT looks up va1
}       //    group C15
{             vsldoi(va1, va1, va1, 2);      // VPU rotates va1 left by 2 bytes
              vlut8a(va0, vi0);              // VLUT looks up va0
}       //    group C16
```

FIGS. 75–78 shows methods to transpose a matrix where each row of the matrix can be loaded into a vector register. In order to transpose a matrix of a dimension such that a vector register is not large enough to hold an entire row of the matrix, the matrix is split into blocks (e.g., 16×16 8-bit blocks, or 8×8 16-bit blocks, or 4×4 32-bit blocks) so that each row of the blocks can be loaded into a vector register. Each block of the matrix can be transposed using the methods according the present invention and stored in an transposed order of the matrix.

While FIGS. 75–76 illustrate a method to transpose a square matrix, the methods shown in FIGS. 77–78 can also be used to transpose other rectangular matrices.

In one embodiment of the present invention, the transposition of a matrix of 16×16 8-bit elements takes only 32 cycles; and the transposition of a matrix of 8×8 16-bit elements takes only 16 cycles. When a series of vector merge instructions is used in same processor, the transposition of a matrix of 16×16 8-bit elements takes 64 cycles; and the transposition of a matrix of 8×8 16-bit elements takes 24 cycles. Thus, the methods according to the present invention significantly increase the efficiency in transposing matrices, so that they are faster than other software implementations and more flexible than solutions based on dedicated hardware. The matrix transposition methods according to the present invention can be used to transpose matrices of various dimensions, as well as matrices with elements of various sizes (e.g., 8-bit, 16-bit, 32-bit or 64-bit elements).

At least one embodiment of the present invention seeks to utilize Vector Look Up Unit (VLUT) to convert color components in one color space (e.g., YCrCb, RGB, YUV, YIQ, HSI, HSV, HLS or others) into color components in another color space.

Color space conversion may be based on a linear transformation. For example, $$Y = 0.257R + 0.504G + 0.098B + 16$$

$$Cb = -0.148R - 0.291G + 0.439B + 128$$

$$Cr = 0.439R - 0.368G - 0.071B + 128$$

However, color space conversion may also be based on a nonlinear transformation, such as $$Y = f11(R) + f12(G) + f13(B) + f1$$

$$Cb = f21(R) + f22(G) + f23(B) + f2$$

$$Cr = f31(R) + f32(G) + f33(B) + f3$$

The partial components (e.g., 0.257 R, or 0.439 B, or f32(G), or f3) of the new components can be computed algebraically. The partial components may also be looked up from a set of look up tables and be summed up as the new components.

The constant partial components may be incorporated into the other partial components, such that $$Y = g11(R) + g12(G) + g13(B)$$

$$Cb = g21(R) + g22(G) + g23(B)$$

$$Cr = g31(R) + g32(G) + g33(B)$$

Figure 90:
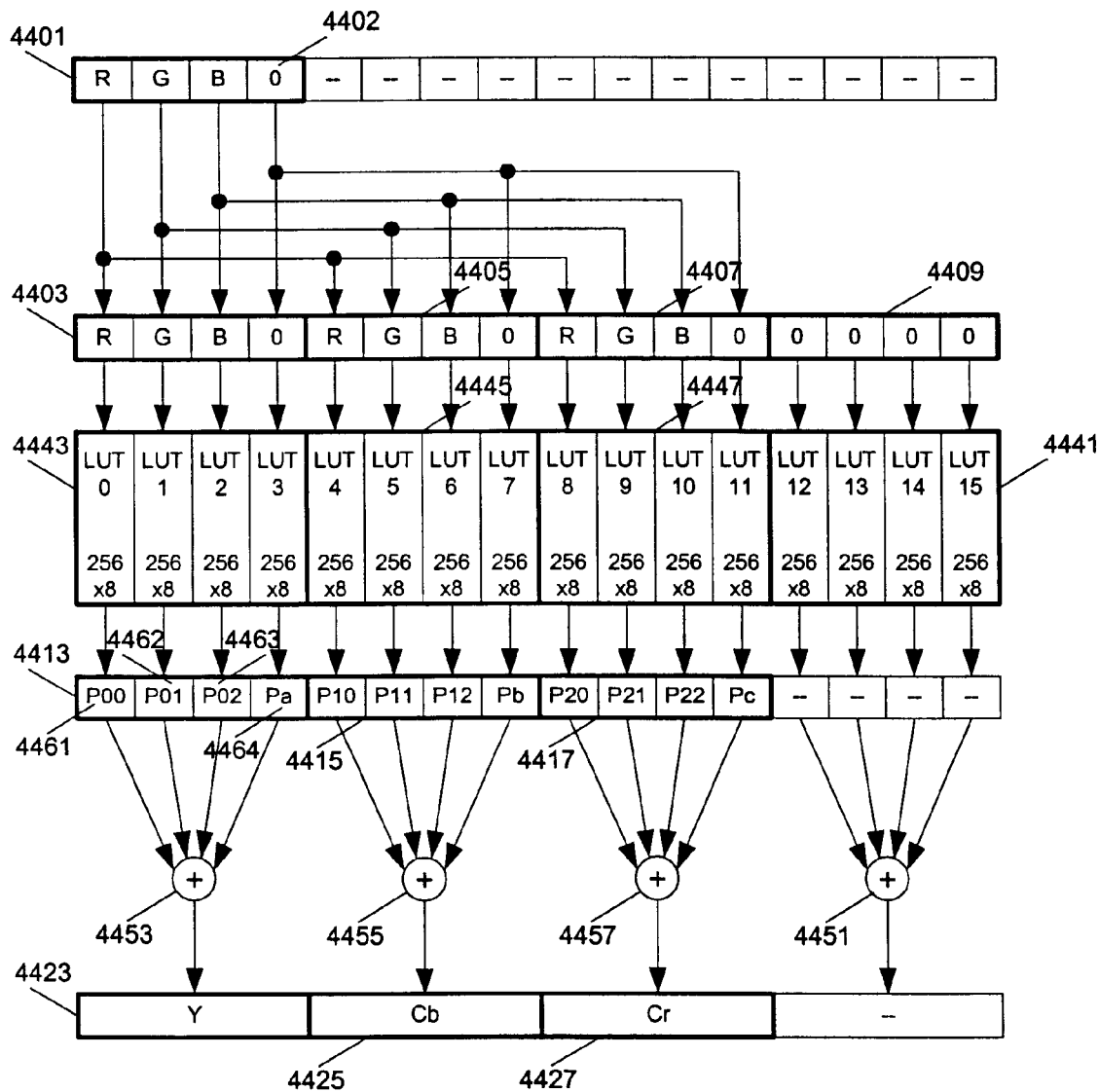
FIG. 90 shows an example of a method to convert a vector of elements into another vector of elements using a vector look up unit according to one embodiment of the present invention.

FIG. 90 shows an example of a method to convert a vector of elements into another vector of elements using a vector look up unit according to one embodiment of the present invention. The components (e.g., RGB) of a color stored in a vector register are used as indices 4401 to look up partial components. Index 4402 is used to look up the constant terms of the transformation. Indices 4401 are replicated (e.g., using a vector permutation operation) to generate indices 4403, 4405, and 4407 for looking up the partial components for all the new components (e.g., YCrCb). For example, a RGB color is converted into a YCrCb color. Since a color in a YCrCb space has only 3 components, look up tables 4441 are not used. Look up tables 4443 contain partial components (including the constants) for the Y component; look up tables 4445 contain partial components (including the constants) for the Cb component; and look up tables 4447 contain partial components (including the constants) for the Cr component. The partial components 4413, 4415, and 4417 are looked up simultaneously from a vector look up unit according to the present invention. For example, data 4461 equals to partial component f11(R); data 4462 equals to partial component f12(G); data 4463 equals to partial component f13(B); and data 4464 equals to partial component f1. The partial components are summed up (e.g., using a vector sum across partial instruction) to produce the color components 4423 (Y), 4425 (Cb), and 4427 (Cr). For example, component 4423 equals f11(R)+f12(G)+f13(B)+f1=Y. In one embodiment of the present invention, the summations 4453, 4455, 4457, and 4451 are performed using a vector sum across partial instruction in a Vector Complex Integer Unit (e.g., VCIU 2810 in FIG. 18). Although FIG. 90 illustrates an example where index 4402 is zero, index 4402 can take any other value when the entries of corresponding look up table (e.g., LUT3, LUT7 and LUT11) indexed by that value have the constant partial components for the transformation. When all the entries in each of the look up tables for looking up the constant partial components are filled with the corresponding constants, the value of the index 4402 can be arbitrary.

To compute all three color components using a linear transformation, 9 multiplications and 9 additions are required. However, when the method as shown in FIG. 90 is used, the new components can be computed using three vector operations (e.g., a vector permutation operation to compute indices 4403–4409, a vector table look up operation to look up partial components 4413–4417, and a vector sum across partial operation to add up partial components into components 4423–4427). Further, these vector operations may be run in parallel in different execution units to provide one color conversion per cycle throughput. More details are described below.

The computed components 4423–4427 may be further clamped to the maximum dynamic range (e.g., from −128 to 127) and represented as 8-bit data. Alternatively, the computed components may be stored with extended precision for further manipulations.

In FIG. 90, look up tables for all the partial components for converting a color can be loaded into a vector look up unit. Thus, after a vector look up unit is loaded with the look up tables, all new components for a set of pixels can be computed in a single pass without having to reload the vector look up unit. However, when partial components of extended precision are used, a vector look up unit may not be able to hold all the tables for looking up the partial components. In this case, multiple passes are necessary. In each of the passes, a subset of the look up tables is loaded into the vector look up unit to compute one or more new components for the set of pixels. The constant partial components may be combined with other non-constant partial components or be added during the summation stage to reduce the required number of look up tables, especially when extended precision is used.

Figure 91:
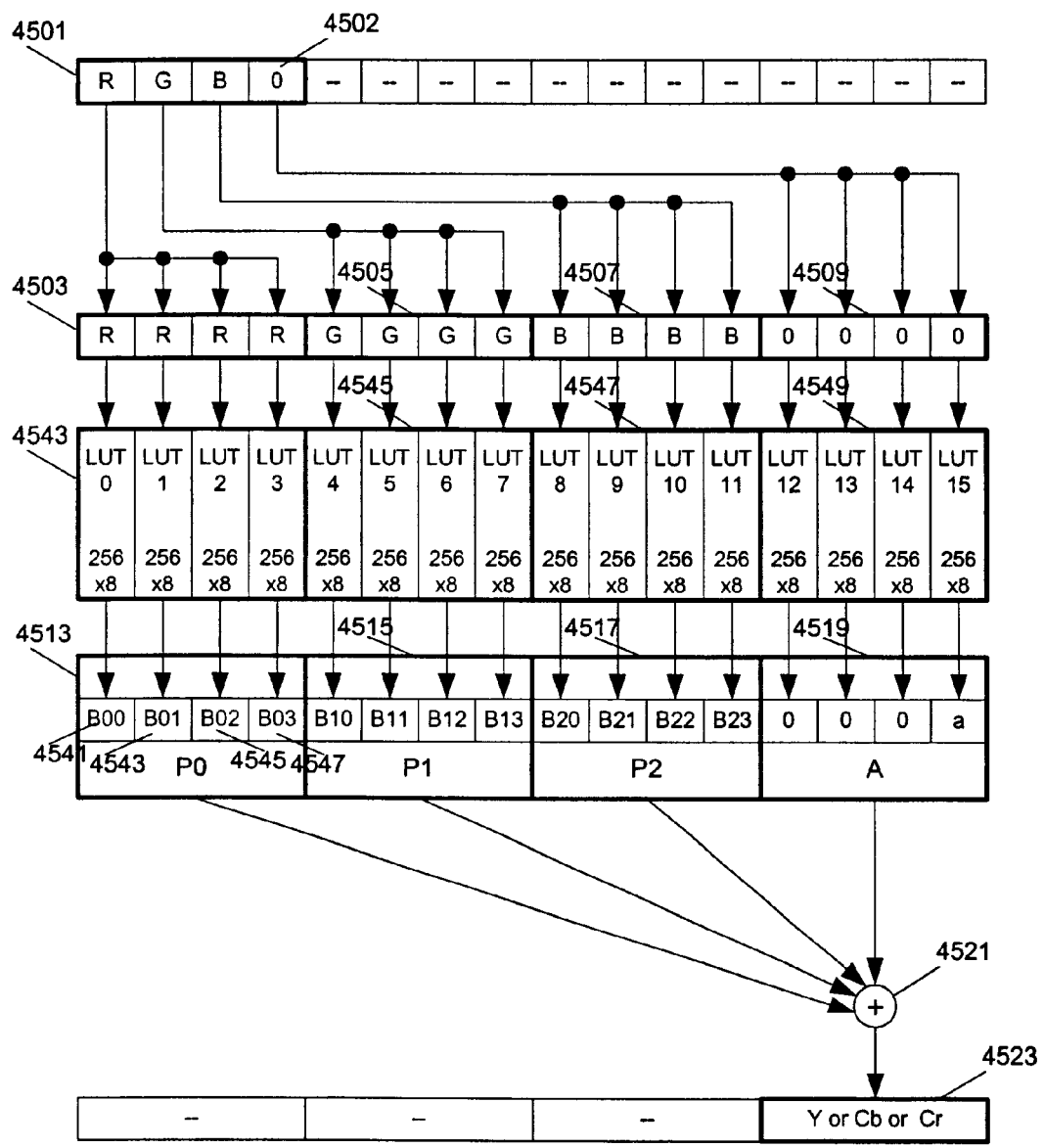
FIG. 91 shows an example of a method to convert a vector of elements into another an element of another vector using extended precision in a vector look up unit according to one embodiment of the present invention.

FIG. 91 shows an example of a method to convert a vector of elements into another an element of another vector using extended precision in a vector look up unit according to one embodiment of the present invention. The indices 4501 are replicated as indices 4503, 4505, 4507 and 4509 for looking up the bytes of the partial components of extended precision. For example, indices 4503 are used in look up tables 4543 for looking up a 4-byte partial component 4513 (P0). Byte 4541 from look up table LUT0 in 4543 is the first byte of P0; byte 4543 is the second byte; byte 4545 is the third byte; and byte 4547 is the forth byte of P0. Similarly, partial component 4515 due to the G component is looked up from look up tables 4545; and partial component 4547 due to the B component is looked up from look up tables 4547. The constant 4519 of the transformation is looked up from tables 4549. When all the entries of the each of tables 4549 takes the same value, index 4502 can be arbitrary. Vector sum across operation 4521 sums the partial components 4513–4519 into a component (4523) of extended precision. To convert RGB components for a set of pixels into YCrCb components, the look up tables 4543–4549 are first loaded with the look up tables for the partial components for the Y component. A loop can be used to compute the Y components for the set of pixels in a one pass. Then, the look up tables for the Cb components can be loaded; and a loop can be used to compute the Cb components for the set of pixels another pass. Finally, the Cr components can be computed in the same fashion.

FIG. 90 and FIG. 91 illustrate the methods for converting RGB color components into YCrCb components. It will be appreciated that these methods can also be applied to the conversion of color components between other color spaces (e.g., from RGB to YUV, or from YUV to HSV). In a 128-bit vector processor, it is possible to look up 16 8-bit numbers, 8 16-bit number, 5 24-bit numbers or 4 32-bit numbers in parallel. If less precision is required, more elements can be processed in parallel. Thus, in a 128-bit vector processor, four new components may be computed from 8-bit partial components after a single vector look up operation; two new components may be computed from 16-bit partial components in extended precision after a single vector look up operation; and one component may be computed from 24-bit or 32-bit partial components in extended precision after a single vector look up operation. When extended precision is used, not all components can be computed in a single vector look up operation. It is necessary to reload (update) the look up tables for the computation of the other components. The computed components may be packed into various different formats, such as packing each components into a separate frame buffer, or interleaving components into a single buffer (e.g., interleaved CrYCbY in 4:2:2 CCIR 601 frame buffer, or interleaved YCrCbX 4:4:4 format). The computed components can either be stored with extended 32-bit precision for further manipulations or be scaled and clamped to the 8-bit dynamic range. Any output packing can be achieved by applying vector permutation operations on the pixel components. Different components may be computed using partial components of different precisions. For example, the Y components may be computed using 32-bit partial components in one pass; and the Cb and Cr components may be computed using 16-bit partial components in another pass.

It will be appreciated that the above method can also be used to convert other types of vectors, whenever the new components can be expressed as sums of partial components.

Figure 92:
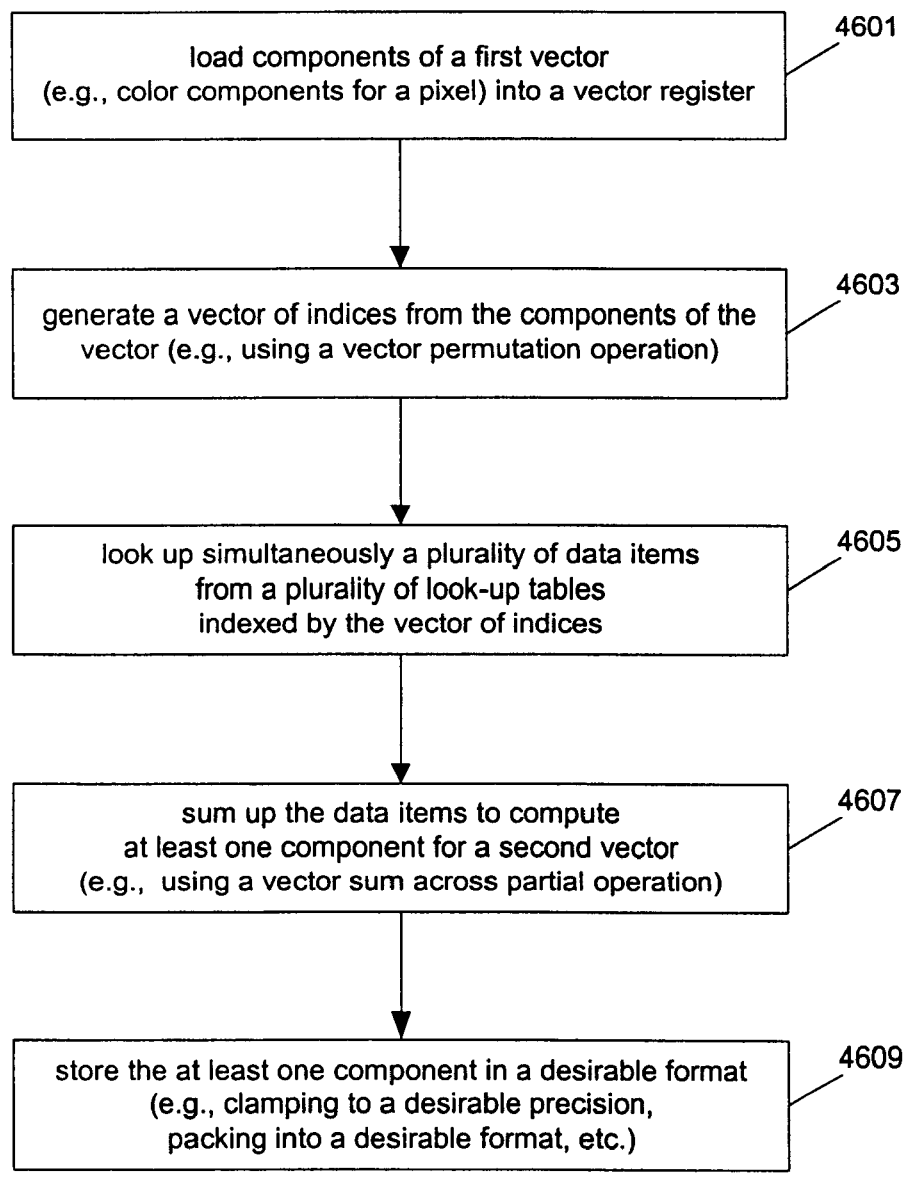
FIG. 92 shows a flow chart for a method to convert a vector of elements into another vector of elements using a vector processor according to one embodiment of the present invention.

FIG. 92 shows a flow chart for a method to convert a vector of elements into another vector of elements using a vector processor according to one embodiment of the present invention. After the look up tables in a vector look up unit are updated for the partial components, operation 4601 loads the components of a first vector (e.g., RGB components of a pixel, or XYZ components of a position vector) into a vector register. Operation 4603 generates a vector of indices from the components of the vector. Operations 4603 may be performed using a vector permutation operation or other vector restructuring operations than can replicate indices in a vector register. Operation 4605 looks up simultaneously a plurality of data items from the look up tables using the vector of indices. The plurality of data items comprises partial components of the components of a second vector. Operation 4607 sums the partial components to produce at least one component for the second vector. Operation 4607 may be performed using a vector sum across partial instruction or a vector sum across instruction. Operation 4609 stores the computed components in a desirable format in memory. It will be appreciated that operations 4601–4609 may be repeated for computing a subset of components for a plurality of vectors, before the look up tables are updated for computing another subset of components of the plurality of vectors. Thus, when the color space conversion must achieve high precision for high quality results, all components of a set of pixels may be computed in two or three passes.

Figure 93:
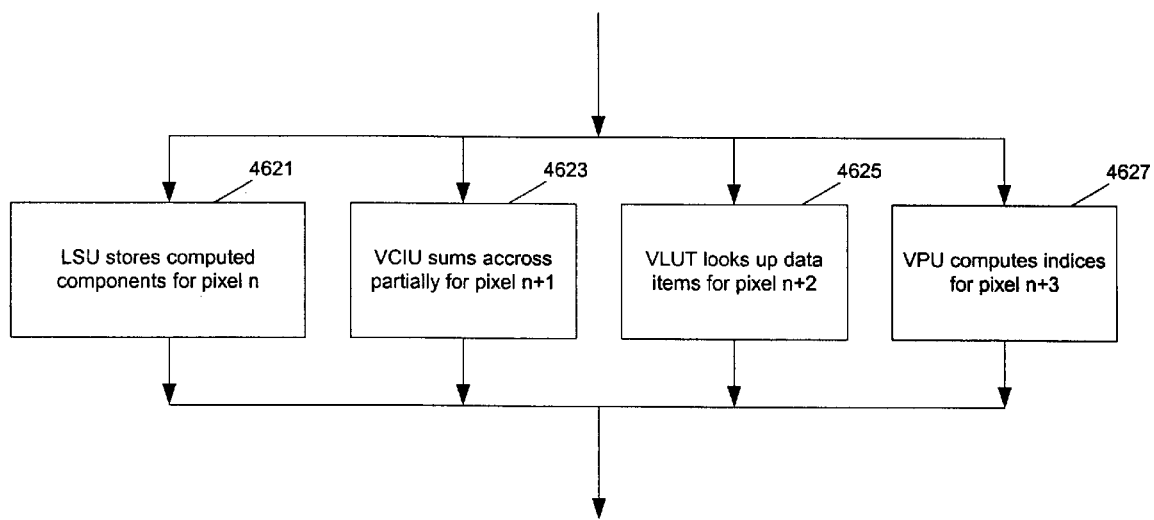
FIG. 93 shows a flow chart for a method to convert a vector of elements into another vector of elements using a VLIW processor according to one embodiment of the present invention.

FIG. 93 shows a flow chart for a method to convert a vector of elements into another vector of elements using a VLIW processor according to the present invention. While VLUT looks up partial components for pixel n+2 in operation 4625, VCIU may be concurrently used to sum across (or sum across partially) the partial components for pixel n+1; VPU may compute indices for looking up partial components for pixel n+2; and LSU may store computed components for pixel n. Thus, a number of execution units can process in parallel to compute components of a vector using a transformation defined by a set of look up tables.

The above methods according to the present invention greatly accelerate the speed for Color Space Conversion (CSC). The programmability of the VLIW engine allows the CSC methods according to the present invention to accommodate various pixel input/output formats (packing formats), clamping modes and dynamic range manipulations. When the CSC is applied at the last stage of a video processing pipeline prior to display, the pixels must be scaled and clamped back to their native dynamic range. When the CSC is applied during some intermediate stage of image composition output pixels may be kept with extended precision in order to achieve higher quality of composition results. Since the CSC methods according to the present invention can be carried out using memory-to-memory operation, they can be used in any stage in the video-processing pipeline. Further, the CSC methods according to the present invention provide the flexibility with respect to the trade off between precision and speed: a higher computation speed can be achieved by requesting less precision in the result, and higher precision in the result can be achieved with a slower computation speed.

It will be also appreciated that the color transformation defined by the look up tables can also incorporate other factors, such as gamma corrections. The look up tables can also be used to represent nonlinear color transformation, which may be used to matching the colors on a display device to that in a printing device, etc.

At least one embodiment of the present invention seeks to utilize a vector look up unit to blending images efficiently.

For all algebraic definitions of blending factors K1 and K2, except those which are functions of both alpha1 and alpha2, a one dimensional lookup table (LUT) with either 256 or 1024 entries can be pre-calculated for 8-bit or 10-bit keys. Using look up tables to compute blending factors has the benefit that all types of blending operation that can be expressed in the form of the general blending equation have deterministic performance. Also, the LUT operation is always faster than computing blending factors algebraically for each attribute of each pixel (a requirement of sequential planar processing). Further, the entries of the look up table can be stored as floating point numbers to eliminate the operation to convert integer "keys" to floating point numbers. Arithmetic of various precisions, such as 32-bit floating point arithmetic or 16-bit fixed point arithmetic, may be used for different performance-quality tradeoffs. Alternatively, the entries of the look up table can be stored as fixed point numbers or integers.

The look up units in a vector look up unit (VLUT) can be configured into a plurality of look up tables. For example, in a 128-bit vector processor, a VLUT can be configured into 16 look up tables of 8-bit data entries indexed by 8 bit indices. A number of the look up tables can be used to store different bit segments of a data item of extended precision. For example, three of the look up tables may be used to store the first, second, and third bytes (i.e., bits 0–7, 8–15 and 16–23) of 24-bit data items. An 8-bit index can be replicated for the three look up tables to look up simultaneously the first, second, and third bytes of a data item indexed by the 8-bit index. Thus, 16 look up tables can be used to look up simultaneously 16 8-bit data items, or 8 16-bit data items, or 4 32-bit data items, etc. Further, the look up tables can be arranged in such a way that bytes of data items of extended precision looked up from a VLUT are properly aligned in a vector register.

Figure 79:
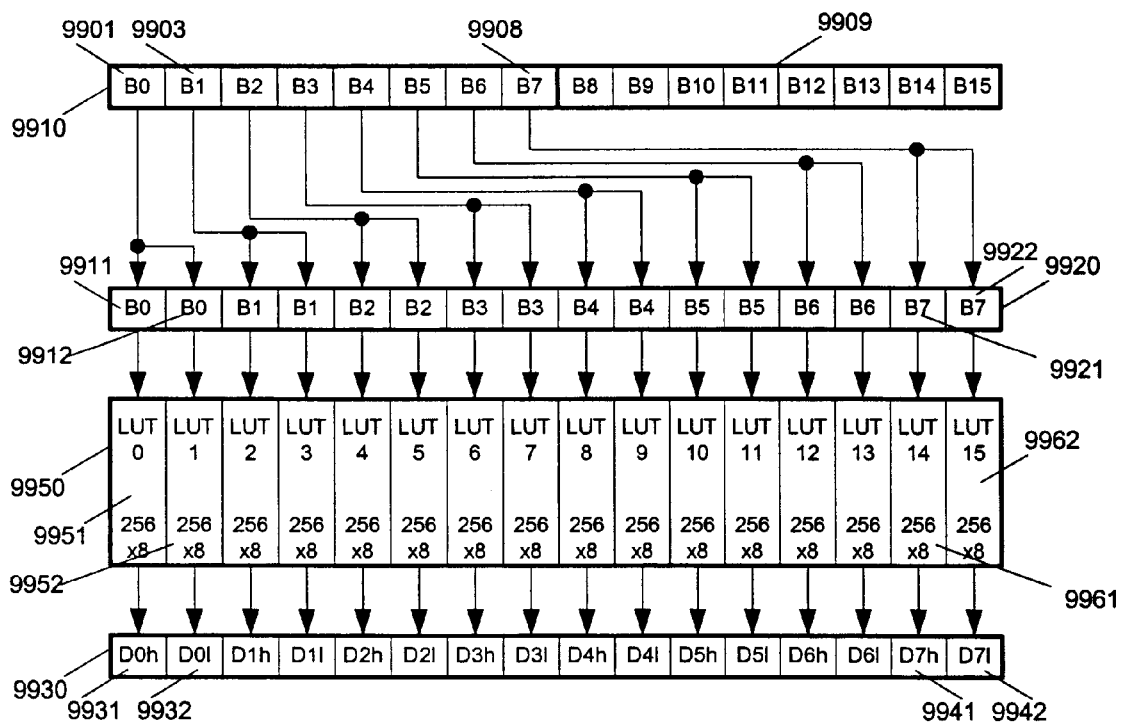
FIG. 79 shows an example of a method to look up a vector of data items of extended precision according to one embodiment of the present invention.

FIG. 79 shows an example of a method to look up a vector of data items of extended precision according to one embodiment of the present invention. Indices 9910 are a portion of the indices in a vector register. Indices 9910 may be replicated as indices 9920 using a vector operation (e.g., using a vector merge operation or a vector permutation operation). Every index in indices 9910 is replicated multiple times for looking up multiple bytes of the data items from the look up tables in the vector look up unit. For example, index 9901 (B0) is replicated as indices 9911 and 9912 for look up tables 9951 (LUT0) and 9952 (LUT1) to look up bytes 9931 (D0h) and 9932 (D0l) of a data item. Since LUT1 contains the higher bytes of the data items, and LUT2 contains the lower bytes of the data items, D0h and D0l represent a correctly aligned 2-byte data item. Similarly, index 9908 is replicated as indices 9921 and 9922 to look up a data item with bytes 9941 and 9942 looked up respectively from tables 9961 and 9962. Similarly, indices 9909 may be replicated to look up another vector of 16-bit data items from the look up tables.

Although FIG. 79 illustrates an example of looking up 2-byte data items using a vector look up unit, it will be appreciated that the method can be used to look up data items of other extended precision, such as 24-bit or 32-bit data.

Loading the look up units of a VLUT is a time-consuming operation, which should be avoided wherever possible while processing an image. The look up tables of blending factors for the first and second images can be loaded sequentially into a VLUT for converting a set of keys into blending factors. However, one operation for loading tables into the VLUT can be eliminated by loading half of the look up tables with blending factors for the first image (e.g., K1), and the other half of the look up tables for the second image (e.g., K2). Thus, vectors of blending factors for the first and second image can be looked up in parallel. Further, when the look up tables for the blending factors for both the first and second images of a frame are loaded in a VLUT, subsequent table loading operations may be eliminated if the same set of keys can be used for blending the subsequent frames of images.

Figure 80:
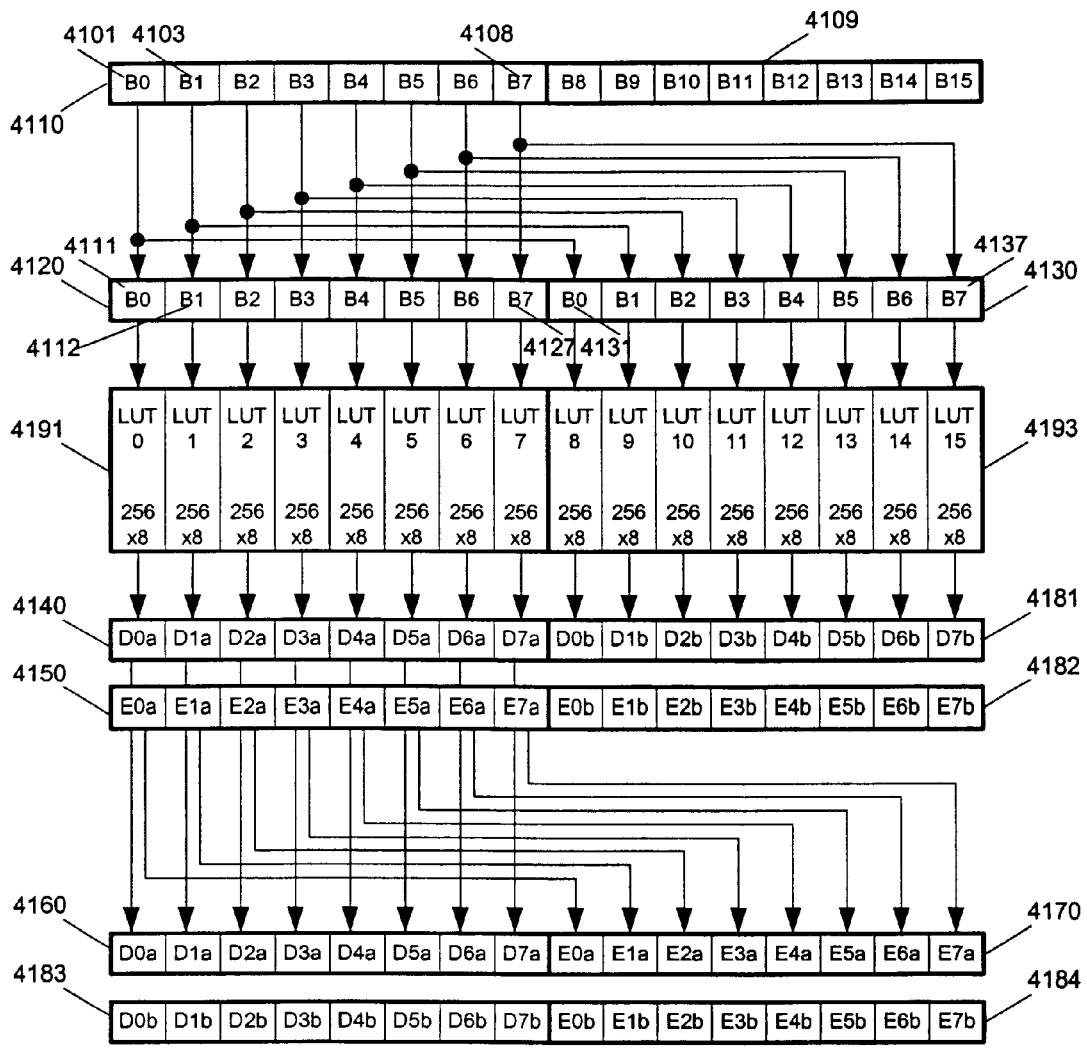
FIG. 80 shows an example of a method to look up two vectors of data items in parallel for one vector of indices according to one embodiment of the present invention.

FIG. 80 shows an example a method to look up two vectors of data items in parallel for one vector of indices according to one embodiment of the present invention. A vector of indices 4110 is replicated as two groups of indices 4120 and 4130. Each group of indices looks up a vector of data items. For example, indices 4120 are used in look up tables 4191 to look up data items 4140; and indices 4130 are used in look up tables 4193 to look up data items 4181. Similarly, indices 4109 may be used to look up data items 4150 from tables 4191 and data items 4182 from tables 4193. Data 4140 and 4150 can be packed into a vector register as data 4160 and 4170 looked up from tables 4191; and data 4181 and 4182 can be packed into a vector register as data 4183 and 4184 looked up from tables 4193. Thus, a vector of indices is used to look up two vectors of data items in parallel from two sets of look up tables. Note that indices 4110 and 4109 may be used in a single look up operation to obtain data 4160 and 4170, if tables 4191 are replicated in the place of tables 4193 (LUT8–LUT15). However, in such an approach, it is necessary to load tables 4193 (in LUT0–LUT15) after looking up 4160 and 4170 in order to look up data 4183 and 4184, which leads to an extra operation for loading look up tables.

In one embodiment of the present invention, tables 4191 are loaded with entries for looking up the blending factors for the first image (e.g., K1); and the tables 4193 are loaded with entries for looking up the blending factors for the second image (e.g., K2). Thus, the blending factors for both images are looked up simultaneously. Although, FIG. 80 illustrates an example where the blending factors for different images are separated in groups 4140 and 4181, the look up tables and the replication of indices may be arranged such the blending factors for the first and the second images are stored in an interleaved format in a vector register after the look up operation (e.g., when the look up tables are interleaved and the indices are replicated in a fashion as in FIG. 79).

Figure 81:
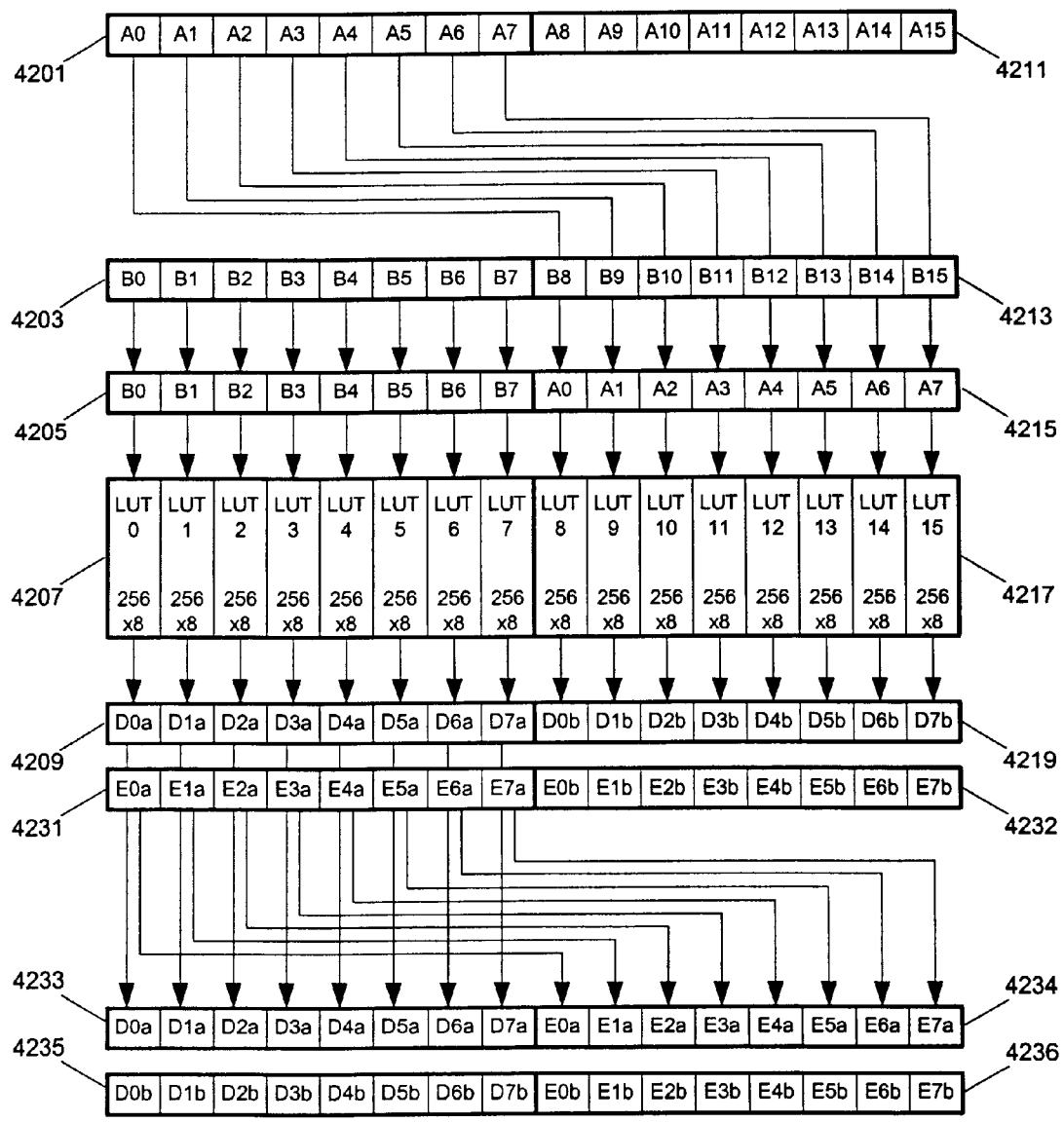
FIG. 81 shows an example of a method to look up two vectors of data items in parallel for two vectors of indices according to one embodiment of the present invention.

FIG. 81 shows an example of a method to look up two vectors of data items in parallel for two vectors of indices according to one embodiment of the present invention. Indices 4201 and 4203 from two different vectors are replicated as indices 4205 and 4215 for look up tables 4207 and 4217 to look up data 4209 and 4219. Similarly, indices 4211 and 4213 are used in tables 4207 and 4217 respectively to look up data 4231 and 4232. Data 4209 and 4231 can be packed into a vector register as data 4233 and 4234 looked up from tables 4207; and data 4219 and 4232 can be packed into a vector register as data 4235 and 4236 looked up from tables 4217.

For some types of blending, K1 is a function of alpha1 while K2 is a function of alpha2, or vice versa. To avoid table reloads, in one embodiment of the present invention, tables 4207 are used to convert alpha1 to K1 and tables 4217 are used to convert alpha2 to K2. Thus, two vectors of keys are used to generate indices to look up in parallel two respective vectors of blending factors for the two images.

Figure 82:
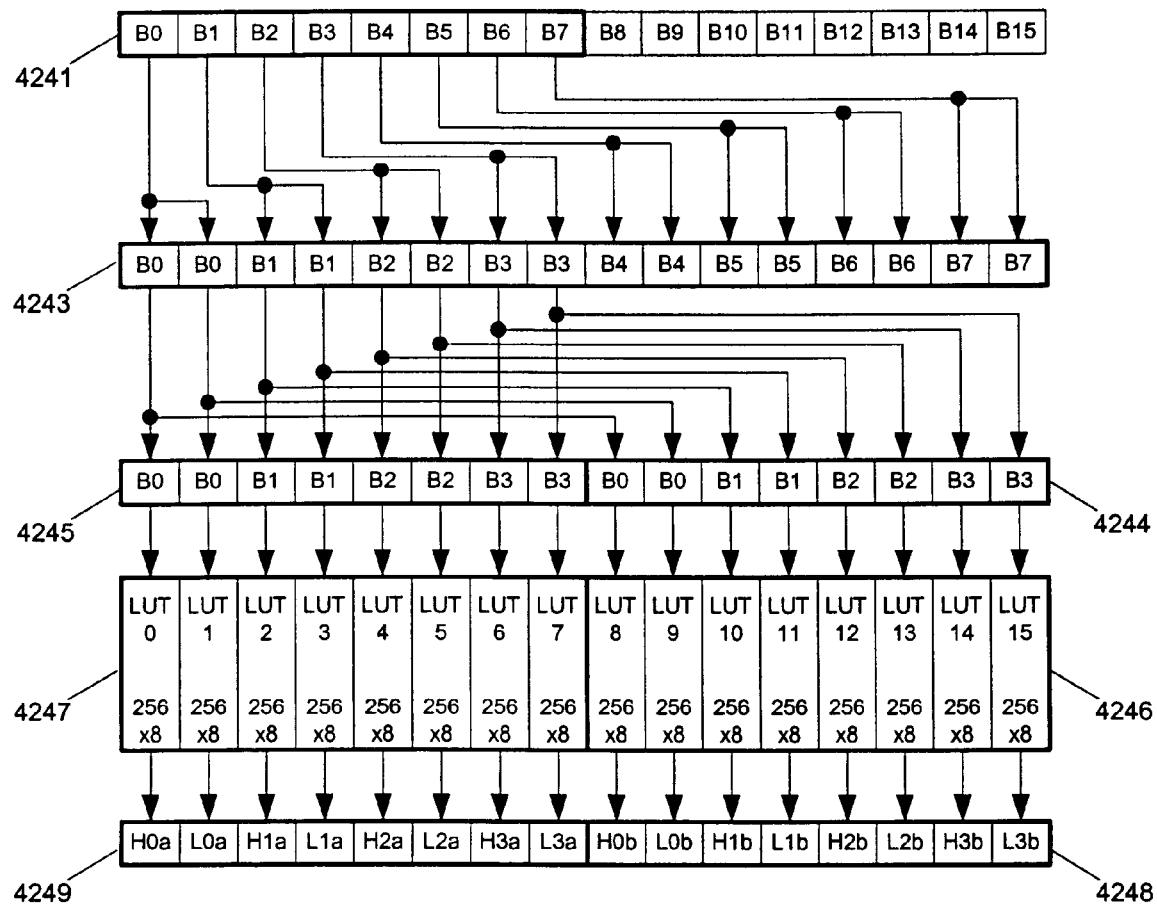
FIG. 82 shows an example of a method to look up two vectors of data items of extended precision in parallel for one vector of indices according to one embodiment of the present invention.

It will be appreciated that the methods illustrated in FIG. 79 and FIG. 80 (or FIG. 81) may be combined to look up two vectors of data of extended precision in parallel. FIG. 82 shows an example of a method to look up two vectors of data items of extended precision in parallel for one vector of indices. Indices 4241 are replicated as indices 4243 for looking up data items of extended precision. Part of indices 4243 is replicated as indices 4245 and 4244 for look up tables 4247 and 4246 to look up vectors 4249 and 4248. Note that indices 4245 and 4244 can be produced from indices 4241 using a single vector permutation operation.

Figure 83:
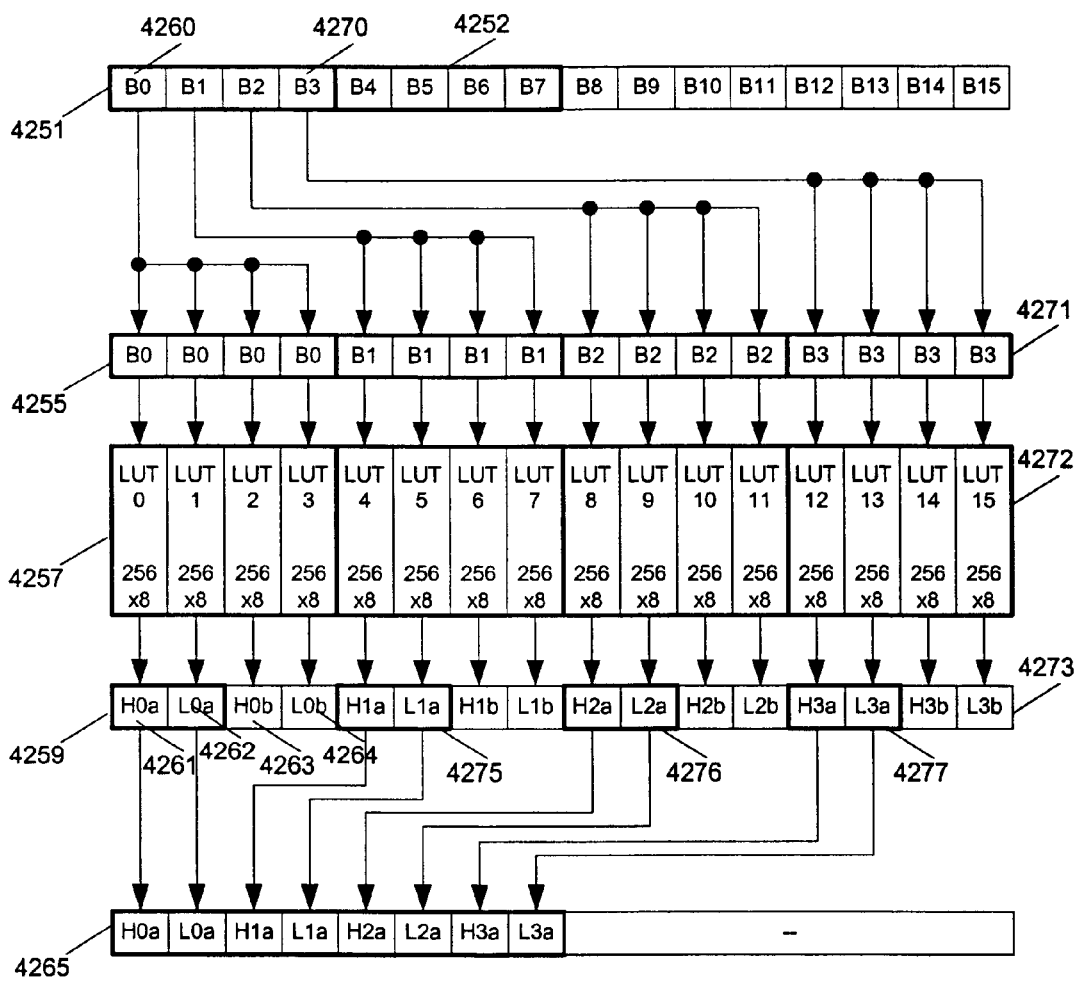
FIG. 83 shows another example of a method to look up two vectors of data items of extended precision in parallel for one vector of indices according to one embodiment of the present invention.

FIG. 83 shows another example of a method to look up two vectors of data items of extended precision in parallel for one vector of indices according to one embodiment of the present invention. Index 4260 of indices 4251 is replicated as indices 4255 for look up tables 4257 to look up two data items of extended precision. Bytes 4261 and 4262 are the higher and lower 8-bits of the data item 4259 for the first output vector; and bytes 4263 and 4264 are the higher and lower 8-bits of the data item for the second output vector. Similarly, date items 4275–4277 are for the first output vector. The date items for the first and the second output vectors are interleaved in the vector register after the look up operation. To separate the first and second output vectors, vector restructuring instructions (e.g., a vector packing instruction or a vector permutation instruction) may be used to pack the data items of output vectors into separate vector registers. For example, date items 4259, 4275–4277 may be packed into a vector 4265. The date items looked up using two groups of indices (e.g., indices 4251 and 4252) can be packed into two vector registers.

From the above description, it would be apparent to those skilled in the art that the look up tables may be arranged in a VLUT in a variety of way to produces two output vectors in a variety of formats (e.g., interleaved or grouped in certain fashion) after a vector look up operation.

Figure 84:
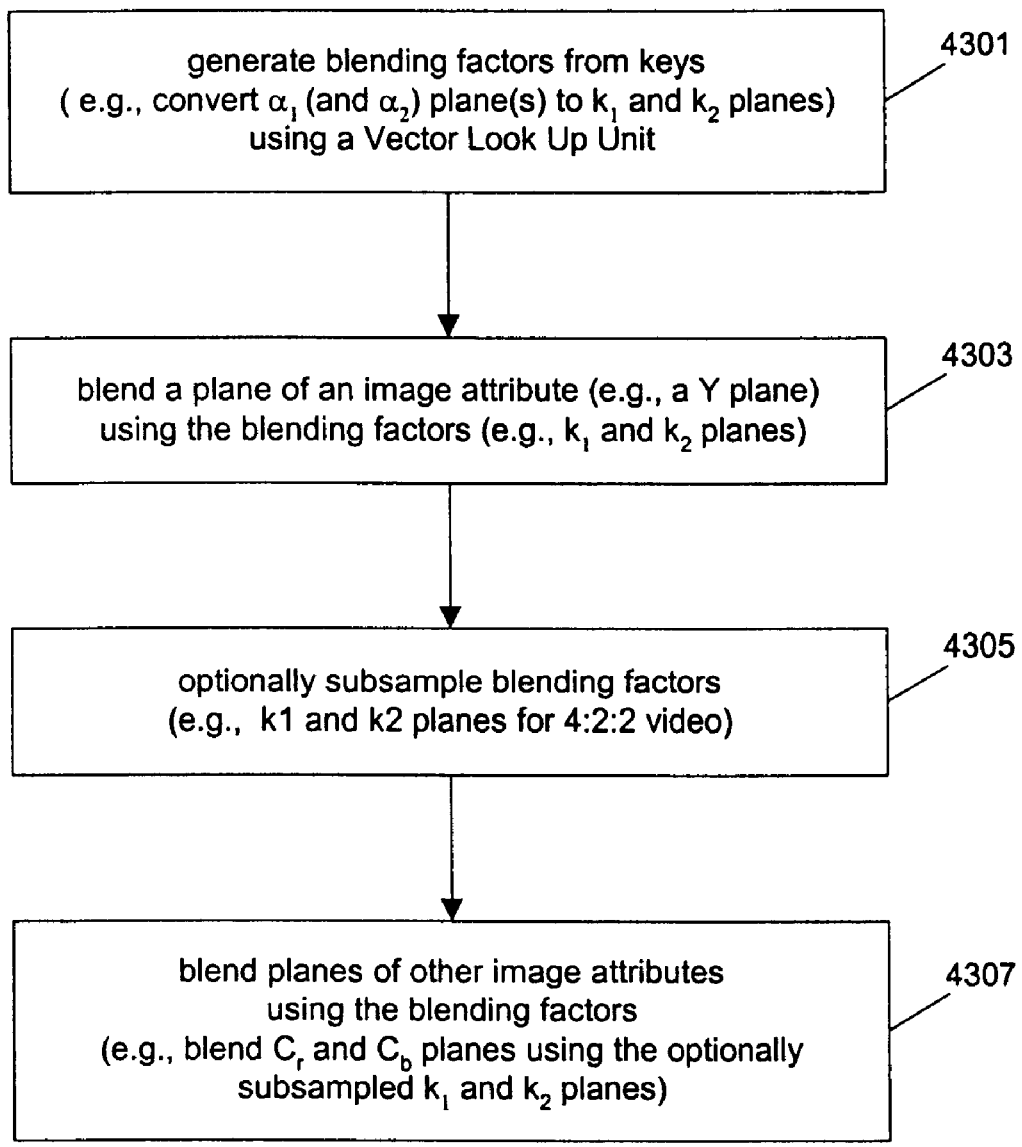
FIG. 84 shows a method to blend two images using a vector look up unit according to one embodiment of the present invention.

FIG. 84 shows a method to blend two images using a vector look up unit according to one embodiment of the present invention. After the look up tables for the blending factors are loaded into the vector look up unit, operation 4301 converts keys for a set of pixels into blending factors using the vector look up unit. For example, the keys for the pixels in a frame may be stored in a buffer, named alpha plane. In some embodiment, two alpha planes (alpha1 and alpha2) are used for determining the blending factors for each of the two source images. Operation 4301 converts the alpha plane (or alpha planes) into blending factor planes (buffers for blending factors) using a vector look up unit. The blending factors for the source images may be looked up sequentially, or may be looked up in parallel using the methods illustrated in FIGS. 79–83. Operation 4303 blends an image attribute (e.g., Y plane using blending factor planes). Optionally, operation 4305 subsamples the blending factors when different image attributes have different sample rates. For example, to blending 4:2:4 YCrCb video images, the blending factors for a Y plane may be subsampled before blending a Cr or Cb plane. Operation 4307 blends the other image attributes using the blending factors. The blending factors for different images may be stored in different planes (buffers), the blending factors may also be stored in a single buffer in an interleaved format.

In one embodiment of the present invention, a multiply accumulate loop is used to compute the blended image attribute using the blending factors and the images attributes from the two source images. Floating point operations are used; and four components per vector may be processed on a 128-bit vector processor. The resulting image attributes are converted from floating point numbers to integer numbers before being stored into host memory.

Figure 85:
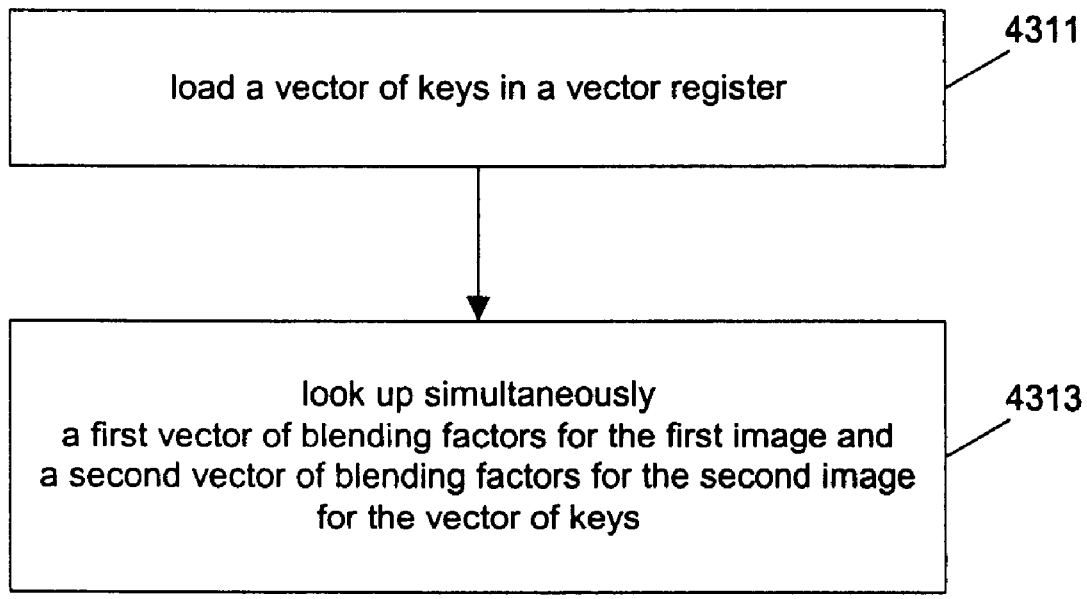
FIG. 85 shows a method to look up vectors of blending factors using a vector look up unit according to one embodiment of the present invention.

FIG. 85 shows a method to look up vectors of blending factors using a vector look up unit according to one embodiment of the present invention. Operation 4311 loads a vector of keys into a vector register. Operation 4313 looks up simultaneously a first vector of blending factors for the first image and a second vector of blending factors for the second image for the vector of keys. The blending factors for the first and second images may be interleaved in a vector register, or may be separated in two groups in a vector register. The blending factors for different images may be stored in different buffers as separate planes of blending factors, or be stored in a buffer in an interleaved format. The blending factors looked up from the look up tables may be floating point numbers, or may be numbers of extended precision (e.g., 16-bit fixed point numbers or 32-bit floating point numbers).

Figure 86:
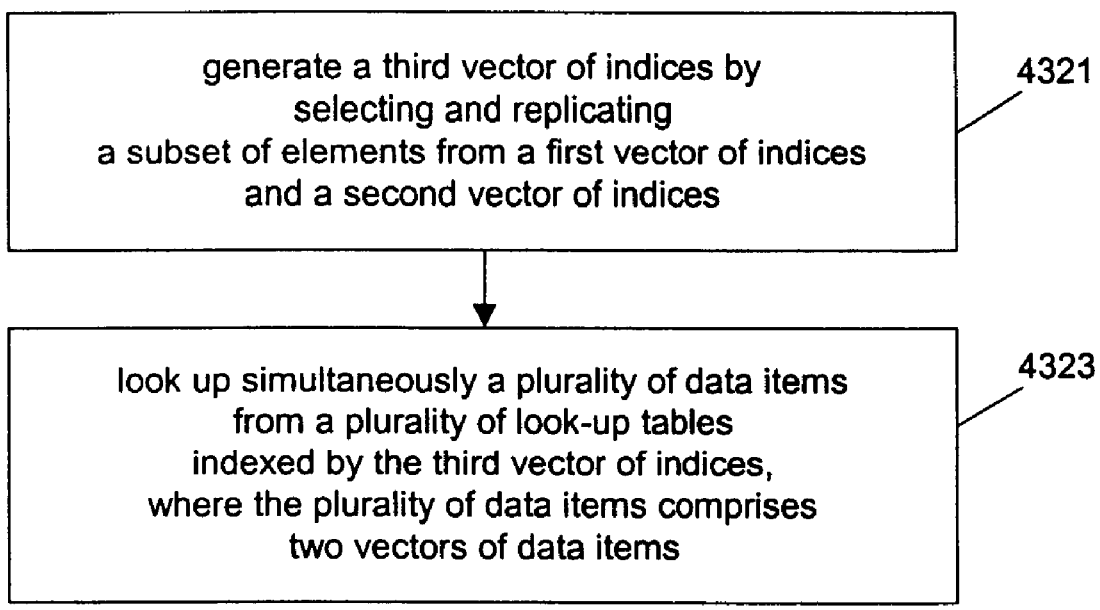
FIG. 86 shows a method to look up two vectors of data items in parallel for two vectors of indices using a vector look up unit according to one embodiment of the present invention.

FIG. 86 shows a method to look up two vectors of data items using two vectors of indices. Operation 4321 generates a third vector of indices by selecting and replicating a subset of elements from the two vectors of indices. Operation 4323 looks up simultaneously a plurality of data items from a plurality of look-up tables in the vector look up unit indexed by the third vector of indices. The plurality of data items comprises the data items of two vectors of data items, corresponding to the indices replicated from the two vectors of indices respectively. The data items for the two vectors of data items may be interleaved, or grouped into separate groups, or packed in other formats in a vector register. The two vectors of indices may be two different vectors, or may be the same vector. The method shown in FIG. 86 may be used to convert keys to blending factors.

Figure 87:
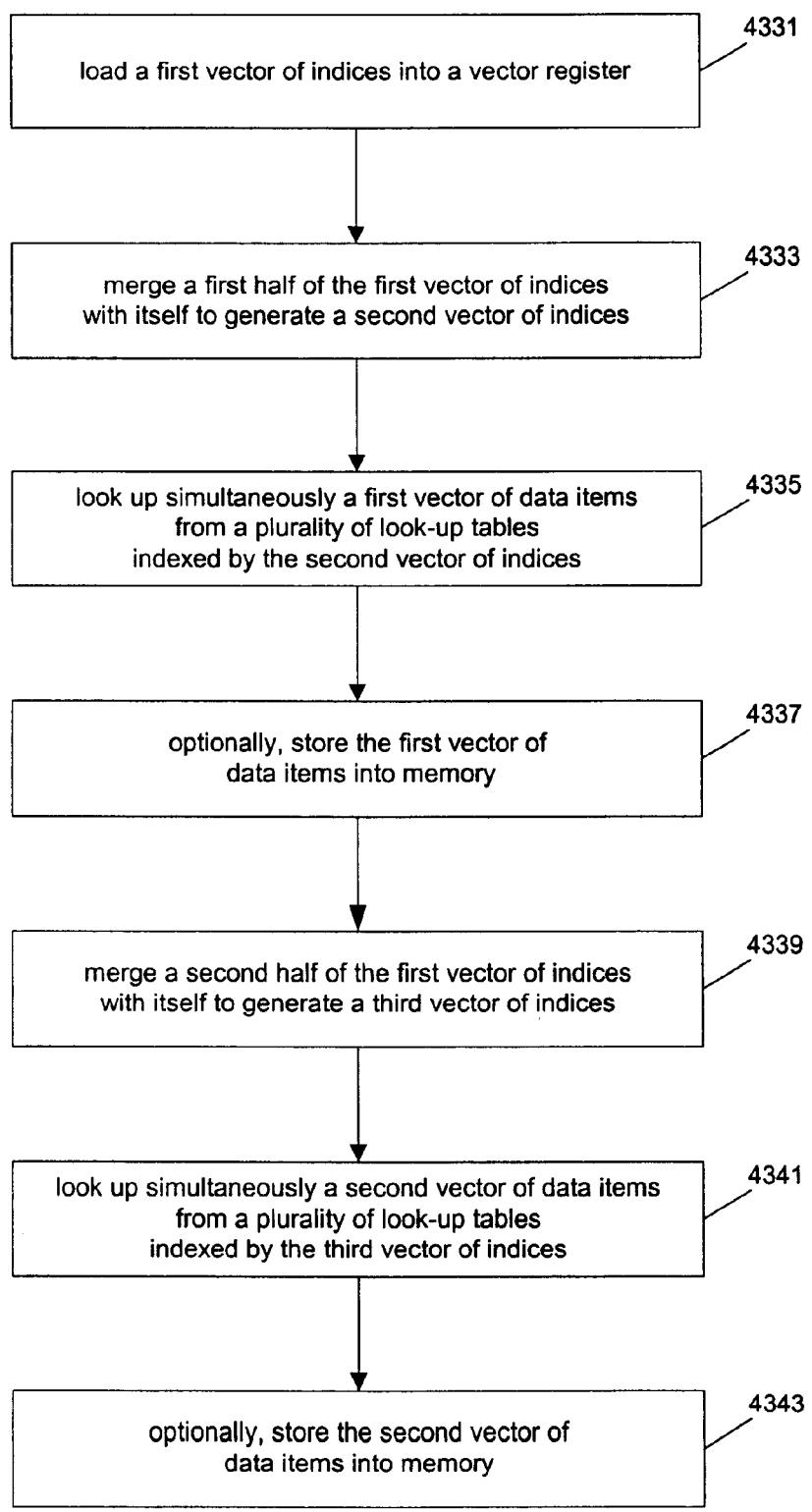
FIGS. 87–89 show flow charts for methods to look up two vectors of data items in parallel for one or two vectors of indices.
Figure 88:
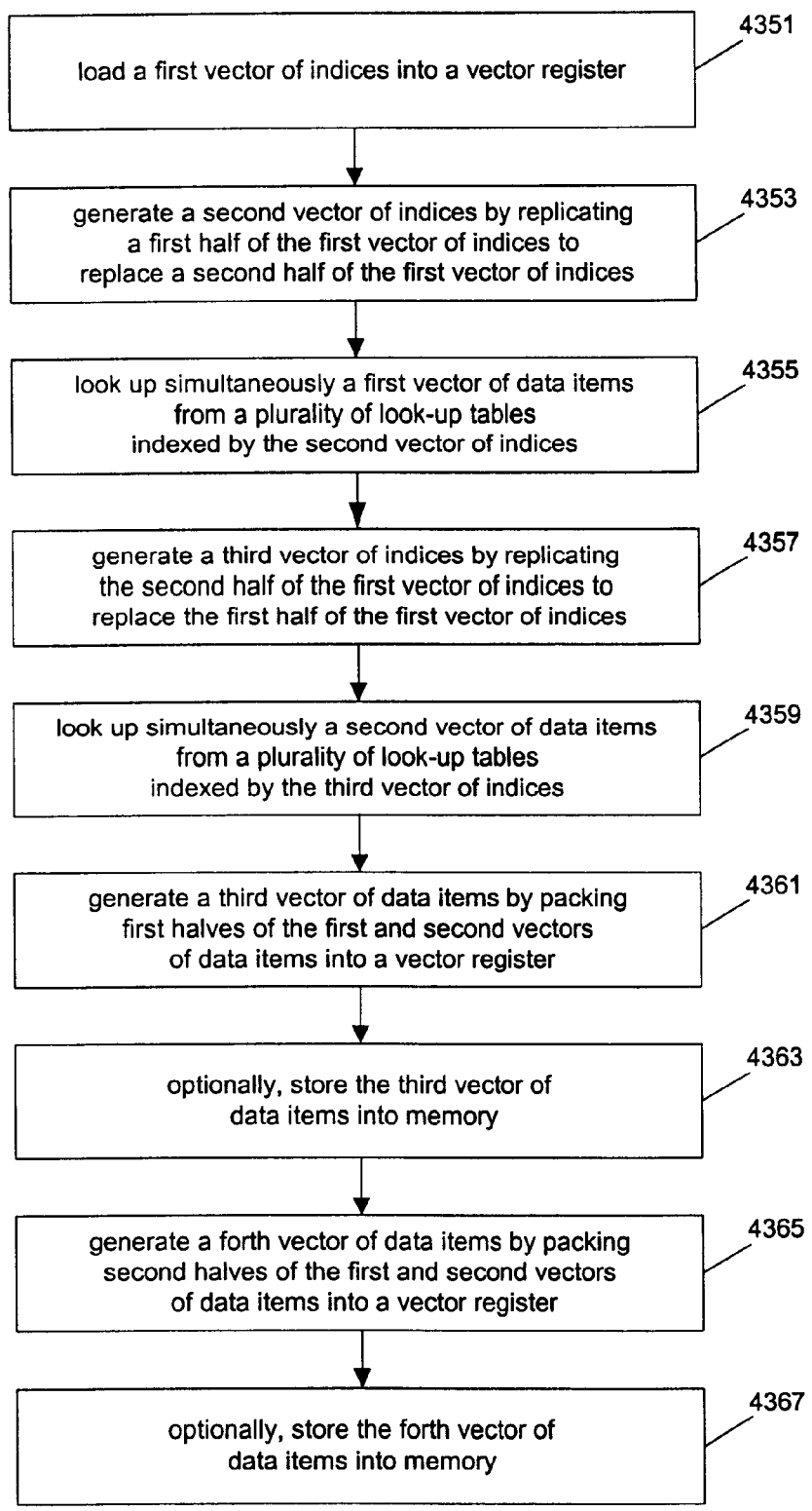
Figure 89:
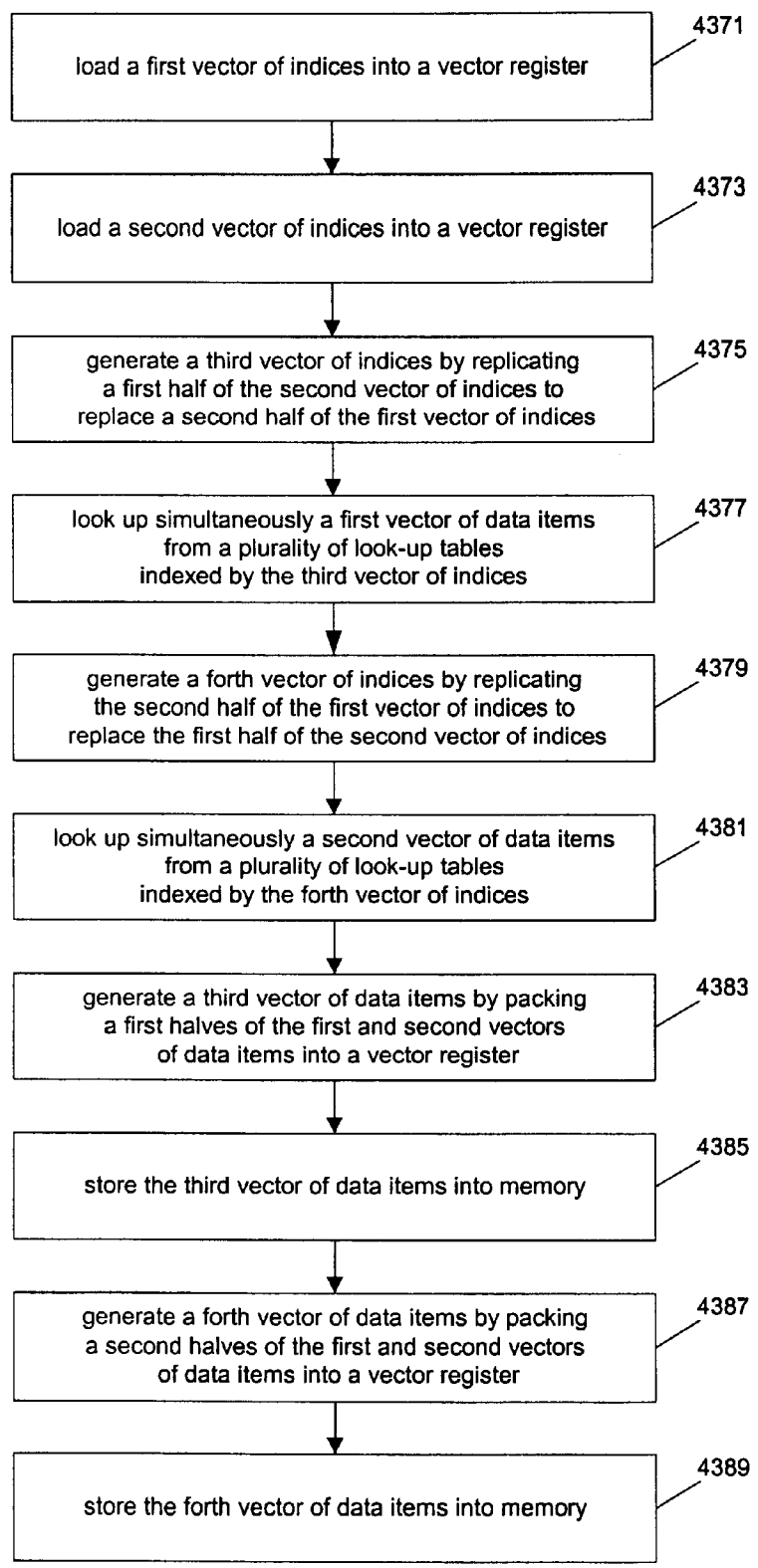

FIGS. 87–89 show flow charts for methods to look up two vectors of data items in parallel for one or two vectors of indices.

In FIG. 87, after operation 4331 loads a first vector of indices into a vector register, operation 4333 merges a first half of the first vector of indices with itself to generate a second vector of indices (in a fashion illustrated in FIG. 79). Operation 4435 looks up simultaneously a first vector of data items from a plurality of look-up tables in a vector look up unit indexed by the second vector of indices. Optionally, operation 4337 stores the first vector of data items into memory. Similarly, operations 4339–4343 look up a second vector of data items from using the second half of the first vector of indices. The method in FIG. 87 can be used to look up two vectors of data items of extended precision, or two interleaved vectors of data items, which may be repacked into two new vectors. The merging operations (in operations 4333 and 4339) may be performed using vector merge instructions, or vector permutation instructions, or other vector restructuring instructions.

In FIG. 88, after operation 4351 loads a first vector of indices into a vector register, operation 4353 generates a second vector of indices by replicating a first half of the first vector of indices to replace a second half of the first vector of indices (in a fashion illustrated in FIG. 80). Operation 4355 looks up simultaneously a first vector of data items from a plurality of look-up tables in a vector look up unit indexed by the second vector of indices. Similarly, operations 4357 and 4359 look up a second vector of data items using a second half of the first vector. Operation 4361 packs the first halves of the first and second vectors of data items into a third vector of data items; and, optionally, operation 4363 stores the third vector of data items into memory. Similarly, operation 4365 packs the second halves of the first and second vectors of data items into a forth vector of data items; and, optionally, operation 4367 stores the forth vector of data items into memory.

In FIG. 89, after operations 4371 and 4373 load first and second vectors of indices into vector registers, operation 4375 generates a third vector of indices by replicating a first half of the second vector of indices to replace a second half of the first vector of indices (in a fashion illustrated in FIG. 81). Operation 4377 looks up simultaneously a first vector of data items from a plurality of look-up tables in a vector look up unit indexed by the third vector of indices. Similarly, operations 4379 and 4381 looks up a second vector of data items using second halves of the first and second vectors of indices. Similar to operations 4361–4367, operations 4383–4389 repack the first and second vectors of data items into third and forth vectors of data items, corresponding respectively to the first and second vector of indices.

From the above description, it would be apparent to those skilled in the art that a variety of variations of the methods in FIGS. 87–89 can be used to look up two vectors of data items of extended precision (e.g., 16-bit, 24-bit, or 32-bit data items) in parallel for one or two vectors of indices.

At least one embodiment of the present invention seeks to decode a bit stream using Very Long Instruction Word (VLIW) processing engines. Each VLIW engine (e.g., engine 2800 in FIG. 18) comprises a number of execution units, such as Integer Arithmetic Logical Unit (e.g., IALU 2805), Integer Shift Unit (e.g., ISHU 2806), Load Store Unit (e.g., LSU 2816), Vector Permute Unit (e.g., VPU 2808), Vector Simple Integer Unit (e.g., VSIU 2809), Vector Complex Integer Unit (e.g., VCIU 2810), Vector Look Up Table Unit (e.g., VLUT 2811), and Branch Unit (e.g., BRU 2824). The execution units can process information in parallel, and VLUT can perform variable length decoding very efficiently. Thus, various methods according the present invention can be used to decode bit streams efficiently.

While a DV video stream is used to illustrate various methods of decoding a bit stream using VLIW processing engines, it will be appreciated that various method illustrated here may also be applied to decoding other bit streams, such as video streams encoded using various MPEG standards or images in JPEG standards.

Due to the limited amounts of local memory and instruction cache available on a processing engine, multiple stages of decoding may be utilized to reduce the requirement on the local memory and eliminate the instruction cache misses. In each stage, only the instructions and data required to perform the operations in that stage is loaded into a processing engine. The command queue mechanism described earlier can be used to maintain a multi-stage frame decode operation since the processing engine is capable to reload execution environments (instructions and arguments) autonomously without the intervention from the host software. Each stage is a memory to memory operation, in which the instructions and data are loaded from the host memory into the processing engine, and the processing results are transferred back from the local memory of the processing engine to the host memory.

Figure 63:
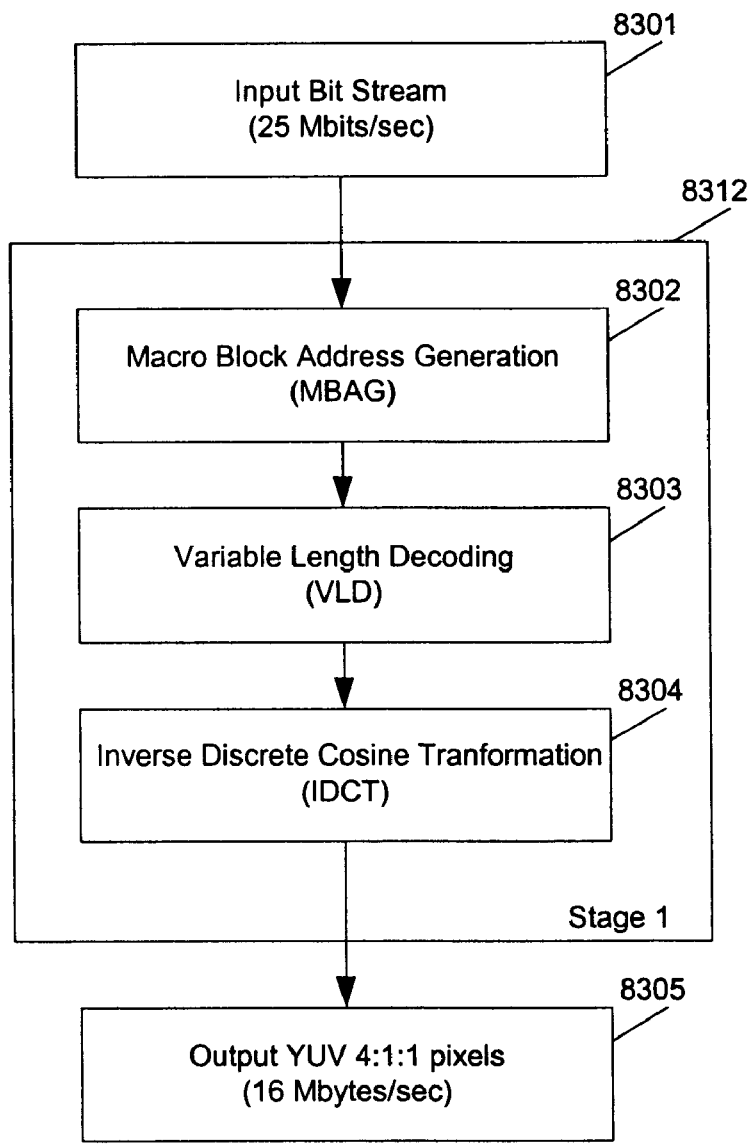
FIG. 63 shows a flow diagram for a method to decode a DV video stream in one stage.

FIG. 63 shows a flow diagram for a method to decode a DV video stream in one stage. In operation 8301, the input bit stream is loaded into the local memory (e.g., local memory 2817 in FIG. 18) of a processing engine (e.g., processing engine 2800). In a single stage 8312, operations 8302–8304 decode the input bit stream to generate a decompressed video stream. Operation 8302 performs Macro Block Address Generation (MBAG); operation 8303 performs Variable Length Decoding (VLD); and operation 8304 performs Inverse Discrete Cosine Transformation (IDCT). The resulting decompressed video stream is buffered in the local memory and is output from the local memory in operation 8305 for display or for further processing. In one example, the input bit stream is a standard DV bit stream at 25 Mbits/sec (SMPTE 316M). The output video stream is YUV frames of 4:1:1 sampling structure at 16 Mbytes/sec. Since a YUV frame is stored in a planar format where separate pixel components are stored in separate frame buffers in the system memory, the chrominance up sampling and luminance/chrominance interleaving operation is offloaded from the decoder. The bandwidth required to transfer data between the processing engine and the host memory is about 20 Mbytes/sec. Since all intermediate results are stored on the local memory, the single stage approach requires least bandwidth. However, since instructions for processing all the operations (i.e., MBAG 8302, VLD 8030 and IDCT 8304) must be loaded into the instruction cache, the greatest amount of instruction cache is required, when compared to the multi-stage approaches, which will be described below. In one embodiment, 8214 bytes of local memory and 8192 bytes of instruction cache are required.

The compressed macro blocks in a DV bit stream must be decoded into two-dimensional blocks of pixels and stored in a pseudo random order specified by the DV standard. MBAG computes the correct destination addresses for reordering. Macro block addresses may be looked up from a single look-up table. Since a frame of DV25 bit stream contains 1350 macro blocks, a look-up table of 2700 bytes is required. Alternatively, macro block addresses may be computed in run time on a macro block per macro block basis. Although computing macro block address in run time reduces the requirement on the size of the memory, it costs extra time in computation. By moving macro block reordering into a separate stage, while using a look-up table for MBAG, it is possible to reduce the overall requirement for memory without extra computation cost.

Figure 64:
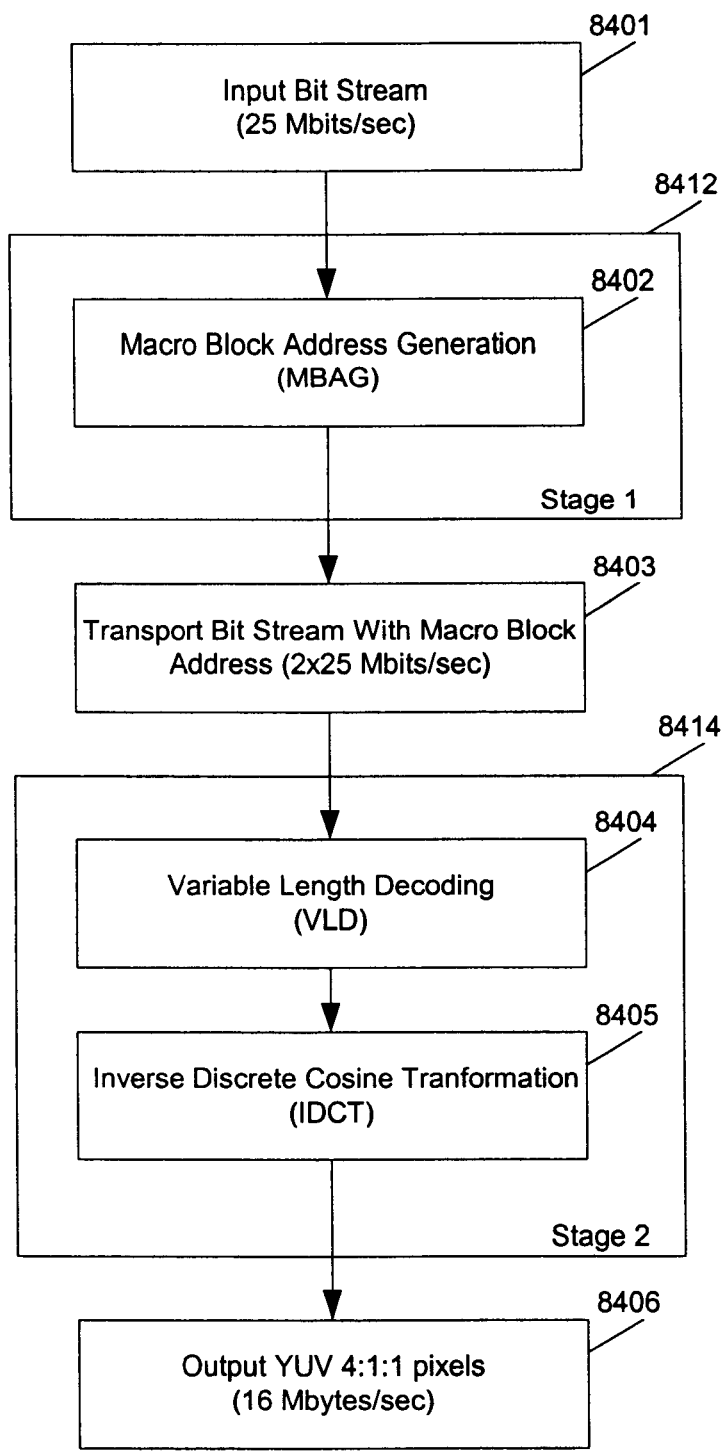
FIG. 64 shows a flow diagram for a method to decode a DV video stream in two stages.

FIG. 64 shows a flow diagram for a method to decode a DV video stream (e.g., a frame of a DV video image) in two stages. In operation 8401, the input bit stream is loaded into the local memory of a processing engine. In stage 8412, operation 8402 performs Macro Block Address Generation (MBAG). Only the instructions for MBAG is required to be loaded into the instruction cache. In stage 8412, macro block addresses are calculated and stored in the first two bytes of Digital Interface (DIF) block headers to generate a modified DV bit stream. In operation 8403, the modified DV bit streams are transferred from the local memory into the host memory after MBAG is performed and are transferred back into the local memory for the operations in stage 8414. In stage 8414, VLD 8404 and IDCT 8405 are performed to generate a decompressed video stream. In stage 8414, only the instructions for performing VLD and IDCT are loaded into the instruction cache. The resulting decompressed video stream buffered in the local memory is output from the local memory in operation 8406. Since the look up table for performing MBAG is not required in this stage for VLD and IDCT, the requirement on the size of the local memory can be reduced. In one implementation, 5514 bytes of local memory and 8192 bytes of instruction cache are required. However, the modified DV bit stream is transferred from the local memory to the host memory and then back to the local memory, the required bandwidth is about 26 Mbytes/sec, which is slightly higher than that for a single stage approach. However, the extra requirement on bandwidth (50 Mbits/sec) is an insignificant amount for any up to date memory subsystem.

Figure 65:
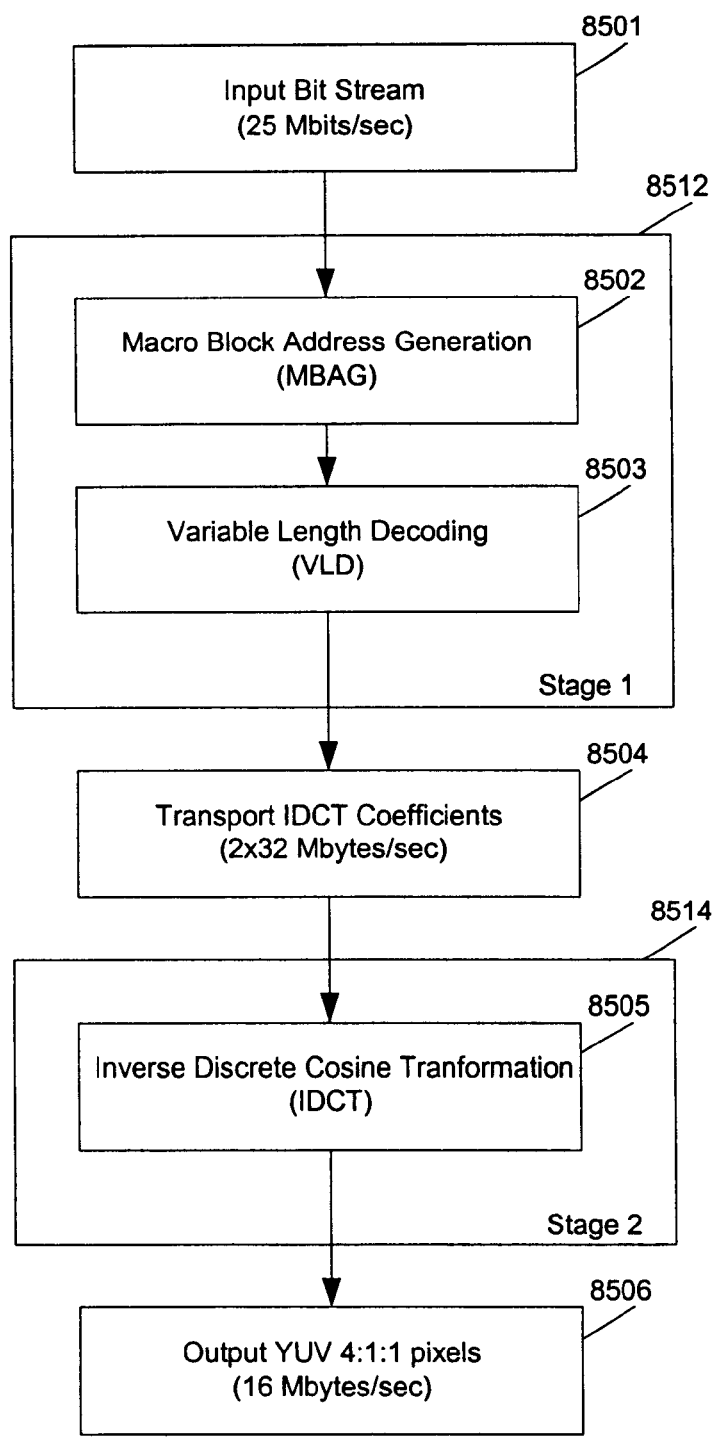
FIG. 65 shows a flow diagram for another method to decode a DV video stream in two stages.

FIG. 65 shows a flow diagram for another method to decode a DV video stream in two stages. In operation 8501, the input bit stream is loaded into the local memory of a processing engine. In stage 8512, operation 8502 performs Macro Block Address Generation (MBAG); and operation 8503 performs Variable Length Decoding (VLD) to generate coefficients for Inverse Discrete Cosine Transformation (IDCT). Inverse zigzagging and inverse scaling are also performed in operation 8503. The macro block reordering from DV the pseudo random order to the sequential raster scan order is performed at stage 8512. In Operation 8504, the IDCT coefficients are transferred from the local memory into the host memory after VLD are performed and are transferred into the local memory from the host memory to perform operations in stage 8514. In stage 8514, IDCT 8405 is performed to generate a decompressed video stream which is buffered in the local memory. The decompressed video stream is transferred from the local memory in operation 8506. Since the two major operations, i.e., VLD and IDCT, are separated in two stages, the requirement on the size of the instruction cache can be reduced. In one implementation, 4096 bytes of instruction cache and 9104 bytes of local memory are required. However, the IDCT coefficients are transferred from the local memory to the host memory and then back to the local memory, the required bandwidth is about 83.5 Mbytes/sec, which is higher than that for a single stage approach.

Figure 66:
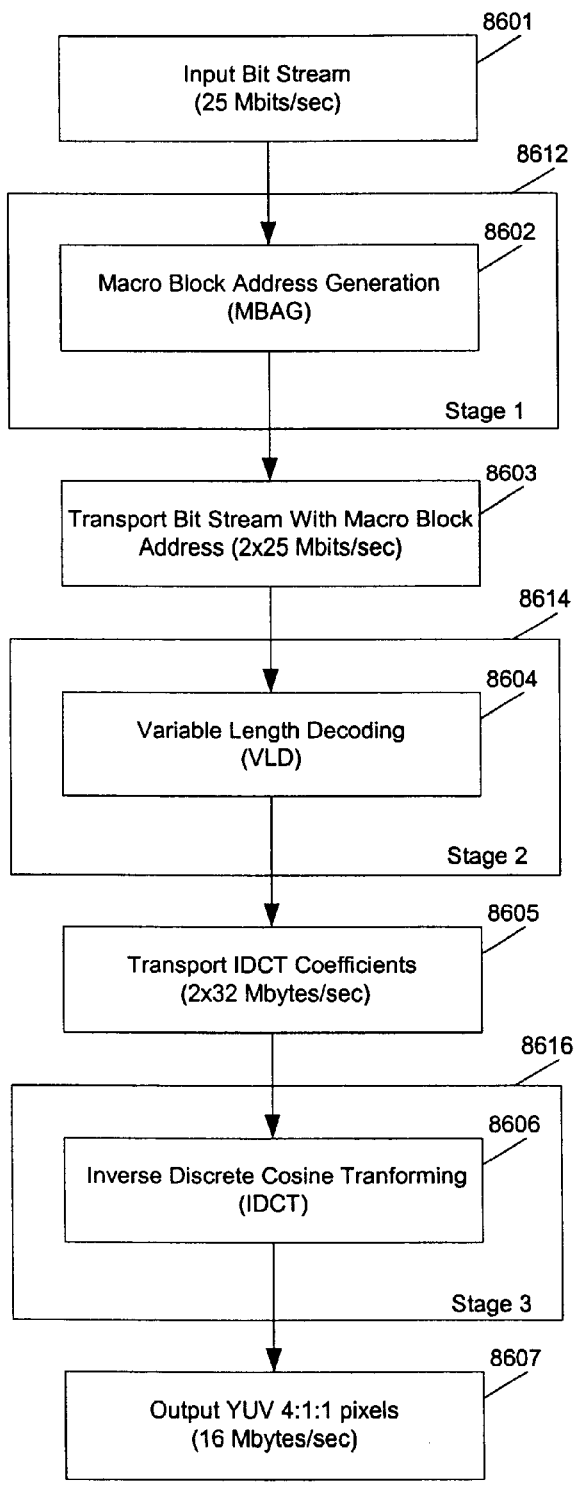
FIG. 66 shows a flow diagram for a method to decode a DV video stream in three stages.

FIG. 66 shows a flow diagram for a method to decode a DV video stream in three stages. In operation 8601, the input bit stream is loaded into local memory of a processing engine. In stage 8612, operation 8502 performs Macro Block Address Generation (MBAG) to calculate macro block addresses which are stored in the first two bytes of Digital Interface (DIF) block headers in a modified DV bit stream. In operation 8603, the modified DV bit streams are transferred out of the local memory into the host memory after MBAG is performed and are transferred back into the local memory to perform operations in stage 8614. Operation 8604 performs Variable Length Decoding (VLD) to generate coefficients for Inverse Discrete Cosine Transformation (IDCT). Inverse zigzagging and inverse scaling are also performed in operation 8604. In Operation 8605, the IDCT coefficients are transferred out of the local memory into the host memory after VLD are performed and are transferred back into the local memory to perform operations in stage 8616. In stage 8616, IDCT 8606 is performed to generate a decompressed video stream. The resulting decompressed video stream buffered in the local memory is output from the local memory in operation 8607. Since the two major operations (VLD and IDCT) are separated in two stages, the requirement on the size of the instruction cache can be reduced. Since the look up table for performing MBAG is not required in the stages for VLD and IDCT, the requirement on the size of the local memory can also be reduced. In one implementation, only 4096 bytes of instruction cache and 6394 bytes of local memory are required. However, since intermediate results are transferred from the local memory to the host memory and then back to the local memory, the required bandwidth is up to about 90 Mbytes/sec.

Although FIGS. 64–66 illustrate the multi-stage approaches using a single processing engine, it will be appreciated that the various stages may be performed in different processing engines to achieve parallel processing using multiple processing engines. In such cases, a interconnect (e.g., 1519 in FIG. 5B) may be used to transfer the data between processing engines. The bandwidth required for accessing the host memory may be reduced.

The local memory may buffer only a portion of the results generated in operations in a stage. The buffered result may be transferred out of the local memory before other portions of the results are generated, or concurrently while other portions of the results are generate. Similarly, the portions of input data may be concurrently transferred into the local memory while other input data are being processed. Detailed examples of various schemes for managing the local memory are described below.

Figure 67:
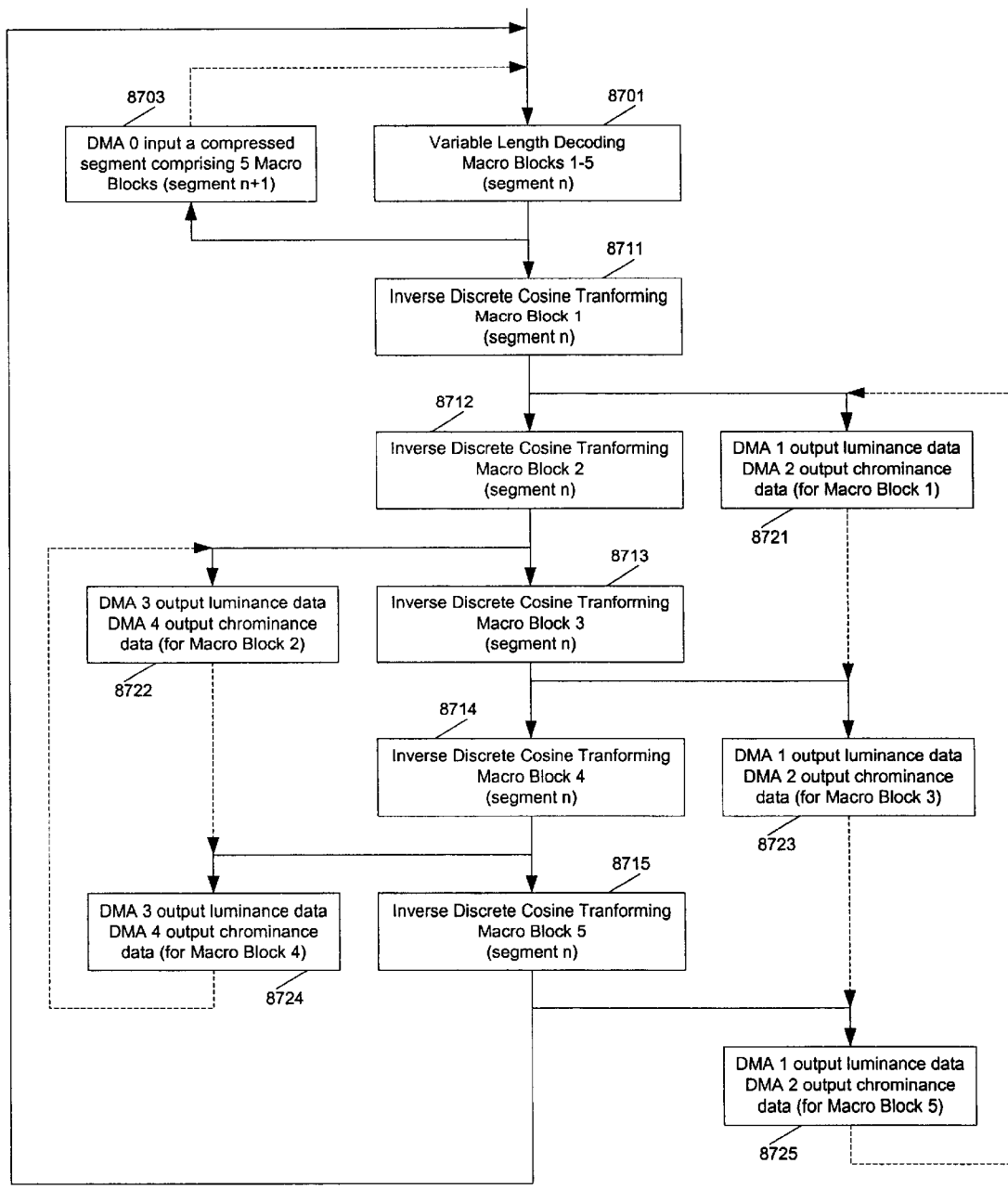
FIG. 67 shows a detailed flow diagram for a method to transfer data while decoding a video stream.

FIG. 67 shows a detailed flow diagram for a method to transfer data while decoding a video stream. Variable length decoding and inverse discrete cosine transforming are performed in the same stage. Operation 8701 variable length decodes a video segment which comprises five macro blocks. Operations 8711–8715 perform inverse discrete cosine transform on the blocks of macro blocks in the video segment. While IDCT is performed for the macro blocks in operations 8711–8715, a Direct Memory Access channel (DMA 0) loads into the local memory, in operation 8703, the next compressed video segment which is to be decoded by operation 8701. Operation 8711 performs IDCT to generate a decompressed video stream from the first macro block in the video segment. While operations 8712 and 8713 perform IDCT on other two macro blocks, a number of DMA channels are used to transfer the decompressed video data from the local memory to the host memory. For example, DMA 1 is used to transfer the luminance data, while DMA 2 is used to transfer the chrominance data. Similarly, DMA 3 and DMA 4 are used to transfer the luminance and chrominance data for the second macro block. After the video images from the third macro block are generated from operation 8713 and the video images for the first macro block are transferred into the host memory in operation 8721, operation 8723 starts to transfer the video data for the third macro block to the host memory. Operations 8724 and 8725 transfer the video images for the forth and fifth macro blocks, which may be performed concurrently while operation 8701 variable length decodes the next segment.

Figure 68:
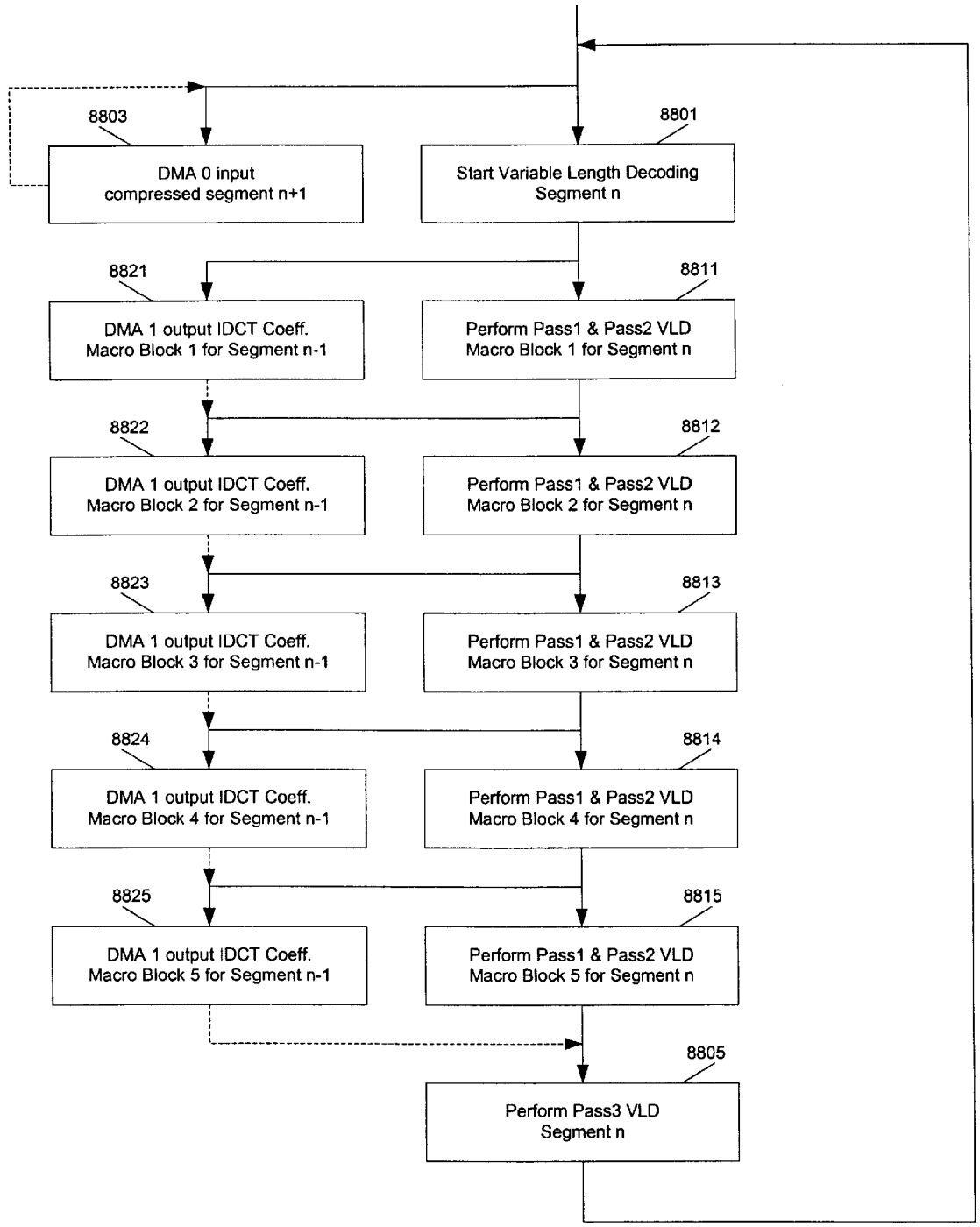
FIG. 68 shows a detailed flow diagram for a method to transfer data while variable length decoding a segment of a video stream.

FIG. 68 shows a detailed flow diagram for a method to transfer data while variable length decoding a current segment of a video stream. Variable length decoding is performed in a separate stage, starting with operation 8801. As in FIGS. 65 and 66, while operations 8811–8815 decode a video segment, DMA 0 transfers the next segment into the local memory in operation 8803, and DMA 1 transfers the IDCT coefficients for the previous segment from the local memory into the host memory in operations 8821–8825. For example, while pass 1 and pass 2 variable length decoding is performed on the first macro block in the current segment in operation 8811, the IDCT coefficients of the first macro block in the previous segment are transferred into the host memory in operation 8821. Similarly, operations 8812–8815 are performed in parallel with operations 8822–8825.

Figure 69:
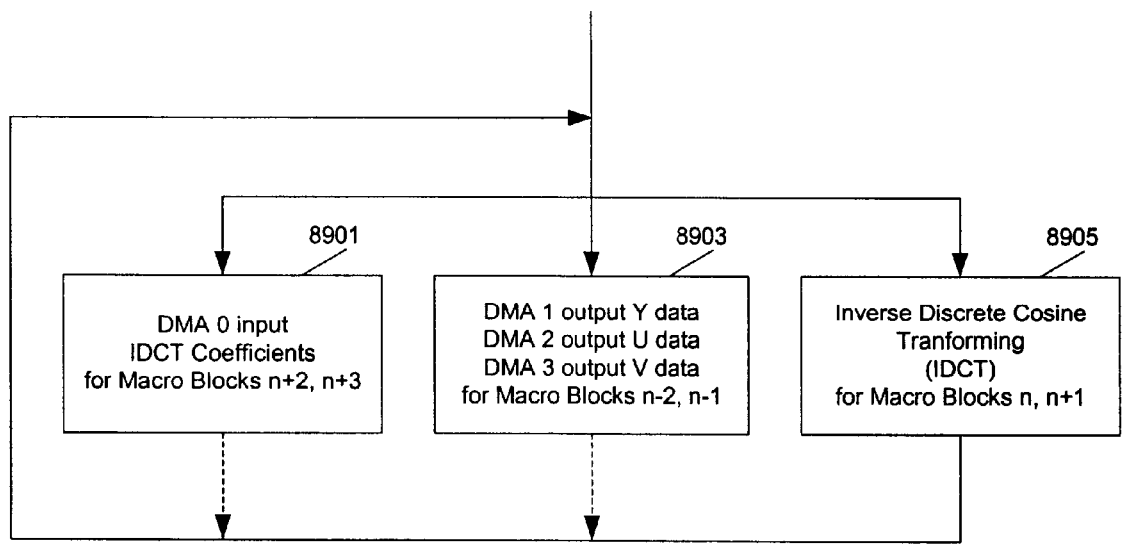
FIG. 69 shows a detailed flow diagram for a method to transfer data while inverse discrete cosine transforming macro blocks of a video stream.

FIG. 69 shows a detailed flow diagram for a method to transfer data while inverse discrete cosine transforming macro blocks of a video stream. IDCT is performed in a separate stage as in FIGS. 65 and 66. While operation 8905 performs IDCT to generate decompressed video data for current macro blocks, operation 8903 outputs the previously decompressed video data for the previous macro blocks, and operation 8901 inputs the IDCT coefficients for inverse discrete cosine transforming subsequent macro blocks.

A number of buffers may be allocated on the local memory for the storage of data for the operations in a stage. The usage of the buffers can be carefully scheduled to reduce the requirement on the size of the local memory.

Figure 70:
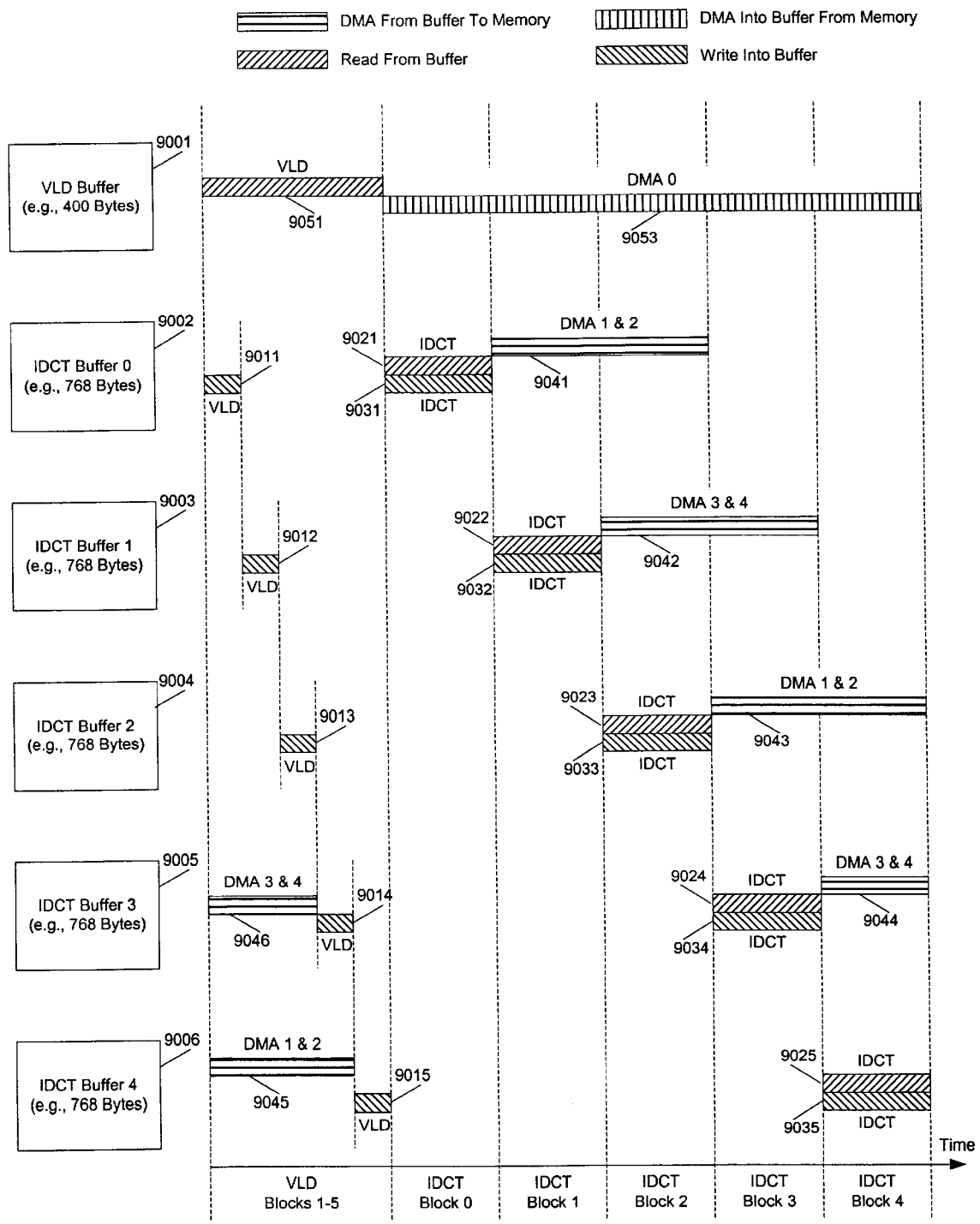
FIG. 70 shows a memory management scheme for a method to transfer data while decoding a video stream.

FIG. 70 shows a memory management scheme for a method to transfer data while decoding a video stream. Variable length decoding and inverse discrete cosine transforming are performed in the same stage as in FIGS. 63 and 64. Thus, buffers for the compressed bit stream and uncompressed video data are needed. Buffer 9001 for compressed bit stream is read during operation 9051 for VLD. During operation 9053, DMA 0 loads a compressed bit stream into buffer 9001, as in operation 8703. Buffers 9002–9006 are for the IDCT operations. In one implementation, buffer 9001 can hold a compressed video segment (e.g., 400 Bytes); and each of the IDCT buffers (9002–9006) can hold a uncompressed video data for a macro block (e.g., 768 bytes). IDCT coefficients generated after VLD operations 9011–9015 are stored into the corresponding IDCT buffers. IDCT are performed in place, i.e., the generated decompressed video data are stored back into the buffer for the corresponding IDCT coefficients. For example, operation 9021 reads IDCT coefficients from buffer 9002 and operation 9031 writes the decompressed video data generated from the IDCT coefficients back into buffer 9002 to replace the corresponding IDCT coefficients. Intermediate results are held in vector register. During operation 9041, DMA 1 and 2 transfer the decompressed video data out of the buffer, as in operation 8721. Similarly, IDCT coefficients are read in operations 9022–9025 from buffers 9003–9006; and the generated uncompressed video data are written back into the corresponding buffers in operations 9032–9035. DMA 3 and 4 start to transfer the decompressed video data from buffer 9003 in operation 9042 while DMA 1 and 2 may still be transferring the decompressed video data from buffer 9002. Operation 9044 for transferring the decompressed video data in buffer 9005 may continue into operation 9046, before the buffer 9005 is used for VLD 9014. Similarly, the decompressed video data in buffer 9006 is transferred during variable length decoding the next segment and before the buffer 9006 is used for storing IDCT coefficients.

Figure 71:
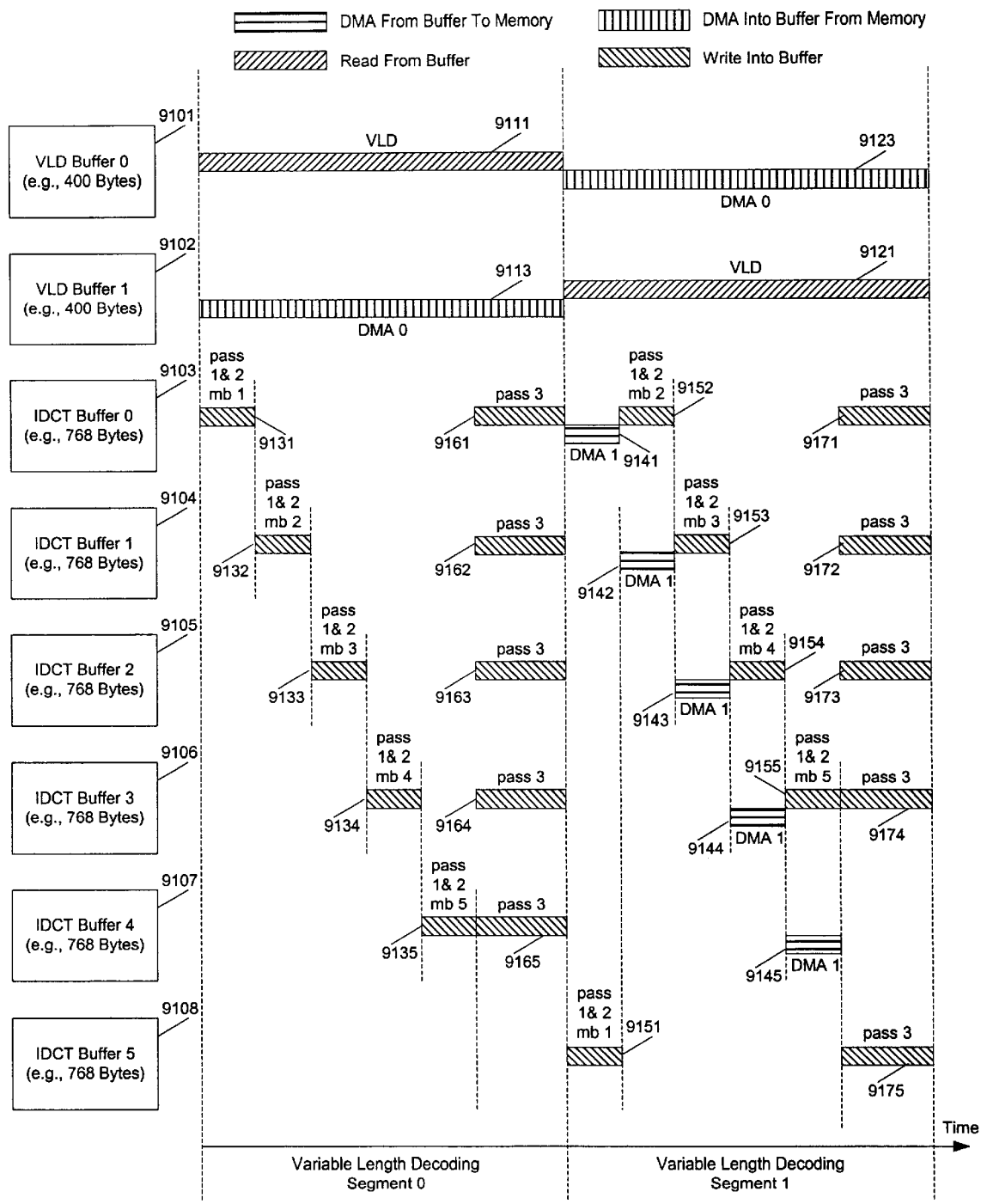
FIG. 71 shows a memory management scheme for a method to transfer data while variable length decoding a segment of a video stream.

FIG. 71 shows a memory management scheme for a method to transfer data while variable length decoding a segment of a video stream. Variable length decoding is performed in a separate stage as in FIGS. 65 and 66. Two VLD buffers (9101 and 9102) are used. While VLD is performed using the compressed bit stream in one of the VLD buffers (e.g., operation 9111 or 9121), DMA 0 loads the next compressed bit stream into the other VLD buffer (e.g., operation 9113 or 9123). Six IDCT buffers (9103–9108) form a circular queue for buffering IDCT coefficients. In one example, a VLD buffer can hold a compressed video segment (e.g., 400 Bytes), and each of the IDCT buffers can hold IDCT coefficients for a macro block (e.g., 768 Bytes). In pass 1 and pass 2 VLD operations for the macro blocks, the IDCT coefficients are written into the corresponding IDCT buffers (e.g., operations 9131–9135). In pass 3 VLD, operations 9161–9165 may access all the five buffers used in pass 1 and 2 VLD. IDCT coefficients in one IDCT buffer are transferred into the host memory using DMA 1 while pass 1 and 2 VLD is using the available IDCT buffer. The pointers to the buffers wrap around when they reach the end of the queue. For example, while DMA 1 is transferring data from buffer 9103, pass 1 and 2 VLD are using buffer 9108. After operation 9141, buffer 9103 becomes available. Then, pass 1 and 2 VLD may use buffer 9103 while DMA 1 transferring data from buffer 9104. In such fashion, the use of the extra IDCT buffer makes it unnecessary to wait until the IDCT coefficients in an IDCT buffer is transferred out, before the VLD operation for the next compressed bit stream can start. Also, there is a memory saving when comparing to full double buffering IDCT coefficients, which requires 10 IDCT buffers.

Figure 72:
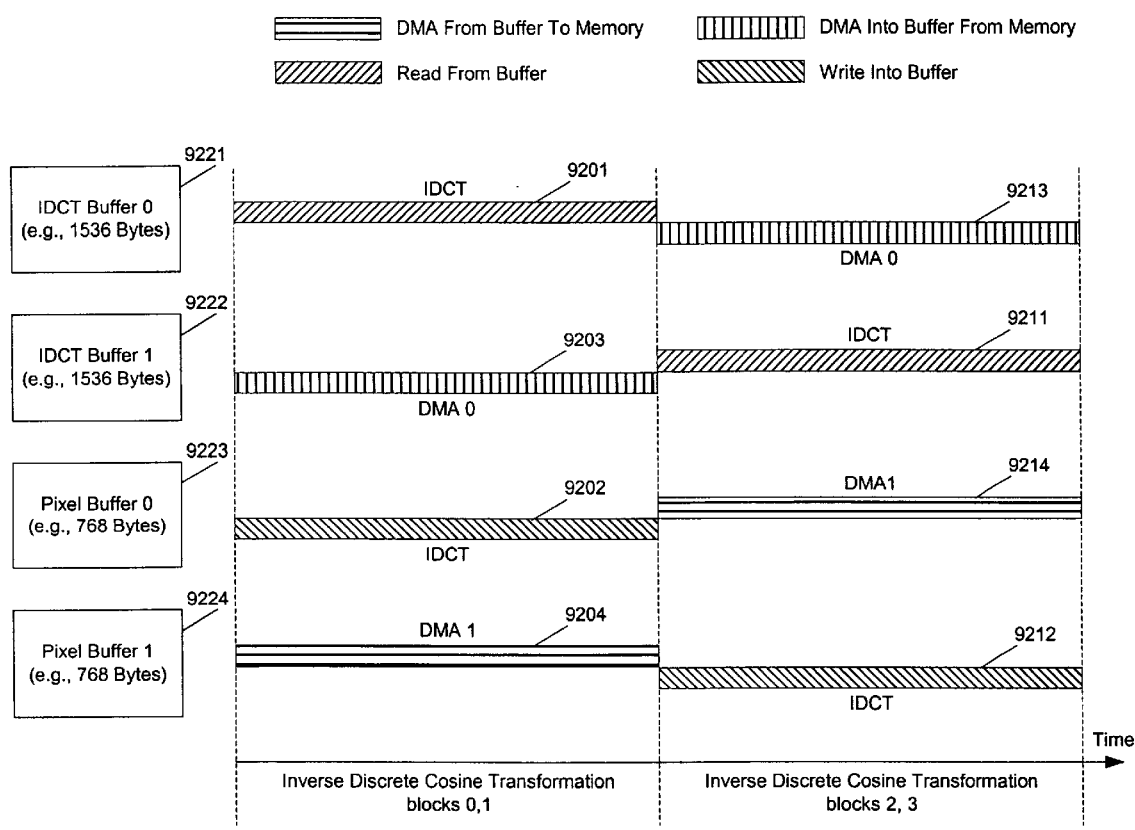
FIG. 72 shows a memory management scheme for a method to transfer data while inverse discrete cosine transforming macro blocks of a video stream.

FIG. 72 shows a memory management scheme for a method to transfer data while inverse discrete cosine transforming macro blocks of a video stream. Inverse discrete cosine transforming is performed in a separate stage. Two IDCT buffers (9221 and 9222) are used for IDCT coefficients; and two pixel buffers (9223 and 9224) are used for decompressed video images. While IDCT operation is generating uncompressed video in one of the pixel buffers from the IDCT coefficients in one of the IDCT buffers (e.g., 9201 and 9202, or 9211 and 9212), DMA 0 transfers IDCT coefficients into the other IDCT buffer (e.g., 9203 or 9213), and DMA 1 transfers decompressed video data out the other pixel buffer (e.g., 9204 or 9214). In one implementation, two macro blocks are processed at a time. Thus, each IDCT buffer can hold IDCT coefficients for two macro blocks (e.g., 1536 Bytes); and each pixel buffer can hold decompressed video data for two macro blocks (e.g., 768 Bytes). Three DMA channels are used to transferring three pixel components (Y, U, and V) into three separate planes in the host memory.

The block VLD processing starts with the block DCT mode extraction. Block mode processing chooses the mode of the IDCT, the zigzag pattern and the inverse scale matrix. IDCT mode is preserved in the unused LSB of the DC term for the subsequent usage by the IDCT stage. Inverse zigzag look up tables are used to store 16 bit IDCT coefficients within 8×8 IDCT blocks. IDCT coefficients are produced in the transposed order to eliminate one transpose operation during IDCT.

Figure 73:
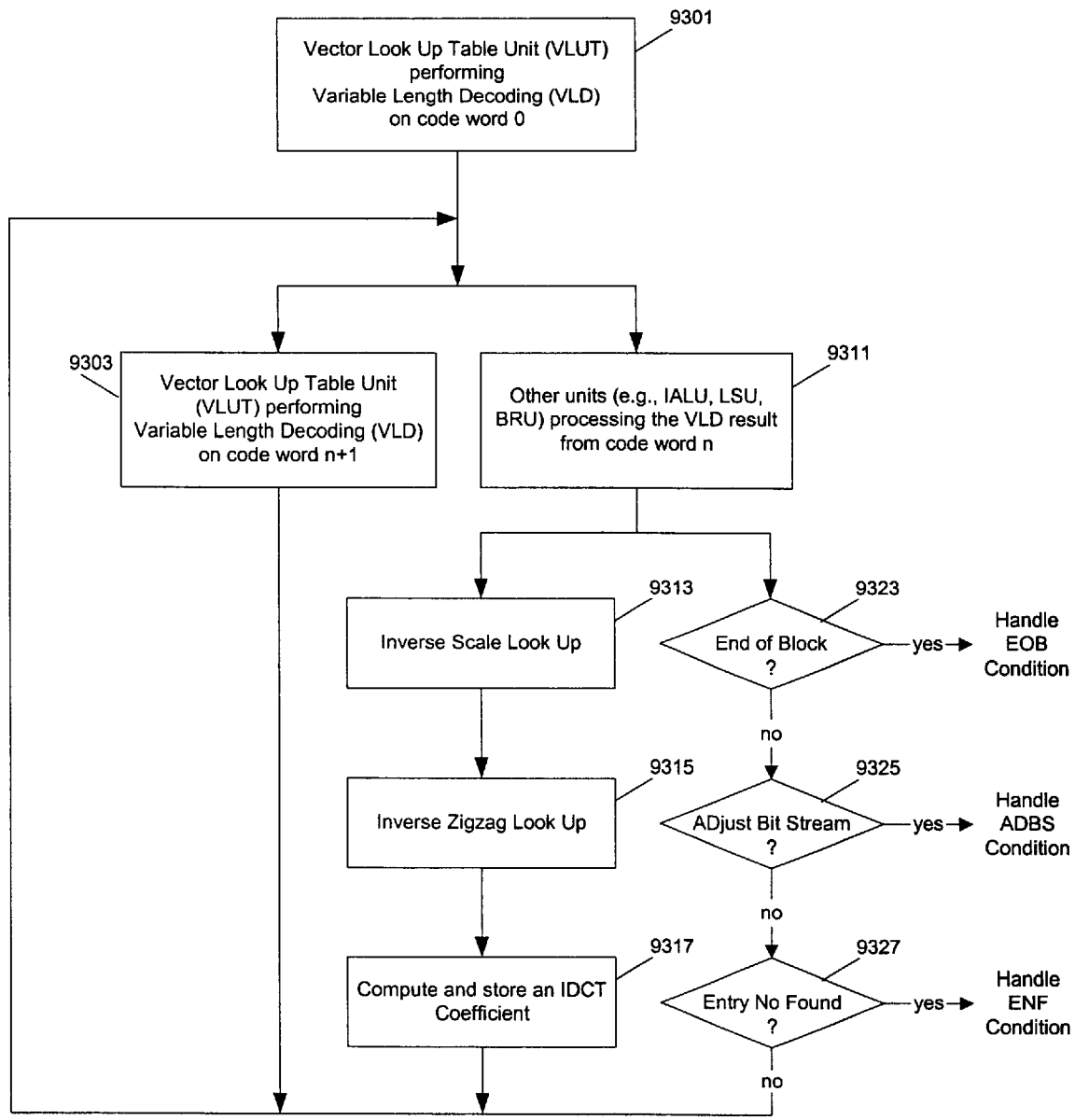
FIG. 73 shows a flow diagram for a method to decode a bit stream by using a plurality of execution units concurrently.

FIG. 73 shows a flow diagram for a method to decode a bit stream by using a plurality of execution units concurrently. After variable length decoding a first code word in a bit stream loaded in a vector register in operation 9301, execution units (i.e., IALU, LSU, or BRU) are used to process the decoded result in operations 9311–9317, while a Vector Look Up Table Unit (VLUT) is used to decode the next code word in the bit stream. Operation 9313 looks up a coefficient for inverse scaling; operation 9315 looks up an inverse zigzag index for storing IDCT coefficient in a transposed inverse zigzag order. Operation 9317 computes and stores an IDCT coefficient in memory in a fashion suitable for the inverse discrete cosine transformation. While other execution units (e.g., IALU, LSU, and others) are performing operations 9313–9315, a branch unit (BRU) performs 9323–9327 to check various conditions which may have been encountered during variable length decoding the code word. If an end of block (EOB) condition is encountered, operation 9323 branches to handle the EOB condition (e.g., checking for remaining bits); if an adjust bit stream (ADBS) condition is encountered, operation 9325 branches to handle the ADBS condition (e.g., checking for incomplete code bits); and if an entry not found (ENF) condition is encountered, operation 9327 branches to handle the ENF condition (e.g., error in the bit stream).

Since the IDCT coefficients are provided in a transposed form in operation 9317, only one transposition per block is required during IDCT. Execution units, such as VSIU, VCIU, VPU, and BRU, can be used in parallel, so that IDCT may be performed in approximately 120 cycles for a block.

In one embodiment of the present invention, a macro block of compressed bit stream (e.g., 80 bits) is loaded into a vector register, which can hold 128 bits, for variable length decoding using a Vector Look Up Table Unit (VLUT). The bit stream is right adjusted in the vector register so that the fence bit is always zero. When ADBS is encountered during VLD, the vector register contains incomplete code bits from the currently decoded block. When EOB is encountered, the vector register contains the left over bits from the currently decoded block (remaining bits). Remaining bits and incomplete code bits must be stored for pass 2 and pass 3 VLD. Remaining bits may be concatenated and be saved into an overflow buffer; and incomplete code bits may be stored with other block parameters into another buffer. Thus, extra space is required for the overflow buffer; and extra time is used to concatenate the remaining bits in a sequential bit stream. Alternatively, since EOB and ADBS are mutually exclusive, a same buffer may be used to store either remaining bits or incomplete code bits without concatenating. Typically, two types of contexts (incomplete code bit context and remaining bit context) are created for each block, as a result of pass one VLD. These two types of contexts share the same memory space. If the block is completely decoded, including EOB symbol, and there is no remaining bits left, no valid context is created.

During pass 2 and pass 3 VLD, the incomplete code bits and remaining bits are concatenated prior to being variable length decoded. Since inverse scaling is performed concurrently with the variable length decoding, it is necessary to use the proper inverse scaling parameter when starting pass 2 or pass 3 decoding. The inverse quantization parameter is stored in the incomplete code bit context along with the incomplete code bits. The pass 2 and pass 3 loops terminate when there is no valid incomplete code bit context or no valid remaining bit context left in the memory.

FIG. 74 shows a data structure for storing either a remaining bit context or an incomplete code bit context. When EOB or ADBS is encountered, remaining bits (RDBITS) or incomplete code bits (ICBITS) are right adjusted in the vector register, since the bit stream is right adjusted during variable length decoding the bit stream. A flag is stored in byte 9401 to indicate whether the context is a remaining bit context or an incomplete code bit context. In one implementation, a flag with a value 0 is used for remaining bits; 0xaa for incomplete code bits; and 0xff for an invalid context. The number of bits in the bit segment for remaining bits (or incomplete code bits) is store in byte 9402. For incomplete code bits, some parameters in the context must be saved for later use, such as the pointers CMPTR, ISPTR and IZZPTR and index CMINDX. For the current macro block, CMPTR points to the memory (9431) for the storage of the IDCT coefficients; ISPTR to the inverse scale look-up table (9433); and IZZPTR to the inverse zigzag look-up table (9435). CMPTR is the index which is used with the decoded run to look up an coefficient for inverse scaling and an index for storing the IDCT coefficients in a transposed inverse zigzag order. As illustrated in FIG. 74, CMINDX, CMPTR, ISPTR and IZZPTR can be stored in bytes 9413–9416. A fixed size buffer area can be used for storing the information about both the incomplete code bits and the remaining bits. In one embodiment of the present invention, each of the macro blocks in an input buffer has a corresponding memory space for the storage of an incomplete code bit context or a remaining bit context. When a macro block is decoded without remaining bits or incomplete code bits, the corresponding memory space is marked invalid; otherwise, a remaining bit context or a incomplete code bit context is generated and stored in the corresponding memory space.

In one embodiment, there is a constant scaling factor (ISCONST) per block. The constant (ISCONST) is computed using class and quantization number during block mode processing. The constant scaling factor is combined with the scaling factor from a look-up table to determine a final scaling factor. In this case, it is necessary to store the constant for pass 2 and 3 VLD. Byte 9417 in an incomplete code bit context may be used for storing ISCONST.

It will be appreciate that multiple processing engines can be used in decoding multiple bit streams by assigning each of the processing engines to process one of the bit streams. Multiple processing engines can also be used in decoding a single bit stream (e.g., a high resolution stream) by assigning each of the processing engines to process a portion of the bit stream (e.g., portions of a frame). Since the granularity of input and output data is a compressed/uncompressed macro block, it is easy to equally divide the sequence of compressed macro blocks into equally sized subsequences and schedule them to be decoded in parallel on multiple processing engines.

Various methods described above for decoding a bit stream may also be adapted to be used in encoding a video stream (e.g., in a DV format). For example, a process of compressing a video stream can also be separated into a plurality stages (i.e., a plurality of memory to memory operations). In each stage, a plurality of execution units may be configured to processing in parallel with DMA operations, which transfer data between the local memory in a processing engine (e.g., memory 2817 in FIG. 18) and the host memory (e.g., memory 1402 in FIG. 4A).

Figure 94:
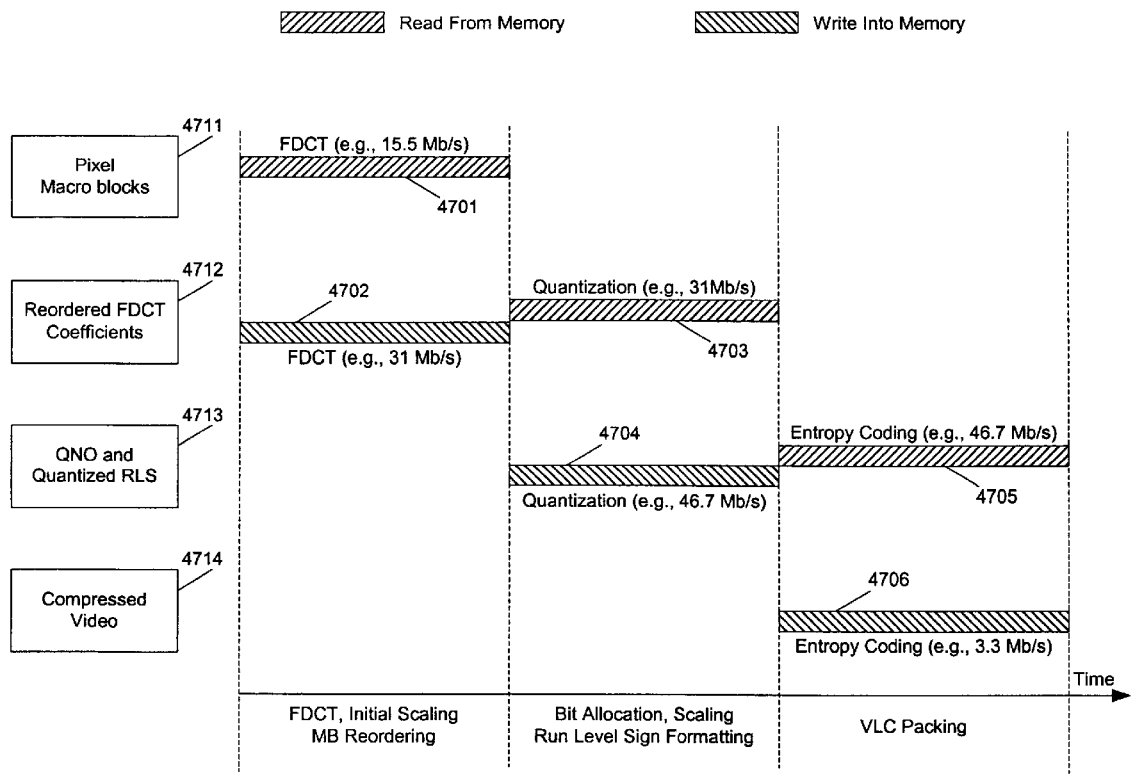
FIG. 94 shows a method to encode a DV video stream in three stages.

FIG. 94 shows a method to encode a DV video stream in three stages. During the first processing stage, called the Forward Discrete Cosine Transformation (FDCT) stage, operation 4701 transfers the components (e.g., 4:1:1 YUV components) of a frame from host memory (e.g., a buffer for pixel macro blocks 4711) to the local memory of a processing engine. After FDCT mode selection, FDCT, zigzag scan, classification and initial scaling, operation 4702 transfers the resulting 16-bit scaled FDCT coefficients for the macro blocks from the local memory back to the host memory (e.g., a buffer for FDCT coefficients 4712). The FDCT macro blocks are stored in host memory in a pseudo random order in accordance with the DV25 standard.

A wide variety of FDCT mode selection algorithms, well-known in the art, that detect the presence of the emphasized horizontal edge patterns due to field interlacing may be used in the FDCT stage. An FDCT may be performed using any of the well known separable fast algorithms. Zigzag can be combined with the final transposition of the coefficients. Classification can be performed in a vector unit using a well known algorithm that selects a class based on maximum absolute value of the FDCT coefficients in the block. Modes and class indices are stored in the three least significant bits of the DC term.

During the second stage, called Quantization stage, operation 4703 transfers the reordered FDCT coefficients from the host memory (e.g., buffer 4712) to the local memory. After reformatting coefficients into a sign and magnitude format, determining macro block bit allocation and Quantization Number (QNO) values, scaling to produce Run-Level-Sign (RLS) coefficients, operation 4704 transfers the QNO values and quantized RLS coefficients from the local memory back to the host memory (e.g., a buffer for QNO and Quantized RLS 4713).

The reordered FDCT coefficients in two's complement format are converted to that in a sign and magnitude format so that the magnitudes and signs may be advantageously stored in two separate arrays. The processing of the signs and magnitudes in the VLC stage is uncoupled and can occur in parallel. Since the magnitude range of the DCT coefficients after class 3 initial scaling is from 0 to 255, vector processing on magnitudes can be done using 16 byte-elements in parallel in a 128-bit vector processor, as oppose to 8 short-elements. The magnitude data in a separate array is directly suitable as indices for looking up VLC code words and code word lengths from look up tables.

The process of bit allocation determines the quatization number (QNO) used for compressing a DV segment. A DV segment contains 5 macro blocks. The amount of space used by each macro block within the segment varies with the complexity of the macro blocks. Any well known algorithm may be used to determine the quatization number (QNO).

During the third and final stage, called the Entropy Coding stage, operation 4705 transfers the QNO values and the quantized RLS coefficients from the host memory (e.g., buffer 4713) to the local memory. Variable Length Coding (VLC) is performed to convert Run-Level-Sign coefficients computed in the previous stage to variable length code words, which are distributed in fixed length segments. After performing variable length coding, operation 4706 transferred the compressed video stream from the local memory back to host memory (e.g., a buffer for compressed video 4714).

To encode a standard DV bit stream, The bandwidth required for operation 4701 to transfer pixel data is about 15.5 Mb/s; the bandwidth required to transfer reordered FDCT coefficients (e.g., operation 4702 or 4703) is about 31 Mb/s; the bandwidth required to transfer QNO and Quantized RLS (e.g., operation 4704 or 4705) is about 31 Mb/s; and the bandwidth required to transfer compressed video (e.g., operation 4705) is about 3.3 Mb/s. Thus, the overall bandwidth required to perform a three-stage encoding operation is about 143 Mb/s. Such multiple-stage approach utilized the memory access bandwidth to reduce the required amount of local memory for data and the required amount of instruction cache on a processing engine.

Figure 95:
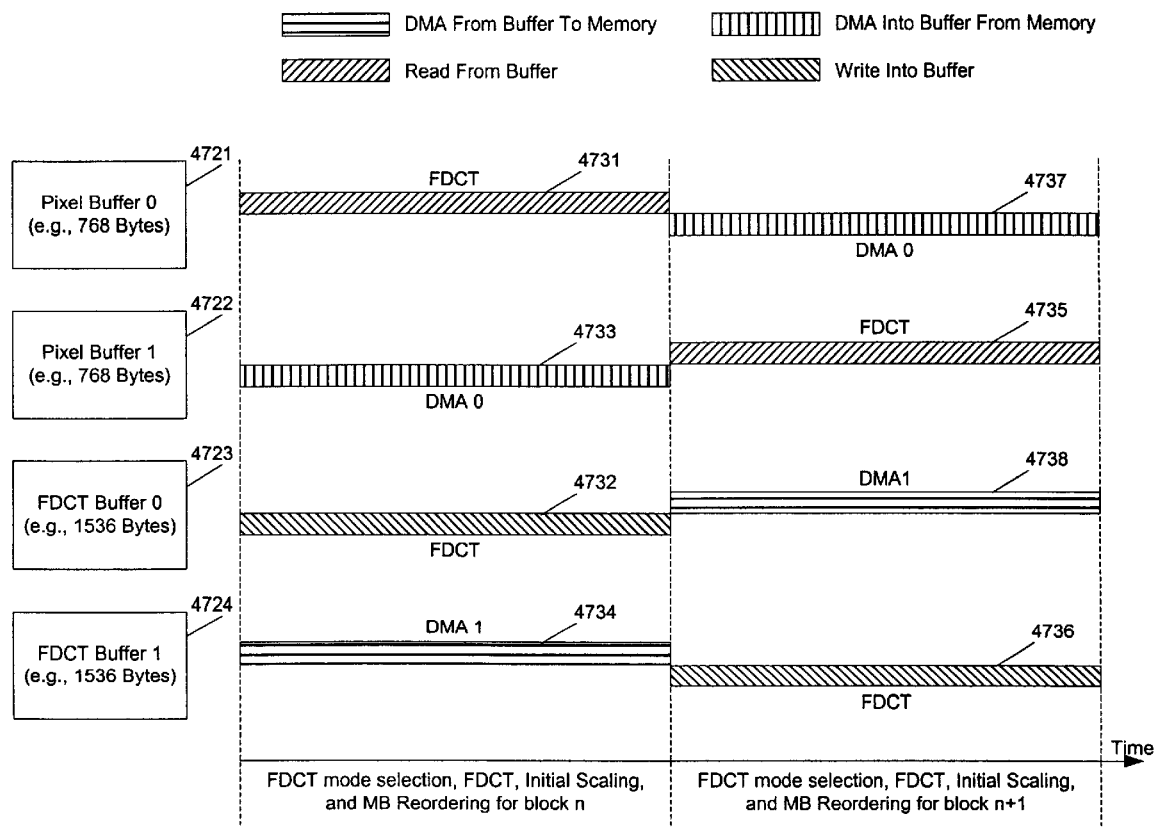
FIG. 95 shows a memory management scheme for a method to transfer data in a Forward Discrete Cosine Transformation stage.

FIG. 95 shows a memory management scheme for a method to transfer data in a Forward Discrete Cosine Transformation stage. Pixel data and FDCT coefficients are double buffered on local memory so that the transferring data between the local memory and the host memory can be performed in parallel with the computation performed in the FDCT stage. For example, while operation 4731 accessing pixel buffer 4721 in order to perform the FDCT stage computation (e.g., mode selection, FDCT, initial scaling, and Macro Block (MB) reordering) on block n to generate FDCT coefficients on FDCT buffer 4723, DMA 0 transfers pixel block n+1 from the host memory to pixel buffer 4722 in operation 4733 and DMA 1 transfers FDCT coefficients from FDCT buffer 4724 for block n−1 to the host memory in operation 4734. While operation 4735 accessing pixel buffer 4722 to generate FDCT coefficients for block n+1 on FDCT buffer 4724, DMA 0 transfers pixel block n+2 from the host memory to pixel buffer 4721 in operation 4737 and DMA 1 transfers FDCT coefficients from FDCT buffer 4723 for block n to the host memory in operation 4738.

In one embodiment for encoding a DV video stream, the input DMA granularity is a 64×16 pixel block. The blocks are fetched in a raster scan order. The output DMA is macro block based. 4:1:1 macro blocks of 16 bit coefficients are stored sequentially in a DV25 pseudo random pattern.

Figure 96:
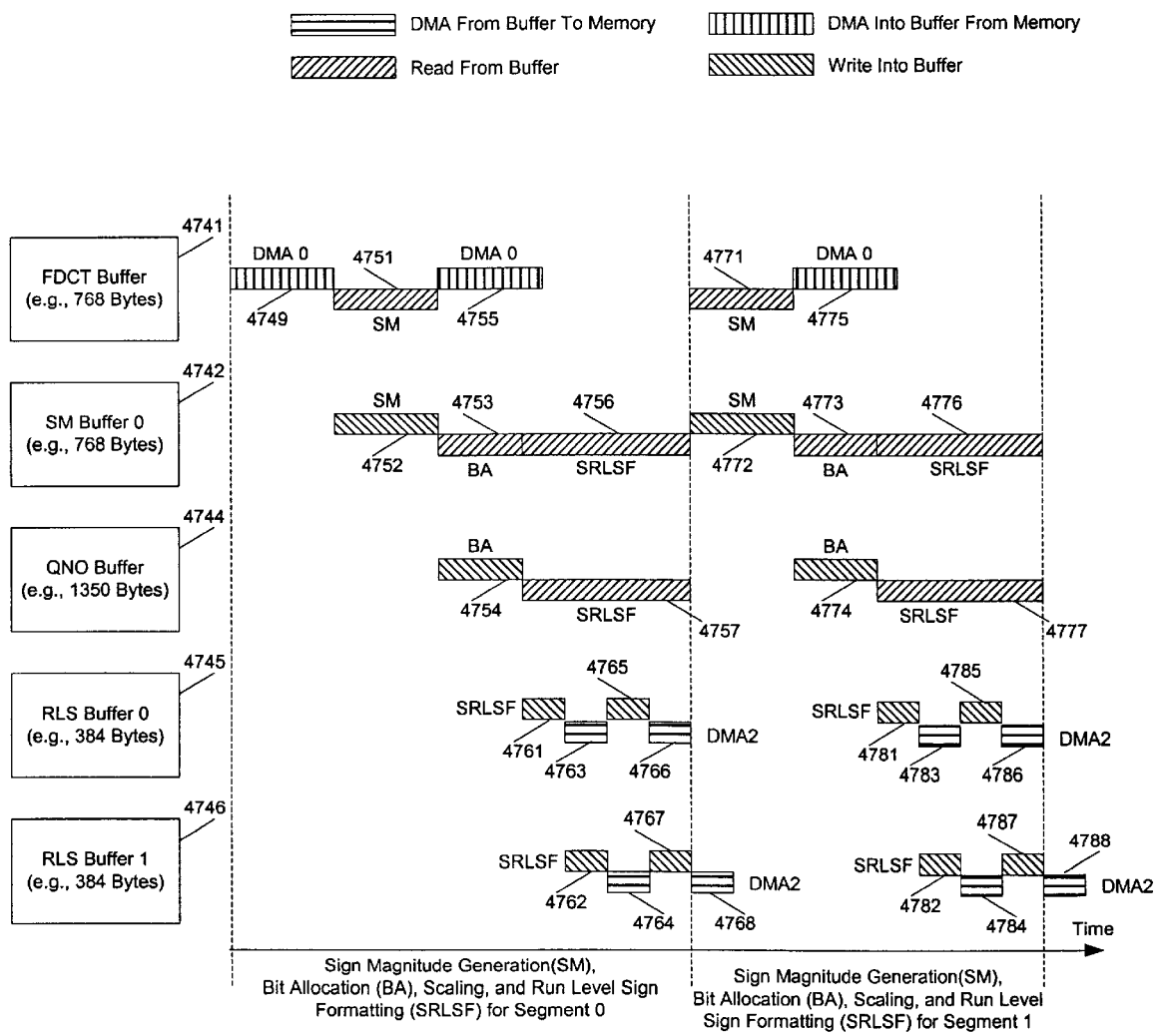
FIG. 96 shows a memory management scheme for a method to transfer data in a Quantization stage.

FIG. 96 shows a memory management scheme for a method to transfer data in a Quantization stage. Buffers 4741–4745 are allocated from the local memory of a process engine. DMA 0 transfers FDCT coefficients from the host memory to FDCT buffer 4741 on the local memory of a processing engine in operation 4749. Operation 4751 reads the FDCT coefficients from buffer 4741 in order to convert the coefficients from a two's complement format to a sign magnitude (SM) format. The SM coefficients are stored in SM buffer 4742 in operation 4752. After the coefficients in buffer 4741 are converted into SM format, DMA 0 loads next FDCT coefficients into buffer 4741 in operation 4755. Bit Allocation (BA) reads the SM coefficients in operation 4753 and generates Quantization Numbers (QNO) in buffer 4744 in operation 4754. Finally, the Scaling, and Run Level Sign Formatting (SRLSF) is performed using the QNO and SM coefficients to generate Run-Level-Sign (RLS) coefficients in RLS buffers 4745 and 4746. Operations 4756 and 4757 read SM coefficients and QNO in order to generate RLS coefficients. RLS coefficients are double buffered in buffers 4745 and 4746 so that one RLS buffer is used in generating RLS coefficients while the RLS coefficients in the other RLS buffer may be concurrently transferred to the host memory. For example, after SRLSF operation 4761 saves the RLS coefficients in buffer 4745, DMA 2 transfers the RLS coefficients in buffer 4745 to the host memory in operation 4763, while SRLSF operation 4762 continues to stores the generated RLS coefficients into buffer 4745. Operations 4765 and 4764 operate in parallel using buffers 4745 and 4746 respectively. Similarly, operations 4767 and 4766 operation in parallel. Operation 4768 continues in parallel with operations 4771 and 4772 for converting FDCT coefficients into SM coefficients, since DMA 0 has already loaded the FDCT coefficients in operation 4755. Since FDCT buffer is retired at the early stage of the processing, the next DMA operation can be started right after the SM conversion to use the same buffer (e.g., operation 4755 starts right after operation 4751). The DMA operation 4755 can continue in parallel with the time consuming operation for bit allocation. Operations 4771–4788 repeats the operations 4751–4768 to process the next FDCT coefficients.

In one embodiment, the input DMA 0 reads 5 768-byte macro blocks (e.g., 30 blocks) a time to fill the FDCT buffer 4741. QNO buffer is large enough to hold all QNO data for an entire frame, so that the QNO data is transferred to the host memory one frame at a time. A RLS buffer (4745 or 4746) can hold RLS data for 2 blocks. Thus, 14 parallel SRLSF and DMA operations as those in operations 4763 and 4762 (or, 4765 and 4764) may be used to generate and transfer RLS coefficients, before finally a DMA operation (e.g., 4768) is used to transfer the last two blocks of RLS to the host memory.

Figure 97:
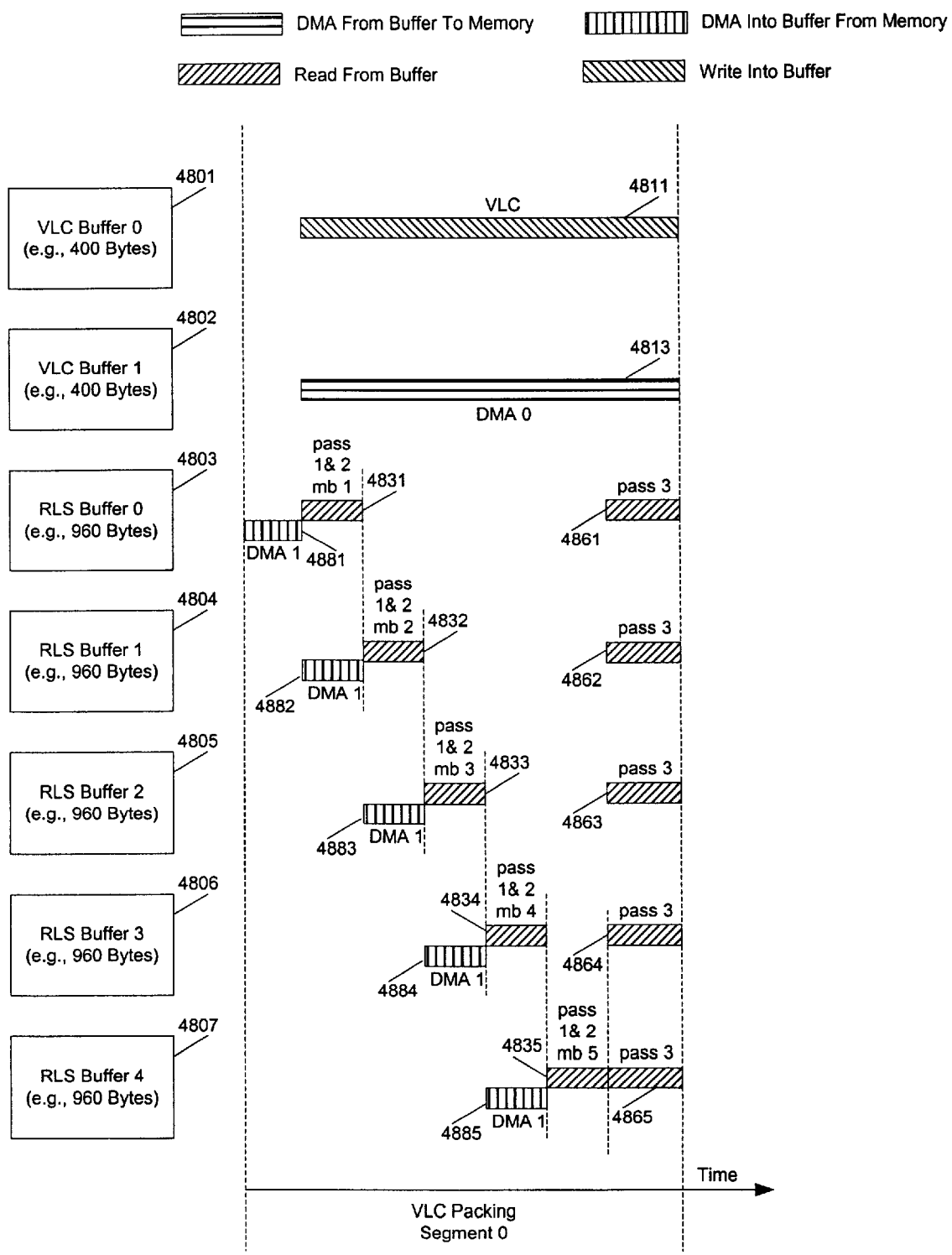
FIG. 97 shows a memory management scheme for a method to transfer data in an Entropy Coding stage.

FIG. 97 shows a memory management scheme for a method to transfer data in an Entropy Coding stage. Compressed video generated by entropy coding is double buffered (e.g., VLC buffers 4801 and 4802) on local memory so that one of buffers is used in generating a portion of compressed video while another portion of the compressed video, which has been already generated on the other buffer, is transferred to the host memory. For example, while compressed video is generated on VLC buffer 4801 in operation 4811, DMA 0 transfers compressed video from VLC buffer 4802 to the host memory in operation 4813.

In one embodiment of the present invention, an array of QNO values for a frame is initially loaded into a buffer using a DMA channel. The QNO data is used in subsequent Variable Length Coding of RLS coefficients. RLS buffers 4803–4807 are allocated from the local memory to store the RLS coefficients. After operation 4881 loads RLS coefficients for a first macro block into buffer 4803, operation 4831 performs pass 1 and pass 2 VLC packing on the first macro block, while operation 4882 continues to load the second macro block into buffer 4804. Similarly, operations 4832–4834 performs pass 1 and pass 2 VLC packing on the RLS coefficients in buffers 4804–4806, while DMA 1 load buffers 4805–4807 with RLS coefficients in operations 4883–4885 respectively. Finally, operation 4835 performs the pass 1 and pass 2 operations on the RLS coefficients in buffer 4807; and pass 3 distributes the remaining data within the segment in operations 4861–4865.

In the Entropy Code stage, when run is less than 16 and level is less than 32, a look up table that contains 32-bit code words is used to convert RLS coefficients to code word; otherwise the coefficients is formatted into escaped data. The concatenated codes are stored with 16-bit write instructions since the block boundaries are 16 bit aligned. Incomplete Code word Structures (ICS) are used for book-keeping the information of remaining of blocks that can not be fitted in the corresponding blocks in a compressed segment; and Remaining Data Structures (RDS) are used to book keep the available spaces in the blocks for the distribution of remaining of blocks in pass 2 and pass 3 operation.

In pass 1 distribution, when the total length of a block of codes exceeds the corresponding fixed size block of storage space in the segment, an Incomplete Code Word Structure (ICS) is created to remember the incomplete codeword, its length and the location in the RLS buffer so that variable length coding and distribution can be continued from that point in pass 2 and pass 3 operations. Note that a code word can be up to 29 bits in length. An Incomplete Code Word Structure contains:

1) incomplete code word (e.g., 4 bytes), which is the first code word in the block that has not been completely distributed in the pass 1 or pass 2 operation;
2) incomplete code word length (e.g., 1 byte), which is the bit length of the incomplete code word that needs to be distributed;
3) EOB flag (e.g., 1 byte), which is set when all the RLS triplets in current block have been coded;
4) incomplete code word done flag (e.g., 1 byte), which is set after the last incomplete code word is distributed in a pass 2 or pass 3 operation; and
5) index in the RLS buffer (1 byte), which is the location in a RLS buffer where the remaining RLS triplets are stored.

Note that the EOB flag may be set before the last incomplete code word is distributed. The incomplete code word done flag is always set after the EOB flag is set.

In pass 1 distribution, when the total length of codes for a block exceeds the corresponding fixed size block of storage space in the segment, a Remaining Data Structure (RDS) is created to contain the pointers to the empty space in the block of storage space such that the empty space can be used in the pass 2 and pass 3 operations to fill the remaining code words from other blocks. In one embodiment, a bit buffer is used to accumulate bits of code words to write concatenated code words 16 bits a time. The content in the bit buffer is also stored in a RDS so that the code words to be distributed in pass 2 or pass 3 can be concatenated with the content in the bit buffer to fill the block of storage space. A Remaining Data Structure contains:

1) bit buffer bits (e.g., 2 bytes), which are the bits left in the bit buffer to be concatenated with other code words to fill the current block of storage space;
2) number of valid bits (e.g., 1 byte), which is the number of valid bits in bit buffer bits;
3) store address pointer (e.g., 2 bytes), which is the beginning address of an empty space in the current block of storage space to be filled up in pass 2 or pass 3 operations;
4) end address pointer (e.g., 2 bytes), which is the ending address of the current block of storage space; and
5) buffer full flag (e.g., 1 byte), which is set when the current block of storage space is full (i.e., the store address pointer reaches the end address pointer).

During pass2 and pass3 coding the list of Incomplete Code word Structures are scanned through to distribute the remaining code words in the unused space pointed by the list of Remaining Data Structure. In pass 2, the remaining of the blocks after the pass 1 operation that cannot be fitted into the corresponding compressed-data area are distributed in to their corresponding compressed macro block. In pass 3, the remainder after the pass 2 operation is distributed into the same video segment.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to decode a variable length encoded bit stream, the method comprising:

concurrently processing first data obtained from variable length decoding a first code word in a register;

while variable length decoding a second code word in the register.

2. A method as in claim 1 wherein said processing first data comprises:

looking up an inverse zigzag index.

3. A method as in claim 2 wherein the inverse zigzag index is for storing an Inverse Direct Cosine Transformation (IDCT) coefficient in a transposed inverse zigzag order.

4. A method as in claim 1 wherein said processing first data comprises:

computing an Inverse Direct Cosine Transformation (IDCT) coefficient.

5. A method as in claim 4 wherein said processing first data further comprises:

storing the IDCT coefficient in a buffer in a transposed inverse zigzag order.

6. A method as in claim 1 wherein said processing first data comprises:
looking up a coefficient for inverse scaling.

7. A method as in claim 1 wherein said processing first data comprises:
branching conditionally based on a condition encountered in variable length decoding the first code word.

8. A method as in claim 7 wherein the condition is one of:
a) an end of block condition;
b) an adjust bit stream condition; and
c) an entry not found condition.

9. A method as in claim 1 wherein said variable length decoding the second code word is performed by an execution unit in response to receiving a single instruction.

10. A method as in claim 9 wherein, in response to the single instruction, the execution unit performs a method comprising:
receiving a string of bits;
generating a plurality of indices using a plurality of segments of bits in the string of bits;
looking up simultaneously a plurality of entries from a plurality of look-up tables using the plurality of indices; and
combining the plurality of entries into a first result.

11. A method as in claim 9 wherein the execution unit is one of a plurality of execution units of a Very Long Instruction Word (VLIW) processing engine.

12. A method to decode a variable length encoded bit stream on a processing engine having an instruction cache and local memory, the method comprising:
loading a first set of instructions into the instruction cache;
loading first data into the local memory;
generating second data from the first data by executing the first set of instructions;
loading the second data from the local memory into first memory external to the processing engine;
loading a second set of instructions into the instruction cache;
loading the second data from the first memory into the local memory; and
generating third data from the second data by executing the second set of instructions.

13. A method as in claim 12 wherein the first set of instructions comprises instructions for at least one of:
a) Macro Block Address Generation (MBAG); and
b) Variable Length Decoding (VLD).

14. A method as in claim 12 wherein the second set of instructions comprises instructions for at least one of:
a) Variable Length Decoding (VLD); and
b) Inverse Discrete Cosine Transformation (IDCT).

15. A method as in claim 12 wherein a second portion of the second data is generated concurrently while a first portion of the second data is loaded from the local memory into the first memory.

16. A method as in claim 12 wherein a first portion of the second data is generated concurrently from a first portion of the first data while a second portion of the first data is loaded from the first memory into the local memory.

17. A method as in claim 12 wherein a first portion of the third data is generated concurrently from a first portion of the second data while a second portion of the second data is loaded from the first memory into the local memory.

18. A method to decode a variable length encoded bit stream on a processing engine having local memory, the method comprising:
concurrently loading a first result generated from first data from the local memory into first memory external to the processing engine using a first at least one Direct Memory Access (DMA) channel;
while generating a second result from second data in the local memory; and
while loading third data into the local memory using a second at least one DMA channel.

19. A method as in claim 18 wherein:
the first, second, and third data are Inverse Direct Cosine Transformation (IDCT) coefficients; and
the first and second results are decompressed video streams.

20. A method as in claim 18 wherein, after a first portion of the first result is loaded into the first memory, a portion of the second result is stored into a location in the local memory in which the first portion of the first result is stored.

21. A method as in claim 18 wherein:
the first, second, and third data are compressed bit streams; and
the first and second results are Inverse Direct Cosine Transformation (IDCT) coefficients.

22. A method as in claim 18 wherein:
the first and second data are Inverse Direct Cosine Transformation (IDCT) coefficients;
the third data is a compressed bit stream; and
the first and second results are decompressed video streams.

23. A method as in claim 22 further comprising:
concurrently variable length decoding the third data to generate a first set of IDCT coefficients;
while loading the second result from the local memory into the first memory using the second at least one DMA channel.

24. A method as in claim 18 wherein the second result is stored into a location in the local memory in which the second data is stored.

25. A method to decode a variable length encoded bit stream, the method comprising:
concurrently executing a first set of instructions in a first processing engine to generate a first result from a first data for a bit stream;
while executing a second set of instructions in a second processing engine to generate a second result from a third result;
wherein the third result is generated from a second data for the bit stream in the first processing engine after execution of the first set of instructions.

26. A method as in claim 25 wherein the first set of instructions comprises instructions for at least one of:
a) Macro Block Address Generation (MBAG); and
b) Variable Length Decoding (VLD).

27. A method as in claim 25 wherein the second set of instructions comprises instructions for at least one of:
a) Variable Length Decoding (VLD); and
b) Inverse Discrete Cosine Transformation (IDCT).

28. A method to decode a variable length encoded bit stream, the method comprising:
variable length decoding a bit stream until a condition in a set of conditions is encountered;

constructing first data containing information about a segment of the bit stream which has not been decoded; and storing first data in a location in memory, the location being independent on the condition.

29. A method as in claim 28 wherein the set of conditions comprises:

a) an end of block condition; and b) an adjust bit stream condition.

30. A method as in claim 28 wherein the first data comprises:

a) bits in the segment;

b) a bit length of the segment; and c) a type of the segment.

31. A method as in claim 30 wherein the type of the segment is one of:

a) incomplete code bits; and b) remaining bits.

32. A machine readable media containing executable computer program instructions which when executed by a digital processing system cause said system to perform a method to decode a variable length encoded bit stream, the method comprising:

concurrently processing first data obtained from variable length decoding a first code word in a register;

while variable length decoding a second code word in the register.

33. A media as in claim 32 wherein said processing first data comprises:

looking up an inverse zigzag index.

34. A media as in claim 33 wherein the inverse zigzag index is for storing an Inverse Direct Cosine Transformation (IDCT) coefficient in a transposed inverse zigzag order.

35. A media as in claim 32 wherein said processing first data comprises:

computing an Inverse Direct Cosine Transformation (IDCT) coefficient.

36. A media as in claim 35 wherein said processing first data further comprises:

storing the IDCT coefficient in a buffer in a transposed inverse zigzag order.

37. A media as in claim 32 wherein said processing first data comprises:

looking up a coefficient for inverse scaling.

38. A media as in claim 32 wherein said processing first data comprises:

branching conditionally based on a condition encountered in variable length decoding the first code word.

39. A media as in claim 38 wherein the condition is one of:

a) an end of block condition;

b) an adjust bit stream condition; and c) an entry not found condition.

40. A media as in claim 32 wherein said variable length decoding the second code word is performed by an execution unit in response to receiving a single instruction.

41. A media as in claim 40 wherein, in response to the single instruction, the execution unit performs a method comprising:

receiving a string of bits;

generating a plurality of indices using a plurality of segments of bits in the string of bits;

looking up simultaneously a plurality of entries from a plurality of look-up tables using the plurality of indices; and combining the plurality of entries into a first result.

42. A media as in claim 40 wherein the execution unit is one of a plurality of execution units of a Very Long Instruction Word (VLIW) processing engine.

43. A machine readable media containing executable computer program instructions which when executed by a digital processing system cause said system to perform a method to decode a variable length encoded bit stream on a processing engine having an instruction cache and local memory, the method comprising:

loading a first set of instructions into the instruction cache;

loading first data into the local memory;

generating second data from the first data by executing the first set of instructions;

loading the second data from the local memory into first memory external to the processing engine;

loading a second set of instructions into the instruction cache;

loading the second data from the first memory into the local memory; and generating third data from the second data by executing the second set of instructions.

44. A media as in claim 43 wherein the first set of instructions comprises instructions for at least one of:

a) Macro Block Address Generation (MBAG); and b) Variable Length Decoding (VLD).

45. A media as in claim 43 wherein the second set of instructions comprises instructions for at least one of:

a) Variable Length Decoding (VLD); and b) Inverse Discrete Cosine Transformation (IDCT).

46. A media as in claim 43 wherein a second portion of the second data is generated concurrently while a first portion of the second data is loaded from the local memory into the first memory.

47. A media as in claim 43 wherein a first portion of the second data is generated concurrently from a first portion of the first data while a second portion of the first data is loaded from the first memory into the local memory.

48. A media as in claim 43 wherein a first portion of the third data is generated concurrently from a first portion of the second data while a second portion of the second data is loaded from the first memory into the local memory.

49. A machine readable media containing executable computer program instructions which when executed by a digital processing system cause said system to perform a method to decode a variable length encoded bit stream on a processing engine having local memory, the method comprising concurrently loading a first result generated from first data from the local memory into first memory external to the processing engine using a first at least one Direct Memory Access (DMA) channel;

while generating a second result from second data in the local memory; and while loading third data into the local memory using a second at least one DMA channel.

50. A media as in claim 49 wherein:

the first, second, and third data are Inverse Direct Cosine Transformation (IDCT) coefficients; and the first and second results are decompressed video streams.

51. A media as in claim 49 wherein, after a first portion of the first result is loaded into the first memory, a portion of the second result is stored into a location in the local memory in which the first portion of the first result is stored.

52. A media as in claim 49 wherein:
the first, second, and third data are compressed bit streams; and
the first and second results are Inverse Direct Cosine Transformation (IDCT) coefficients.

53. A media as in claim 49 wherein:
the first and second data are Inverse Direct Cosine Transformation (IDCT) coefficients;
the third data is a compressed bit stream; and
the first and second results are decompressed video streams.

54. A media as in claim 53 wherein the method further comprises:
concurrently variable length decoding the third data to generate a first set of IDCT coefficients;
while loading the second result from the local memory into the first memory using the second at least one DMA channel.

55. A media as in claim 49 wherein the second result is stored into a location in the local memory in which the second data is stored.

56. A machine readable media containing executable computer program instructions which when executed by a digital processing system cause said system to perform a method to decode a variable length encoded bit stream, the method comprising:
concurrently executing a first set of instructions in a first processing engine to generate a first result from a first data for a bit stream;
while executing a second set of instructions in a second processing engine to generate a second result from a third result;
wherein the third result is generated from a second data for the bit stream in the first processing engine after execution of the first set of instructions.

57. A media as in claim 56 wherein the first set of instructions comprises instructions for at least one of:
a) Macro Block Address Generation (MBAG); and
b) Variable Length Decoding (VLD).

58. A media as in claim 56 wherein the second set of instructions comprises instructions for at least one of:
a) Variable Length Decoding (VLD); and
b) Inverse Discrete Cosine Transformation (IDCT).

59. A machine readable media containing executable computer program instructions which when executed by a digital processing system cause said system to perform a method to decode a variable length encoded bit stream, the method comprising:
variable length decoding a bit stream until a condition in a set of conditions is encountered;
constructing first data containing information about a segment of the bit stream which has not been decoded; and
storing first data in a location in memory, the location being independent on the condition.

60. A media as in claim 59 wherein the set of conditions comprises:
a) an end of block condition; and
b) an adjust bit stream condition.

61. A media as in claim 59 wherein the first data comprises:

a) bits in the segment;
b) a bit length of the segment; and
c) a type of the segment.

62. A media as in claim 61 wherein the type of the segment is one of:
a) incomplete code bits; and
b) remaining bits.

63. A variable length encoded bit stream decoder comprising:
means for processing first data obtained from variable length decoding a first code word in a register; and
means for variable length decoding a second code word in the register;
wherein the above means operate concurrently.

64. A decoder as in claim 63 wherein said means for processing first data comprises:
means for looking up an inverse zigzag index.

65. A decoder as in claim 64 wherein the inverse zigzag index is for storing an Inverse Direct Cosine Transformation (IDCT) coefficient in a transposed inverse zigzag order.

66. A decoder as in claim 63 wherein said means for processing first data comprises:
means for computing an Inverse Direct Cosine Transformation (IDCT) coefficient.

67. A decoder as in claim 66 wherein said means for processing first data further comprises:
means for storing the IDCT coefficient in a buffer in a transposed inverse zigzag order.

68. A decoder as in claim 63 wherein said means for processing first data comprises:
means for looking up a coefficient for inverse scaling.

69. A decoder as in claim 63 wherein said means for processing first data comprises:
means for branching conditionally based on a condition encountered in variable length decoding the first code word.

70. A decoder as in claim 69 wherein the condition is one of:
a) an end of block condition;
b) an adjust bit stream condition; and
c) an entry not found condition.

71. A decoder as in claim 63 wherein said variable length decoding the second code word is performed by an execution unit in response to receiving a single instruction.

72. A decoder as in claim 71 wherein the execution unit comprises:
means for receiving a string of bits;
means for generating a plurality of indices using a plurality of segments of bits in the string of bits;
means for looking up simultaneously a plurality of entries from a plurality of look-up tables using the plurality of indices; and
means for combining the plurality of entries into a first result;
wherein the above means operate in response to receiving a single instruction.

73. A decoder as in claim 71 wherein the execution unit is one of a plurality of execution units of a Very Long Instruction Word (VLIW) processing engine.

74. A variable length encoded bit stream decoder comprising:
a processing engine having an instruction cache and local memory;

means for loading a first set of instructions into the instruction cache;

means for loading first data into the local memory;

means for generating second data from the first data by executing the first set of instructions;

means for loading the second data from the local memory into first memory external to the processing engine;

means for loading a second set of instructions into the instruction cache;

means for loading the second data from the first memory into the local memory; and means for generating third data from the second data by executing the second set of instructions.

75. A decode as in claim 74 wherein the first set of instructions comprises instructions for at least one of:

a) Macro Block Address Generation (MBAG); and b) Variable Length Decoding (VLD).

76. A decode as in claim 74 wherein the second set of instructions comprises instructions for at least one of:

a) Variable Length Decoding (VLD); and b) Inverse Discrete Cosine Transformation (IDCT).

77. A decode as in claim 74 wherein a second portion of the second data is generated concurrently while a first portion of the second data is loaded from the local memory into the first memory.

78. A decode as in claim 74 wherein a first portion of the second data is generated concurrently from a first portion of the first data while a second portion of the first data is loaded from the first memory into the local memory.

79. A decode as in claim 74 wherein a first portion of the third data is generated concurrently from a first portion of the second data while a second portion of the second data is loaded from the first memory into the local memory.

80. A variable length encoded bit stream decoder comprising:

a processing engine having local memory;

means for loading a first result generated from first data from the local memory into first memory external to the processing engine using a first at least one Direct Memory Access (DMA) channel;

means for generating a second result from second data in the local memory; and means for loading third data into the local memory using a second at least one DMA channel;

wherein the above means operate concurrently.

81. A decode as in claim 80 wherein:

the first, second, and third data are Inverse Direct Cosine Transformation (IDCT) coefficients; and the first and second results are decompressed video streams.

82. A decode as in claim 80 wherein, after a first portion of the first result is loaded into the first memory, a portion of the second result is stored into a location in the local memory in which the first portion of the first result is stored.

83. A decode as in claim 80 wherein:

the first, second, and third data are compressed bit streams; and the first and second results are Inverse Direct Cosine Transformation (IDCT) coefficients.

84. A decode as in claim 80 wherein:

the first and second data are Inverse Direct Cosine Transformation (IDCT) coefficients;

the third data is a compressed bit stream; and the first and second results are decompressed video streams.

85. A decode as in claim 84 further comprising:

means for variable length decoding the third data to generate a first set of IDCT coefficients; and means for loading the second result from the local memory into the first memory using the second at least one DMA channel;

wherein the above means operates concurrently.

86. A decode as in claim 80 wherein the second result is stored into a location in the local memory in which the second data is stored.

87. A variable length encoded bit stream decoder comprising:

means for generating a first result from a first data for a bit stream in a first processing engine by executing a first set of instructions;

means for generating a second result from a third result in a second processing engine by executing a second set of instructions;

wherein the above means operate concurrently; and wherein the third result is generated from a second data for the bit stream in the first processing engine after execution the first set of instructions.

88. A decode as in claim 87 wherein the first set of instructions comprises instructions for at least one of:

a) Macro Block Address Generation (MBAG); and b) Variable Length Decoding (VLD).

89. A decode as in claim 87 wherein the second set of instructions comprises instructions for at least one of:

a) Variable Length Decoding (VLD); and b) Inverse Discrete Cosine Transformation (IDCT).

90. A variable length encoded bit stream decoder comprising:

means for variable length decoding a bit stream until a condition in a set of conditions is encountered;

means for constructing first data containing information about a segment of the bit stream which has not been decoded; and means for storing first data in a location in memory, the location being independent on the condition.

91. A decode as in claim 90 wherein the set of conditions comprises:

a) an end of block condition; and b) an adjust bit stream condition.

92. A decode as in claim 90 wherein the first data comprises:

a) bits in the segment;

b) a bit length of the segment; and c) a type of the segment.

93. A decode as in claim 92 wherein the type of the segment is one of:

a) incomplete code bits; and b) remaining bits.

94. A variable length encoded bit stream decoder comprising:

memory;

a register; and a first execution unit and a plurality of other execution units coupled to the register and the memory, the plurality of other execution units concurrently processing first data obtained from variable length decoding a first code word in the register while the first execution unit variable length decoding a second code word in the register.

95. A decoder as in claim 94 wherein, in processing the first data, the plurality of other execution units look up an inverse zigzag index.

96. A decoder as in claim 95 wherein the inverse zigzag index is for storing an Inverse Direct Cosine Transformation (IDCT) coefficient in a transposed inverse zigzag order.

97. A decoder as in claim 94 wherein, in processing the first data, the plurality of other execution units compute an Inverse Direct Cosine Transformation (IDCT) coefficient.

98. A decoder as in claim 97 wherein, in processing the first data, the plurality of other execution units further store the IDCT coefficient in the memory in a transposed inverse zigzag order.

99. A decoder as in claim 94 wherein, in processing the first data, the plurality of other execution units look up a coefficient for inverse scaling.

100. A decoder as in claim 94 wherein, in processing the first data, the plurality of other execution units branch conditionally based on a condition encountered in variable length decoding the first code word.

101. A decoder as in claim 100 wherein the condition is one of:
   a) an end of block condition;
   b) an adjust bit stream condition; and
   c) an entry not found condition.

102. A decoder as in claim 94 wherein the first execution unit variable length decodes the second code word in response to receiving a single instruction.

103. A decoder as in claim 102 wherein the first execution unit comprises:
   a plurality of look-up tables;
   a first circuit coupled to the plurality of look-up tables, the first circuit configured to receive a string of bits; and
   a second circuit coupled to the plurality of look-up tables and the first circuit, the second circuit configured to receive a plurality of data elements, in response to the microprocessor receiving a single instruction,
   the second circuit generating a plurality of indices using the plurality of data elements and the string of bits,
   the plurality of look-up tables looking up simultaneously a plurality of entries using the plurality of indices; and
   a third circuit coupled to the plurality of look-up tables, the third circuit combining the plurality of values into a first result.

104. A decoder as in claim 102 wherein the first execution unit and the plurality of other execution units are configured to process Very Long Instruction Words (VLIW).

105. A variable length encoded bit stream decoder comprising:
   first memory;
   a processing engine coupled to the first memory, the processing engine comprising an instruction cache, local memory and a plurality of execution units;
   the processing engine loading a first set of instructions into the instruction cache, loading first data into the local memory, generating second data from the first data by executing the first set of instructions using the plurality of execution units, loading the second data from the local memory into the first memory, loading a second set of instructions into the instruction cache, loading the second data from the first memory into the local memory, and generating third data from the second data by executing the second set of instructions using the plurality of execution units.

106. A decode as in claim 105 wherein the first set of instructions comprises instructions for at least one of:

a) Macro Block Address Generation (MBAG); and
b) Variable Length Decoding (VLD).

107. A decode as in claim 105 wherein the second set of instructions comprises instructions for at least one of:
   a) Variable Length Decoding (VLD); and
   b) Inverse Discrete Cosine Transformation (IDCT).

108. A decode as in claim 105 wherein a second portion of the second data is generated concurrently while a first portion of the second data is loaded from the local memory into the first memory.

109. A decode as in claim 105 wherein a first portion of the second data is generated concurrently from a first portion of the first data while a second portion of the first data is loaded from the first memory into the local memory.

110. A decode as in claim 105 wherein a first portion of the third data is generated concurrently from a first portion of the second data while a second portion of the second data is loaded from the first memory into the local memory.

111. A variable length encoded bit stream decoder comprising:
   a processing engine comprising local memory, a first at least one Direct Memory Access (DMA) channel, a second at least one DMA channel, and a plurality of execution units; and
   first memory coupled to the processing engine, the first at least one DMA channel concurrently loading a first result generated from first data from the local memory into the first memory, while the plurality of execution units generating a second result from second data in the local memory, and while the second at least one DMA channel loading third data into the local memory.

112. A decode as in claim 111 wherein:
   the first, second, and third data are Inverse Direct Cosine Transformation (IDCT) coefficients; and
   the first and second results are decompressed video streams.

113. A decode as in claim 111 wherein, after a first portion of the first result is loaded into the first memory, a portion of the second result is stored into a location in the local memory in which the first portion of the first result is stored.

114. A decode as in claim 111 wherein:
   the first, second, and third data are compressed bit streams; and
   the first and second results are Inverse Direct Cosine Transformation (IDCT) coefficients.

115. A decode as in claim 111 wherein:
   the first and second data are Inverse Direct Cosine Transformation (IDCT) coefficients;
   the third data is a compressed bit stream; and
   the first and second results are decompressed video streams.

116. A decode as in claim 115 wherein the plurality of execution units concurrently variable length decode the third data to generate a first set of IDCT coefficients, while the second at least one DMA channel loads the second result from the local memory into the first memory.

117. A decode as in claim 111 wherein the second result is stored into a location in the local memory in which the second data is stored.

118. A variable length encoded bit stream decoder comprising:
   a first processing engine;
   a second processing engine coupled to the first processing engine, the first processing engine concurrently executing a first set of instructions to generate a first result from a first data for a bit stream, while the second processing engine executing a second set of instructions to generate a second result from the first result;

wherein the third result is generated from a second data for the bit stream by the first processing engine after executing the first set of instructions.

119. A decode as in claim 118 wherein the first set of instructions comprises instructions for at least one of:

a) Macro Block Address Generation (MBAG); and b) Variable Length Decoding (VLD).

120. A decode as in claim 118 wherein the second set of instructions comprises instructions for at least one of:

a) Variable Length Decoding (VLD); and b) Inverse Discrete Cosine Transformation (IDCT).

121. A variable length encoded bit stream decoder comprising:

a processor;

memory coupled to the processor, the processor variable length decoding a bit stream until a condition in a set of conditions is encountered, the processor constructing first data containing information about a segment of the bit stream which has not been decoded, and the processor storing first data in a location in the memory, wherein the location is independent on the condition.

122. A decode as in claim 121 wherein the set of conditions comprises:

a) an end of block condition; and b) an adjust bit stream condition.

123. A decode as in claim 121 wherein the first data comprises:

a) bits in the segment;

b) a bit length of the segment; and c) a type of the segment.

124. A decode as in claim 123 wherein the type of the segment is one of:

a) incomplete code bits; and b) remaining bits.

* * * * *